(12) United States Patent
Nomura et al.

(10) Patent No.: US 10,554,179 B2
(45) Date of Patent: Feb. 4, 2020

(54) DIFFERENTIAL CIRCUIT

(71) Applicant: ROHM CO., LTD., Kyoto-shi, Kyoto (JP)

(72) Inventors: Naohiro Nomura, Kyoto (JP); Sachito Horiuchi, Kyoto (JP); Kunihiko Iwamoto, Kyoto (JP); Takatoshi Manabe, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/055,387

(22) Filed: Aug. 6, 2018

(65) Prior Publication Data

US 2019/0052231 A1    Feb. 14, 2019

(30) Foreign Application Priority Data

Aug. 8, 2017  (JP) .................. 2017-153675
Aug. 8, 2017  (JP) .................. 2017-153676

(51) Int. Cl.
  *H03F 3/45*    (2006.01)
  *H03F 1/26*    (2006.01)

(52) U.S. Cl.
  CPC ........... *H03F 1/26* (2013.01); *H03F 3/45179* (2013.01); *H03F 2200/372* (2013.01); *H03F 2203/45018* (2013.01); *H03F 2203/45116* (2013.01)

(58) Field of Classification Search
  CPC .................... H03F 3/45; H03F 2003/45008
  USPC .................................... 330/253, 261
  See application file for complete search history.

(56) References Cited

U.S. PATENT DOCUMENTS

| 7,227,413 B1* | 6/2007 | Marty ............... H03F 1/305 |
| | | 330/253 |
| 2006/0267685 A1* | 11/2006 | Alenin ............... H03F 1/48 |
| | | 330/258 |

FOREIGN PATENT DOCUMENTS

JP    2011172203 A    9/2011

* cited by examiner

*Primary Examiner* — Steven J Mottola
(74) *Attorney, Agent, or Firm* — Cantor Colburn LLP

(57) ABSTRACT

A differential circuit includes a differential pair and a back gate bias circuit. The differential circuit includes a first MOS transistor and a second MOS transistor provided between a first power supply line, to which a first power supply voltage is applied, and a second power supply line, to which a second power supply voltage is applied. The back gate bias circuit applies a bias voltage closer to the first power supply voltage than source potentials of the first MOS transistor and the second MOS transistor to back gates of the first MOS transistor and the second MOS transistor.

28 Claims, 60 Drawing Sheets

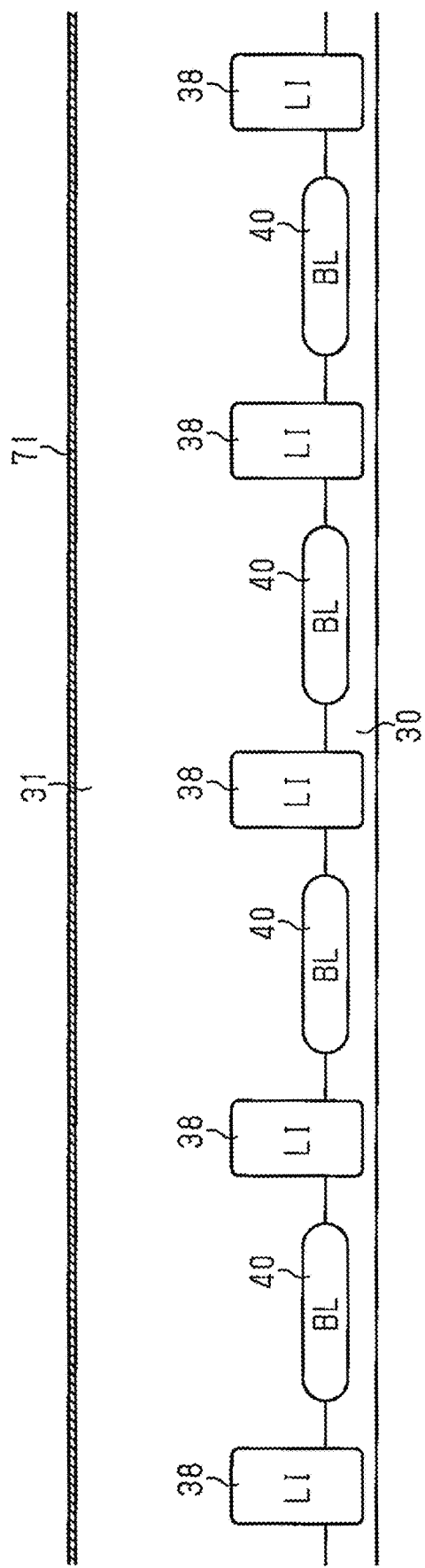

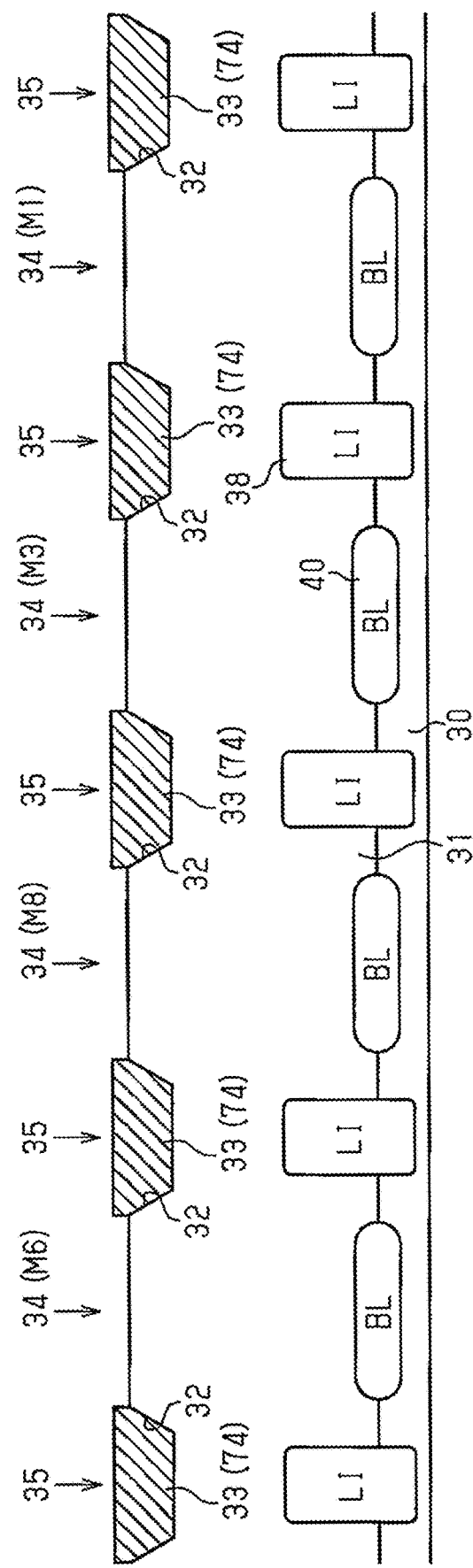

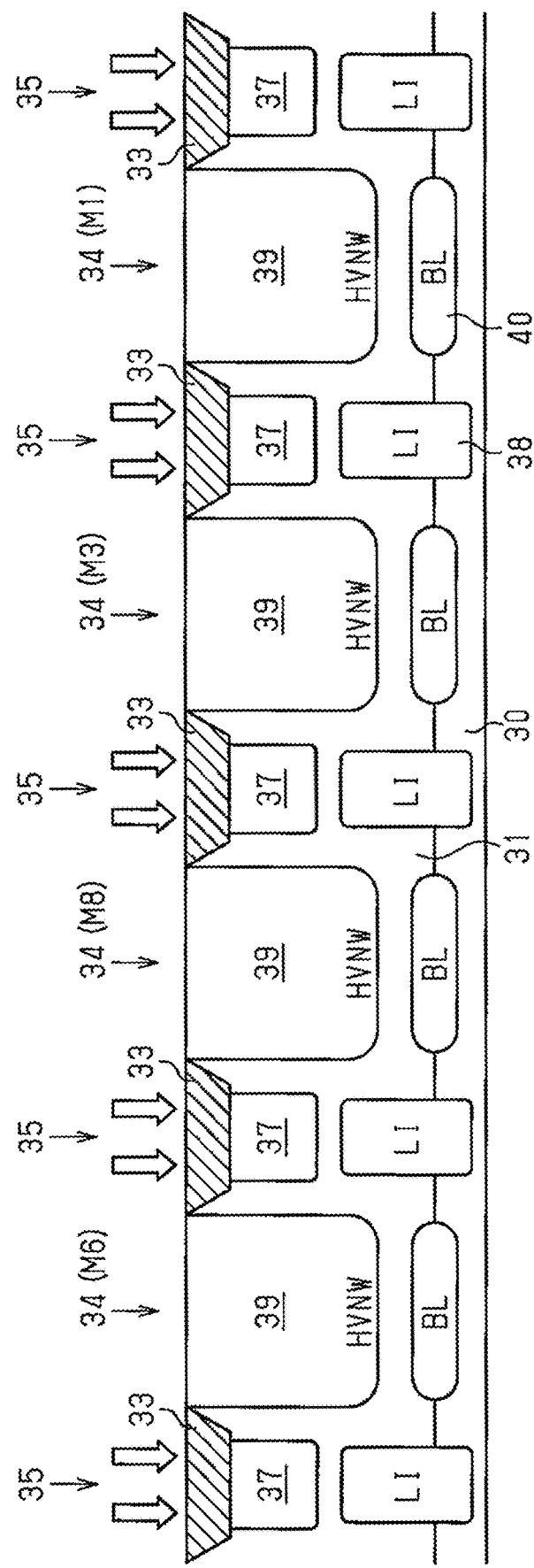

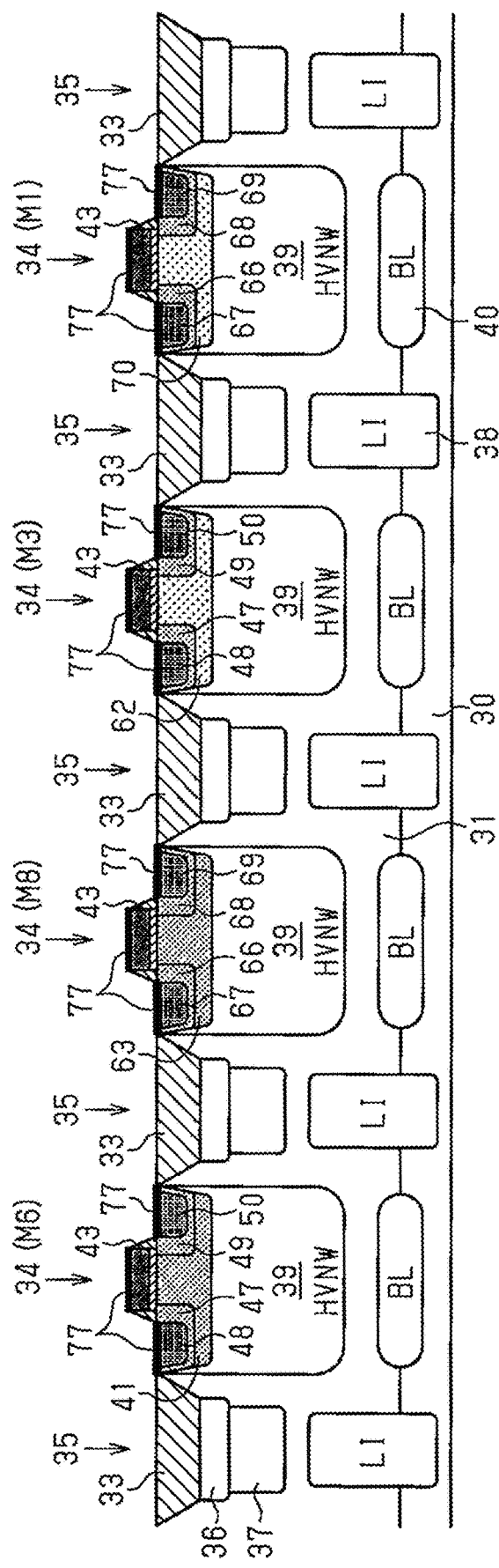

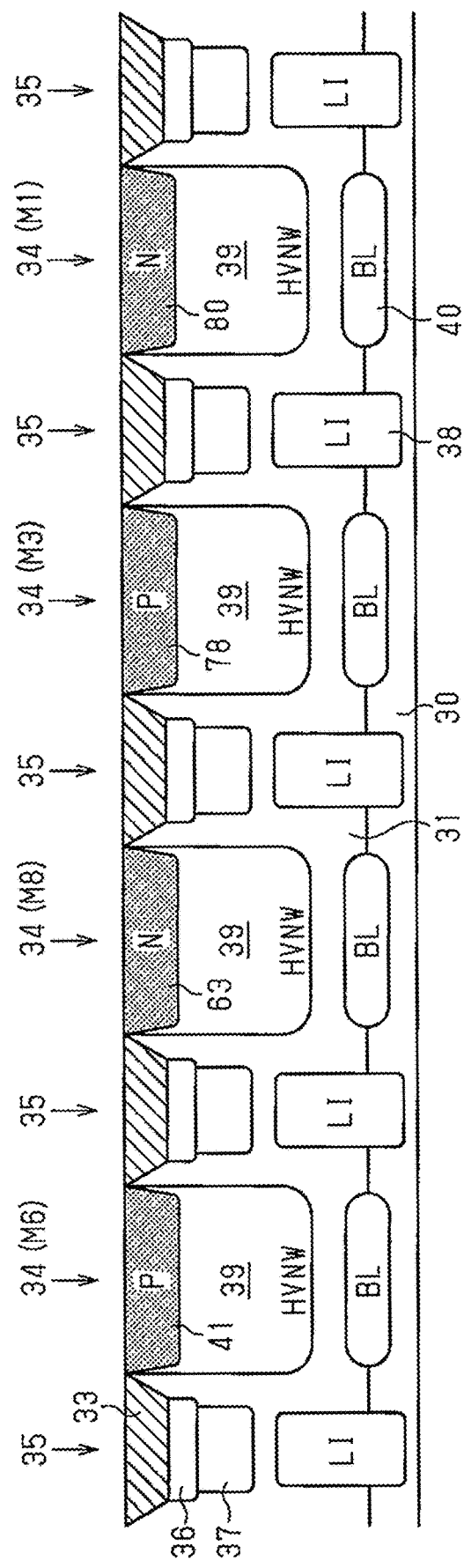

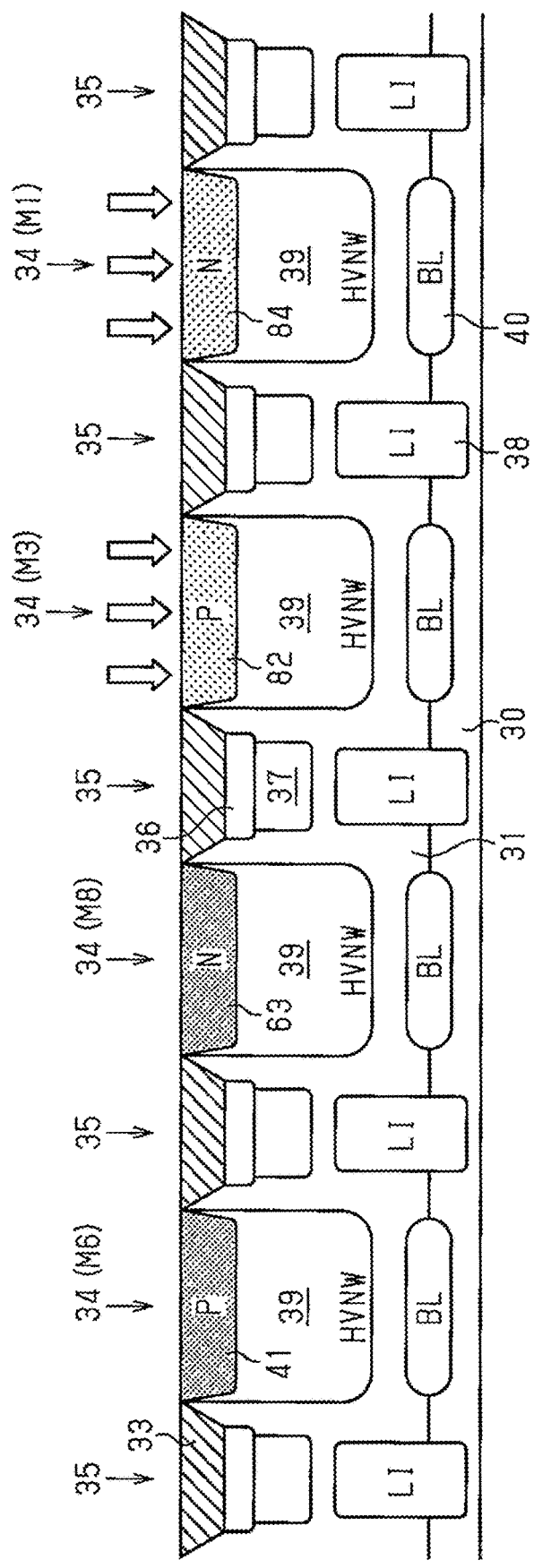

Fig. 36

DIFFERENTIAL CIRCUIT

CROSS REFERENCE TO RELATED APPLICATION

The present application claims priority under 35 U.S.C. § 119 to Japanese Patent Application No. 2017-153675 filed on Aug. 8, 2017 and Japanese Patent Application No. 2017-153676, filed on Aug. 8, 2017, the entire contents of which are incorporated herein by reference.

BACKGROUND OF THE INVENTION

The present invention relates to a differential circuit.

An operational amplifier, which is an example of a differential circuit, is included in various electronic devices. For example, an operational amplifier described in Japanese Laid-Open Patent Publication No. 2011-172203 is included in a liquid crystal driving device.

There has been a demand for further improvement of noise reduction of output signals generated from an operational amplifier.

SUMMARY OF THE INVENTION

It is an object of the present invention to provide a differential circuit capable of reducing noise of output signals.

[1] A differential circuit for achieving the above object includes a differential pair including a first metal oxide semiconductor (MOS) transistor and a second MOS transistor provided between a first power supply line, to which a first power supply voltage is applied, and a second power supply line, to which a second power supply voltage that differs from the first power supply voltage is applied. A back gate bias circuit that a bias voltage, which is closer to the first power supply voltage than source potentials of the first MOS transistor and the second MOS transistor, to back gates of the first MOS transistor and the second MOS transistor.

As a parameter affecting noise of an output signal of the differential circuit, the inventors of the present application have focused on transconductance of each of the first MOS transistor and the second MOS transistor configuring the differential pair. More specifically, the noise of the output signal of the differential circuit decreases as the transconductance increases. The inventors of the present application have found that the transconductance of each of the first MOS transistor and the second MOS transistor increases as a back gate-to-source voltage, which is a voltage between the back gate and the source of each of the first MOS transistor and the second MOS transistor configuring the differential pair, rises. Accordingly, the transconductance of each of the first MOS transistor and the second MOS transistor becomes larger when a bias voltage applied to each of the back gates of the first MOS transistor and the second MOS transistor is closer to the first power supply voltage than the source potential, as compared to when the bias voltage is equal to the voltage between the back gate and source of each of the first MOS transistor and the second MOS transistor.

In this differential circuit, therefore, a bias voltage closer to the first power supply voltage than the source potentials of the first MOS transistor and the second MOS transistor is applied to the back gates of the first MOS transistor and the second MOS transistor by the back gate bias circuit. As a result, the back gate-to-source voltage of the first MOS transistor and the second MOS transistor rises. This increases the transconductance of each of the first MOS transistor and the second MOS transistor, thereby reducing the noise of the output signal of the differential circuit.

[2] In the above differential circuit, a voltage conversion circuit is preferably provided between the first power supply line and the differential pair to convert the first power supply voltage into a voltage closer to the source potentials of the first MOS transistor and the second MOS transistor than the first power supply voltage.

According to the above configuration, the back gate-to-source voltage, which is a voltage between the back gate and the source of each of the first MOS transistor and the second MOS transistor, can be raised. Therefore, reduction of the noise of the output signal of the differential circuit is achievable.

[3] In the above differential circuit, the back gate bias circuit preferably generates the bias voltage with a third power supply voltage that differs from the first power supply voltage. The first power supply voltage is preferably a voltage closer to the source potentials of the first MOS transistor and the second MOS transistor than the third power supply voltage.

According to the above configuration, the back gate-to-source voltage, which is a voltage between the back gate and the source of each of the first MOS transistor and the second MOS transistor, can be raised. Therefore, reduction of the noise of the output signal of the differential circuit is achievable.

[4] In the above differential circuit, the bias voltage is preferably a voltage within a predetermined range including the first power supply voltage and excluding a voltage equal to the first power supply voltage.

According to the above configuration, effects of the noise from the first power supply line decreases, and the transconductance of each of the first MOS transistor and the second MOS transistor increases. Accordingly, further reduction of the noise of the output signal of the differential circuit is achievable.

[5] In the above differential circuit, the first power supply voltage is preferably higher than the second power supply voltage. The first MOS transistor and the second MOS transistor are preferably P-channel MOS transistors. The bias voltage is preferably higher than the first power supply voltage.

According to the above configuration, further reduction of the noise of the output signal of the differential circuit is achievable.

[6] In the above differential circuit, the bias voltage is preferably lower than a voltage at which parasitic diodes of the first MOS transistor and the second MOS transistor are turned on.

According to the above configuration, the first MOS transistor and the second MOS transistor can operate in a stable manner.

[7] In the above differential circuit, the bias voltage is preferably a voltage within ±20% of the first power supply voltage.

According to the above configuration, effective reduction of the noise of the output signal of the differential circuit is achievable.

[8] In the above differential circuit, the second power supply voltage is preferably higher than the first power supply voltage. The first MOS transistor and the second MOS transistor are preferably N-channel MOS transistors. The bias voltage is preferably lower than the first power supply voltage.

According to the above configuration, further reduction of the noise of the output signal of the differential circuit is achievable.

[9] The above differential circuit preferably includes an active load including a third MOS transistor, which is connected to the first MOS transistor, and a fourth MOS transistor, which is connected to the second MOS transistor. A first resistance portion is provided between the third MOS transistor and the second power supply line. A second resistance portion is provided between the fourth MOS transistor and the second power supply line.

The noise of the output signal of the differential circuit decreases as the transconductance of each of the third MOS transistor and the fourth MOS transistor as the active load decreases.

In this respect, according to the above configuration, source potentials of the third MOS transistor and the fourth MOS transistor are raised by the first resistance portion and the second resistance portion when the gate-to-source voltage of each of the third MOS transistor and the fourth MOS transistor rises with a flow of a drain current through the third MOS transistor and the fourth MOS transistor. Accordingly, an increase in the drain current flowing through the third MOS transistor and the fourth MOS transistor is prevented. In other words, the gate-to-source voltage of each of the third MOS transistor and the fourth MOS transistor decreases in accordance with the first resistance portion and the second resistance portion when viewed from the drain side of the third MOS transistor and the fourth MOS transistor as the effective transconductance of each of the third MOS transistor and the fourth MOS transistor. As a result, the third MOS transistor and the fourth MOS transistor operate to reduce the drain current. Therefore, the transconductance of each of the third MOS transistor and the fourth MOS transistor on the circuit decreases. Accordingly, reduction of the noise of the output signal of the differential circuit is achievable.

[10] The above differential circuit preferably includes a first control unit that controls a source potential of the third MOS transistor by supplying a current between a source of the third MOS transistor and the first resistance portion and a second control unit that controls a source potential of the fourth MOS transistor by supplying a current between a source of the fourth MOS transistor and the second resistance portion.

According to the above configuration, the source potential of the third MOS transistor can be controlled by the first control unit, while the source potential of the fourth MOS transistor can be controlled by the second control unit. Accordingly, the effective transconductance of each of the third MOS transistor and the fourth MOS transistor can be reduced. Therefore, reduction of the noise of the output signal of the differential circuit is achievable.

[11] In the above differential circuit, the first control unit preferably includes a first control transistor connected between the source of the third MOS transistor and the first resistance portion. The second control unit preferably includes a second control transistor connected between the source of the fourth MOS transistor and the second resistance portion. Voltages of control terminals of the first control transistor and the second control transistor are preferably controlled by gate voltages of the third MOS transistor and the fourth MOS transistor.

According to the above configuration, currents corresponding to an increase in the currents flowing through the first MOS transistor and the second MOS transistor can be prevented from flowing toward the third MOS transistor and the fourth MOS transistor, and the source potentials of the third MOS transistor and the fourth MOS transistor can be raised.

[12] In the above differential circuit, the first control unit preferably further includes a first current source connected to the first power supply line and the first control transistor. The second control unit preferably further includes a second current source connected to the first power supply line and the second control transistor.

[13] The above differential circuit preferably further includes a current adjustment unit that causes larger currents to flow through the first MOS transistor and the second MOS transistor than currents flowing through the third MOS transistor and the fourth MOS transistor.

The noise of the output signal of the differential circuit decreases as the transconductance of each of the first MOS transistor and the second MOS transistor configuring the differential pair increases. On the other hand, the noise of the output signal of the differential circuit increases as the transconductance of each of the third MOS transistor and the fourth MOS transistor configuring the active load increases.

In this respect, according to the above configuration, the current adjustment unit increases the transconductance of each of the first MOS transistor and the second MOS transistor by increasing the current flowing through the first MOS transistor and the second MOS transistor that configure the differential pair. On the other hand, the currents flowing through the third MOS transistor and the fourth MOS transistor configuring the active load are smaller than the currents flowing through the first MOS transistor and the second MOS transistor. Accordingly, an increase in the transconductance of each of the third MOS transistor and the fourth MOS transistor caused by increasing the currents flowing through the first MOS transistor and the second MOS transistor is suppressed. Therefore, reduction of the noise of the output signal of the differential circuit is achievable.

[14] In the above differential circuit, the current adjustment unit preferably includes a first adjustment transistor, which is connected in parallel with the third MOS transistor, and a second adjustment transistor, which is connected in parallel with the fourth MOS transistor and has a control terminal connected to a control terminal of the first adjustment transistor.

According to the above configuration, a part of the currents from the first MOS transistor and the second MOS transistor flows toward the first adjustment transistor and the second adjustment transistor, and do not flow to the drains of the third MOS transistor and the fourth MOS transistor. In this case, the currents flowing through the third MOS transistor and the fourth MOS transistor are smaller than the currents flowing through the first MOS transistor and the second MOS transistor. Accordingly, reduction of the noise of the output signal of the differential circuit is achievable.

[15] In the above differential circuit, the current adjustment unit preferably includes a current supplying unit that supplies the differential pair with an adjustment current for adjusting a sum of an amount of current flowing through the first adjustment transistor and an amount of current flowing through the second adjustment transistor.

According to the above configuration, the current supplied to the differential pair by the current supplying unit flows to the first adjustment transistor and the second adjustment transistor. In this case, while the amount of current supplied to the differential pair increases, the amount of current supplied to the active load does not increase. Therefore, while the transconductance of each of the first MOS transistor and the second MOS transistor increases, the transconductance of each of the third MOS transistor and the fourth MOS transistor does not increase. Accordingly, reduction of the noise of the output signal of the differential circuit is achievable.

[16] In the above differential circuit, the current supplying unit preferably includes a first supply transistor and a second supply transistor, which are connected in series between the first power supply line and the second power supply line, a third supply transistor, which is provided between the first supply transistor and the differential pair, and a third resistance portion, which is provided between the second supply transistor and the second power supply line. The first supply transistor is preferably provided between the second supply transistor and the first power supply line. The control terminal of the second supply transistor is preferably connected to a control terminal of the first adjustment transistor and a control terminal of the second adjustment transistor. The third supply transistor preferably configures a current mirror circuit in cooperation with the first supply transistor and supplies the adjustment current to the differential pair.

According to the above configuration, the current supplied to the differential pair by the current supplying unit flows to the first adjustment transistor and the second adjustment transistor. In this case, while the amount of current supplied to the differential pair increases, the amount of current supplied to the active load does not increase. Accordingly, reduction of the noise of the output signal of the differential circuit is achievable.

[17] In the above differential circuit, the first adjustment transistor and the second adjustment transistor preferably cause a flow of a current smaller than or equal to the current flowing through the third MOS transistor.

A difference between the current flowing through the first adjustment transistor and the current flowing through the second adjustment transistor, produced by element variations of the first adjustment transistor and the second adjustment transistor, affects the currents flowing through the third MOS transistor and the fourth MOS transistor, and may generate offset voltages of the third MOS transistor and the fourth MOS transistor.

In this respect, according to the above configuration, the current flowing through the first adjustment transistor and the current flowing through the second adjustment transistor become lower than or equal to the current flowing through the third MOS transistor. In this case, effects produced by element variations of the adjustment transistors and imposed on the currents flowing through the third MOS transistor and the fourth MOS transistor can decrease.

[18] The above differential circuit preferably includes an active load that includes a third MOS transistor, which is connected to the first MOS transistor, and a fourth MOS transistor, which is connected to the second MOS transistor and has a gate connected to a gate of the third MOS transistor. A current adjustment unit causes larger currents to flow through the first MOS transistor and the second MOS transistor than currents flowing through the third MOS transistor and the fourth MOS transistor.

According to the above configuration, the current adjustment unit increases the transconductance of each of the first MOS transistor and the second MOS transistor by increasing the currents flowing through the first MOS transistor and the second MOS transistor that configure the differential pair. On the other hand, the currents flowing through the third MOS transistor and the fourth MOS transistor configuring the active load are smaller than the currents flowing through the first MOS transistor and the second MOS transistor. Accordingly, an increase in the transconductance of each of the third MOS transistor and the fourth MOS transistor caused by increasing the currents flowing through the first MOS transistor and the second MOS transistor is suppressed. Therefore, reduction of the noise of the output signal of the differential circuit is achievable.

[19] In the above differential circuit, the current adjustment unit preferably includes a first adjustment transistor connected in parallel with the third MOS transistor, and a second adjustment transistor connected in parallel with the fourth MOS transistor and having a control terminal connected to a control terminal of the first adjustment transistor.

According to the above configuration, a part of the currents from the first MOS transistor and the second MOS transistor flows toward the first adjustment transistor and the second adjustment transistor, and do not flow to the drains of the third MOS transistor and the fourth MOS transistor. In this case, the currents flowing through the third MOS transistor and the fourth MOS transistor are smaller than the currents flowing through the first MOS transistor and the second MOS transistor. Accordingly, reduction of the noise of the output signal of the differential circuit is achievable.

[20] In the above differential circuit, the current adjustment unit preferably includes a current supplying unit that supplies the differential pair with an adjustment current for adjusting a sum of an amount of current flowing through the first adjustment transistor and an amount of current flowing through the second adjustment transistor.

According to the above configuration, the current supplied to the differential pair by the current supplying unit flows to the first adjustment transistor and the second adjustment transistor. In this case, while the amount of current supplied to the differential pair increases, the amount of current supplied to the active load does not increase. Therefore, while the transconductance of each of the first MOS transistor and the second MOS transistor increases, the transconductance of each of the third MOS transistor and the fourth MOS transistor does not increase. Accordingly, reduction of the noise of the output signal of the differential circuit is achievable.

[21] In the above differential circuit, the current supplying unit preferably includes a first supply transistor and a second supply transistor, which are connected in series between the first power supply line and the second power supply line, and a third supply transistor, which is provided between the first power supply line and the differential pair. The first supply transistor is preferably provided between the second supply transistor and the first power supply line. A control terminal of the second supply transistor is preferably connected to a control terminal of the first adjustment transistor and a control terminal of the second adjustment transistor. The third supply transistor preferably configures a current mirror circuit in cooperation with the first supply transistor, and supplies the adjustment current to the differential pair.

According to the above configuration, the current supplied to the differential pair by the current supplying unit flows to the first adjustment transistor and the second adjustment transistor. In this case, while the amount of current supplied to the differential pair increases, the amount of current supplied to the active load does not increase. Accordingly, reduction of the noise of the output signal of the differential circuit is achievable.

[22] In the above differential circuit, the first adjustment transistor and the second adjustment transistor preferably cause a flow of a current smaller than or equal to the current flowing through the third MOS transistor.

A difference between the current flowing through the first adjustment transistor and the current flowing through the second adjustment transistor, produced by element variations of the first adjustment transistor and the second adjustment transistor, affects the currents flowing through the third MOS transistor and the fourth MOS transistor, and may generate offset voltages of the third MOS transistor and the fourth MOS transistor.

In this respect, according to the above configuration, the current flowing through the first adjustment transistor and the current flowing through the second adjustment transistor become lower than or equal to the current flowing through the third MOS transistor. In this case, effects produced by element variations of the adjustment transistors and imposed on the currents flowing through the third MOS transistor and the fourth MOS transistor can decrease.

[23] In the above differential circuit, the current supplying unit preferably biases the first adjustment transistor and the second adjustment transistor so that a current smaller than or equal to the current flowing through the third MOS transistor is caused to flow by a current source.

According to the above configuration, the current flowing through the first adjustment transistor and the current flowing through the second adjustment transistor become lower than or equal to the current flowing through the third MOS transistor. In this case, effects produced by element variations of the adjustment transistors and imposed on the currents flowing through the third MOS transistor and the fourth MOS transistor can decrease.

[24] In the above differential circuit, the back gate bias circuit preferably includes a plurality of MOS transistors. Each of the plurality of MOS transistors is preferably a high concentration transistor whose impurity concentration in a channel region is a first concentration. Each of the first MOS transistor and the second MOS transistor is preferably a low concentration transistor whose impurity concentration in a channel region is a second concentration lower than the first concentration.

According to the above configuration, the impurity concentration in the channel region of each of the first MOS transistor and the second MOS transistor configuring the differential pair and easily affected by 1/f noise in the differential circuit is lower than the impurity concentration in the channel region of each of the plurality of transistors configuring the back gate bias circuit and not easily affected by 1/f noise. In this case, fluctuations of mobility decrease, wherefore fluctuations of the drain current can be reduced. Accordingly, effective reduction of 1/f noise of the differential circuit is achievable.

In addition, the high concentration transistors are adopted as the plurality of MOS transistors of the back gate bias circuit. Accordingly, variations in threshold voltages of the plurality of MOS transistors decrease, wherefore the back gate bias circuit can operate in a stable manner.

[25] In the differential circuit, it is preferable that the second concentration be about ½ or lower of the first concentration.

According to the above configuration, effective reduction of 1/f noise of the differential circuit is achievable.

[26] In the differential circuit, it is preferable that the second concentration be about 1/10 of the first concentration.

According to the above configuration, effective reduction of 1/f noise of the differential circuit is achievable.

[27] In the above differential circuit, the third MOS transistor and the fourth MOS transistor of the active load are preferably the low concentration transistors.

According to the above configuration, fluctuations of mobility can be reduced by adopting low concentration transistors for the third MOS transistor and the fourth MOS transistor configuring an active load and easily affected by 1/f noise of the differential circuit. Accordingly, fluctuations of the drain current can decrease. Accordingly, effective reduction of 1/f noise of the differential circuit is achievable.

[28] In the above differential circuit, the third MOS transistor and the fourth MOS transistor are preferably embedded channel type MOS transistors.

According to the above configuration, effects produced by the embedded channels in the third MOS transistor and the fourth MOS transistor configuring the active load and easily affected by 1/f noise of the differential circuit, and imposed on the interface between a gate insulation film and a semiconductor substrate can decrease. In this case, fluctuations of mobility decrease, wherefore fluctuations of the drain current can be reduced. Accordingly, effective reduction of 1/f noise of the differential circuit is achievable.

[29] In the above differential circuit, the differential circuit preferably includes a cascode current mirror circuit as an active load. The cascode current mirror circuit preferably includes a fifth MOS transistor, a sixth MOS transistor, a seventh MOS transistor, and an eighth MOS transistor. The drain of the fifth MOS transistor is preferably connected to the drain of the first MOS transistor. The source of the fifth MOS transistor is preferably connected to the second power supply line. The drain of the sixth MOS transistor is preferably connected to the drain of the second MOS transistor. The source of the sixth MOS transistor is preferably connected to the second power supply line. The source of the seventh MOS transistor is preferably connected to the drain of the fifth MOS transistor. The source of the eighth MOS transistor is preferably connected to the drain of the sixth MOS transistor. The gates of the seventh MOS transistor and the eighth MOS transistor are preferably connected in common, and a predetermined bias voltage is applied to these gates. The fifth MOS transistor and the sixth MOS transistor are preferably the low concentration transistors. The seventh MOS transistor and the eighth MOS transistor are preferably the high concentration transistors.

According to the above configuration, fluctuations of mobility can be reduced by adopting low concentration transistors as the fifth MOS transistor and the sixth MOS transistor configuring a constant current source of the cascode current mirror circuit and easily affected by 1/f noise of the differential circuit. Accordingly, fluctuations of the drain current can decrease. Accordingly, effective reduction of 1/f noise of the differential circuit is achievable.

[30] In the above differential circuit, the fifth MOS transistor and the sixth MOS transistor are preferably embedded channel type MOS transistors, while the seventh MOS transistor and the eighth MOS transistor are preferably surface channel type MOS transistors.

According to the above configuration, fluctuations of mobility can be reduced by adopting embedded channel type MOS transistors as the fifth MOS transistor and the sixth MOS transistor configuring a constant current source of the cascode current mirror circuit and easily affected by 1/f noise of the differential circuit. Accordingly, fluctuations of the drain current can decrease. Accordingly, effective reduction of 1/f noise of the differential circuit is achievable.

[31] In the differential circuit, the plurality of MOS transistors are preferably surface channel type MOS transistors.

[32] In the above differential circuit, the first MOS transistor and the second MOS transistor are preferably embedded channel type MOS transistors.

According to the above configuration, fluctuations of mobility can be reduced by adopting embedded channel type MOS transistors as the first MOS transistor and the second MOS transistor configuring the differential pair and easily affected by 1/f noise of the differential circuit. Accordingly, fluctuations of the drain current can decrease. Accordingly, effective reduction of 1/f noise of the differential circuit is achievable.

[33] In the above differential circuit, the impurity concentration in the channel region of each of the first control transistor and the second control transistor is preferably higher than the impurity concentration in the channel region of each of the first MOS transistor and the second MOS transistor.

According to the above configuration, the impurity concentration in the channel region of each of the first control transistor and the second control transistor is high. Accordingly, variations in the threshold voltage of each of the control transistors can decrease, wherefore the first control unit and the second control unit can operate in a stable manner.

[34] In the above differential circuit, the first control transistor and the second control transistor are preferably surface channel type MOS transistors.

[35] In the above differential circuit, the impurity concentration in the channel region of each of the first adjustment transistor and the second adjustment transistor is preferably higher than the impurity concentration in the channel region of each of the first MOS transistor and the second MOS transistor.

According to the above configuration, the impurity concentration in the channel region of each of the first adjustment transistor and the second adjustment transistor is high. Accordingly, variations in the threshold voltage of each of the adjustment transistors can decrease, wherefore the current adjustment unit can operate in a stable manner.

[36] In the above differential circuit, the first adjustment transistor and the second adjustment transistor are preferably surface channel type MOS transistors.

[37] In the above differential circuit, the impurity concentration in the channel region of each of the first supply transistor, the second supply transistor, and the third supply transistor is preferably higher than the impurity concentration in the channel region of each of the first MOS transistor and the second MOS transistor.

According to the above configuration, the impurity concentration in the channel region of each of the first to third supply transistors is high. Accordingly, variations in the threshold voltage of each of the supply transistors can decrease, wherefore the current supplying unit can operate in a stable manner.

[38] In the above differential circuit, the first supply transistor, the second supply transistor, and the third supply transistor are preferably surface channel type MOS transistors.

[40] The differential circuit is preferably used as an operational amplifier.

[41] A differential circuit for achieving the above object includes a differential pair provided between a first power supply line and a second power supply line and including a first transistor and a second transistor. An active load includes a third transistor connected to the first transistor and a fourth transistor connected to the second transistor. A first resistance portion provided between the third transistor and the second power supply line. A second resistance portion is provided between the fourth transistor and the second power supply line.

The noise of the output signal of the differential circuit decreases as the transconductance of each of the third transistor and the fourth transistor as the active load decreases.

In this respect, according to the above configuration, source potentials of the third transistor and the fourth transistor are raised by the first resistance portion and the second resistance portion when the gate-to-source voltage of each of the third transistor and the fourth transistor rises with a flow of a drain current through the third transistor and the fourth transistor. Accordingly, an increase in the drain current flowing through the third transistor and the fourth transistor is prevented. In other words, the gate-to-source voltage of each of the third transistor and the fourth transistor decreases in accordance with the first resistance portion and the second resistance portion when viewed from the drain side of the third transistor and the fourth transistor as the effective transconductance of each of the third transistor and the fourth transistor. As a result, the third transistor and the fourth transistor operate to reduce the drain current. Therefore, the transconductance of each of the third transistor and the fourth transistor on the circuit decreases. Therefore, reduction of the noise of the output signal of the differential circuit is achievable.

[42] The above differential circuit preferably includes a first control unit that controls a source potential of the third transistor by supplying a current between a source of the third transistor and the first resistance portion. A second control unit controls a source potential of the fourth transistor by supplying a current between a source of the fourth transistor and the second resistance portion.

According to the above configuration, the source potential of the third transistor can be controlled by the first control unit, while the source potential of the fourth transistor can be controlled by the second control unit. Accordingly, the effective transconductance of each of the third transistor and the fourth transistor can be reduced. Therefore, reduction of the noise of the output signal of the differential circuit is achievable.

[43] In the above differential circuit, the first control unit preferably includes a first control transistor connected between the source of the third transistor and the first resistance portion. The second control unit preferably includes a second control transistor connected between the source of the fourth transistor and the second resistance portion. Voltages of control terminals of the first control transistor and the second control transistor are preferably controlled by gate voltages of the third transistor and the fourth transistor.

According to the above configuration, currents corresponding to an increase in the currents flowing through the first transistor and the second transistor can be prevented from flowing toward the third transistor and the fourth transistor, and the source potentials of the third transistor and the fourth transistor can be raised.

[44] In the above differential circuit, the first control unit preferably further includes a first current source connected to the first power supply line and the first control transistor. The second control unit preferably further includes a second current source connected to the first power supply line and the second control transistor.

[45] The above differential circuit preferably further includes a current adjustment unit that causes larger currents to flow through the first transistor and the second transistor than currents flowing through the third transistor and the fourth transistor.

The noise of the output signal of the differential circuit decreases as the transconductance of each of the first transistor and the second transistor configuring the differential pair increases. On the other hand, the noise of the output signal of the differential circuit increases as the transconductance of each of the third transistor and the fourth transistor configuring the active load increases.

In this respect, according to the above configuration, the current adjustment unit increases the transconductance of each of the first transistor and the second transistor by increasing the current flowing through the first transistor and the second transistor that configure the differential pair. On the other hand, the currents flowing through the third transistor and the fourth transistor configuring the active load are smaller than the currents flowing through the first transistor and the second transistor. Accordingly, an increase in the transconductance of each of the third transistor and the fourth transistor caused by increasing the currents flowing through the first transistor and the second transistor is suppressed. Therefore, reduction of the noise of the output signal of the differential circuit is achievable.

[46] In the above differential circuit, the current adjustment unit preferably includes a first adjustment transistor connected in parallel with the third transistor, and a second adjustment transistor connected in parallel with the fourth transistor and having a control terminal connected to a control terminal of the first adjustment transistor.

According to the above configuration, a part of the currents from the first transistor and the second transistor flows toward the first adjustment transistor and the second adjustment transistor, and do not flow to the drains of the third transistor and the fourth transistor. In this case, the currents flowing through the third transistor and the fourth transistor are smaller than the currents flowing through the first transistor and the second transistor. Accordingly, reduction of the noise of the output signal of the differential circuit is achievable.

[47] In the above differential circuit, the current adjustment unit preferably includes a current supplying unit that supplies, to the differential pair, an adjustment current for adjusting a sum of an amount of current flowing through the first adjustment transistor and an amount of current flowing through the second adjustment transistor.

According to the above configuration, the current supplied to the differential pair by the current supplying unit flows to the first adjustment transistor and the second adjustment transistor. In this case, while the amount of current supplied to the differential pair increases, the amount of current supplied to the active load does not increase. Therefore, while the transconductance of each of the first transistor and the second transistor increases, the transconductance of each of the third transistor and the fourth transistor does not increase. Accordingly, reduction of the noise of the output signal of the differential circuit is achievable.

[48] In the above differential circuit, the current supplying unit preferably includes a first supply transistor and a second supply transistor, which are connected in series between the first power supply line and the second power supply line, a third supply transistor, which is provided between the first power supply line and the differential pair, and a third resistance portion, which is provided between the second supply transistor and the second power supply line. The first supply transistor is preferably provided between the second supply transistor and the first power supply line. The control terminal of the second supply transistor is preferably connected to a control terminal of the first adjustment transistor and a control terminal of the second adjustment transistor. The third supply transistor preferably configures a current mirror circuit in cooperation with the first supply transistor, and supplies the adjustment current to the differential pair.

[49] In the above differential circuit, the first adjustment transistor and the second adjustment transistor preferably cause a flow of a current smaller than or equal to the current flowing through the third transistor.

A difference between the current flowing through the first adjustment transistor and the current flowing through the second adjustment transistor, produced by element variations of the first adjustment transistor and the second adjustment transistor, affects the currents flowing through the third transistor and the fourth transistor, and may generate offset voltages of the third transistor and the fourth transistor.

In this respect, according to the above configuration, the current flowing through the first adjustment transistor and the current flowing through the second adjustment transistor become lower than or equal to the current flowing through the third transistor. In this case, effects produced by element variations of the adjustment transistors and imposed on the currents flowing through the third transistor and the fourth transistor can decrease.

[50] A differential circuit for achieving the above object includes a differential pair provided between a first power supply line and a second power supply line and including a first transistor and a second transistor. An active load includes a third transistor connected to the first transistor and a fourth transistor connected to the second transistor. A current adjustment unit causes larger currents to flow through the first transistor and the second transistor than currents flowing through the third transistor and the fourth transistor.

According to the above configuration, the current adjustment unit increases the transconductance of each of the first transistor and the second transistor by increasing the currents flowing through the first transistor and the second transistor that configure the differential pair. On the other hand, the currents flowing through the third transistor and the fourth transistor configuring the active load are smaller than the currents flowing through the first transistor and the second transistor. Accordingly, an increase in the transconductance of each of the third transistor and the fourth transistor caused by increasing the currents flowing through the first transistor and the second transistor is suppressed. Therefore, reduction of the noise of the output signal of the differential circuit is achievable.

[51] In the above differential circuit, the current adjustment unit preferably includes a first adjustment transistor, which is connected in parallel with the third transistor, and a second adjustment transistor, which is connected in parallel with the fourth transistor and has a control terminal connected to a control terminal of the first adjustment transistor.

According to the above configuration, a part of the currents from the first transistor and the second transistor flows toward the first adjustment transistor and the second adjustment transistor, and do not flow to the drains of the third transistor and the fourth transistor. In this case, the currents flowing through the third transistor and the fourth transistor are smaller than the currents flowing through the first transistor and the second transistor. Accordingly, reduction of the noise of the output signal of the differential circuit is achievable.

[52] In the above differential circuit, the current adjustment unit preferably includes a current supplying unit that supplies the differential pair with an adjustment current for adjusting a sum of an amount of current flowing through the first adjustment transistor and an amount of current flowing through the second adjustment transistor.

According to the above configuration, the current supplied to the differential pair by the current supplying unit flows to the first adjustment transistor and the second adjustment transistor. In this case, while the amount of current supplied to the differential pair increases, the amount of current supplied to the active load does not increase. Therefore, while the transconductance of each of the first transistor and the second transistor increases, the transconductance of each of the third transistor and the fourth transistor does not increase. Accordingly, reduction of the noise of the output signal of the differential circuit is achievable.

[53] In the above differential circuit, the current supplying unit preferably includes a first supply transistor and a second supply transistor, which are connected in series between the first power supply line and the second power supply line, and a third supply transistor, which is provided between the first power supply line and the differential pair. The first supply transistor is preferably provided between the second supply transistor and the first power supply line. A control terminal of the second supply transistor is preferably connected to a control terminal of the first adjustment transistor and a control terminal of the second adjustment transistor. The third supply transistor preferably configures a current mirror circuit in cooperation with the first supply transistor, and supplies the adjustment current to the differential pair.

According to the above configuration, the current supplied to the differential pair by the current supplying unit flows to the first adjustment transistor and the second adjustment transistor. In this case, while the amount of current supplied to the differential pair increases, the amount of current supplied to the active load does not increase. Accordingly, reduction of the noise of the output signal of the differential circuit is achievable.

[54] In the above differential circuit, the first adjustment transistor and the second adjustment transistor preferably cause a flow of a current smaller than or equal to the current flowing through the third transistor.

A difference between the current flowing through the first adjustment transistor and the current flowing through the second adjustment transistor, produced by element variations of the first adjustment transistor and the second adjustment transistor, affects the currents flowing through the third transistor and the fourth transistor, and may generate offset voltages of the third transistor and the fourth transistor.

In this respect, according to the above configuration, the current flowing through the first adjustment transistor and the current flowing through the second adjustment transistor become smaller than or equal to the current flowing through the third transistor. In this case, effects produced by element variations of the adjustment transistors and imposed on the currents flowing through the third transistor and the fourth transistor can decrease.

[55] In the above differential circuit, the current supplying unit preferably biases the first adjustment transistor and the second adjustment transistor so that a current smaller than or equal to the current flowing through the third transistor is caused to flow by a current source.

According to the above configuration, the current flowing through the first adjustment transistor and the current flowing through the second adjustment transistor become smaller than or equal to the current flowing through the third transistor. In this case, effects produced by element variations of the adjustment transistors and imposed on the currents flowing through the third transistor and the fourth transistor can decrease.

[56] In the above differential circuit, the differential circuit preferably includes a plurality of transistors including the first transistor, the second transistor, the third transistor, and the fourth transistor. The plurality of transistors preferably include high concentration transistors whose impurity concentration in the channel region is a first concentration and low concentration transistors whose impurity concentration in the channel region is a second concentration lower than the first concentration.

According to the above configuration, fluctuations of mobility can be reduced by lowering the impurity concentration in the channel region of the transistors. Accordingly, fluctuation of the drain current can decrease. Fluctuations of the drain current exhibit a correlation with the magnitude of 1/f noise of the differential circuit. Accordingly, reduction of 1/f noise of the differential circuit is achievable by reducing fluctuations of the drain current.

[57] In the above differential circuit, the low concentration transistor is preferably adopted as a transistor more easily affected by 1/f noise among the plurality of transistors, rather than the high concentration transistor.

According to this configuration, by lowering the impurity concentration in the channel region of the transistor easily affected by 1/f noise of the differential circuit, fluctuations of mobility of the transistor can be reduced. Accordingly, fluctuations of the drain current can decrease. Accordingly, effective reduction of 1/f noise of the differential circuit is achievable.

[58] In the above differential circuit, each of the plurality of transistors preferably has a shallow trench isolation (STI) structure.

[59] In the above differential circuit, the first transistor and the second transistor that configure the differential pair among the plurality of transistors are preferably the low concentration transistors.

According to this configuration, 1/f noise of the differential circuit can be effectively reduced by lowering the impurity concentration in the channel region of the transistor configuring the differential pair and easily affected by 1/f noise of the differential circuit.

[60] In the differential circuit, it is preferable that the second concentration be about ½ or lower of the first concentration.

According to the above configuration, effective reduction of 1/f noise of the differential circuit is achievable.

[61] In the differential circuit, it is preferable that the second concentration be about 1/10 of the first concentration.

According to the above configuration, effective reduction of 1/f noise of the differential circuit is achievable.

[62] In the above differential circuit, the third transistor and the fourth transistor that configure the active load among the plurality of transistors are preferably the low concentration transistors.

According to the above configuration, fluctuations of mobility can be reduced by adopting low concentration transistors for the third transistor and the fourth transistor configuring an active load and easily affected by 1/f noise of the differential circuit. Accordingly, fluctuations of the drain current can decrease. Accordingly, effective reduction of 1/f noise of the differential circuit is achievable.

[63] In the above differential circuit, the third transistor and the fourth transistor are preferably embedded channel type transistors.

According to the above configuration, effects of the interface between a gate insulation film and a semiconductor substrate imposed on the channel region can decrease by the embedded channels in the third transistor and the fourth transistor configuring the active load and easily affected by 1/f noise of the differential circuit. In this case, fluctuations of mobility decrease, wherefore fluctuations of the drain current can be reduced. Accordingly, effective reduction of 1/f noise of the differential circuit is achievable.

[64] In the above differential circuit, the differential circuit preferably includes a cascode current mirror circuit connected to the second power supply line as the active load. The cascode current mirror circuit preferably includes a fifth transistor, a sixth transistor, a seventh transistor, and an eighth transistor. The drain of the fifth transistor is preferably connected to the drain of the first transistor. The source of the fifth transistor is preferably connected to the second power supply line. The drain of the sixth transistor is preferably connected to the drain of the second transistor. The source of the sixth transistor is preferably connected to the second power supply line. The source of the seventh transistor is preferably connected to the drain of the fifth transistor. The source of the eighth transistor is preferably connected to the drain of the sixth transistor. The gates of the seventh transistor and the eighth transistor are preferably connected in common, and a predetermined bias voltage is applied to these gates. The fifth transistor and the sixth transistor are preferably the low concentration transistors. The seventh transistor and the eighth transistor are preferably the high concentration transistors.

According to the above configuration, fluctuations of mobility can be reduced by adopting low concentration transistors as the fifth transistor and the sixth transistor configuring a constant current source of the cascode current mirror circuit and easily affected by 1/f noise of the differential circuit. Accordingly, fluctuations of the drain current can decrease. Accordingly, effective reduction of 1/f noise of the differential circuit is achievable.

[65] In the above differential circuit, the fifth transistor and the sixth transistor are preferably embedded channel type transistors, while the seventh transistor and the eighth transistor are preferably surface channel type transistors.

According to the above configuration, fluctuations of mobility can be reduced by adopting embedded channel type transistors as the fifth transistor and the sixth transistor configuring a constant current source of the cascode current mirror circuit and easily affected by 1/f noise of the differential circuit. Accordingly, fluctuations of the drain current can decrease. Accordingly, effective reduction of 1/f noise of the differential circuit is achievable.

[66] In the above differential circuit, the first transistor and the second transistor are preferably embedded channel type transistors.

According to the above configuration, fluctuations of mobility can be reduced by adopting embedded channel type transistors as the first transistor and the second transistor configuring the differential pair and easily affected by 1/f noise of the differential circuit. Accordingly, fluctuations of the drain current can decrease. Accordingly, effective reduction of 1/f noise of the differential circuit is achievable.

[67] In the above differential circuit, the impurity concentration in the channel region of each of the first control transistor and the second control transistor is preferably higher than the impurity concentration in the channel region of each of the first transistor and the second transistor.

According to the above configuration, the impurity concentration in the channel region of each of the first control transistor and the second control transistor is high. Accordingly, variations in the threshold voltage of each of the control transistors can decrease, wherefore the first control unit and the second control unit can operate in a stable manner.

[68] In the above differential circuit, the first control transistor and the second control transistor are preferably surface channel type transistors.

[69] In the above differential circuit, the impurity concentration in the channel region of each of the first adjustment transistor and the second adjustment transistor is preferably higher than the impurity concentration in the channel region of each of the first transistor and the second transistor.

According to the above configuration, the impurity concentration in the channel region of each of the first adjustment transistor and the second adjustment transistor is high. Accordingly, variations in the threshold voltage of each of the adjustment transistors can decrease, wherefore the current adjustment unit can operate in a stable manner.

[70] In the above differential circuit, the first adjustment transistor and the second adjustment transistor are preferably surface channel type transistors.

[71] In the above differential circuit, the impurity concentration in the channel region of each of the first supply transistor, the second supply transistor, and the third supply transistor is preferably higher than the impurity concentration in the channel region of each of the first transistor and the second transistor.

According to the above configuration, the impurity concentration in the channel region of each of the first to third supply transistors is high. Accordingly, variations in the threshold voltage of each of the supply transistors can decrease, wherefore the current supplying unit can operate in a stable manner.

[72] In the above differential circuit, the first supply transistor, the second supply transistor, and the third supply transistor are preferably surface channel type transistors.

[73] The differential circuit is preferably used as an operational amplifier.

BRIEF DESCRIPTION OF THE DRAWINGS

The invention, together with objects and advantages thereof, may best be understood by reference to the following description of the presently preferred embodiments together with the accompanying drawings in which:

FIG. 6A is a cross-sectional view illustrating a manufacturing step of the first transistor, the third transistor, the sixth transistor, and the eighth transistor;

FIG. 6C is a cross-sectional view illustrating a step subsequent to the manufacturing step of the transistors shown in FIG. 6B;

FIG. 6E is a cross-sectional view illustrating a step subsequent to the manufacturing step of the transistors shown in FIG. 6D;

FIG. 6L is a cross-sectional view illustrating a step subsequent to the manufacturing step of the transistors shown in FIG. 6K;

FIG. 11A is a cross-sectional view illustrating a manufacturing step of the first transistor, the third transistor, a sixth transistor, and an eighth transistor;

FIG. 14B is a cross-sectional view illustrating a step subsequent to the manufacturing step of the transistors shown in FIG. 14A;

FIG. 36 is a circuit diagram of an operational amplifier according to a nineteenth embodiment;

DETAILED DESCRIPTION OF PREFERRED EMBODIMENTS

Embodiments of a differential circuit will now be described with reference to the drawings. Each of the embodiments described below presents a configuration and a method for embodying a technical idea by way of example. It is therefore not intended that material, shape, structure, arrangement, size, and the like of each component be limited to those described below. The following embodiments may be modified in various ways.

In the present specification, "a state where a member A is connected to a member B" includes a state that the member A and the member B are physically and directly connected, and a state that the member A and the member B are indirectly connected via another member which does not affect an electric connection state.

Similarly, "a state where a member C is provided between a member A and a member B" includes a state that the member A and the member C, or the member B and the member C are directly connected, and a state that the member A and the member C, or the member B and the member C are indirectly connected via another member which does not affect an electric connection state.

First Embodiment

Figure 1:
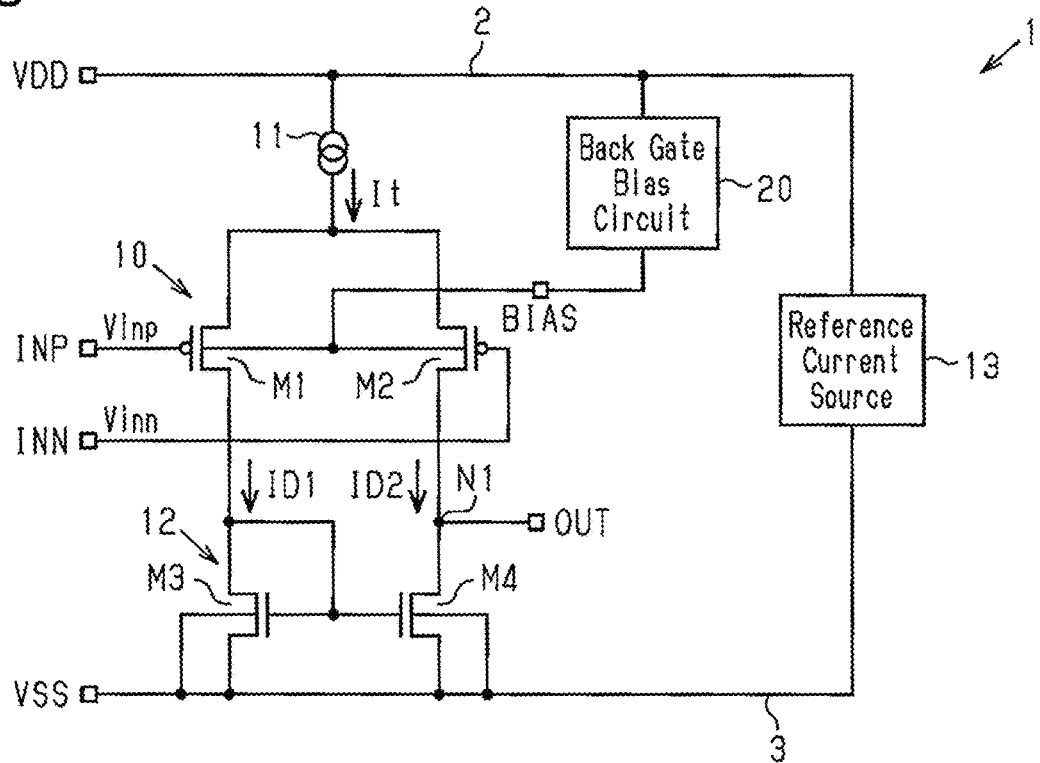
FIG. 1 is a circuit diagram of an operational amplifier including a differential circuit of a first embodiment.

As shown in FIG. 1, an operational amplifier 1 as an example of a differential circuit amplifies a potential difference between an inverting input terminal INN and a noninverting input terminal INP, and outputs an output signal Sout, which is a voltage signal, from an output terminal OUT. The operational amplifier 1 includes a differential pair 10, a constant current source 11, a current mirror circuit 12 as an active load, a reference current source 13, and a back gate bias circuit 20. The operational amplifier 1 is integrated on one semiconductor substrate.

The differential pair 10 includes a first transistor M1 and a second transistor M2 provided between a first power supply line 2 to which a first power supply voltage VDD is applied and a second power supply line 3 to which a second power supply voltage VSS is applied. The second power supply voltage VSS is different from the first power supply voltage VDD. According to the present embodiment, the second power supply voltage VSS is lower than the first power supply voltage VDD. The first transistor M1 and the second transistor M2 in the present embodiment are P-channel metal-oxide semiconductor field-effect transistors (MOSFETs). The first transistor M1 and the second transistor M2 may have either a depletion-type structure or an enhancement type structure. According to the present embodiment, each of the first transistor M1 and the second transistor M2 has an enhancement type structure. The gate of the first transistor M1 is connected to a noninverting input terminal INP, and the gate of the second transistor M2 is connected to an inverting input terminal INN. The source of the first transistor M1 and the source of the second transistor M2 are sources connected in common. The back gates of the first transistor M1 and the second transistor M2 are common gates. The back gates of the first transistor M1 and the second transistor M2 are connected to a bias terminal BIAS. The differential pair 10 generates differential currents ID1 and ID2 in accordance with input voltages Vinn and Vinp of the inverting input terminal INN and the noninverting input terminal INP.

The constant current source 11 is provided between the first power supply line 2 and the differential pair 10. The constant current source 11 is connected to the sources of the transistors M1 and M2. The constant current source 11 of the present embodiment includes a transistor. The transistor of the constant current source 11 is a P-channel MOSFET. The source of the transistor of the constant current source 11 is connected to the first power supply line 2 to receive the first power supply voltage VDD.

The current mirror circuit 12 includes a third transistor M3 and a fourth transistor M4 connected to the differential pair 10. The third transistor M3 and the fourth transistor M4 of the present embodiment are enhancement type N-channel MOSFETs. The sources of the third transistor M3 and the fourth transistor M4 are connected to the second power supply line 3 to receive the second power supply voltage VSS. The drain and the gate of the third transistor M3 are connected in common to the drain of the first transistor M1. The gate of the fourth transistor M4 is connected to the gate of the third transistor M3, while the drain of the fourth transistor M4 is connected to the drain of the second transistor M2. The back gates of the third transistor M3 and the fourth transistor M4 are connected to the second power supply line 3. The output terminal OUT is connected to a node N1 between the drain of the fourth transistor M4 and the drain of the second transistor M2.

The reference current source 13 supplies a current to the constant current source 11 to allow the constant current source 11 to generate a constant current It. The reference current source 13 includes a transistor. The transistor of the reference current source 13 is a P-channel MOSFET. The source of the transistor of the reference current source 13 is connected to the first power supply line 2, while the drain of the transistor is connected to the second power supply line 3. The gate of the transistor is connected to the gate of the transistor of the constant current source 11, and connected to a bias circuit (not shown). In this manner, the transistor of the reference current source 13 and the transistor of the constant current source 11 configure a current mirror circuit.

Figure 5A:
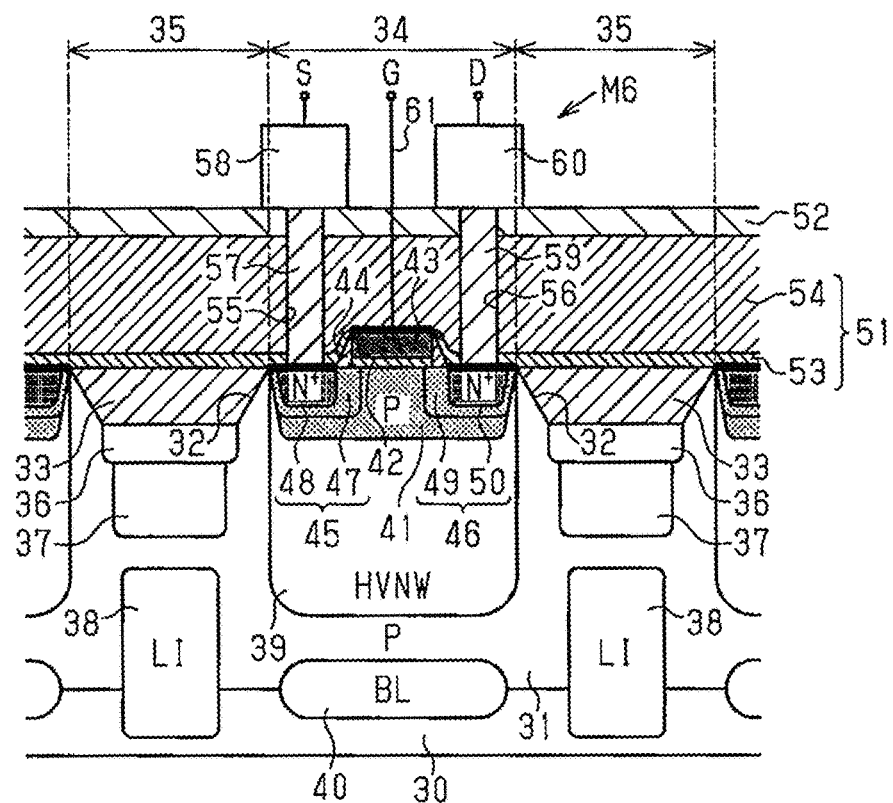
FIG. 5A is a cross-sectional view of a sixth transistor configuring the back gate bias circuit of the operational amplifier.
Figure 5B:
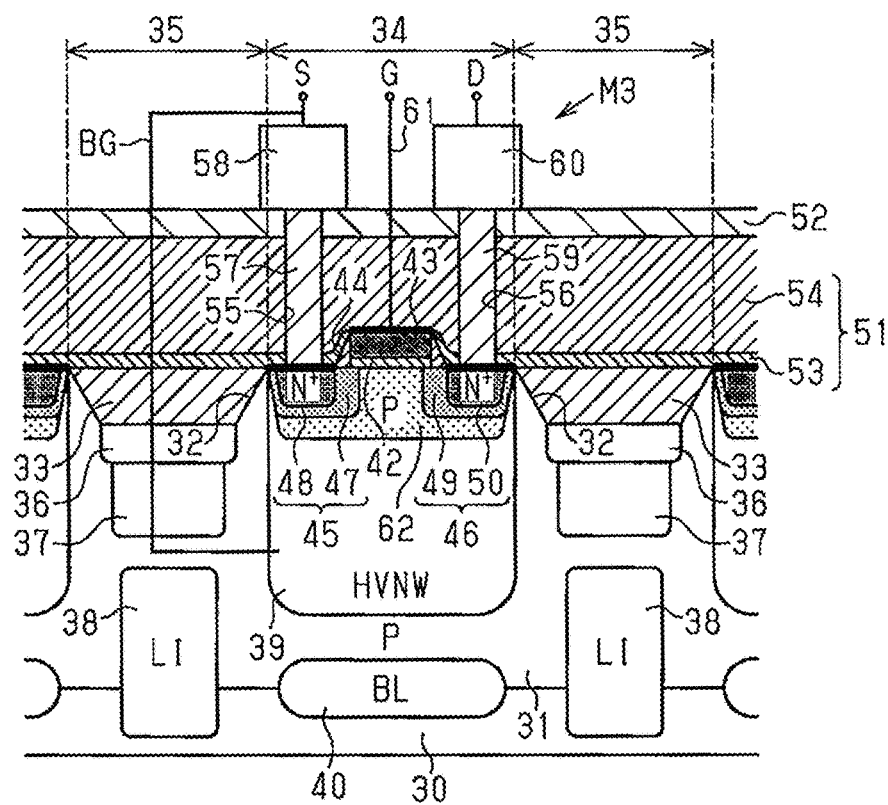
FIG. 5B is a cross-sectional view of a third transistor configuring an active load of the operational amplifier.
Figure 5C:
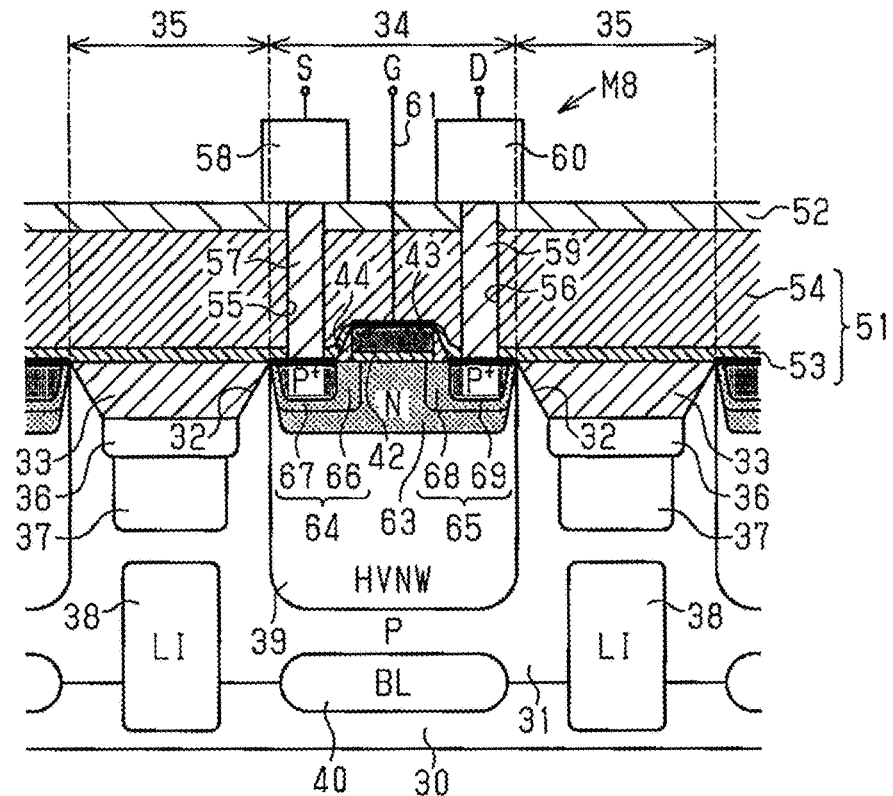
FIG. 5C is a cross-sectional view of an eighth transistor configuring the back gate bias circuit of the operational amplifier.
Figure 5D:
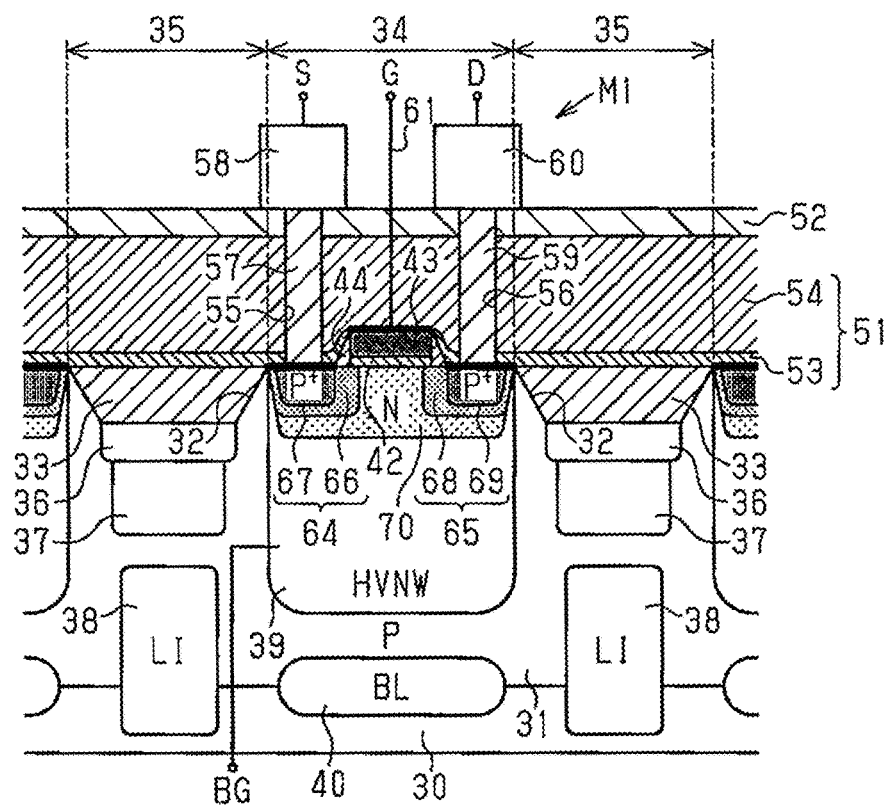
FIG. 5D is a cross-sectional view of a first transistor configuring the differential pair of the operational amplifier.

The back gate bias circuit 20 is connected to the bias terminal BIAS and the first power supply line 2, and applies a bias voltage VB to the back gates of the first transistor M1 and the second transistor M2, which are back gates of the first transistor M1 and the second transistor M2 (N-type well layer 39 in FIG. 5D). FIG. 5D illustrates a mode for applying the bias voltage VB to the back gate of the first transistor M1 in a simplified manner (BG in FIG. 5D). In reality, however, a contact area (not shown) for applying the bias voltage VB to the back gate of the first transistor M1 is provided in the N-type well layer 39.

Figure 2:
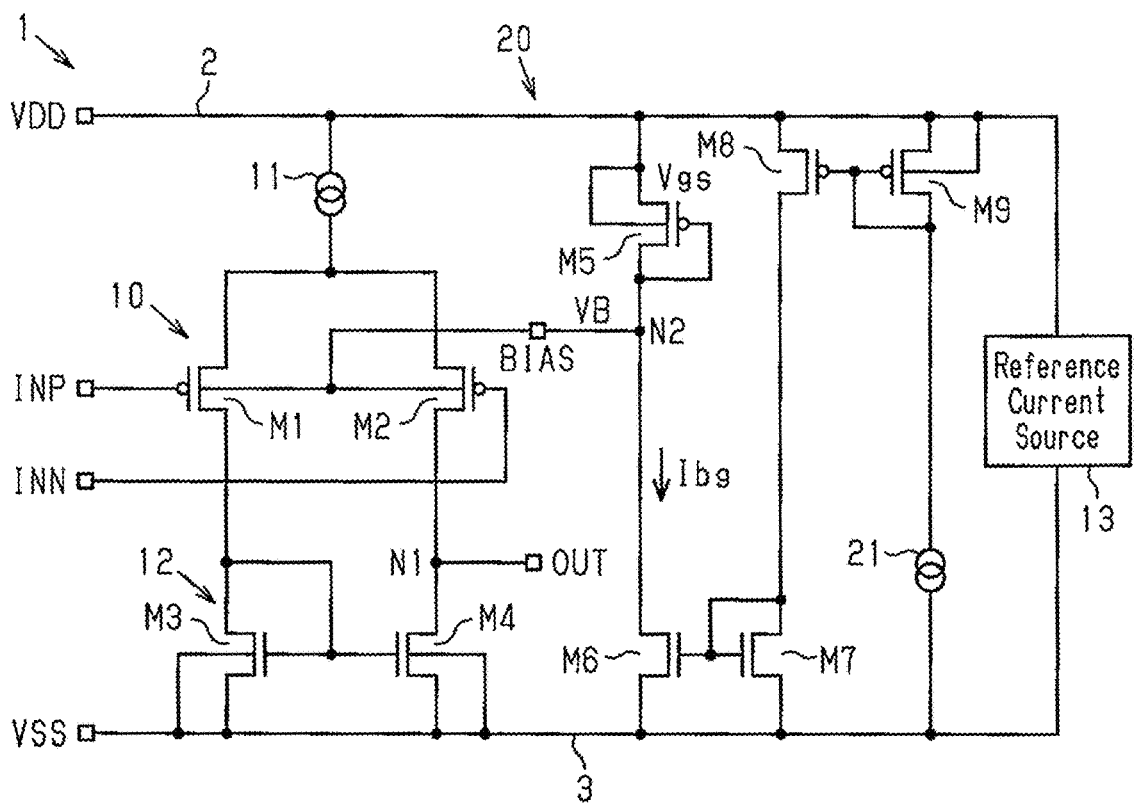
FIG. 2 is a circuit diagram of the operational amplifier showing an example of a back gate bias circuit of the operational amplifier.

FIG. 2 is a circuit diagram of the operational amplifier 1 showing an example of the back gate bias circuit 20. The back gate bias circuit 20 includes a fifth transistor M5, a sixth transistor M6, a seventh transistor M7, an eighth transistor M8, a ninth transistor M9, and a constant current source 21. The fifth transistor M5, the eighth transistor M8, and the ninth transistor M9 of the present embodiment are P-channel MOSFETs, while the sixth transistor M6 and the seventh transistor M7 are N-channel MOSFETs.

The fifth transistor M5 and the sixth transistor M6, the seventh transistor M7 and the eighth transistor M8, and the ninth transistor M9 and the constant current source 21 are connected in series between the first power supply line 2 and the second power supply line 3. The sixth transistor M6 and the seventh transistor M7 configure a current mirror circuit, while the eighth transistor M8 and the ninth transistor M9 configure a current mirror circuit.

More specifically, the source of the fifth transistor M5 is connected to the first power supply line 2, the drain of the fifth transistor M5 is connected to the drain of the sixth transistor M6, and the gate of the fifth transistor M5 is connected to the drain of the fifth transistor M5. A back gate of the fifth transistor M5 is connected to the source of the fifth transistor M5. The bias terminal BIAS is connected to a node N2 between the drain of the fifth transistor M5 and the drain of the sixth transistor M6. The source of the sixth transistor M6 is connected to the second power supply line 3, while the gate of the sixth transistor M6 is connected to the gate of the seventh transistor M7. The source of the seventh transistor M7 is connected to the second power supply line 3, while the gate of the seventh transistor M7 is connected to the drain of the seventh transistor M7. In this manner, the sixth transistor M6 and the seventh transistor M7 configure a current mirror circuit. The drain of the seventh transistor M7 is connected to the drain of the eighth transistor M8. The source of the eighth transistor M8 is connected to the first power supply line 2. The gate of the eighth transistor M8 is connected to the gate of the ninth transistor M9. The source of the ninth transistor M9 is connected to the first power supply line 2, the drain of the ninth transistor M9 is connected to the constant current source 21, and the gate of the ninth transistor M9 is connected to the drain of the ninth transistor M9. The back gate of the ninth transistor M9 is connected to the first power supply line 2.

The constant current source 21 includes a transistor. The transistor of the constant current source 21 is an N-channel MOSFET. The drain of the transistor of the constant current source 21 is connected to the drain of the ninth transistor M9, the source of the transistor is connected to the second power supply line 3, and the gate of the transistor is connected in common to the gate of the transistor of the reference current source 13. The transistor of the constant current source 21 and the transistor of the reference current source 13 configure a current mirror circuit.

In the back gate bias circuit 20, a voltage applied to the bias terminal BIAS, that is, a voltage (bias voltage VB) applied to the back gates of the first transistor M1 and the second transistor M2 is determined based on a voltage drop caused by the fifth transistor M5, that is, a difference (VDD−Vgs) between the first power supply voltage VDD and a gate-to-source voltage Vgs of the fifth transistor M5, and a current Ibg flowing through the sixth transistor M6.

According to the operational amplifier 1 thus configured, it is preferable that noise of the output signal Sout be small. The noise of the output signal Sout is determined based on an input referred noise voltage $Vn^2$ which is noise input to the operational amplifier 1.

The input referred noise voltage $Vn^2$ of the output signal Sout is expressed by following Equation 1.

$$\overline{Vn^2} = 2\left[\frac{8}{3}kT\frac{1}{gm_{12}}\left(1+\frac{gm_{34}}{gm_{12}}\right)+\frac{1}{Coxf}\left(\frac{Kp}{(WL)_{12}}+\frac{Kn}{(WL)_{34}}\frac{gm_{34}^2}{gm_{12}^2}\right)\right] \quad \text{[Equation 1]}$$

In this equation, gm12 is transconductance of the differential pair 10, that is, transconductance of the first transistor M1 and the second transistor M2, while gm34 is transconductance of an active load, that is, transconductance of the third transistor M3 and the fourth transistor M4. Further shown in the equation are Kp and Kn as noise parameter constants peculiar to processing, k as Boltzmann's constant, T as an absolute temperature, W as a channel width, L as a channel length, Cox as a capacitance of a gate oxide film, and f as a frequency.

The transconductance gm (gm12, gm34) is expressed by following Equation 2.

$$gm = \frac{\mu Cox}{2}\frac{W}{L}(Vgs-Vth) = \sqrt{2\mu Cox\frac{W}{L}ID} \quad \text{[Equation 2]}$$

Shown in above Equation 2 are Vgs as a gate-to-source voltage, Vth as a threshold voltage, μ as a mobility, and ID as a drain current flowing through a transistor. The mobility μ and the capacitance of oxide film Cox are peculiar to processing.

As can be seen from above Equation 1, at least one of an increase in at least one of the channel width W and the channel length L of each of the first transistor M1 to the fourth transistor M4, a decrease in the transconductance gm34, and an increase in the transconductance gm12 is necessary to reduce the input referred noise voltage $Vn^2$. Moreover, as can be seen from above Equation 2, at least one of an increase in the channel length L and a decrease in the channel width W is necessary to reduce the transconductance gm 34. In addition, at least one of an increase in the channel width W, a decrease in the channel length L, and an increase in the drain current ID is necessary to increase the transconductance gm12.

In case of the increase in the channel width W of each of the first transistor M1 and the second transistor M2, or the increase in the channel length L of each of the third transistor M3 and the fourth transistor M4, an element area increases. The increase in the element area may cause degradation of transistor characteristics, such as increase in parasitic capacitance. On the other hand, in case of the decrease in the channel length L of each of the first transistor M1 and the second transistor M2, or in case of the decrease in the channel width W of each of the third transistor M3 and the fourth transistor M4, a threshold voltage may be varied by short channel effect or narrow channel effect. In case of the increase in the drain current ID (Im1, Im2) of each of the first transistor M1 and the second transistor M2, current consumption of the operational amplifier 1 increases.

Under these circumstances, the inventors of the present application have conducted keen studies, and focused on a substrate bias effect of the first transistor M1 and the second transistor M2.

Generally, a threshold voltage VT of a transistor in consideration of a substrate bias effect is expressed by Equation 3.

$$VT = VFB + 2\phi b + \gamma\sqrt{2\phi b + VSB}$$ [Equation 3]

Shown in Equation 3 are VFB as a flat band voltage, φb as a work function, γ as a substrate bias coefficient, and VSB as a source-back gate voltage.

The drain current ID in consideration of a substrate bias effect is given by Equation 4.

$$ID = \frac{1}{2}\mu Cox\frac{W}{L}(Vgs - VTSB)^2$$ [Equation 4]

A result obtained by differentiating the drain current ID with the gate-to-source voltage Vgs is the transconductance gm of the transistor. Accordingly, a source-to-back gate conductance gmb is expressed as Equation 5 and Equation 6 based on Equation 3 and Equation 4.

$$gmb = \frac{\delta ID}{\delta Vgs}\frac{\delta VT}{\delta VSB}$$ [Equation 5]

$$\frac{\delta VT}{\delta VSB} = \frac{\gamma}{2\sqrt{2\phi b + VSB}},$$ [Equation 6]

The source-to-back gate conductance gmb represented by the transconductance gm is expressed as Equation 7.

$$gmb = gm\frac{\gamma}{2\sqrt{2\phi b + VSB}}$$ [Equation 7]

Generally, the drain current ID in consideration of the substrate bias effect is expressed as Equation 8.

$$ID = gmVgs + gmbVSB = gmVgs + gm\frac{\gamma}{2\sqrt{2\phi b + VSB}}VSB$$ [Equation 8]

As apparent from Equation 8, at the high source back gate voltage VSB, the substrate bias effect increases, and therefore the transconductance gm increases.

Figure 3:
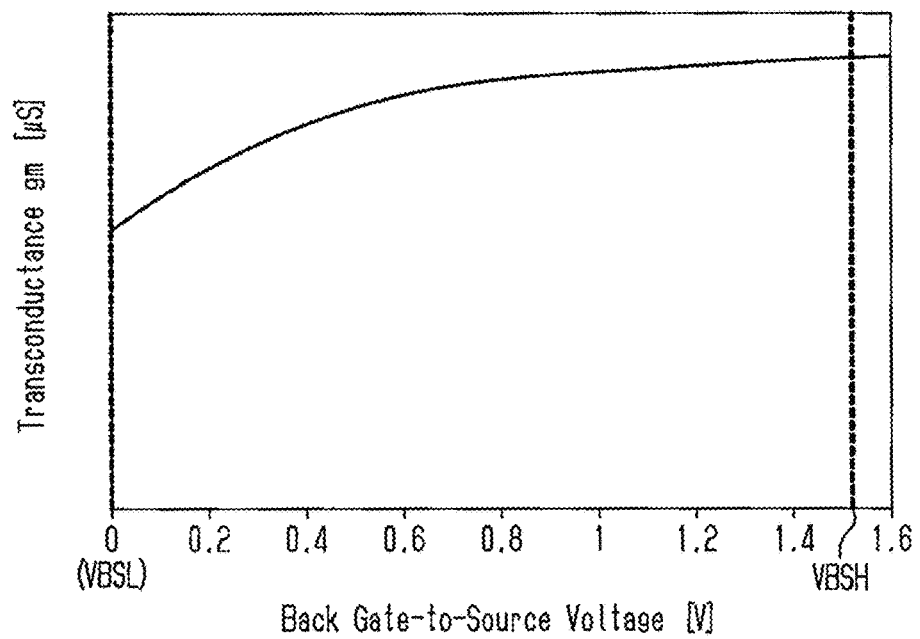
FIG. 3 is a graph showing the relationship between transconductance of a differential pair and back gate-to-source voltage of the differential pair.

FIG. 3 is a simulation result showing the relationship between the back gate-to-source voltage VBS and the transconductance gm12. As can be seen from FIG. 3, the transconductance gm12 decreases as the back gate-to-source voltage VBS approaches a back gate-to-source voltage (hereinafter simply referred to as "back gate-to-source voltage VBSL") generated when the back gates of the transistors M1 and M2 are connected to the sources of the first transistor M1 and the second transistor M2. On the other hand, the transconductance gm12 increases as the back gate-to-source voltage VBS approaches a back gate-to-source voltage (hereinafter simply referred to as "back gate-to-source voltage VBSH") generated when the back gates of the transistors M1 and M2 are connected to the first power supply voltage VDD. Even in a state that the back gate-to-source voltage VBS is higher than the back gate-to-source voltage VBSH, the transconductance gm12 increases as the back gate-to-source voltage VBS increases.

In this manner, for increasing the transconductance gm12, the back gate bias circuit 20 applies the bias voltage VB, which is closer to the first power supply voltage VDD than the source potentials of the first transistor M1 and the second transistor M2, to the back gates of the first transistor M1 and the second transistor M2. In other words, the back gate bias circuit 20 applies a bias voltage VB, which is closer to the first power supply voltage VDD than an intermediate voltage between the source potentials of the first transistor M1 and the second transistor M2 and the first power supply voltage VDD, to the back gates of the first transistor M1 and the second transistor M2. That is, the back gate bias circuit 20 applies, to the first transistor M1 and the second transistor M2, the bias voltage VB which increases the back gate-to-source voltage VBS. As a result, the back gate-to-source voltage VBS becomes a voltage around the back gate-to-source voltage VBSH. The bias voltage VB may be higher than the first power supply voltage VDD. In this case, it is preferable that the bias voltage VB be higher than the first power supply voltage VDD within a range where parasitic diodes of the first transistor M1 and the second transistor M2 are not turned on. It is therefore preferable that the bias voltage VB be lower than a voltage at which parasitic diodes of the first transistor M1 and the second transistor M2 are turned on. An example of the voltage at which the parasitic diodes of the first transistor M1 and the second transistor M2 are turned on is a voltage 0.5 V to 0.6 V higher than the first power supply voltage VDD (VDD+0.5 to 0.6). It is preferable that the bias voltage VB be a voltage within a predetermined range including the first power supply voltage VDD and excluding a voltage equal to the first power supply voltage VDD. More specifically, it is more preferable that the bias voltage VB be a voltage within ±20% of the first power supply voltage VDD and excluding a voltage equal to the first power supply voltage VDD. As a result, the back gate-to-source voltage VBS becomes a voltage within the range of ±20% of the back gate-to-source voltage VBSH and excluding the back gate-to-source voltage VBSH.

As shown in FIG. 3, when the back gate-to-source voltage VBSH is 1.5 V, it is preferable that the back gate-to-source voltage VBS be 1.2 V or higher and 1.8 V or lower (except 1.5 V). More preferably, the back gate-to-source voltage VBS is 1.4 V or higher and 1.6 V or lower (except for 1.5 V). According to the present embodiment, the back gate bias circuit 20 shown in FIG. 2 is connected to the first power supply line 2, wherefore the back gate-to-source voltage VBS is lower than the back gate-to-source voltage VBSH. According to the present embodiment, the back gate-to-source voltage VBS is 1.45 V.

Figure 4:
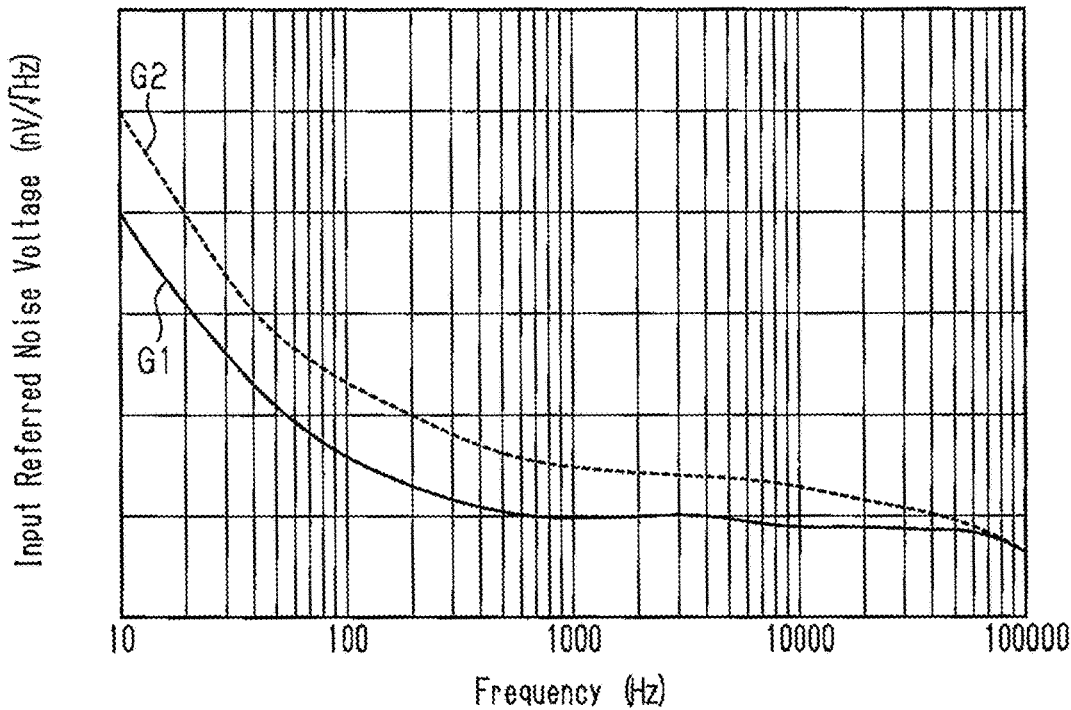
FIG. 4 is a graph showing the relationship between frequency and input referred noise voltage.

As a result, as shown in FIG. 4, input referred noise voltage caused by both 1/f noise and thermal noise becomes lower when the back gate-to-source voltage VBS of the present embodiment is closer to the first power supply voltage VDD (graph G1), than when the back gates of the first transistor M1 and the second transistor M2 are connected to the sources of the first transistor M1 and the second transistor M2 (graph G2).

Furthermore, according to the present embodiment, for further reducing the 1/f noise of the output signal Sout of the operational amplifier 1, an impurity concentration in a channel region of some transistors of the operational amplifier 1 is made lower than an impurity concentration in a channel region of the other transistors of the operational amplifier 1. That is, the plurality of transistors of the operational amplifier 1 include high concentration transistors whose impurity concentration in the channel region is a first concentration, and low concentration transistors whose impurity concentration in the channel region is a second concentration lower than the first concentration. More specifically, an impurity concentration in a channel region of a transistor easily affected by the 1/f noise of the output signal Sout among transistors of the operational amplifier 1 is made lower than an impurity concentration in a channel region of a transistor not easily affected by the 1/f noise of the output signal Sout among the transistors of the operational amplifier 1. That is, rather than a high concentration transistor, a low concentration transistor is used as a transistor more easily affected by the 1/f noise of the output signal Sout among the plurality of transistors. On the other hand, rather than a low concentration transistor, a high concentration transistor is used as a transistor not easily affected by the 1/f noise of the output signal Sout among the plurality of transistors. More specifically, according to the operational amplifier 1, the differential pair 10 and the current mirror circuit 12 are easily affected by the 1/f noise of the output signal Sout, while the constant current source 11, the reference current source 13, and the back gate bias circuit 20 are not easily affected by the 1/f noise of the output signal Sout.

According to the present embodiment, the impurity concentration in the channel region of each of the transistors of the differential pair 10 and the current mirror circuit 12 is made lower than the impurity concentration in the channel region of each of the transistors of the constant current source 11, the reference current source 13, and the back gate bias circuit 20. That is, the transistors configuring the differential pair 10 and the current mirror circuit 12 are low concentration transistors, while the transistors configuring the constant current source 11, the reference current source 13, and the back gate bias circuit 20 are high concentration transistors. Specifically, the impurity concentration in the channel region of each of the first transistor M1, the second transistor M2, the third transistor M3, and the fourth transistor M4 is made lower than the impurity concentration in the channel region of each of the transistor of the constant current source 11, the transistor of the reference current source 13, the fifth transistor M5, the sixth transistor M6, the seventh transistor M7, the eighth transistor M8, and the ninth transistor M9. That is, the transistors M1 to M4 are low concentration transistors, while the transistor of the constant current source 11, the transistor of the reference current source 13, and the transistors M5 to M9 are high concentration transistors.

The operational amplifier 1 includes the transistors M1 to M9 manufactured by a miniaturization technology of semiconductor processing, and therefore achieves a high degree of integration. Each of the transistors M1 to M9 has a shallow trench isolation (STI) structure as an element isolation structure.

As shown in FIG. 5A, the sixth transistor M6 which is an N-channel MOSFET is formed in a P-type epitaxial layer 31 grown on a P-type silicon substrate 30 as a semiconductor substrate. A shallow trench 32 for isolating the P-type epitaxial layer 31 into a plurality of regions is formed in a surface layer portion of the P-type epitaxial layer 31. A silicon oxide film 33 is embedded in the trench 32. A width of the trench 32 (silicon oxide film 33) is 0.22 μm, for example. An active region isolated by the trench 32 (STI) is further formed in the P-type epitaxial layer 31. The active region shown in FIG. 5A is an element formation region 34 where the sixth transistor M 6 is formed. On the other hand, a region corresponding to the trench 32 is an element isolation region 35. The element isolation region 35 includes a P-type well layer 36 and a P-type drift layer 37. The P-type well layer 36 is provided adjacent to a bottom of the trench 32. The P-type drift layer 37 is provided adjacent to the P-type well layer 36 on the silicon substrate 30 side with respect to the P-type well layer 36. This arrangement achieves more reliable element isolation. Further provided in the element isolation region 35 is a P-type embedded layer (LI) 38 on the silicon substrate 30 side with a clearance left from the P-type drift layer 37 in the depth direction. The P-type embedded layer 38 is formed at a boundary between the silicon substrate 30 and the P-type epitaxial layer 31.

The element formation region 34 has the deep N-type well layer 39 (HVNW) and an N-type embedded layer (BL) 40. The N-type well layer 39 is a high breakdown voltage well region, and is isolated by the element isolation region 35. The N-type embedded layer 40 is formed in the element formation region 34 on the silicon substrate 30 side with respect to the N-type well layer 39 with a clearance left in the depth direction. The N-type embedded layer 40 is formed at a boundary between the silicon substrate 30 and the P-type epitaxial layer 31.

The P-type well layer 41 is formed in the surface layer portion of the N-type well layer 39 and surrounded by the N-type well layer 39. The P-type well layer 41 is a region doped with a P-type impurity. For example, B (boron) or the like may be adopted as the P-type impurity. The P-type well layer 41 is a region doped with a P-type impurity such that the P-type impurity concentration becomes 1E+17 cm$^{-3}$ to 1E+18 cm$^{-3}$, for example.

A gate insulation film 42 is formed on a surface of the P-type well layer 41. The gate insulation film 42 is made of a silicon oxide film, for example. The thickness of the gate insulation film 42 ranges from 1 nm to 20 nm, for example.

A gate electrode 43 is formed on the gate insulation film 42. The gate electrode 43 is made of Si, Co, Hf, Zr, Al, Ti, Ta, Mo, or the like, or an alloy of these materials, for example. The thickness of the gate electrode 43 ranges from 50 nm to 250 nm, for example. A sidewall 44 surrounding a sidewall of the gate electrode 43 throughout the circumference of the gate electrode 43 is formed on the surface of the P-type well layer 41. The sidewall 44 is made of silicon oxide, silicon nitride, or a laminated structure of these materials, for example.

Formed in the P-type well layer 41 are an N-type source region 45 and an N-type drain region 46 on one side (left side in FIG. 5A) and the other side (right side in FIG. 5A), respectively, each including a region (channel region) facing the gate insulation film 42.

According to the present embodiment, the channel region of the sixth transistor M6 is disposed in the P-type well layer 41 below the gate insulation film 42 and between the source region 45 and the drain region 46. According to the present embodiment, the channel region of the sixth transistor M6 includes an interface between the P-type well layer 41 and the gate insulation film 42. The impurity concentration in the channel region of the sixth transistor M6 is equal to the impurity concentration of the P-type well layer 41.

The source region 45 has such a structure where low concentration and high concentration N-type impurities are dually diffused. The source region 45 includes an N$^-$-type low concentration source region 47 in which an N-type impurity is diffused at a low concentration, and an N$^+$-type high concentration source region 48 in which an N-type impurity is diffused at a high concentration.

The low concentration source region 47 is a region doped with an N-type impurity such that the N-type impurity concentration becomes $5E+17$ cm$^{-3}$ to $5E+18$ cm$^{-3}$, for example, extended in a depth direction from the surface of the P-type well layer 41, and formed such that a part of the low concentration source region 47 faces one side edge of the gate insulation film 42 in a width direction. The depth of the low concentration source region 47 ranges from 100 nm to 400 nm, for example.

The high concentration source region 48 is a region doped with an N-type impurity such that the N-type impurity concentration becomes $5E+19$ cm$^{-3}$ to $5E+20$ cm$^{-3}$, for example, extended in the depth direction from the surface of the P-type well layer 41, and formed in a self-aligned manner with respect to the sidewall 44. The depth of the high concentration source region 48 is 50 nm to 200 nm, for example.

The drain region 46 has such a structure where low concentration and high concentration N-type impurities are dually diffused. The drain region 46 has an N$^-$-type low concentration drain region 49 in which an N-type impurity is diffused at a low concentration, and an N$^+$-type high concentration drain region 50 in which an N-type impurity is diffused at a high concentration.

The low concentration drain region 49 is a region doped with an N-type impurity such that the N-type impurity concentration becomes $5E+17$ cm$^{-3}$ to $5E+18$ cm$^{-3}$, for example, extended in a depth direction from the surface of the P-type well layer 41, and formed such that a part of the low concentration drain region 49 faces the other side edge of the gate insulation film 42 in a width direction. The depth of the low concentration drain region 49 is equal to the depth of the low concentration source region 47, for example.

The high concentration drain region 50 is a region doped with an N-type impurity such that the N-type impurity concentration becomes $5E+19$ cm$^{-3}$ to $5E+20$ cm$^{-3}$, for example, extended in the depth direction from the surface of the P-type well layer 41, and formed in a self-aligned manner with respect to the sidewall 44. The depth of the high concentration drain region 50 is equal to the depth of the high concentration source region 48.

A first insulating layer 51 and a second insulating layer 52 as insulation films are laminated on the silicon substrate 30 in this order.

The first insulating layer 51 includes a film 53 formed on a surface of the P-type epitaxial layer 31 and a side surface of the sidewall 44, and a first interlayer insulation film 54 formed on the film 53. The film 53 is made of silicon nitride (SiN), for example. The first interlayer insulation film 54 is made of, silicon oxide (SiO$_2$), for example. The thickness of the film 53 ranges from 10 nm to 100 nm, for example, while the thickness of the first interlayer insulation film 54 ranges 300 nm to 500 nm, for example.

The second insulating layer 52 is a single layer film made of silicon oxide (SiO$_2$). The thickness of the second insulating layer 52 ranges 100 nm to 300 nm, for example.

A source contact hole 55 and a drain contact hole 56 continuously penetrate the first insulating layer 51 and the second insulating layer 52 in portions facing the source region 45 and the drain region 46.

A source contact plug 57 is embedded in the source contact hole 55. The source contact plug 57 has a laminated structure of W/TiN/Ti, and is in contact with the source region 45. A source wiring 58 having a laminated structure of Al/TiN/Ti and integrated with the source contact plug 57 is formed on the second insulating layer 52.

A drain contact plug 59 is embedded in the drain contact hole 56. The drain contact plug 59 has a laminated structure of W/TiN/Ti, and is in contact with the drain region 46. A drain wiring 60 having a laminated structure of Al/TiN/Ti and integrated with the drain contact plug 59 is formed on the second insulating layer 52. Furthermore, a gate wiring 61 is connected to the gate electrode 43. The seventh transistor M7 has a configuration similar to the configuration of the sixth transistor M6.

As shown in FIG. 5B, the third transistor M3, which is an N-channel MOSFET, is formed on the surface layer portion of the P-type epitaxial layer 31 similarly to the sixth transistor M6. The active region isolated by the trench 32 (STI) in the P-type epitaxial layer 31 shown in FIG. 5B is the element formation region 34 where the third transistor M3 is formed. The third transistor M3 has a structure identical to the structure of the sixth transistor M6 except that the back gate of the third transistor M3 is connected to the source of the third transistor M3, and that the impurity concentration of a P-type well layer 62 is different. A contact region (not shown) for applying a voltage to the back gate is formed on the N-type well layer 39 of the third transistor M3.

The P-type well layer 62 of the third transistor M3 is formed in the P-type epitaxial layer 31 in the element formation region 34 where the third transistor M3 is formed. The depth and width of the P-type well layer 62 are substantially equal to the depth and width of the P-type well layer 41 of the sixth transistor M6. On the other hand, the P-type impurity concentration of the P-type well layer 62 is lower than the P-type impurity concentration of the P-type well layer 41 of the sixth transistor M6. Specifically, the P-type impurity concentration of the P-type well layer 41 of the sixth transistor M6 is a P-type impurity concentration based on a scaling rule (proportional reduction rule). The P-type impurity concentration of the P-type well layer 62 of the third transistor M3 is lower than the P-type impurity concentration based on the scaling rule. It is preferable that the P-type impurity concentration of the P-type well layer 62 be the lowest possible concentration within a range in which element characteristics do not excessively deviate by a drop of the P-type impurity concentration. For example, the P-type impurity concentration of the P-type well layer 62 is about ½ or lower of the P-type impurity concentration of the P-type well layer 41 of the sixth transistor M6. It is preferable that the P-type impurity concentration of the P-type well layer 62 be about 1/10 of the P-type impurity concentration of the P-type well layer 41 of the sixth transistor M6. The P-type impurity concentration of the P-type well layer 62 in the present embodiment ranges from $1E+16$ cm$^{-3}$ to $1E+17$ cm$^{-3}$.

According to the present embodiment, the channel region of the third transistor M3 is disposed in the P-type well layer 62 below the gate insulation film 42 and between the source region 45 and the drain region 46. According to the present embodiment, the channel region of the third transistor M3 includes an interface between the P-type well layer 62 and the gate insulation film 42. The impurity concentration in the channel region of the third transistor M3 is equal to the impurity concentration of the P-type well layer 62. The fourth transistor M4 has a configuration similar to the configuration of the third transistor M3.

As shown in FIG. 5C, the eighth transistor M8, which is an P-channel MOSFET, is formed on the surface layer portion of the P-type epitaxial layer 31 similarly to the sixth transistor M6. The active region isolated by the trench 32 (STI) in the P-type epitaxial layer 31 shown in FIG. 5C is the element formation region 34 where the eighth transistor M8 is formed.

An N-type well layer 63 is provided in the element formation region 34. The N-type well layer 63 is formed in the surface layer portion of the N-type well layer 39 and surrounded by the N-type well layer 39. The N-type well layer 63 is a region doped with an N-type impurity. P (phosphorus) or the like can be adopted as the N-type impurity, for example. The N-type well layer 63 is a region doped with an N-type impurity such that the N-type impurity concentration becomes $1E+17$ $cm^{-3}$ to $1E+18$ $cm^{-3}$, for example.

Similarly to the sixth transistor M6, the gate insulation film 42 is formed on the surface of the N-type well layer 63, and the gate electrode 43 is formed on the gate insulation film 42. The materials and thicknesses of the gate insulation film 42 and the gate electrode 43 are equal to the materials and thicknesses of the gate insulation film 42 and the gate electrode 43 of the sixth transistor M6. The sidewall 44 surrounding the sidewall of the gate electrode 43 throughout the circumference of the gate electrode 43 is formed on the surface of the P-type well layer 63. The sidewall 44 is made of silicon oxide, for example.

Formed in the N-type well layer 63 are a P-type source region 64 and a P-type drain region 65 on one side (left side in FIG. 5C) and the other side (right side in FIG. 5C), respectively, each including a region (channel region) facing the gate insulation film 42.

According to the present embodiment, the channel region of the eighth transistor M8 is disposed in the N-type well layer 63 below the gate insulation film 42 and between the source region 64 and the drain region 65. According to the present embodiment, the channel region of the eighth transistor M8 includes an interface between the N-type well layer 63 and the gate insulation film 42. The impurity concentration in the channel region of the eighth transistor M8 is equal to the impurity concentration of the N-type well layer 63.

The source region 64 has such a structure where low concentration and high concentration P-type impurities are dually diffused. The source region 64 has an $P^-$-type low concentration source region 66 in which an P-type impurity is diffused at a low concentration, and an $P^+$-type high concentration source region 67 in which an P-type impurity is diffused at a high concentration.

The low concentration source region 66 is a region doped with a P-type impurity such that the P-type impurity concentration becomes $5E+17$ $cm^{-3}$ to $5E+18$ $cm^{-3}$, for example, extended in a depth direction from the surface of the N-type well layer 63, and formed such that a part of the low concentration source region 66 faces one side edge of the gate insulation film 42 in a width direction. The depth of the low concentration source region 66 ranges from 50 nm to 300 nm, for example.

The high concentration source region 67 is a region doped with a P-type impurity such that the P-type impurity concentration becomes $1E+19$ $cm^{-3}$ to $1E+20$ $cm^{-3}$, for example, extended in the depth direction from the surface of the N-type well layer 63, and formed in a self-aligned manner with respect to the sidewall 44. The depth of the high concentration source region 67 ranges 50 nm to 150 nm, for example.

The drain region 65 has such a structure where low concentration and high concentration P-type impurities are dually diffused. The drain region 65 has a $P^-$-type low concentration drain region 68 in which a P-type impurity is diffused at a low concentration, and a $P^+$-type high concentration drain region 69 in which a P-type impurity is diffused at a high concentration.

The low concentration drain region 68 is a region doped with a P-type impurity such that the P-type impurity concentration becomes $5E+17$ $cm^{-3}$ to $5E+18$ $cm^{-3}$, for example, extended in a depth direction from the surface of the N-type well layer 63, and formed such that a part of the low concentration drain region 68 faces the other side edge of the gate insulation film 42 in a width direction. The depth of the low concentration drain region 68 is equal to the depth of the low concentration source region 66, for example.

The high concentration drain region 69 is a region doped with a P-type impurity such that the P-type impurity concentration becomes $1E+19$ $cm^{-3}$ to $1E+20$ $cm^{-3}$, for example, extended in the depth direction from the surface of the N-type well layer 63, and formed in a self-aligned manner with respect to the sidewall 44. The depth of the high concentration drain region 69 is equal to the depth of the high concentration source region 67.

The first insulating layer 51 and the second insulating layer 52 as insulation films are laminated on the P-type epitaxial layer 31 in this order. The source contact hole 55 and the drain contact hole 56 are formed in the first insulating layer 51 and the second insulating layer 52, respectively. The source contact plug 57 and the drain contact plug 59 are embedded in the source contact hole 55 and the drain contact hole 56, respectively. The first insulating layer 51, the second insulating layer 52, the source contact hole 55, the drain contact hole 56, the source contact plug 57, and the drain contact plug 59 of the eighth transistor M8 have the same structures as the structures of the first insulating layer 51, the second insulating layer 52, the source contact hole 55, the drain contact hole 56, the source contact plug 57, and the drain contact plug 59 of the sixth transistor M6. The MOS transistor of the constant current source 11, the fifth transistor M5, and the ninth transistor M9 each have a structure similar to the structure of the eighth transistor M8. However, the ninth transistor M9 is different in that the back gate of the ninth transistor M9 is connected to the source (first power supply line 2) of the ninth transistor M9, and that the contact region for applying a voltage to the back gate is provided in the N-type well layer 39.

As shown in FIG. 5D, the first transistor M1, which is a P-channel MOSFET, is formed on the surface layer portion of the P-type epitaxial layer 31 similarly to the eighth transistor M8. The first transistor M1 has a structure identical to the structure of the eighth transistor M8 except that the back gate of the first transistor M1 is connected to the back gate bias circuit 20 via the bias terminal BIAS, and that the impurity concentration of an N-type well layer 70 is different. A contact region (not shown) for applying the bias voltage VB of the back gate bias circuit 20 is provided in the N-type well layer 39.

The N-type well layer 70 of the first transistor M1 is formed in the P-type epitaxial layer 31 in the element formation region 34 where the first transistor M1 is formed. The depth and width of the N-type well layer 70 are substantially equal to the depth and width of the N-type well layer 63 of the eighth transistor M8. On the other hand, the N-type impurity concentration of the N-type well layer 70 is lower than the N-type impurity concentration of the N-type well layer 63 of the eighth transistor M8. Specifically, the N-type impurity concentration of the N-type well layer 63 of the eighth transistor M8 is an N-type impurity concentration based on a scaling rule (proportional reduction rule). The N-type impurity concentration of the N-type well layer 70 of the first transistor M1 is lower than the N-type impurity concentration based on the scaling rule. It is preferable that the N-type impurity concentration of the N-type well layer 70 be the lowest possible concentration within a range in which element characteristics do not excessively deviate by a drop of the N-type impurity concentration. For example, the range in which element characteristics do not excessively deviate is a concentration higher than an upper limit of the N-type impurity concentration at which a function of the current mirror circuit 12 does not hold due to deviation of a threshold voltage. For example, the N-type impurity concentration of the N-type well layer 70 is about ½ or lower of the N-type impurity concentration of the N-type well layer 63 of the eighth transistor M8. The N-type impurity concentration of the N-type well layer 70 is preferably about ⅒ of the N-type impurity concentration of the N-type well layer 63 of the eighth transistor M8. The P-type impurity concentration of the N-type well layer 70 in the present embodiment ranges from 1E+16 cm$^{-3}$ to 1E+17 cm$^{-3}$.

According to the present embodiment, the channel region of the first transistor M1 is disposed in the N-type well layer 70 below the gate insulation film 42 and between the source region 64 and the drain region 65. According to the present embodiment, the channel region of the first transistor M1 includes an interface between the N-type well layer 70 and the gate insulation film 42. The impurity concentration in the channel region of the first transistor M1 is equal to the impurity concentration of the N-type well layer 70. The second transistor M2 has a structure identical to the structure of the first transistor M1.

[Method for Manufacturing Transistor]

A method for manufacturing the first transistor M1, the third transistor M3, the sixth transistor M6, and the eighth transistor M8 will be described with reference to FIGS. 6A to 6M. In FIGS. 6A to 6M, it is assumed that the first transistor M1, the third transistor M3, the sixth transistor M6, and the eighth transistor M8 are formed adjacently to each other for convenience of explanation.

Figure 6B:
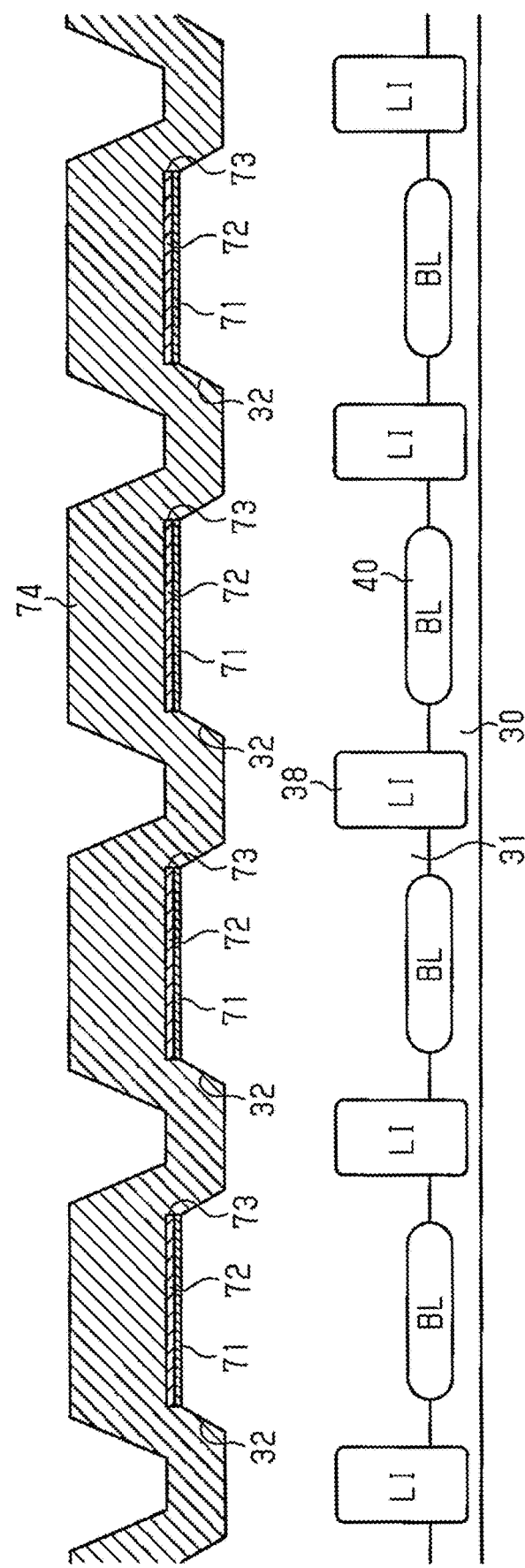
FIG. 6B is a cross-sectional view illustrating a step subsequent to the manufacturing step of the transistors shown in FIG. 6A.
Figure 6D:
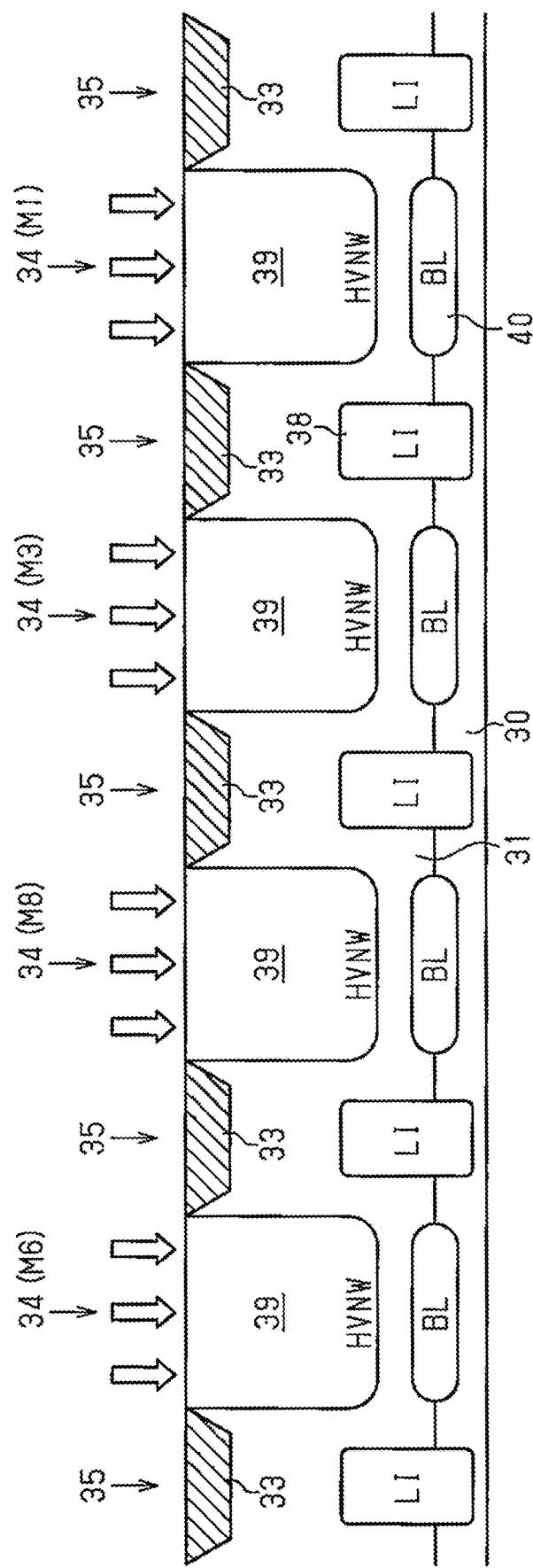
FIG. 6D is a cross-sectional view illustrating a step subsequent to the manufacturing step of the transistors shown in FIG. 6C.
Figure 6F:
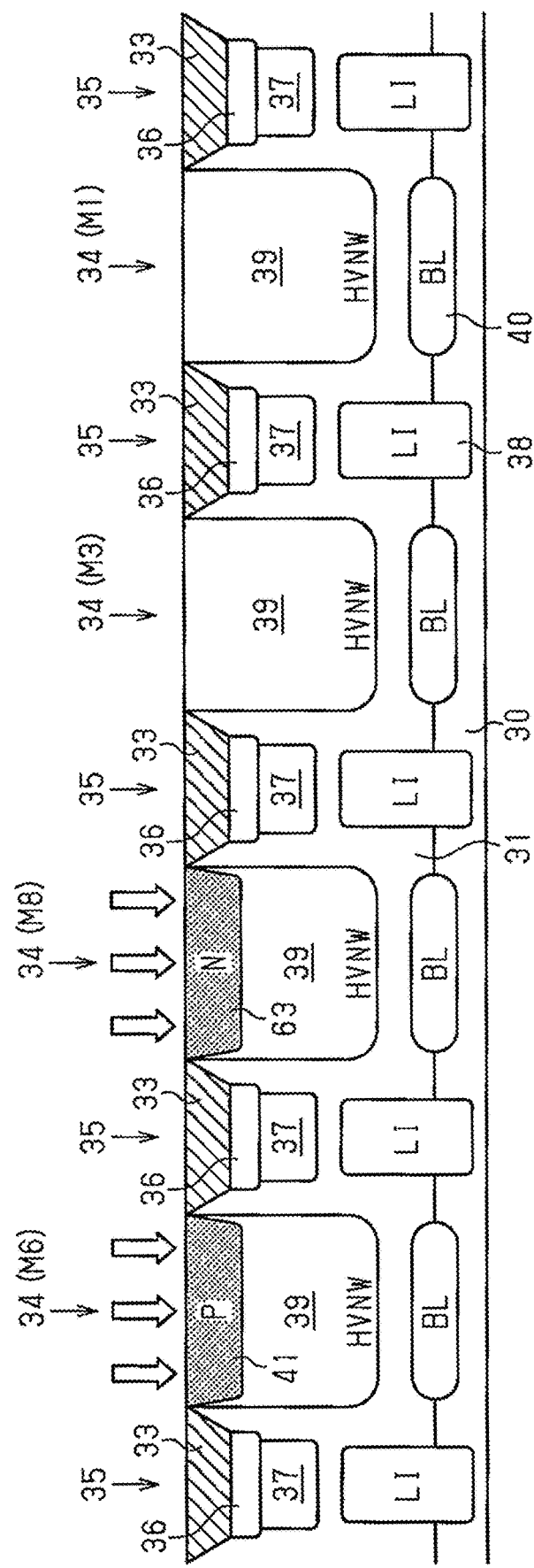
FIG. 6F is a cross-sectional view illustrating a step subsequent to the manufacturing step of the transistors shown in FIG. 6E.
Figure 6G:
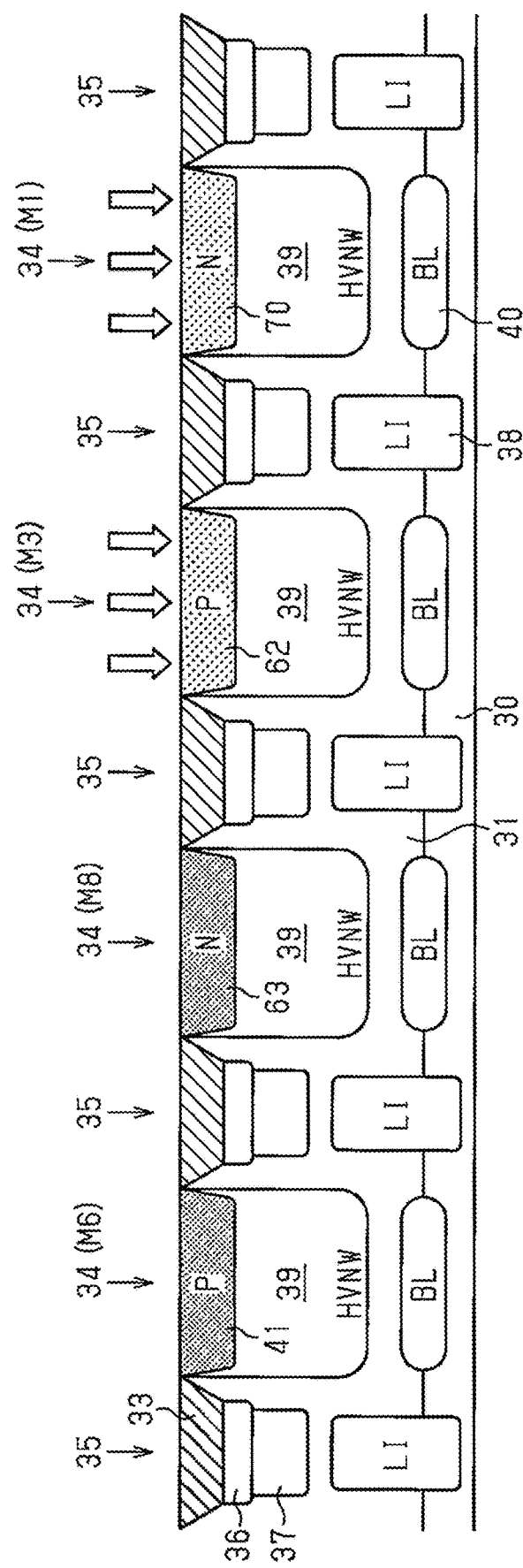
FIG. 6G is a cross-sectional view illustrating a step subsequent to the manufacturing step of the transistors shown in FIG. 6F.
Figure 6H:
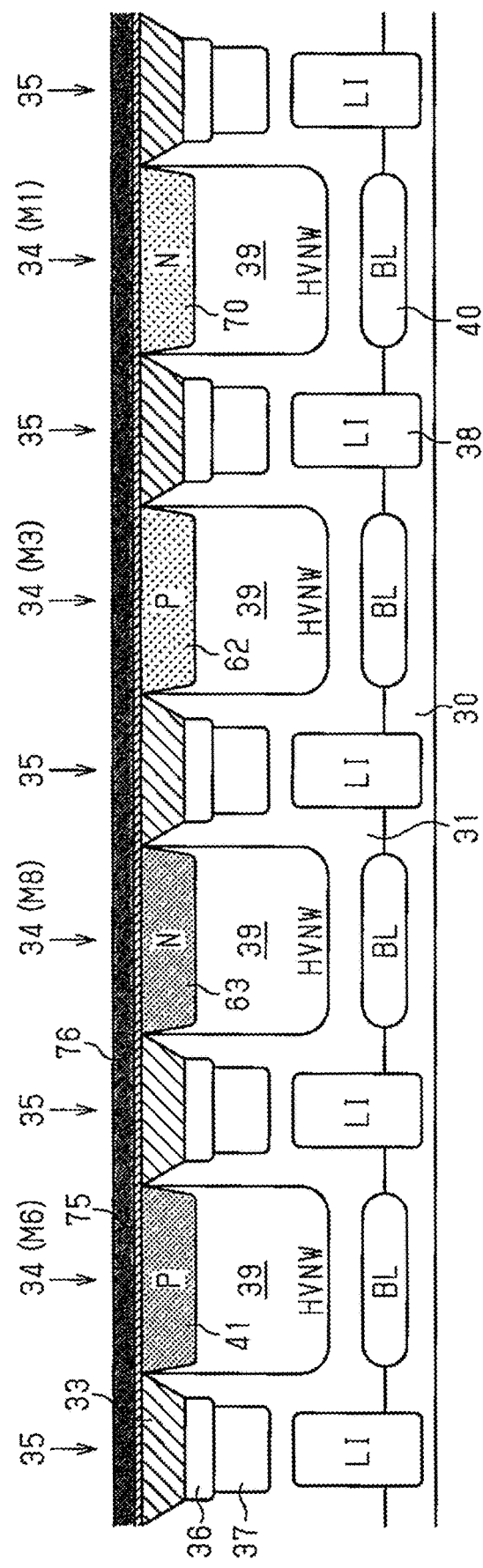
FIG. 6H is a cross-sectional view illustrating a step subsequent to the manufacturing step of the transistors shown in FIG. 6G.
Figure 6I:
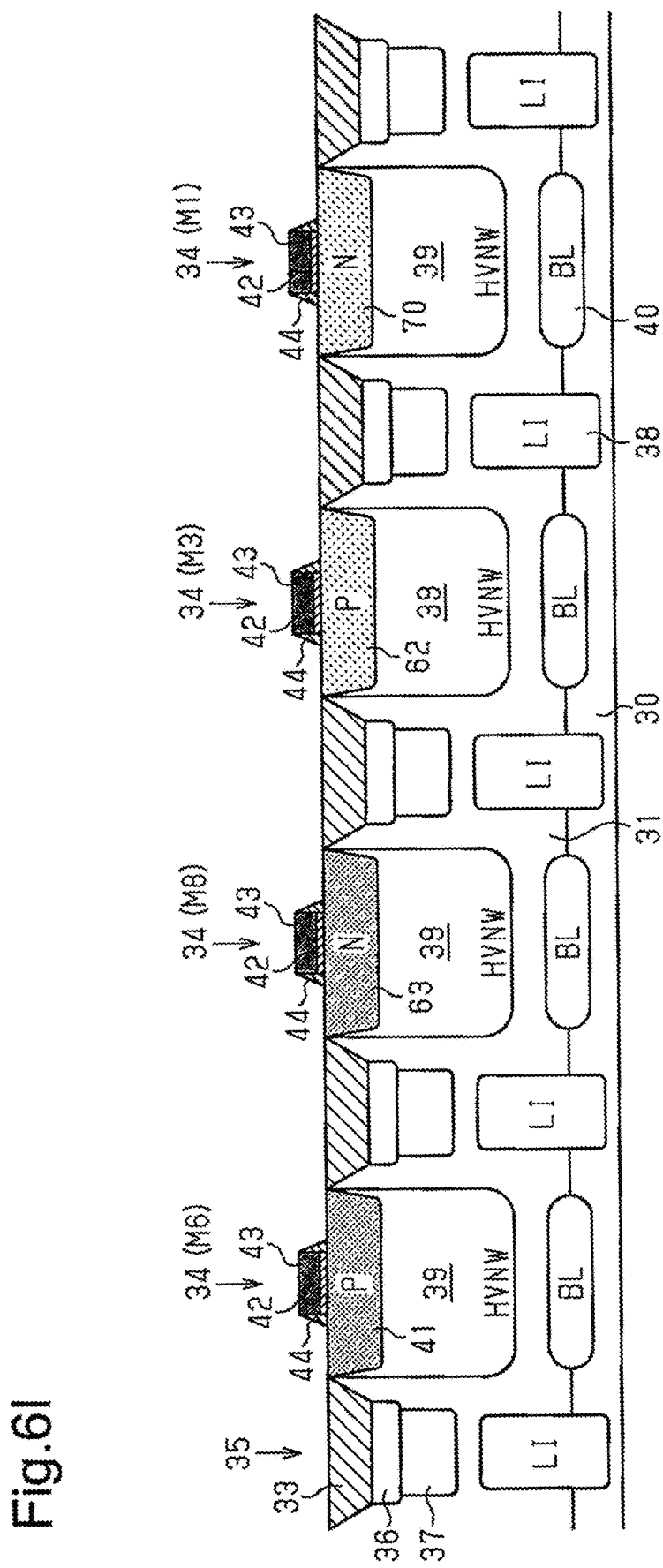
FIG. 6I is a cross-sectional view illustrating a step subsequent to the manufacturing step of the transistors shown in FIG. 6H.
Figure 6J:
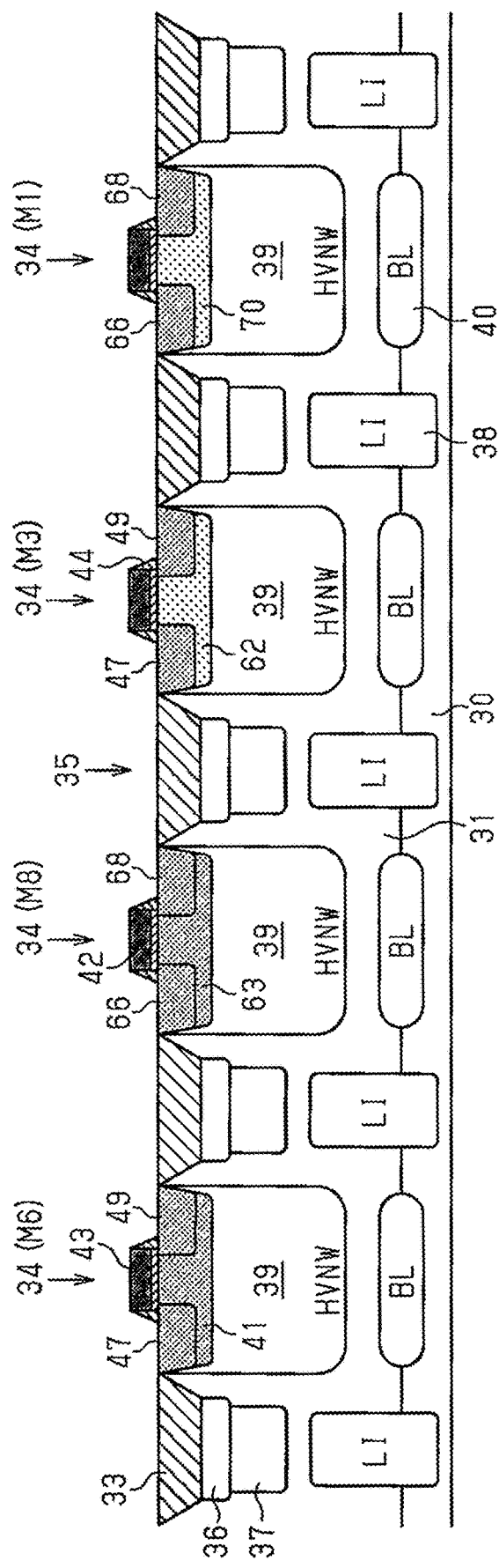
FIG. 6J is a cross-sectional view illustrating a step subsequent to the manufacturing step of the transistors shown in FIG. 6I.
Figure 6K:
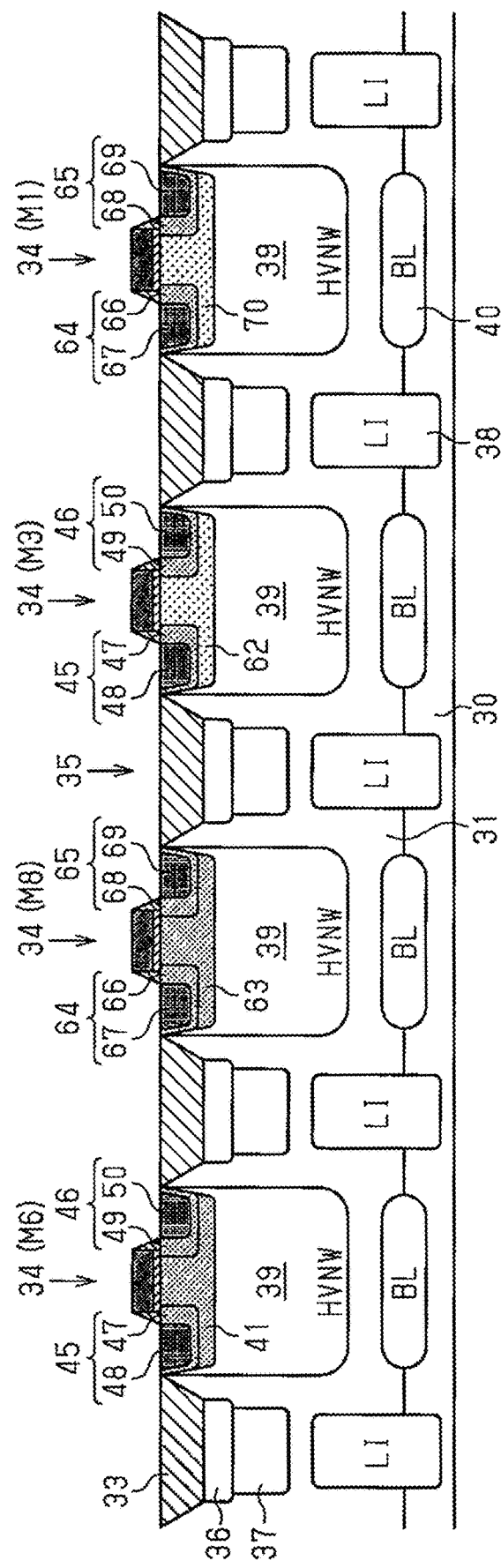
FIG. 6K is a cross-sectional view illustrating a step subsequent to the manufacturing step of the transistors shown in FIG. 6J.
Figure 6M:
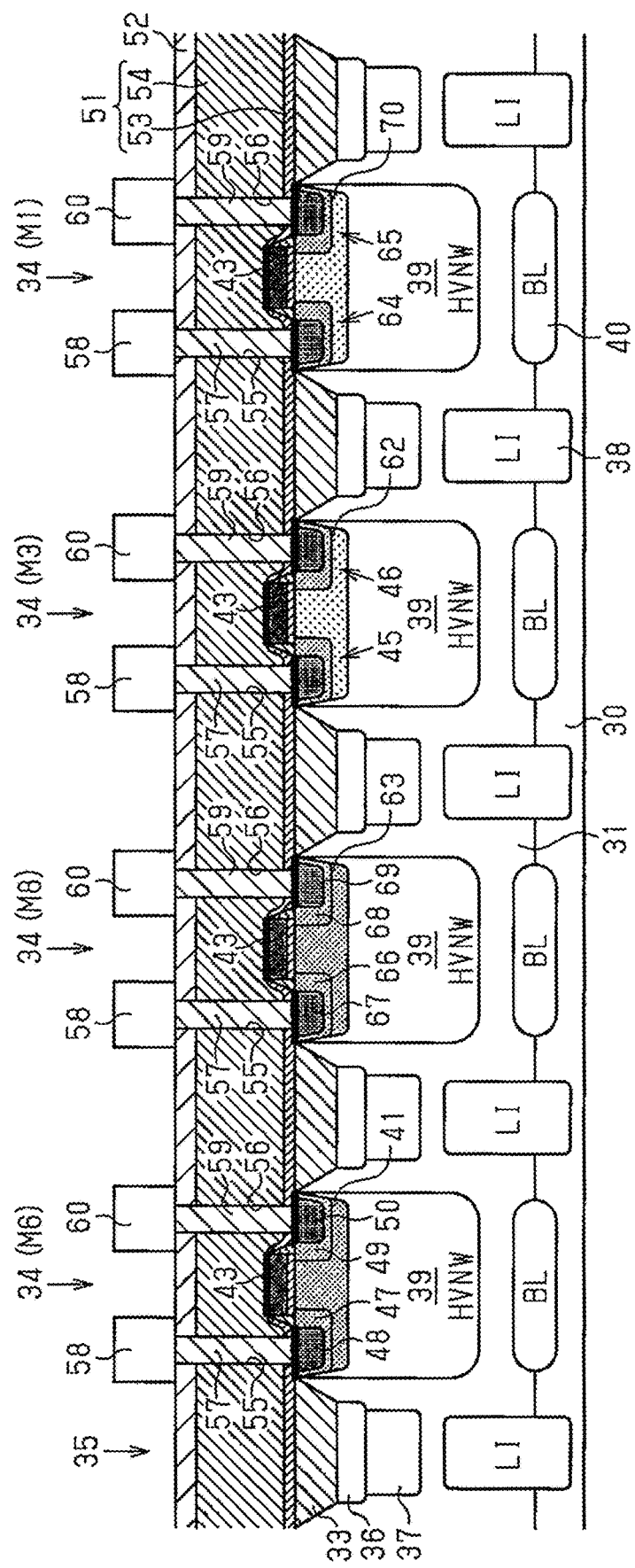
FIG. 6M is a cross-sectional view illustrating a step subsequent to the manufacturing step of the transistors shown in FIG. 6L.

The method for manufacturing these transistors includes an epitaxial layer formation step (FIG. 6A), an isolation formation step (FIGS. 6B and 6C), a well formation step (FIGS. 6D to 6G), a gate formation step (FIGS. 6H and 6I), a source/drain formation step (FIGS. 6J to 6L), and a wiring step (FIG. 6M).

As shown in FIG. 6A, a P-type silicon substrate 30 is prepared, and a thermal oxide film 71 is formed on a surface of the silicon substrate 30 by a thermal oxidation method, for example. Next, ion implantation for the N-type embedded layer 40 is performed for the surface of the silicon substrate 30. For example, arsenic ions are implanted as the N-type impurity ions. Thereafter, a drive treatment (thermal treatment) for activating the implanted ions is executed. Next, ion implantation for a P-type embedded layer 38 is performed. For example, boron is implanted as the P-type impurity ions.

Subsequently, the P-type epitaxial layer 31 is grown on the silicon substrate 30. Specifically, a silicon crystal is epitaxially grown with addition of P-type impurities (e.g., boron). The thickness of the P-type epitaxial layer 31 is about 5 μm, for example. With heat generated during epitaxial growth, N-type impurities and P-type impurities implanted into the silicon substrate 30 are diffused into the silicon substrate 30 and the P-type epitaxial layer 31. As a result, the P-type embedded layer 38 and the N-type embedded layer 40 are formed at the boundary between the silicon substrate 30 and the P-type epitaxial layer 31.

As shown in FIG. 6B, a nitride film 72 is formed to cover an entire region of the thermal oxide film 71 by a chemical vapor deposition (CVD) method, for example. An opening 73 through which a formation region of the trench 32 is exposed is selectively formed in the nitride film 72 and the thermal oxide film 71 by photolithography and etching, for example. Next, an unnecessary portion of the P-type epitaxial layer 31 is removed by etching using the nitride film 72 and the thermal oxide film 71 as masks to form the trench 32. Subsequently, a thin liner oxide film (not shown) is formed on a side surface and a bottom surface of the trench 32 by using a thermal oxidation method, for example. Then, an insulation film 74 (silicon oxide film) made of silicon oxide is formed by filling the trench 32 and covering the entire region of the nitride film 72 using the CVD method, for example.

Next, as shown in FIG. 6C, the silicon oxide film 33 functioning as an insulator is embedded in the trench 32. As a result, the element isolation region 35 is formed to section the element formation region 34 into the first transistor M1, the third transistor M3, the sixth transistor M6, and the eighth transistor M8. Then, the nitride film 72 and the thermal oxide film 71 are sequentially removed by etching.

As shown in FIG. 6D, the high breakdown voltage N-type well layer 39 is formed in each of the element formation regions 34 for forming the first transistor M1, the third transistor M3, the sixth transistor M6, and the eighth transistor M8. Specifically, N-type impurity ions are implanted into each of the element formation regions 34.

As shown in FIG. 6E, a P-type drift layer 37 is formed in each of the element isolation regions 35. Specifically, P-type impurity ions are implanted into each of the element isolation regions 35. For example, boron ions are adopted as the P-type impurity ions. Thereafter, an annealing treatment is performed as a heat treatment to activate the implanted N-type impurity ions and P-type impurity ions.

As shown in FIG. 6F, the P-type well layer 41 is formed in the surface layer portion of the N-type well layer 39 in the element formation region 34 corresponding to the sixth transistor M6, while the N-type well layer 63 is formed in the surface layer portion in the element formation region 34 corresponding to the eighth transistor M8. More specifically, an ion implantation mask (not shown) having an opening through which the element formation region 34 of the sixth transistor M6 is exposed is formed in such a manner as to cover the element formation region 34 and the element isolation region 35 of each of the first transistor M1, the third transistor M3, and the eighth transistor M8. P-type impurity ions are implanted through the opening of the ion implantation mask. More specifically, impurity ions are implanted into the region where the sixth transistor M6 is formed in the silicon substrate 30 which is a semiconductor substrate, while ions are selectively implanted such that impurity ions are not implanted into the regions where the first transistor M1, the third transistor M3, and the eighth transistor M8 are formed to form a channel region in the region where the sixth transistor M6 is formed. For example, boron ions are adopted as the P-type impurity ions. Subsequently, an ion implantation mask (not shown) having an opening through which the element formation region 34 of the eighth transistor M8 is exposed is formed in such a manner as to cover the element formation region 34 and the element isolation region 35 of each of the first transistor M1, the third transistor M3, and the sixth transistor M6. N-type impurity ions are implanted through the opening of the ion implantation mask. More specifically, impurity ions are implanted into the region where the eighth transistor M8 is formed in the silicon substrate 30, while ions are selectively implanted such that impurity ions are not implanted into the regions where the first transistor M1, the third transistor M3, and the sixth transistor M6 are formed to form a channel region in the region where the eighth transistor M8 is formed. For example, arsenic ions and phosphorus ions are used as the N-type impurity ions. In the present embodiment, the N-type well layer 63 of the eighth transistor M8 is formed after the P-type well layer 41 of the sixth transistor M6 is formed. However, the P-type well layer 41 of the sixth transistor M6 may be formed after the N-type well layer 63 of the eighth transistor M8 is formed.

As shown in FIG. 6G, the P-type well layer 62 is formed in the surface layer portion of the N-type well layer 39 of the third transistor M3, while the N-type well layer 70 is formed in the surface layer portion of the N-type well layer 39 of the first transistor M1. More specifically, an ion implantation mask (not shown) having an opening through which the element formation region 34 of the third transistor M3 is exposed is formed in such a manner as to cover the element formation region 34 and the element isolation region 35 of each of the first transistor M1, the sixth transistor M6, and the eighth transistor M8. P-type impurity ions are implanted through the opening of the ion implantation mask. More specifically, impurity ions are implanted into the region where the third transistor M3 is formed in the silicon substrate 30 which is a semiconductor substrate, while ions are selectively implanted such that impurity ions are not implanted into the regions where the first transistor M1, the sixth transistor M6, and the eighth transistor M8 are formed to form a channel region in the region where the third transistor M3 is formed. For example, boron ions are adopted as the P-type impurity ions. Ion implantation is herein performed so that the P-type impurity concentration of the P-type well layer 41 of the third transistor M3 becomes lower than the P-type impurity concentration of the P-type well layer 41 of the sixth transistor M6. For example, ion implantation is performed so that the P-type impurity concentration of the P-type well layer 62 of the third transistor M3 becomes about ½ or lower of the P-type impurity concentration of the P-type well layer 41 of the sixth transistor M6. Ion implantation is preferably performed so that the P-type impurity concentration of the P-type well layer 62 of the third transistor M3 becomes about ¹⁄₁₀ of the P-type impurity concentration of the P-type well layer 41 of the sixth transistor M6.

Subsequently, an ion implantation mask (not shown) having an opening through which the element formation region 34 of the first transistor M1 is exposed is formed in such a manner as to cover the element formation region 34 and the element isolation region 35 of each of the third transistor M3, the sixth transistor M6, and the eighth transistor M8. P-type impurity ions are implanted through the opening of the ion implantation mask. More specifically, impurity ions are implanted into the region where the first transistor M1 is formed in the silicon substrate 30 which is a semiconductor substrate, while ions are selectively implanted such that impurity ions are not implanted into the regions where the third transistor M3, the sixth transistor M6, and the eighth transistor M8 are formed to form a channel region in the region where the first transistor M1 is formed. For example, arsenic ions and phosphorus ions are adopted as the N-type impurity ions. Ion implantation is herein performed so that the N-type impurity concentration of the N-type well layer 70 of the first transistor M1 becomes lower than the N-type impurity concentration of the N-type well layer 63 of the eighth transistor M8. For example, ion implantation is performed so that the N-type impurity concentration of the N-type well layer 70 of the first transistor M1 becomes about ½ or lower of the N-type impurity concentration of the N-type well layer 63 of the eighth transistor M8. Ion implantation is preferably performed so that the N-type impurity concentration of the N-type well layer 70 of the first transistor M1 becomes about ¹⁄₁₀ of the N-type impurity concentration of the N-type well layer 63 of the eighth transistor M8. In the present embodiment, the N-type well layer 70 of the first transistor M1 is formed after the P-type well layer 62 of the third transistor M3 is formed. However, the P-type well layer 62 of the third transistor M3 may be formed after the N-type well layer 70 of the first transistor M1 is formed.

As shown in FIG. 6H, a thermal oxide film 75 is formed on the surface of each of the element formation regions 34 of the P-type epitaxial layer 31 by a thermal oxidation method, for example. Next, a polysilicon film 76 is formed in such a manner as to cover the thermal oxide film 75 and the silicon oxide film 33.

As shown in FIG. 6I, the gate insulation film 42 and the gate electrode 43 patterned into a predetermined shape by removal of unnecessary portions from the thermal oxide film 75 and the polysilicon film 76 are formed in the element formation region 34 of each of the first transistor M1, the third transistor M3, the sixth transistor M6, and the eighth transistor M8 by photolithography and etching, for example. Then, a laminated film (not shown) of a nitride film/oxide film is formed on the P-type epitaxial layer 31 by the CVD method, for example, and then selectively etched to form the sidewall 44 on each of the side surfaces of the gate electrodes 43.

As shown in FIG. 6J, the low concentration source region 47 and the low concentration drain region 49 are formed in the element formation region 34 of each of the third transistor M3 and the sixth transistor M6, while the low concentration source region 66 and the low concentration drain region 68 are formed in the element formation region 34 of each of the first transistor M1 and the eighth transistor M8. More specifically, an ion implantation mask (not shown) having openings through which the element formation regions 34 of the third transistor M3 and the sixth transistor M6 are exposed is formed in such a manner as to cover the element formation region 34 and the element isolation region 35 of each of the first transistor M1 and the eighth transistor M8. N-type impurity ions are implanted through the opening of the ion implantation mask. Subsequently, the ion implantation mask described above is removed after an ion implantation mask (not shown) having openings through which the element formation regions 34 of the first transistor M1 and the eighth transistor M8 are exposed is formed in such a manner as to cover the element formation region 34 and the element isolation region 35 of each of the third transistor M3 and the sixth transistor M6. P-type impurity ions are implanted through the opening of the ion implantation mask. For example, BF$_2$ ions are adopted as the P-type impurity ions. In the present embodiment, the low concentration source region 66 and the low concentration drain region 68 are formed after the low concentration source region 47 and the low concentration drain region 49 are formed. However, the low concentration source region 47 and the low concentration drain region 49 may be formed after the low concentration source region 66 and the low concentration drain region 68 are formed.

As shown in FIG. 6K, the high concentration source region 48 and the high concentration drain region 50 are formed in the element formation region 34 of each of the third transistor M3 and the sixth transistor M6, while the high concentration source region 67 and the high concentration drain region 69 are formed in the element formation region 34 of each of the first transistor M1 and the eighth transistor M8. More specifically, an ion implantation mask (not shown) having openings through which the element formation regions 34 of the third transistor M3 and the sixth transistor M6 are exposed is formed in such a manner as to cover the element formation region 34 and the element isolation region 35 of each of the first transistor M1 and the eighth transistor M8. N-type impurity ions are implanted through the opening of the ion implantation mask. For example, arsenic ions are adopted as the N-type impurity ions. Subsequently, the ion implantation mask described above is removed after an ion implantation mask (not shown) having openings through which the element formation regions 34 of the first transistor M1 and the eighth transistor M8 are exposed is formed in such a manner as to cover the element formation region 34 and the element isolation region 35 of each of the third transistor M3 and the sixth transistor M6. P-type impurity ions are implanted through the opening of the ion implantation mask. For example, boron ions are used as the P-type impurity ions. In the present embodiment, the high concentration source region 67 and the high concentration drain region 69 are formed after the high concentration source region 48 and the high concentration drain region 50 are formed. However, the high concentration source region 48 and the high concentration drain region 50 may be formed after the high concentration source region 67 and the high concentration drain region 69 are formed.

As shown in FIG. 6L, a silicide layer 77 is formed on surfaces of the high concentration source region 48, the high concentration drain region 50, and the gate electrode 43 formed in the element formation region 34 of each of the third transistor M3 and the sixth transistor M6. The silicide layer 77 is further formed on surfaces of the high concentration source region 67, the high concentration drain region 69, and the gate electrode 43 formed in the element formation region 34 of each of the first transistor M1 and the eighth transistor M8. Specifically, after a cobalt film (not shown) is formed toward the P-type epitaxial layer 31 by a PVD method, for example, heat treatment is performed. As a result, the cobalt film on the high concentration source regions 48 and 67, the high concentration drain regions 50 and 69, and the gate electrode 43 in each of the element formation regions 34 changes into the silicide layer 77, while the cobalt film on the silicon oxide film 33 in each of the element isolation regions 35 remains cobalt. Then, cobalt on each of the silicon oxide films 33 is selectively removed by chemical treatment, for example.

As shown in FIG. 6M, the first insulating layer 51, the second insulating layer 52, the source wiring 58, and the drain wiring 60 are formed. Specifically, a nitride film and an oxide film are successively laminated on the P-type epitaxial layer 31 by the CVD method, for example, to form the film 53 and the first interlayer insulation film 54. Then, the first interlayer insulation film 54 is polished by chemical mechanical polishing (CMP) treatment, for example. Next, the second insulating layer 52 is laminated on the first interlayer insulation film 54 as a silicon oxide film. Subsequently, the source contact hole 55 and the drain contact hole 56 are formed in the second insulating layer 52 and the first insulating layer 51 in each of the element formation regions 34 by photolithography and etching. Then, Ti/TiN/Al as a material of the source contact plug 57, the drain contact plug 59, the source wiring 58, and the drain wiring 60 is accumulated on the second insulating layer 52. Next, a Ti/TiN/Al laminated film is patterned by photolithography and etching to form the source contact plug 57, the drain contact plug 59, the source wiring 58, and the drain wiring 60. The gate wiring 61 (not shown in FIG. 6M) is further formed. Manufacture of the first transistor M1, the third transistor M3, the sixth transistor M6, and the eighth transistor M8 is thus completed.

The second transistor M2 is manufactured in a manner similar to the manner for manufacturing the first transistor M1, while the fourth transistor M4 is manufactured in a manner similar to the manner for manufacturing the third transistor M3. The seventh transistor M7 is manufactured in a manner similar to the manner for manufacturing the sixth transistor M6, the fifth transistor M5, the ninth transistor M9, while the transistor of the constant current source 11, and the transistor of the reference current source 13 are manufactured in a manner similar to the manner for manufacturing the eighth transistor M8. The first transistor M1 and the second transistor M2 are simultaneously formed, while the third transistor M3 and the fourth transistor M4 are simultaneously formed. The fifth transistor M5, the eighth transistor M8, the ninth transistor M9, the transistor of the constant current source 11, and the transistor of the reference current source 13 are simultaneously formed.

Figure 7A:
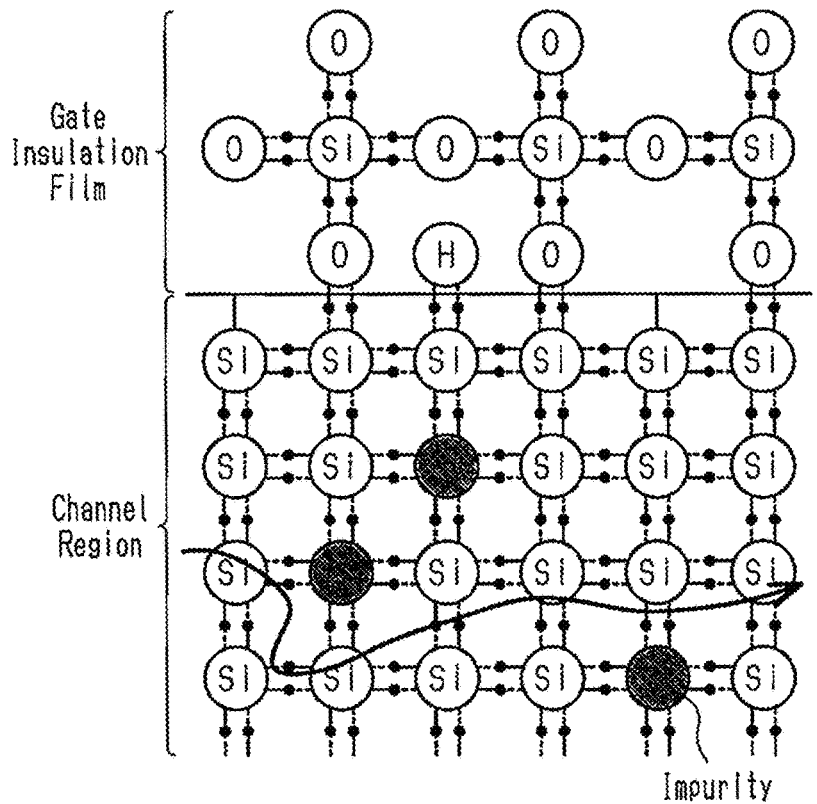
FIG. 7A is a schematic diagram illustrating an operation of the present embodiment.
Figure 7B:
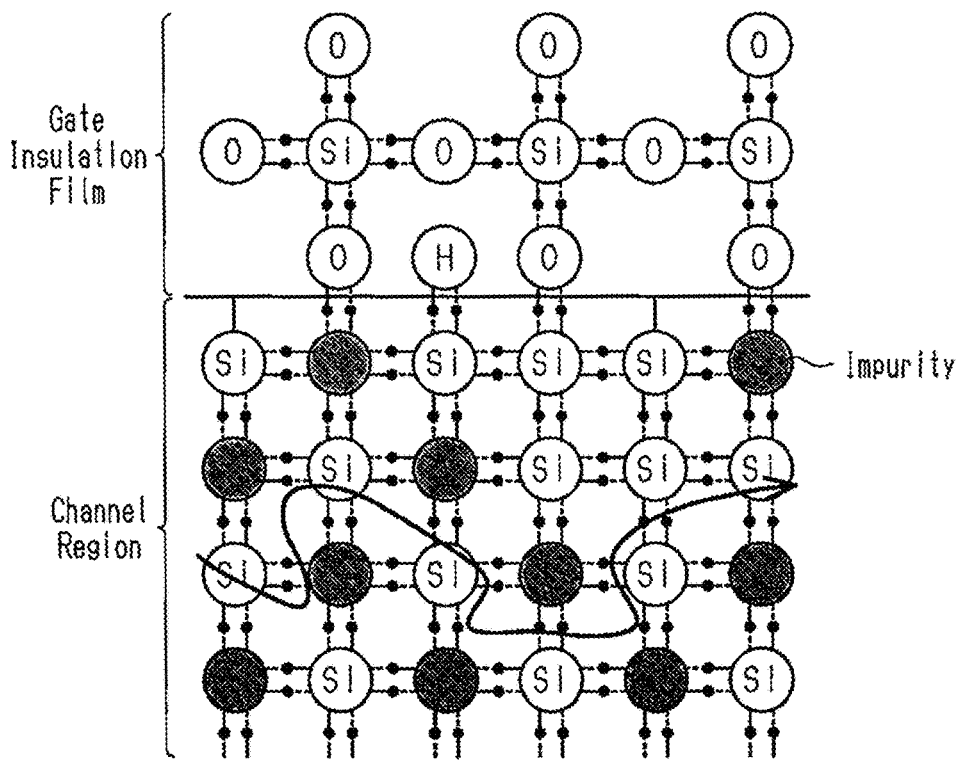
FIG. 7B is a schematic diagram illustrating an operation of a comparative example.

The relationship between an impurity concentration of the transistor of the operational amplifier 1 of the present embodiment and noise of the output signal Sout will be described with reference to FIG. 7A, FIG. 7B, and FIG. 8. FIGS. 7A and 7B are diagrams schematically showing an atomic arrangement at an interface between the gate electrode 43 and the channel region. FIG. 7A shows an example of movement of electrons when an impurity concentration in a channel region is low, while FIG. 7B shows an example of movement of electrons when an impurity concentration in a channel region is high. In other words, FIG. 7B shows an example of movement of electrons in a channel region of a high concentration transistor whose impurity concentration in the channel region is a first concentration, while FIG. 7A shows an example of movement of electrons in a channel region of a low concentration transistor whose impurity concentration in the channel region is a second concentration lower than the first concentration. Shaded circles in FIGS. 7A and 7B indicate impurities.

A transistor has been miniaturized for improvement of a logic integration degree of a differential circuit. For example, a minimum dimension of each of the transistors M1 to M9 preferably ranges from 0.05 μm to 10 μm, and is set to 0.13 μm, for example, in the present embodiment. With this miniaturization of a transistor, 1/f noise (flicker noise) of an output signal from a differential circuit increases in some cases.

The inventors of the present application have focused on the fact that 1/f noise of an output signal is produced by fluctuations of drain current, and that these fluctuations of drain current are caused by fluctuations of mobility of a transistor. In addition, as one of factors causing fluctuations of the foregoing mobility, an impurity concentration of a channel region has been given consideration.

More specifically, as shown in FIGS. 7A and 7B, electrons move while scattered with impurities. In this case, movement trajectory of electrons (arrow in FIG. 7B) caused when the impurity concentration in the channel region is high is more complicated than movement trajectory of electrons (arrow in FIG. 7A) caused when the impurity concentration of the region is low. Accordingly, fluctuations of mobility when the impurity concentration in the channel region is high are greater than fluctuations of mobility when the impurity concentration of the channel region is low.

In particular, for miniaturizing a transistor, a rise of an impurity concentration of a channel region based on the scaling rule is generally considered to reduce the short channel effect of each transistor. In this case, scattering with impurities is likely to occur, wherefore fluctuations of the mobility tends to increase.

In view of the above, the inventors of the present application have found that fluctuations of mobility can be reduced by making a lower impurity concentration in a channel region of each of some transistors of the plurality of transistors configuring a differential circuit than an impurity concentration in a channel region of each of the other transistors. That is, the inventors of the present application have found that fluctuations of mobility can be reduced by configuring a plurality of transistors of a differential circuit by high concentration transistors whose impurity concentration in each channel region is the first concentration and low concentration transistors whose impurity concentration in each channel region is the second concentration lower than the first concentration.

In the present embodiment, the impurity concentrations of the P-type well layer 41 and the N-type well layer 63 of each of a plurality of transistors configuring the back gate bias circuit 20 and not easily affected by 1/f noise of the output signal Sout of the operational amplifier 1 among the transistors configuring the operational amplifier 1, the transistor of the constant current source 11, and the transistor of the reference current source 13 are relatively raised. On the other hand, in the present embodiment, the impurity concentrations of the P-type well layer 62 and the N-type well layer 70 of the first transistor M1 to the fourth transistor M4, which are easily affected by 1/f noise of the output signal Sout of the operational amplifier 1 among the transistors configuring the operational amplifier 1, are set to relatively low impurity concentrations not in conformity with the scaling rule. Specifically, the impurity concentration (second concentration) of each of the P-type well layer 62 and the N-type well layer 70 of the first transistor M1 to the fourth transistor M4 is set to approximately 1/10 of the impurity concentration (first concentration) of the P-type well layer 41 and the N-type well layer 63 of the fifth transistor M5 to the ninth transistor M9, the transistors of the constant current sources 11 and 21, and the transistor of the reference current source 13. According to this configuration, fluctuations of mobility of transistors which are easily affected by 1/f noise of the output signal Sout can be reduced.

Figure 8:
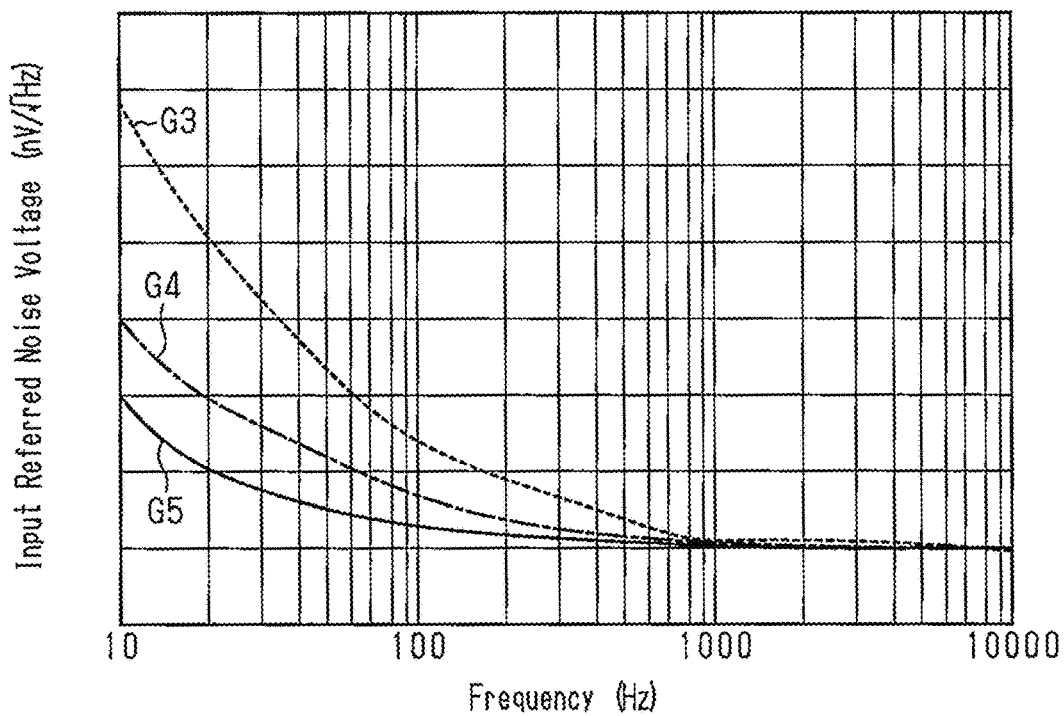
FIG. 8 is a graph showing the relationship between frequency and input referred noise voltage.

A graph G3 indicated by a broken line in FIG. 8 shows input referred noise voltage generated when the impurity concentrations of the P-type well layer 62 and the N-type well layer 70 of each of the first transistor M1 to the fourth transistor M4 are equal to the impurity concentrations of the P-type well layer 41 and the N-type well layer 63 of each of the fifth transistor M5 to the ninth transistor M9, the transistors of the constant current source 11 and 21, and the transistor of the reference current source 13. A graph G3 indicated by a single-dashed line in FIG. 8 shows input referred noise voltage generated when the impurity concentrations of the P-type well layer 62 and the N-type well layer 70 of each of the first transistor M1 to the fourth transistor M4 are about ½ of the impurity concentrations of the P-type well layer 41 and the N-type well layer 63 of each of the fifth transistor M5 to the ninth transistor M9, the transistors of the constant current source 11 and 21, and the transistor of the reference current source 13. A graph G5 indicated by a solid line in FIG. 8 shows input referred noise voltage generated when the impurity concentrations of the P-type well layer 62 and the N-type well layer 70 of each of the first transistor M1 to the fourth transistor M4 are about 1/10 of the impurity concentrations of the P-type well layer 41 and the N-type well layer 63 of each of the fifth transistor M5 to the ninth transistor M9, the transistors of the constant current source 11 and 21, and the transistor of the reference current source 13. As can be seen from the graphs G3 to G5 in FIG. 8, the input referred noise voltage, that is, 1/f noise of output signal Sout decreases in accordance with reduction of the impurity concentrations of the P-type well layer 62 and the N-type well layer 70 of each of the first transistor M1 to the fourth transistor M4.

According to the present embodiment, following effects are obtained.

(1-1) The back gate bias circuit 20 applies the bias voltage VB to the back gates of the first transistor M1 and the second transistor M2 (contact areas for applying bias voltage VB to back gates of N-type well layers 39 of the first transistor M1 and the second transistor M2). The bias voltage VB is closer to the first power supply voltage VDD than source potentials of the first transistor M1 and the second transistor M2. In this case, the back gate-to-source voltage VBS of each of the first transistor M1 and the second transistor M2 increases. Accordingly, the transconductance gm12 of each of the first transistor M1 and the second transistor M2 increases, wherefore noise of the output signal Sout of the operational amplifier 1 can be reduced without increasing the channel length L and the channel width W, i.e., without increasing the element area.

Particularly, the back gate bias circuit 20 of the present embodiment is connected to the first power supply line 2, but the bias voltage VB is reduced to a voltage slightly lower than the first power supply voltage VDD by the fifth transistor M5. In this case, effects of the noise of the first power supply line 2 on the bias voltage VB can be reduced. Accordingly, noise of the output signal Sout of the operational amplifier 1 can be reduced in comparison with a configuration which directly connects the back gates of the first transistor M1 and the second transistor M2 to the first power supply line 2.

(1-2) The back gate bias circuit 20 can further reduce noise of the output signal Sout of the operational amplifier 1 by setting the bias voltage VB higher than the first power supply voltage VDD, and thereby further increasing the transconductance gm12 of each of the first transistor M1 and the second transistor M2.

(1-3) The first transistor M1 and the second transistor M2 can be operated in a stable manner by setting the bias voltage VB to a voltage lower than such a voltage at which parasitic diodes of the first transistor M1 and the second transistor M2 are turned on.

(1-4) Increase in the transconductance gm12 of each of the first transistor M1 and the second transistor M2, and stable operation of the first transistor M1 and the second transistor M2 can be achieved by setting the bias voltage VB to a voltage within a predetermined range including the first power supply voltage VDD and excluding the first power supply voltage VDD, and thereby increasing the back gate-to-source voltage VBS. In particular, the back gate-to-source voltage VBS is made close to the back gate-to-source VBSH by setting the bias voltage VB to a voltage within ±20% of the first power supply voltage VDD and excluding a voltage equal to the first power supply voltage VDD. Accordingly, the transconductance gm12 of each of the first transistor M1 and the second transistor M2 increases, and the first transistor M1 and the second transistor M2 can be operated in a more stable manner.

(1-5) The impurity concentration of the P-type well layer 62 of each of the first transistor M1 and the second transistor M2 configuring the differential pair 10 of the operational amplifier 1 is lower than the impurity concentration of the P-type well layer 41 of each of the sixth transistor M6 and the seventh transistor M7 configuring the back gate bias circuit 20. According to this configuration, fluctuations of mobility and fluctuations of drain current can be reduced by decreasing the impurity concentration of the P-type well layer 62 of each of the transistors M1 and M2 configuring the differential pair 10 and easily affected by 1/f noise of the output signal Sout in the operational amplifier 1. Accordingly, 1/f noise of the operational amplifier 1 can be effectively reduced.

Meanwhile, a stable threshold voltage is required for the plurality of transistors M5 to M9 and the transistor of the constant current source 21 included in the back gate bias circuit 20. When low concentration transistors such as the transistors M1 and M2 are adopted as transistors for which a stable threshold voltage is required, the operation of the back gate bias circuit 20 may become unstable.

Accordingly, fluctuations of the threshold voltages of the transistors M5 to M9 can be reduced by relatively increasing the impurity concentrations of the N-type well layer 63 of each of the fifth transistor M5, the eighth transistor M8, and the ninth transistor M9, and the P-type well layer 41 of each of the sixth transistor M6 and the seventh transistor M7, of the back gate bias circuit 20 of the present embodiment. In this manner, the operation of the back gate bias circuit 20 can be stabilized.

As described above, both low concentration transistors such as the transistors M1 and M2 and high concentration transistors such as the transistors M5 to M9 and the transistor of the constant current source 21 are present in the operational amplifier 1. Accordingly, the operation of the operational amplifier 1 is stabilized while effectively reducing 1/f noise.

(1-6) The impurity concentration in the channel region of each of the fourth transistor M4 and the fifth transistor M5 configuring the current mirror circuit 12 of the operational amplifier 1 is lower than the impurity concentration in the channel region of each of the fifth transistor M5, the eighth transistor M8, and the ninth transistor M9 configuring the back gate bias circuit 20. According to this configuration, fluctuations of mobility and fluctuations of drain current can be reduced by decreasing the impurity concentration in the channel region of each of the transistors M4 and M5 configuring the current mirror circuit 12 and easily affected by 1/f noise of the output signal Sout in the operational amplifier 1. Accordingly, 1/f noise of the operational amplifier 1 can be effectively reduced.

(1-7) The transistor of the constant current source 11, the transistor of the reference current source 13, and the fifth transistor M5, the eighth transistor M8, and the ninth transistor M9 configuring the back gate bias circuit 20 are the same conductivity type MOSFETs (P-channel MOSFETs). The N-type well layer 63 of the constant current source 11, the N-type well layer 63 of the transistor of the reference current source 13, and the N-type well layer 63 of each of the transistors M5, M8, and M9 have the same impurity concentration. According to this configuration, the step of forming the N-type well layer 63 of the transistor of the constant current source 11, the step of forming the N-type well layer 63 of the transistor of the reference current source 13, and the steps of forming the N-type well layers 63 of the transistors M5, M8, and M9 can be collectively performed. Accordingly, the step of manufacturing the operational amplifier 1 can be simplified.

(1-8) The P-type well layers 41 of the sixth transistor M6 and the seventh transistor M7 configuring the back gate bias circuit 20, and the P-type well layer 41 of the transistor of the constant current source 21 have the same impurity concentration. In this case, the step of forming the P-type well layer 41 of the sixth transistor M6, the step of forming the P-type well layer 41 of the seventh transistor M7, and the step of forming the P-type well layer 41 of the transistor of the constant current source 21 can be collectively performed. Accordingly, the step of manufacturing the operational amplifier 1 can be simplified.

Modifications of First Embodiment

The operational amplifier 1 of the present embodiment can be modified in following manners.

Figure 9:
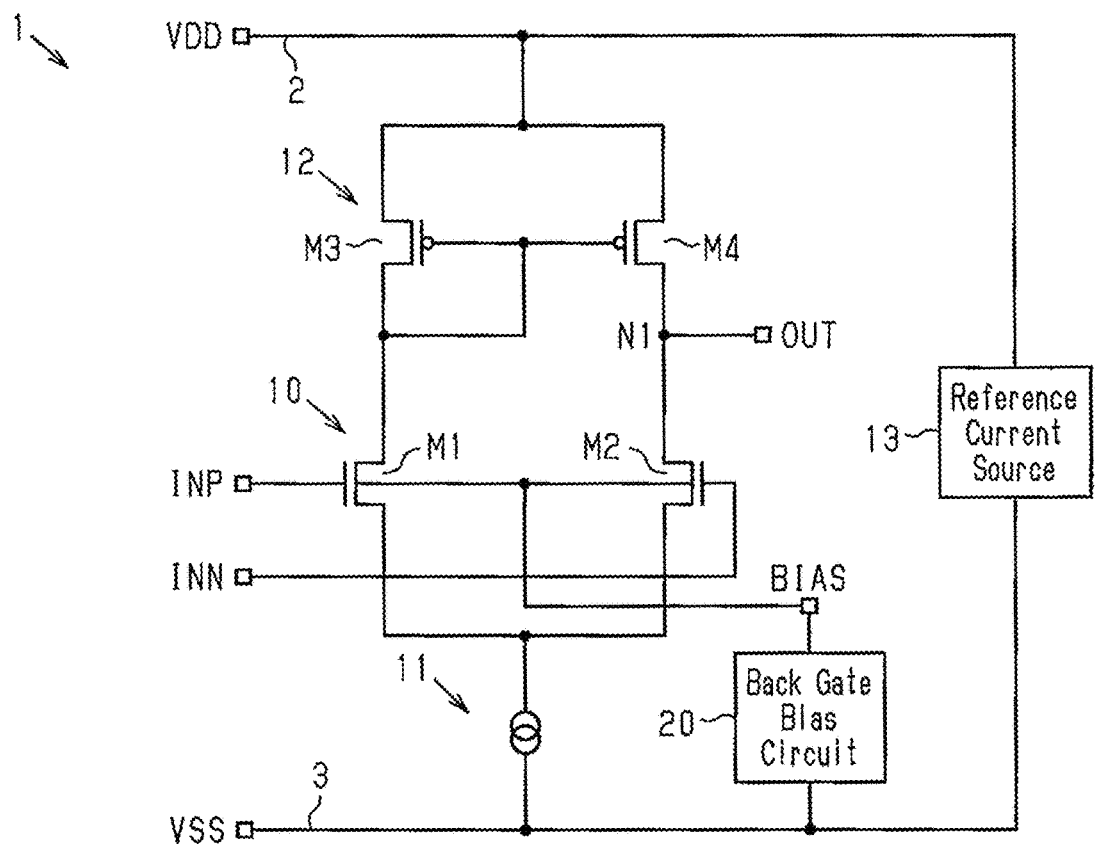
FIG. 9 is a circuit diagram of an operational amplifier according to a modification of the first embodiment.

The operational amplifier 1 shown in FIG. 1 can be modified into an operational amplifier 1 shown in FIG. 9. The operational amplifier 1 in FIG. 9 is chiefly different in the conductivity type of the transistors configuring the operational amplifier 1.

The first transistor M1 and the second transistor M2 of the differential pair 10, and the transistor of the constant current source 11 are N-channel MOSFETs. The source of the transistor of the constant current source 11 is connected to the second power supply line 3, while the drain of the transistor of the constant current source 11 is connected to the sources of the first transistor M1 and the second transistor M2.

The fourth transistor M4 and the fifth transistor M5 of the current mirror circuit 12 are P-channel MOSFETs. The sources of the fourth transistor M4 and the fifth transistor M5 are connected to the first power supply line 2, the drain of the fourth transistor M4 is connected to the drain of the first transistor M1, and the drain of the fifth transistor M5 is connected to the drain of the second transistor M2.

The back gate bias circuit 20 is connected to the common back gate of the first transistor M1 and the second transistor M2, and the second power supply line 3. The back gate bias circuit 20 applies the bias voltage VB, which is closer to the second power supply voltage VSS than the source potentials of the first transistor M1 and the second transistor M2, to the back gates of the first transistor M1 and the second transistor M2. In other words, the back gate bias circuit 20 applies the bias voltage VB, which is closer to the second power supply voltage VSS than an intermediate voltage between the source potentials of the first transistor M1 and the second transistor M2 and the second power supply voltage VSS, to the back gates of the first transistor M1 and the second transistor M2. That is, the back gate bias circuit 20 applies, to the back gates of the first transistor M1 and the second transistor M2, the bias voltage VB which increases the back gate-to-source voltage VBS. As a result, the back gate-to-source voltage VBS becomes a voltage close to the back gate-to-source voltage VBSH. The bias voltage VB may be lower than the second power supply voltage VSS. In this case, it is preferable that the bias voltage VB be lower than the second power supply voltage VSS within a range where parasitic diodes of the first transistor M1 and the second transistor M2 are not turned on. It is preferable that the bias voltage VB be a voltage within a predetermined range including the second power supply voltage VSS and excluding a voltage equal to the second power supply voltage VSS. In one example, it is preferable that the bias voltage VB be a voltage within ±20% of the second power supply voltage VSS and excluding a voltage equal to the second power supply voltage VSS. According to this configuration, the transconductance gm12 of each of the first transistor M1 and the second transistor M2 increases. Accordingly, noise of the output signal Sout of the operational amplifier 1 can be reduced.

In the operational amplifier 1 in FIG. 9, similarly to the operational amplifier 1 in FIG. 1, the impurity concentrations of the P-type well layer 62 and the N-type well layer 70 of each of the first transistor M1 to the fourth transistor M4 are made lower than the impurity concentrations of the P-type well layer 41 and the N-type well layer 63 of each of the transistor of the constant current source 11, the transistor of the reference current source 13, the transistors of the transistors M5 to M9 and the transistor of the constant current source 21 of the back gate bias circuit 20. Accordingly, effects similar to the effects (1-5) to (1-8) of the operational amplifier 1 in FIG. 1 can also be obtained by the operational amplifier 1 in FIG. 9.

Second Embodiment

An operational amplifier 1 according to a second embodiment will be described with reference to FIG. 1 and FIGS. 10A to 12B. The operational amplifier 1 of the present embodiment has a different transistor structure for reducing 1/f noise of the output signal Sout of the operational amplifier 1 from the corresponding structure of the operational amplifier 1 of the first embodiment.

Figure 10A:
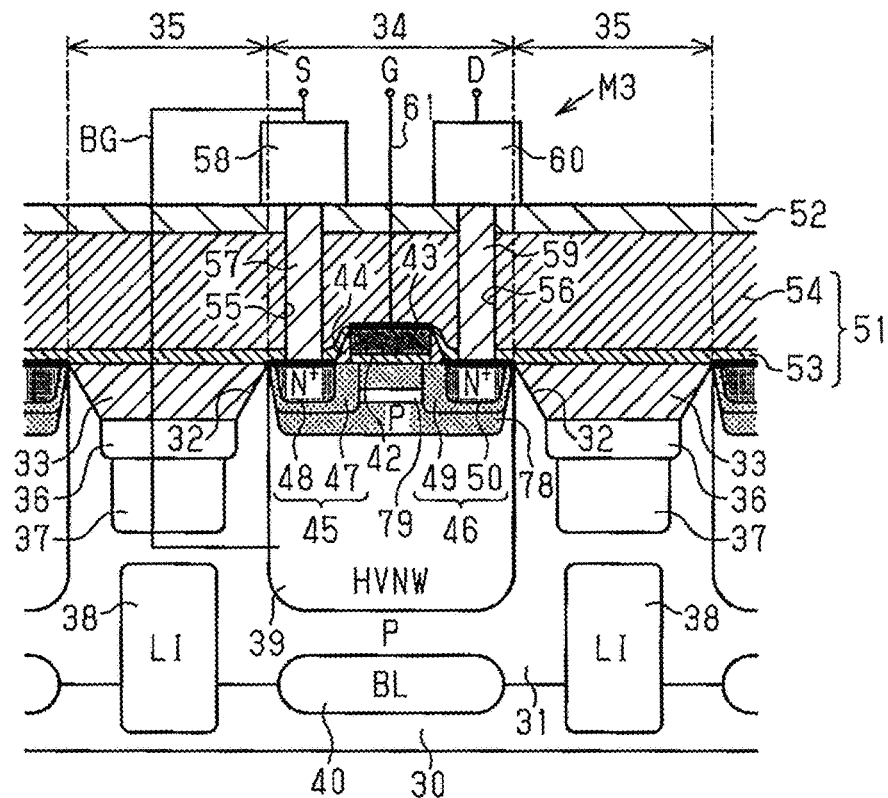
FIG. 10A is a cross-sectional view of a third transistor configuring an active load of an operational amplifier in a differential circuit of a second embodiment.

As shown in FIG. 10A, the third transistor M3 of the present embodiment has a structure similar to the structure of the sixth transistor M6 of the first embodiment (see FIG. 5A) except that the back gate of the third transistor M3 is connected to the source of the third transistor M3, and that a change to an embedded channel type is made. More specifically, the P-type impurity concentration of a P-type well layer 78 of the third transistor M3 of the present embodiment is equal to the P-type impurity concentration of the P-type well layer 41 of the sixth transistor M6 (see FIG. 5A), unlike the P-type impurity concentration of the P-type well layer 62 of the third transistor M3 (see FIG. 5B) of the first embodiment. A contact region (not shown) for applying a voltage to a back gate is formed in the N-type well layer 39 of the third transistor M3.

An embedded channel layer 79 is formed in a region (channel region) facing the gate insulation film 42 in the P-type well layer 78. The embedded channel layer 79 is a region (layer) of the same conductivity type as the conductivity type of the source region 45 and the drain region 46. That is, the embedded channel layer 79 is a region (layer) of the N type similarly to the source region 45 and the drain region 46 doped with N-type impurities. The embedded channel layer 79 is formed inside the P-type well layer 78. More specifically, the embedded channel layer 79 is formed at a position spaced downward from an interface between the P-type well layer 78 and the gate insulation film 42.

In the present embodiment, as described above, the channel region (embedded channel layer 79) of the third transistor M3 is disposed in the P-type well layer 78 below the gate insulation film 42 and between the source region 45 and the drain region 46. In the present embodiment, the channel region (embedded channel layer 79) of the third transistor M3 does not include an interface between the P-type well layer 78 and the gate insulation film 42. A total impurity concentration in the channel region (embedded channel layer 79) of the third transistor M3 is higher than the impurity concentration of the P-type well layer 78. The fourth transistor M4 has a configuration similar to the configuration of the third transistor M3.

Figure 10B:
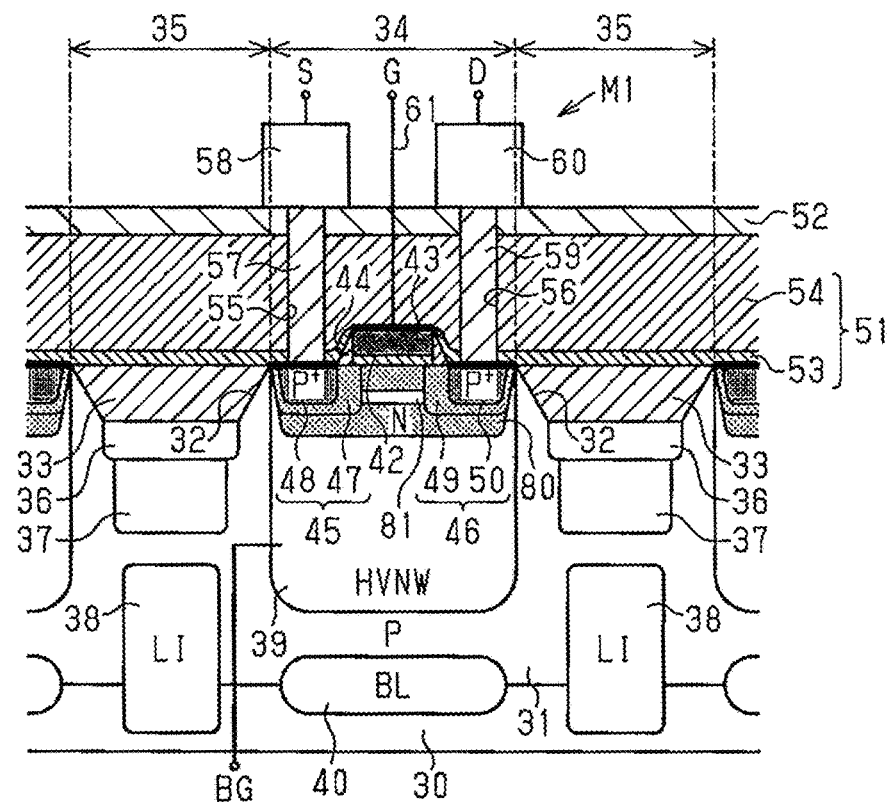
FIG. 10B is a cross-sectional view of a first transistor forming a differential pair of the operational amplifier.

As shown in FIG. 10B, the first transistor M1 has a structure identical to the structure of the eighth transistor M8 (see FIG. 5C) except that the back gate of the first transistor M1 is connected to the back gate bias circuit 20 via the bias terminal BIAS, and that a change to an embedded channel type is made. More specifically, the N-type impurity concentration of an N-type well layer 80 of the first transistor M1 of the present embodiment is equal to the N-type impurity concentration of the N-type well layer 63 (see FIG. 5C) of the eighth transistor M8, unlike the N-type impurity concentration of the N-type well layer 70 (see FIG. 5D) of the first transistor M1 of the first embodiment. A contact region (not shown) for applying the bias voltage VB of the back gate bias circuit 20 is provided in the N-type well layer 39.

An embedded channel layer 81 is formed in a region (channel region) facing the gate insulation film 42 in the N-type well layer 80. The embedded channel layer 81 is a region (layer) of the same conductivity type as the conductivity type of the source region 64 and the drain region 65. That is, the embedded channel layer 81 is a region (layer) of the P-type similarly to the source region 64 and the drain region 65 doped with P-type impurities. The embedded channel layer 81 is formed inside the N-type well layer 80. More specifically, the embedded channel layer 81 is formed at a position spaced downward from an interface between the N-type well layer 80 and the gate insulation film 42.

In the present embodiment, as described above, the channel region (embedded channel layer 81) of the first transistor M1 is disposed in the N-type well layer 80 below the gate insulation film 42 and between the source region 64 and the drain region 65. In the present embodiment, the channel region (embedded channel layer 81) of the first transistor M1 does not include the interface between the N-type well layer 80 and the gate insulation film 42. A total impurity concentration of the channel region (embedded channel layer 81) of the first transistor M1 is higher than the impurity concentration of the N-type well layer 80. The second transistor M2 has a configuration similar to the configuration of the first transistor M1.

[Method for Manufacturing Transistor]

Figure 11B:
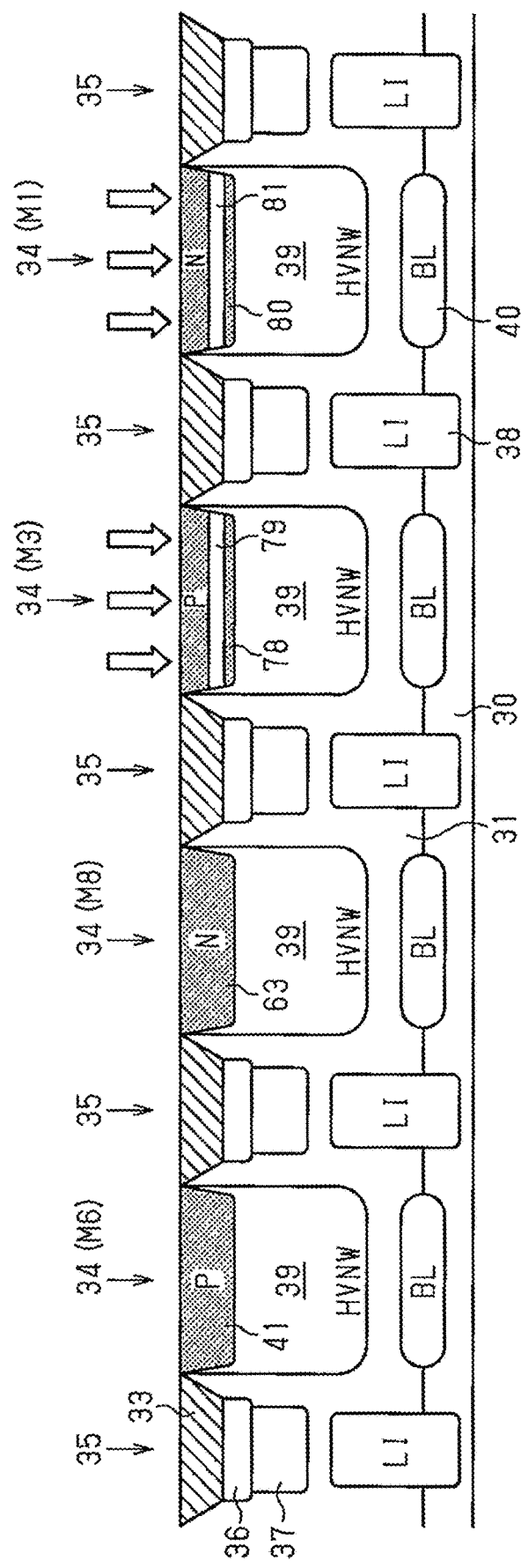
FIG. 11B is a cross-sectional view illustrating a step subsequent to the manufacturing step of the transistors shown in FIG. 11A.

A method for manufacturing the first transistor M1, the third transistor M3, the sixth transistor M6, and the eighth transistor M8 will be described with reference to FIGS. 11A and 11B. In FIGS. 11A and 11B, it is assumed that the first transistor M1, the third transistor M3, the sixth transistor M6, and the eighth transistor M8 are formed adjacently to each other for convenience of explanation. The method for manufacturing the transistor of the present embodiment is different from the method for manufacturing the transistor of the first embodiment in a well forming step. The well forming step is hereinafter chiefly described.

In the well forming step, the step of forming the high breakdown voltage N-type well layer 39 in the element formation region 34 of the P-type epitaxial layer 31, and the step of forming the P-type drift layer 37 in the element isolation region 35 of the P-type epitaxial layer 31 are similar to the corresponding steps in the first embodiment.

As shown in FIG. 11A, the P-type well layer 78 is formed in the surface layer portion of the N-type well layer 39 of the third transistor M3, while the P-type well layer 41 is formed in the surface layer portion of the N-type well layer 39 of the sixth transistor M6. The N-type well layer 80 is formed in the surface layer portion of the N-type well layer 39 of the first transistor M1, while the N-type well layer 63 is formed in the surface layer portion of the N-type well layer 39 of the eighth transistor M8. More specifically, an ion implantation mask (not shown) having openings through which the element formation regions 34 of the third transistor M3 and the sixth transistor M6 are exposed is formed in such a manner as to cover the element formation region 34 and the element isolation region 35 of each of the first transistor M1 and the eighth transistor M8. P-type impurity ions are implanted through the opening of the ion implantation mask. For example, boron ions are adopted as the P-type impurity ions. Subsequently, the ion implantation mask described above is removed after an ion implantation mask (not shown) having openings through which the element formation regions 34 of the first transistor M1 and the eighth transistor M8 are exposed is formed in such a manner as to cover the element formation region 34 and the element isolation region 35 of each of the third transistor M3 and the sixth transistor M6. N-type impurity ions are implanted through the opening of the ion implantation mask. For example, arsenic ions and phosphorus ions are adopted as the N-type impurity ions. In this manner, the P-type impurity concentration of the P-type well layer 78 of the third transistor M3 is equal to the impurity concentration of the P-type well layer 41 of the sixth transistor M6, while the impurity concentration of the N-type well layer 80 of the first transistor M1 is equal to the impurity concentration of the N-type well layer 63 of the eighth transistor M8.

According to the present embodiment, the N-type well layer 80 of the first transistor M1 and the N-type well layer 63 of the eighth transistor M8 are formed after the P-type well layer 78 of the third transistor M3 and the P-type well layer 41 of the sixth transistor M6 are formed. However, the P-type well layer 78 of the third transistor M3 and the P-type well layer 41 of the sixth transistor M6 may be formed after the N-type well layer 80 of the first transistor M1 and the N-type well layer 63 of the eighth transistor M 8 are formed.

As shown in FIG. 11B, the embedded channel layer 79 is formed in the P-type well layer 78 of the third transistor M3, while the embedded channel layer 81 is formed in the N-type well layer 80 of the first transistor M1. More specifically, an ion implantation mask (not shown) having an opening through which the element formation region 34 of the third transistor M3 is exposed is formed in such a manner as to cover the element formation region 34 and the element isolation region 35 of each of the first transistor M1, the sixth transistor M6, and the eighth transistor M8. N-type impurity ions are implanted through the opening of the ion implantation mask. For example, phosphorus ions are used as the N-type impurity ions. In this manner, the embedded channel layer 79 is formed. Subsequently, the ion implantation mask described above is removed after an ion implantation mask (not shown) having an opening through which the element formation region 34 of the first transistor M1 is exposed is formed in such a manner as to cover the element formation region 34 and the element isolation region 35 of each of the third transistor M3, the sixth transistor M6, and the eighth transistor M8. P-type impurity ions are implanted through the opening of the ion implantation mask. For example, $BF_2$ is adopted as the P-type impurity ions. In this manner, the embedded channel layer 81 is formed. Thereafter, the ion implantation mask is removed. Then, similarly to the first embodiment, the first transistor M1, the third transistor M3, the sixth transistor M6, and the eighth transistor M8 are manufactured through a gate forming step, a source/drain forming step, and a wiring step.

According to the present embodiment, the embedded channel layer 81 of the first transistor M1 is formed after the embedded channel layer 79 of the third transistor M3 is formed. However, the embedded channel layer 79 of the third transistor M3 may be formed after the embedded channel layer 81 of the first transistor M1 is formed.

The second transistor M2 is manufactured in a manner similar to the manner for manufacturing the first transistor M1, while the fourth transistor M4 is manufactured in a manner similar to the manner for manufacturing the third transistor M3. The seventh transistor M7 is manufactured in a manner similar to the manner for manufacturing the sixth transistor M6, while the fifth transistor M5, the ninth transistor M9, the transistors configuring the constant current sources 11 and 21, and the transistor configuring the reference current source 13 are manufactured in a manner similar to the manner for manufacturing the eighth transistor M8. The first transistor M1 and the second transistor M2 are simultaneously formed, while the third transistor M3 and the fourth transistor M4 are simultaneously formed. The sixth transistor M6 and the seventh transistor M7 are simultaneously formed. The fifth transistor M5, the eighth transistor M8, the ninth transistor M9, the transistors configuring the constant current sources 11 and 21, and the transistor configuring the reference current source 13 are simultaneously formed.

An operation of the present embodiment will be described with reference to FIGS. 12A and 12B. Hatched circles in FIGS. 12A and 12B are impurities.

The inventors of the present application have focused on effects produced by roughness of an interface as a factor causing fluctuations of mobility of a transistor.

Figure 12A:
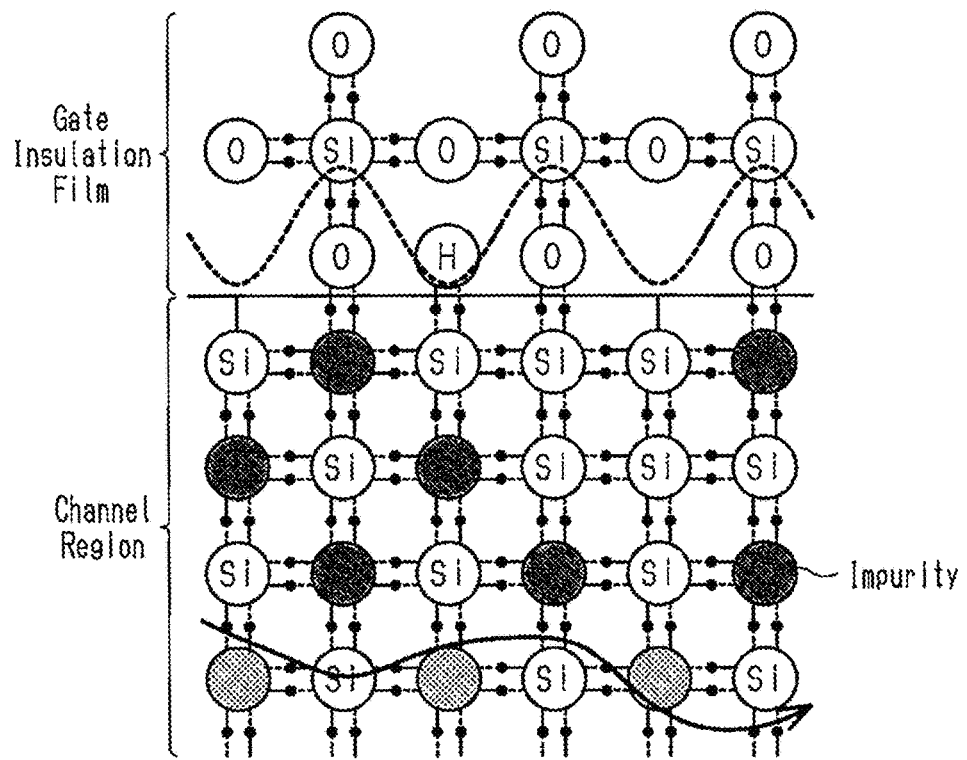
FIG. 12A is a schematic diagram illustrating an operation of the present embodiment.
Figure 12B:
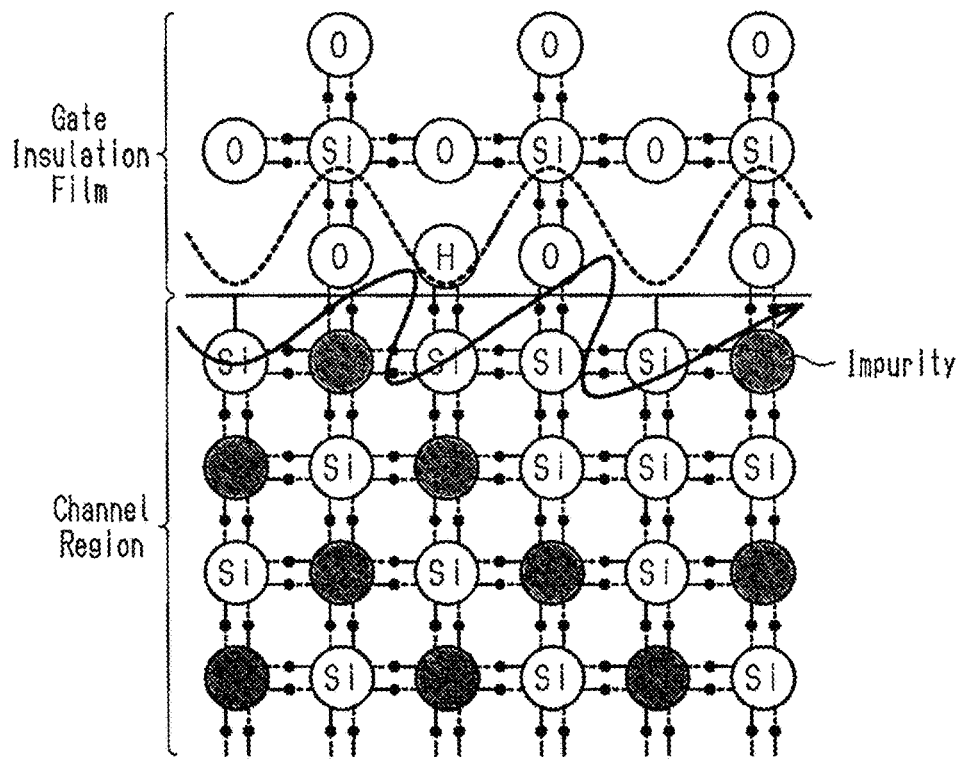
FIG. 12B is a schematic diagram illustrating an operation of a comparative example.

Specifically, as shown in FIGS. 12A and 12B, in case of a surface channel type MOSFET, electrons move in the vicinity of an interface between a P-type well layer and a gate insulation film in a channel region (arrow in FIG. 12B). In case of an embedded channel type MOSFET, electrons move in a region below the interface between the P-type well layer and the gate insulation film (arrow in FIG. 12A). The interface between the P-type well layer and the gate insulation film herein is uneven as shown by a broken line in FIG. 12B, wherefore electrons are scattered and moved in the surface channel type MOSFET. In addition, effects of trap and detrap produced by a defect level at the interface between the P-type well layer and the gate insulation film are easily imposed. On the other hand, in case of the embedded channel type MOSFET, electrons move in a region away from the interface between the P-type well layer and the gate insulation film in the channel region, wherefore electrons are not easily affected by the interface during movement. Accordingly, fluctuations of mobility of the embedded channel type MOSFET become smaller than fluctuations of mobility of the surface channel type MOSFET.

In view of the above, the inventors of the present application have found that fluctuations of mobility can be reduced by using embedded channel type MOSFETs as some transistors of a plurality of transistors configuring the operational amplifier 1, and also using surface channel type MOSFETs as the other transistors. More specifically, embedded channel type MOSFETs are used as transistors easily affected by 1/f noise of the output signal Sout of the operational amplifier 1, and surface channel type MOSFETs are used as transistors not easily affected by 1/f noise of the output signal Sout of the operational amplifier 1, among a plurality of transistors configuring the operational amplifier 1.

According to the present embodiment, the transistor of the constant current source 11, the transistor of the reference current source 13, and the transistors of the plurality of transistors M5 to M9 and the transistor of the constant current source 21 configuring the back gate bias circuit 20, each transistor being not easily affected by 1/f noise of the output signal Sout of the operational amplifier 1 among the transistors configuring the operational amplifier 1, are the surface channel type MOSFETs. The first transistors M1 to the fourth transistor M4, which are easily affected by 1/f noise of the output signal Sout of the operational amplifier 1 among the transistors configuring the operational amplifier 1, are the embedded channel type MOSFETs. In this case, fluctuations of mobility of the transistors easily affected by 1/f noise of the output signal Sout decrease, wherefore 1/f noise of the output signal Sout can be reduced.

Modifications of Second Embodiment

The operational amplifier 1 of the present embodiment can be modified in following manners.

The operational amplifier 1 of the present embodiment is applicable to the operational amplifier 1 in FIG. 9. According to the present embodiment, the transistor of the constant current source 11, the transistor of the reference current source 13, and the transistors of the plurality of transistors M5 to M9 and the transistor of the constant current source 21 configuring the back gate bias circuit 20, each transistor being not easily affected by 1/f noise of the output signal Sout of the operational amplifier 1 among the transistors configuring the operational amplifier 1 in FIG. 9, are the surface channel type MOSFETs. The first transistors M1 to the fourth transistor M4, which are easily affected by 1/f noise of the output signal Sout of the operational amplifier 1 among the transistors configuring the operational amplifier 1, are the embedded channel type MOSFETs.

Third Embodiment

An operational amplifier 1 according to a third embodiment will be described with reference to FIG. 1 and FIGS. 13A to 14C. The operational amplifier 1 of the present embodiment is different from the operational amplifier 1 of the first embodiment in a structure of a transistor devised to reduce 1/f noise of the output signal Sout of the operational amplifier 1.

Figure 13A:
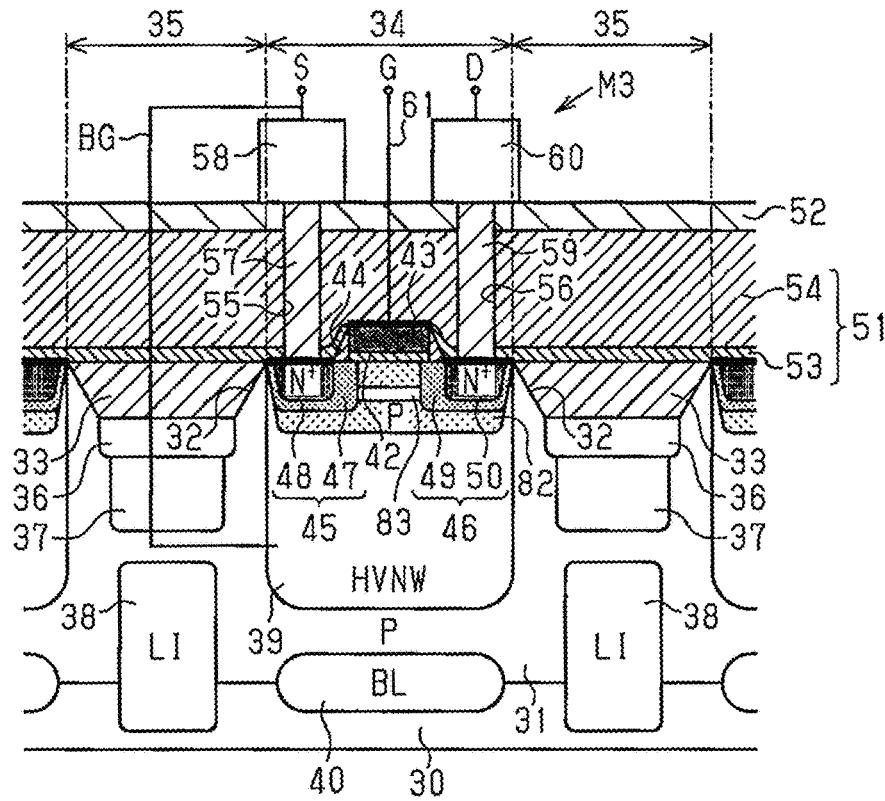
FIG. 13A is a cross-sectional view of a third transistor configuring an active load of an operational amplifier in a differential circuit of a third embodiment.

As shown in FIG. 13A, the third transistor M3 of the present embodiment is a combination of the third transistor M3 of the first embodiment and the third transistor M3 of the second embodiment. More specifically, the impurity concentration in the channel region of the third transistor M3 of the present embodiment is lower than the impurity concentration in the channel region of the sixth transistor M6 (P-type well layer 41: see FIG. 5A). Moreover, the third transistor M3 of the present embodiment is changed to an embedded channel type MOSFET. Further, the back gate of the third transistor M3 is connected to the source (second power supply line 3) of the third transistor M3. Other structures are identical to the corresponding structures of the sixth transistor M6.

The impurity concentration of the P-type well layer 82 configuring the channel region of the third transistor M3 is lower than the impurity concentration in the channel region based on the scaling rule. It is preferable that the impurity concentration of the P-type well layer 82 be the lowest possible concentration within a range in which element characteristics do not excessively deviate by a drop of the impurity concentration. For example, the P-type impurity concentration of the P-type well layer 82 is about ½ or lower of the P-type impurity concentration of the P-type well layer 41 of the sixth transistor M6. It is preferable that the impurity concentration of the P-type well layer 82 be about 1/10 of the impurity concentration of the P-type well layer 41 of the sixth transistor M6.

An embedded channel layer 83 is formed in a region (channel region) facing the gate insulation film 42 in the P-type well layer 82. The embedded channel layer 83 is a region (layer) of the same conductivity type as the conductivity type of the source region 45 and the drain region 46. That is, the embedded channel layer 83 is a region (layer) of the N type similarly to the source region 45 and the drain region 46 doped with N-type impurities.

In the present embodiment, as described above, the channel region (embedded channel layer 83) of the third transistor M3 is disposed in the P-type well layer 82 below the gate insulation film 42 and between the source region 45 and the drain region 46. In the present embodiment, the channel region (embedded channel layer 83) of the third transistor M3 does not include the interface between the P-type well layer 82 and the gate insulation film 42. The impurity concentration of the channel region (embedded channel layer 83) of the third transistor M3 is higher than the impurity concentration of the P-type well layer 82. The fourth transistor M4 has a configuration similar to the configuration of the third transistor M3.

Figure 13B:
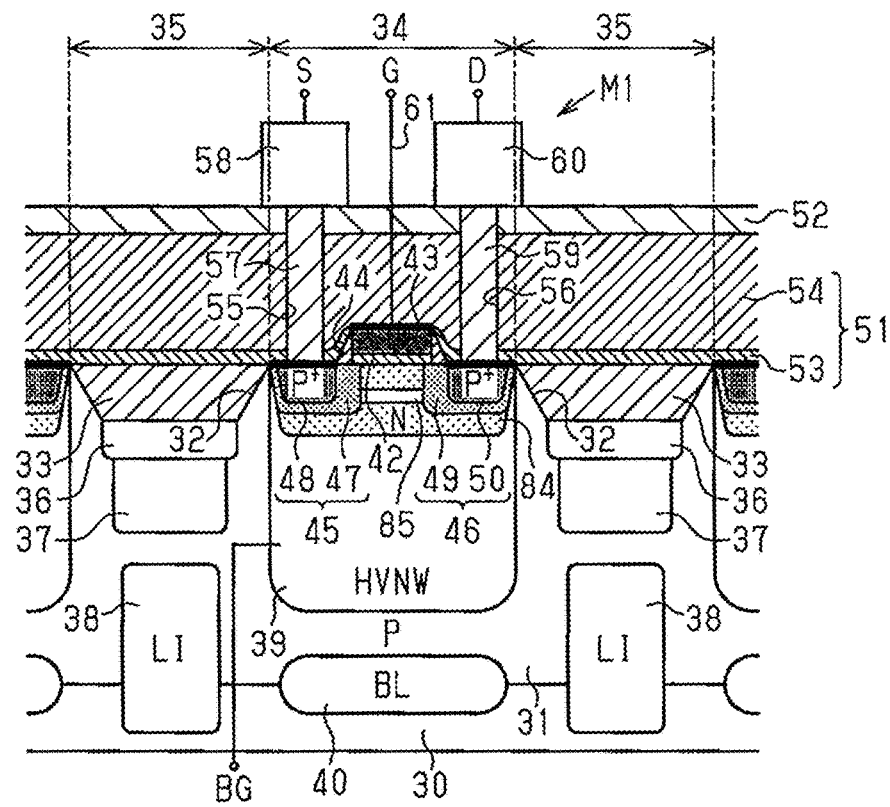
FIG. 13B is a cross-sectional view of a first transistor configuring a differential pair of the operational amplifier.

As shown in FIG. 13B, the first transistor M1 of the present embodiment is a combination of the first transistor M1 of the first embodiment and the first transistor M1 of the second embodiment. More specifically, the impurity concentration in the channel region of the first transistor M1 of the present embodiment is lower than the impurity concentration in the channel region of the eighth transistor M8 (N-type well layer 63: see FIG. 5C). Moreover, the first transistor M1 of the present embodiment is changed to an embedded channel type. The back gate of the first transistor M1 is connected to the back gate bias circuit 20 via the bias terminal BIAS. The other structures are identical to the corresponding structures of the eighth transistor M8.

The impurity concentration of the N-type well layer 84 of the first transistor M1 is lower than the N-type impurity concentration based on the scaling rule. It is preferable that the impurity concentration of the N-type well layer 84 be the lowest possible concentration within a range in which element characteristics do not excessively deviate by a drop of the impurity concentration. For example, the range in which element characteristics do not excessively deviate includes a concentration higher than an upper limit of an impurity concentration at which a function of the current mirror circuit 12 (see FIG. 1) does not hold due to deviation of a threshold voltage. For example, the impurity concentration of the N-type well layer 84 is about ½ or lower of the impurity concentration of the N-type well layer 63 of the eighth transistor M8. It is preferable that the impurity concentration of the N-type well layer 84 be about ⅒ of the impurity concentration of the N-type well layer 63 of the eighth transistor M8.

An embedded channel layer 85 is formed in a region (channel region) facing the gate insulation film 42 in the N-type well layer 84. The embedded channel layer 85 is a region (layer) of the same conductivity type as the conductivity type of the source region 64 and the drain region 65. That is, the embedded channel layer 85 is a region (layer) of the P-type similarly to the source region 64 and the drain region 65 doped with P-type impurities.

In the present embodiment, as described above, the channel region (embedded channel layer 85) of the first transistor M1 is disposed in the N-type well layer 84 below the gate insulation film 42 and between the source region 64 and the drain region 65. In the present embodiment, the channel region (embedded channel layer 85) of the first transistor M1 does not include the interface between the N-type well layer 84 and the gate insulation film 42. The impurity concentration of the channel region (embedded channel layer 85) of the first transistor M1 is higher than the impurity concentration of the N-type well layer 84. The second transistor M2 has a configuration similar to the configuration of the first transistor M1.

As described above, according to the operational amplifier 1 of the present embodiment, each of the transistors M1 and M2 of the differential pair 10 and each of the transistors M3 and M4 of the current mirror circuit 12 as an active load are embedded channel type MOSFETs. The impurity concentration in the channel region of each of these transistors is lower than the impurity concentration in the channel region of each of the transistor of the constant current source 11, the transistor of the reference current source 13, and the transistors of the plurality of transistors M5 to M9 and the transistor of the constant current source 21 of the back gate bias circuit 20. On the other hand, the plurality of transistors M5 to M9 and the transistor of the constant current source 21 of the back gate bias circuit 20 are surface channel type MOSFETs.

[Method for Manufacturing Transistor]

A method for manufacturing the first transistor M1, the third transistor M3, the sixth transistor M6, and the eighth transistor M8 will be described with reference to FIGS. 14A to 14C. In FIGS. 14A to 14M, it is assumed that the first transistor M1, the third transistor M3, the sixth transistor M6, and the eighth transistor M8 are formed adjacently to each other for convenience of explanation. The method for manufacturing the transistor of the present embodiment is different from the method for manufacturing the transistor of the first embodiment in the point of the well forming step. The well forming step is hereinafter chiefly described.

In the well forming step, the step of forming the high breakdown voltage N-type well layer 39 in each of the element formation regions 34 of the P-type epitaxial layer 31, and the step of forming the P-type drift layer 37 in each of the element isolation regions 35 of the P-type epitaxial layer 31 are similar to the corresponding steps in the first embodiment.

Figure 14A:
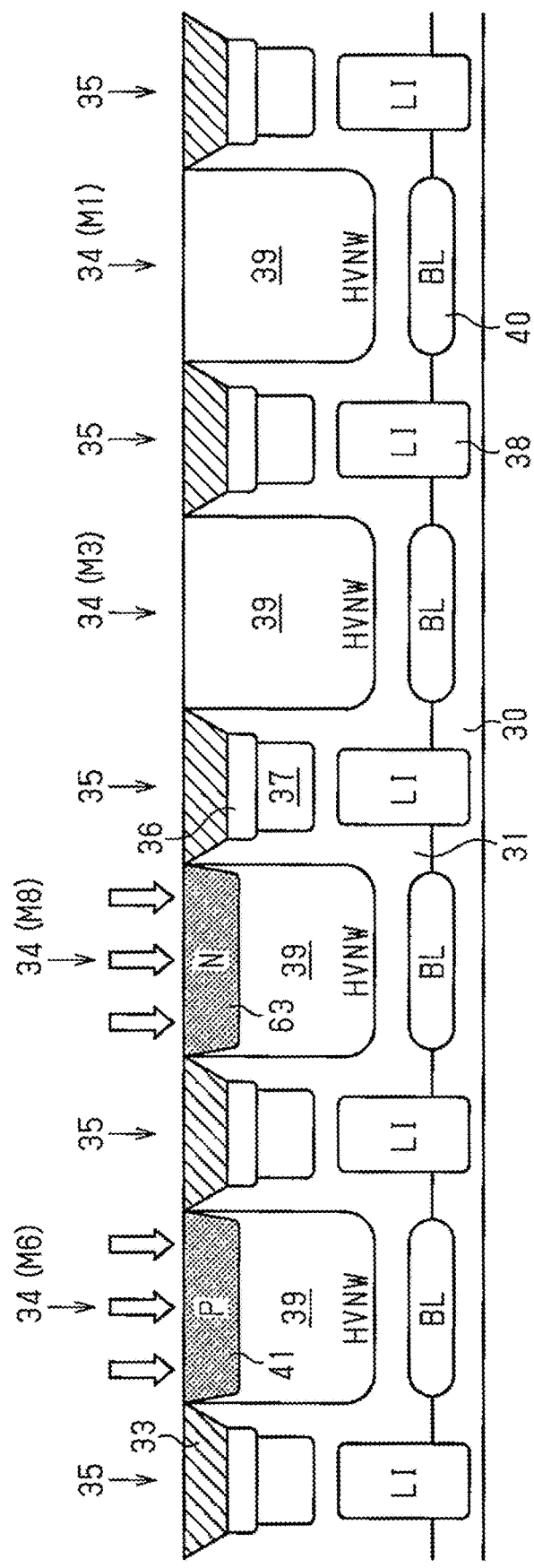
FIG. 14A is a cross-sectional view illustrating a manufacturing step of the first transistor, the third transistor, a sixth transistor, and an eighth transistor.

As shown in FIG. 14A, the P-type well layer 41 is formed in the surface layer portion of the N-type well layer 39 of the sixth transistor M6, while the N-type well layer 63 is formed in the surface layer portion of the eighth transistor M8. The method for forming the P-type well layer 41 and the N-type well layer 63 is similar to the corresponding method of the first embodiment. More specifically, impurity ions are implanted into the region where the sixth transistor M6 is formed in the silicon substrate 30 which is a semiconductor substrate, while ions are selectively implanted such that impurity ions are not implanted into the regions where the first transistor M1, the third transistor M3, and the eighth transistor M8 are formed to form a channel region in the region where the sixth transistor M6 is formed. Moreover, impurity ions are implanted into the region where the eighth transistor M8 is formed in the silicon substrate 30, while ions are selectively implanted such that impurity ions are not implanted into the regions where the first transistor M1, the third transistor M3, and the sixth transistor M6 are formed to form a channel region in the region where the eighth transistor M8 is formed.

As shown in FIG. 14B, the P-type well layer 82 is formed in the surface layer portion of the N-type well layer 39 of the third transistor M3, while the N-type well layer 84 is formed in the surface layer portion of the first transistor M1. More specifically, an ion implantation mask (not shown) having an opening through which the element formation region 34 of the third transistor M3 is exposed is formed in such a manner as to cover the element formation region 34 and the element isolation region 35 of each of the first transistor M1, the sixth transistor M6, and the eighth transistor M8. P-type impurity ions are implanted through the opening of the ion implantation mask. More specifically, impurity ions are implanted into the region where the third transistor M3 is formed in the silicon substrate 30 which is a semiconductor substrate, while ions are selectively implanted such that impurity ions are not implanted into the regions where the first transistor M1, the sixth transistor M6, and the eighth transistor M8 are formed to form a channel region in the region where the third transistor M3 is formed. For example, boron ions are adopted as the P-type impurity ions. Ion implantation is herein performed so that the impurity concentration of the P-type well layer 82 of the third transistor M3 becomes lower than the impurity concentration of the P-type well layer 41 of the sixth transistor M6. For example, ion implantation is performed so that the impurity concentration of the P-type well layer 82 of the third transistor M3 becomes about ½ or lower of the impurity concentration of the P-type well layer 41 of the sixth transistor M6. Preferably, ion implantation is performed so that the impurity concentration of the P-type well layer 82 of the third transistor M 3 becomes about ⅒ of the impurity concentration of the P-type well layer 41 of the sixth transistor M6.

Subsequently, an ion implantation mask (not shown) having an opening through which the element formation region 34 of the first transistor M1 is exposed is formed in such a manner as to cover the element formation region 34 and the element isolation region 35 of each of the third transistor M3, the sixth transistor M6, and the eighth transistor M8. N-type impurity ions are implanted through the opening of the ion implantation mask. More specifically, impurity ions are implanted into the region where the first transistor M1 is formed in the silicon substrate 30 which is a semiconductor substrate, while ions are selectively implanted such that impurity ions are not implanted into the regions where the third transistor M3, the sixth transistor M6, and the eighth transistor M8 are formed to form a channel region in the region where the first transistor M1 is formed. For example, arsenic ions and phosphorus ions are adopted as the N-type impurity ions. Ion implantation is herein performed so that the impurity concentration of the N-type well layer 84 of the first transistor M1 becomes lower than the impurity concentration of the N-type well layer 63 of the eighth transistor M8. For example, ion implantation is performed so that the impurity concentration of the N-type well layer 84 of the first transistor M1 becomes about ½ or lower of the impurity concentration of the N-type well layer 63 of the eighth transistor M8. Ion implantation is preferably performed so that the impurity concentration of the N-type well layer 84 of the first transistor M1 becomes about 1/10 of the impurity concentration of the N-type well layer 63 of the eighth transistor M8. In the present embodiment, the N-type well layer 84 is formed after the P-type well layer 82 is formed. However, the P-type well layer 82 may be formed after the N-type well layer 84 is formed.

Figure 14C:
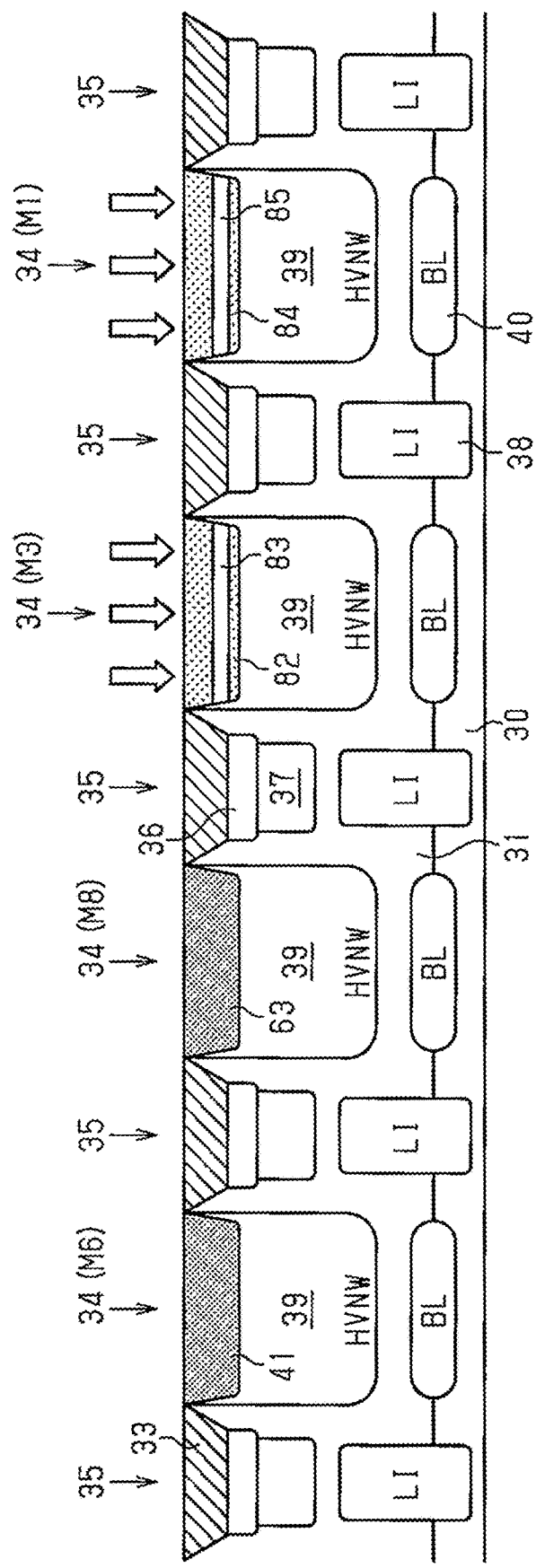
FIG. 14C is a cross-sectional view illustrating a step subsequent to the manufacturing step of the transistors shown in FIG. 14B.

As shown in FIG. 14C, the embedded channel layer 83 is formed in the N-type well layer 39 of the third transistor M3, while the embedded channel layer 85 is formed in the N-type well layer 39 of the first transistor M1. More specifically, an ion implantation mask (not shown) having an opening through which the element formation region 34 of the third transistor M3 is exposed is formed in such a manner as to cover the element formation region 34 and the element isolation region 35 of each of the first transistor M1, the sixth transistor M6, and the eighth transistor M8. N-type impurity ions are implanted through the opening of the ion implantation mask. For example, phosphorus ions are adopted as the N-type impurity ions. In this manner, the embedded channel layer 83 is formed. Subsequently, the ion implantation mask described above is removed after an ion implantation mask (not shown) having an opening through which the element formation regions 34 of the first transistor M1 is exposed is formed in such a manner as to cover the element formation region 34 and the element isolation region 35 of each of the third transistor M3, the sixth transistor M6, and the eighth transistor M8. P-type impurity ions are implanted through the opening of the ion implantation mask. For example, $BF_2$ is adopted as the P-type impurity ions. In this manner, the embedded channel layer 85 is formed. In the present embodiment, the embedded channel layer 85 is formed after the embedded channel layer 83 is formed. However, the embedded channel layer 83 may be formed after the embedded channel layer 85 is formed.

Thereafter, the ion implantation mask is removed. Then, similarly to the first embodiment, the first transistor M1, the third transistor M3, the sixth transistor M6, and the eighth transistor M8 are manufactured through the gate forming step, the source/drain forming step, and the wiring step.

The second transistor M2 is manufactured in a manner similar to the manner for manufacturing the first transistor M1, while the fourth transistor M4 is manufactured in a manner similar to the manner for manufacturing the third transistor M3. The seventh transistor M7 is manufactured in a manner similar to the manner for manufacturing the sixth transistor M6, while the transistors of the constant current sources 11 and 21, and the transistor of the reference current source 13, the fifth transistor M5, and the ninth transistor M9 are manufactured in a manner similar to the manner for manufacturing the eighth transistor M8. The first transistor M1 and the second transistor M2 are simultaneously formed, while the third transistor M3 and the fourth transistor M4 are simultaneously formed. The sixth transistor M6 and the seventh transistor M7 are simultaneously formed. The transistors of the constant current sources 11 and 21, and the transistor of the reference current source 13, and the fifth transistor M5, the eighth transistor M8, and the ninth transistor M9 are simultaneously formed. According to the present embodiment, effects similar to those of the first embodiment and the second embodiment can be obtained.

Modifications of Third Embodiment

The operational amplifier 1 of the present embodiment can be modified in following manners.

The operational amplifier 1 of the present embodiment is applicable to the operational amplifier 1 in FIG. 9. According to the present embodiment, the transistor of the constant current source 11, the transistor of the reference current source 13, and the transistors of the transistors M5 to M9 and the transistor of the constant current source 21 configuring the back gate bias circuit 20, each transistor being not easily affected by 1/f noise of the output signal Sout of the operational amplifier 1 among the transistors configuring the operational amplifier 1 in FIG. 9, are the surface channel type MOSFETs. The first transistor M1 to the fourth transistor M4, which are easily affected by 1/f noise of the output signal Sout of the operational amplifier 1 among the transistors configuring the operational amplifier 1 in FIG. 9, are the embedded channel type MOSFETs. The impurity concentration in the channel region of each of the first transistor M1 to the fourth transistor M4 among the transistors configuring the operational amplifier 1 in FIG. 9 is lower than the impurity concentration of each of the transistor of the constant current source 11, the transistor of the reference current source 13, and the transistors of the plurality of transistors M5 to M9 and the transistor of the constant current source 21 of the back gate bias circuit 20 among the transistors configuring the operational amplifier 1 in FIG. 9.

Fourth Embodiment

An operational amplifier 1A according to a fourth embodiment will be described with reference to FIG. 15.

The operational amplifier 1A of the present embodiment is a two-stage amplifier circuit, and includes the reference current source 13, the back gate bias circuit 20, a differential amplifier stage 90, and an output stage 93. The operational amplifier 1A amplifies a potential difference between the inverting input terminal INN and a noninverting input terminal INP, and outputs the output signal Sout from an output terminal OUT. The operational amplifier 1A is integrated on one semiconductor substrate. The differential amplifier stage 90 includes the differential pair 10, the constant current source 11, a cascode current mirror circuit 91, and a bias circuit 92. The differential pair 10, the constant current source 11, the reference current source 13, and the back gate bias circuit 20 have configurations similar to the configurations of the differential pair 10, the constant current source 11, the reference current source 13, and the back gate bias circuit 20 of the first embodiment. According to the present embodiment, the back gate bias circuit 20 is connected to the first power supply line 2, and the back gates of the first transistor M1 and the second transistor M2, similarly to the first embodiment.

The cascode current mirror circuit 91 is an active load connected to the differential pair 10. The cascode current mirror circuit 91 is configured by two stacked transistors of the same type, and includes a tenth transistor M10 to a thirteenth transistor M13. In the present embodiment, the tenth transistor M10 to the thirteenth transistor M13 are configured by N-channel MOSFETs. In particular, each of the tenth transistor M10 and the eleventh transistor M11 has an enhancement type structure. The tenth transistor M10 corresponds to the "fifth transistor", the eleventh transistor M11 corresponds to the "sixth transistor", the twelfth transistor M12 corresponds to the "seventh transistor", and the thirteenth transistor M13 corresponds to the "eighth transistor".

The tenth transistor M10 is provided in series with the first transistor M1. More specifically, the tenth transistor M10 is provided between the drain of the first transistor M1 and the second power supply line 3. The drain of the tenth transistor M10 is connected to the drain of the first transistor M1, while the source of the tenth transistor M10 is connected to the second power supply line 3. The eleventh transistor M11 is provided in series with the second transistor M2. More specifically, the eleventh transistor M11 is provided between the drain of the second transistor M2 and the second power supply line 3. The drain of the eleventh transistor M11 is connected to the drain of the second transistor M2, while the source of the eleventh transistor M11 is connected to the second power supply line 3. The twelfth transistor M12 is vertically stacked on the tenth transistor M10, while the thirteenth transistor M13 is vertically stacked on the eleventh transistor M11. More specifically, the source of the twelfth transistor M12 is connected to the drain of the tenth transistor M10, while the source of the thirteenth transistor M13 is connected to the drain of the eleventh transistor M11. The gates of the twelfth transistor M12 and the thirteenth transistor M13 are appropriately biased by a bias voltage Vbn1 input from a first bias circuit (not shown). The gates of the tenth transistor M10 and the eleventh transistor M11 are connected to the drain of the twelfth transistor M12. When the first transistor M1 and the second transistor M2 are of depletion-type, input full swing (rail-to-rail) can be implemented by a circuit configuration shown in FIG. 15.

The bias circuit 92 is a constant current circuit that maintains the cascode current mirror circuit 91 in an appropriate biased state. In one example, the bias circuit 92 is configured by two stacked transistors of the same type, and includes a fourteenth transistor M14 to a seventeenth transistor M17. In the present embodiment, the fourteenth transistor M14 to the seventeenth transistor M17 are configured by P-channel MOSFETs. In particular, each of the fourteenth transistor M14 and the fifteenth transistor M15 has an enhancement type structure.

The fourteenth transistor M14 and the fifteenth transistor M15 configure a current source for generating a predetermined current. The source of the fourteenth transistor M14 and the source of the fifteenth transistor M15 are connected to the first power supply line 2, the gate of the fourteenth transistor M14 and the gate of the fifteenth transistor M15 are connected in common to a second bias circuit (not shown). The gates of the fourteenth transistor M14 and the fifteenth transistor M15 are appropriately biased by a bias voltage Vbp1 input from the second bias circuit. The sixteenth transistor M16 is vertically stacked on the fourteenth transistor M14, while the seventeenth transistor M17 is vertically stacked on the fifteenth transistor M15. More specifically, the source of the sixteenth transistor M16 is connected to the drain of the fourteenth transistor M14, while the source of the seventeenth transistor M17 is connected to the drain of the fifteenth transistor M15. The drain of the sixteenth transistor M16 is connected to the drain of the twelfth transistor M12, while the drain of the seventeenth transistor M17 is connected to the drain of the thirteenth transistor M13. The drain of the seventeenth transistor M17 is connected to the output stage 93. The gate of the sixteenth transistor M16 and the gate of the seventeenth transistor M17 are connected in common to a third bias circuit (not shown). The gates of the sixteenth transistor M16 and the seventeenth transistor M17 are appropriately biased by a bias voltage Vbp2 input from the third bias circuit.

The output stage 93 is connected to the output terminal OUT to invert and amplify the output signal Sout of the cascode current mirror circuit 91, and output the inverted and amplified signal Sout to the output terminal OUT. An example of the output stage 93 is a source-grounded circuit. More specifically, the output stage 93 includes two transistors connected in series between the first power supply line 2 and the second power supply line 3. The two transistors are a P-channel MOSFET and an N-channel MOSFET. A capacitor 94 for phase compensation is connected to the output stage 93.

The back gate bias circuit 20 is connected to the first power supply line 2, and the common back gate of the first transistor M1 and the second transistor M2 configuring the differential pair 10. The back gate bias circuit 20 of the present embodiment is similar to the back gate bias circuit 20 of the first embodiment (see FIG. 2).

Accordingly, effects similar to the effects of (1-1) to (1-4) of the first embodiment can be obtained.

Furthermore, according to the present embodiment, the impurity concentration in channel regions of some transistors among transistors configuring the operational amplifier 1A is made lower than the impurity concentration in channel regions of the other transistors configuring the operational amplifier 1A for further reduction of 1/f noise of the output signal Sout of the output stage 93. That is, the plurality of transistors configuring the operational amplifier 1A include high concentration transistors whose impurity concentration in the channel region is a first concentration, and low concentration transistors whose impurity concentration in the channel region is a second concentration lower than the first concentration. More specifically, the impurity concentration in the channel region of the transistors easily affected by 1/f noise of the output signal Sout is made lower than the impurity concentration in the channel region of the transistors not easily affected by 1/f noise of the output signal Sout. That is, rather than high concentration transistors, low concentration transistors are used as transistors more easily affected by 1/f noise of the output signal Sout among the plurality of transistors. On the other hand, rather than low concentration transistors, high concentration transistors are used as transistors not easily affected by 1/f noise of the output signal Sout among the plurality of transistors. Specifically, a section easily affected by 1/f noise of the output signal Sout in the operational amplifier 1A includes the differential pair 10 of the differential amplifier stage 90, a part of the bias circuit 92, and a part of the cascode current mirror circuit 91. A section not easily affected by the 1/f noise of the output signal Sout in the operational amplifier 1A includes the constant current source 11, the reference current source 13, the back gate bias circuit 20, the other part of the bias circuit 92, the other part of the cascode current mirror circuit 91, and the output stage 93.

According to the present embodiment, the impurity concentration in the channel region of each of the transistors of the differential pair 10, a part of the bias circuit 92, and a part of the cascode current mirror circuit 91 is made lower than the impurity concentration in the channel region of each of the transistors of the constant current source 11, the reference current source 13, and the back gate bias circuit 20, the other part of the bias circuit 92, the other part of the cascode current mirror circuit 91, and the output stage 93. That is, each of the transistors configuring the differential pair 10, a part of the bias circuit 92, and a part of the cascode current mirror circuit 91 is a low concentration transistor, while each of the transistors configuring the constant current source 11, the reference current source 13, and the back gate bias circuit 20, the other part of the bias circuit 92, the other part of the cascode current mirror circuit 91, and the output stage 93 is a high concentration transistor. Specifically, the impurity concentration in the channel region of each of the first transistor M1, the second transistor M2, the tenth transistor M10, the eleventh transistor M11, the fourteenth transistor M14, and the fifteenth transistor M15 is made lower than the impurity concentration in the channel region of each of the transistors of the constant current sources 11 and 21, the transistor of the reference current source 13, the fifth transistor M5, the sixth transistor M6, the seventh transistor M7, the eighth transistor M8, the ninth transistor M9, the twelfth transistor M12, the thirteenth transistor M13, the sixteenth transistor M16, the seventeenth transistor M17, and the transistor of the output stage 93. That is, each of the transistors M1, M2, M10, M11, M14, and M15 is a low concentration transistor, while each of the transistors of the constant current sources 11 and 21, the transistor of the reference current source 13, the transistor of the output stage 93, and the transistors M5 and M6, M7, M8, M9, M12, M13, M16 and M17 is a high concentration transistor.

The impurity concentration in the channel region of each of the transistors M1, M2, M10, M11, M14, M15 is preferably about ½ or lower of the impurity concentration in the channel region of each of the transistors of the constant current sources 11, 21, the transistor of the reference current source 13, the transistor of the output stage 93, and the transistors M5, M6, M7, M8, M12, M13, M16, and M17. According to the present embodiment, the impurity concentration in the channel region of each of the transistors M1, M2, M10, M11, M14, M15 is about ⅒ of the impurity concentration in the channel region of each of the transistors of the constant current sources 11, 21, the transistor of the reference current source 13, the transistor of the output stage 93, and the transistors M5, M6, M7, M8, M12, M13, M16, and M17. Each of the transistors of the constant current sources 11 and 21, the transistor of the reference current source 13, the transistor of the output stage 93, and the transistors M5, M6, M7, M8, M9, M12, M13, M16 and M17 is a surface channel type MOSFET.

The structure and manufacturing method of the N-channel MOSFET and the P-channel MOSFET of the transistors configuring the operational amplifier 1A are similar to the structure and manufacturing method of the N-channel MOSFET and the P-channel MOSFET of the first transistor M1 and the like of the first embodiment.

According to the present embodiment, following effects can be obtained in addition to the effects (1-1) to (1-4) of the first embodiment.

(4-1) The impurity concentration of each of the channel regions of the tenth transistor M10 and the eleventh transistor M11 configuring the current source of the cascode current mirror circuit 91 is lower than the impurity concentration in the channel region of each of the sixth transistor M6 and the seventh transistor M7 configuring the back gate bias circuit 20. According to this configuration, fluctuations of mobility, and fluctuations of the drain current can be reduced by decreasing the impurity concentration in the channel region of each of the transistors M10 and M11 configuring the current source of the cascode current mirror circuit 91 and easily affected by 1/f noise of the output signal Sout of the operational amplifier 1A. Therefore, 1/f noise of the output signal Sout of the operational amplifier 1A can effectively decrease.

(4-2) The impurity concentration of each of the channel regions of the fourteenth transistor M14 and the fifteenth transistor M15 configuring the current source of the bias circuit 92 is lower than the impurity concentration in the channel region of each of the fifth transistor M5, the eighth transistor M8, and the ninth transistor M9 configuring the back gate bias circuit 20. According to this configuration, fluctuations of mobility, and fluctuations of the drain current can be reduced by decreasing the impurity concentration of the N-type well layer 70 of each of the transistors M14 and M15 configuring the current source of the bias circuit 92 and easily affected by 1/f noise of the output signal Sout of the operational amplifier 1A. Therefore, 1/f noise of the output signal Sout of the operational amplifier 1A can effectively decrease.

(4-3) The impurity concentration in the channel region of each of the first transistor M1 and the second transistor M2, which are P-channel MOSFETs configuring the differential pair 10, is equal to the impurity concentration in the channel region of each of the fourteenth transistor M14 and the fifteenth transistor M15, which are P-channel MOSFETs configuring the current source of the bias circuit 92. According to this configuration, the step of forming the N-type well layer 70 of each of the transistors M14 and M15 configuring the current source of the bias circuit 92, and the step of forming the N-type well layer 70 of each of the transistor M1 and M2 configuring the differential pair 10 can be collectively performed. Accordingly, the step of manufacturing the operational amplifier 1A can be simplified.

(4-4) The impurity concentration in the channel region of each of the transistor of the constant current source 11, the fifth transistor M5, the eighth transistor M8, and the ninth transistor M9, which are P-channel MOSFETs configuring the back gate bias circuit 20, is equal to the impurity concentration in the channel region of the sixteenth transistor M16 and the seventeenth transistor M17, which are P-channel MOSFETs configuring the bias circuit 92. According to this configuration, the step of forming the N-type well layer 63 of the transistor of the constant current source 11, the step of forming the N-type well layer 63 of each of the transistors M5, M8, M9 of the back gate bias circuit 20, and the step of forming the N-type well layer 63 of each of the transistors M16 and M17 of the bias circuit 92 can be collectively performed. Accordingly, the step of manufacturing the operational amplifier 1A can be simplified.

(4-5) The impurity concentration in the channel region of each of the sixth transistor M6 and the seventh transistor M7 which are N-channel MOSFETs configuring the back gate bias circuit 20, and the transistor of the constant current source 21 is equal to the impurity concentration in the channel region of each of the twelfth transistor M12 and the thirteenth transistor M13 which are N-channel MOSFETs configuring the cascode current mirror circuit 91. According to this configuration, the step of forming the P-type well layer 41 of the transistors M6 and M7 of the back gate bias circuit 20, and the transistor of the constant current source 21, and the step of forming the P-type well layer 41 of the transistors M12 and M13 of the cascode current mirror circuit 91 can be collectively performed. Accordingly, the step of manufacturing the operational amplifier 1A can be simplified.

Modifications of Fourth Embodiment

The operational amplifier 1A of the present embodiment can be modified in following manners.

Figure 15:
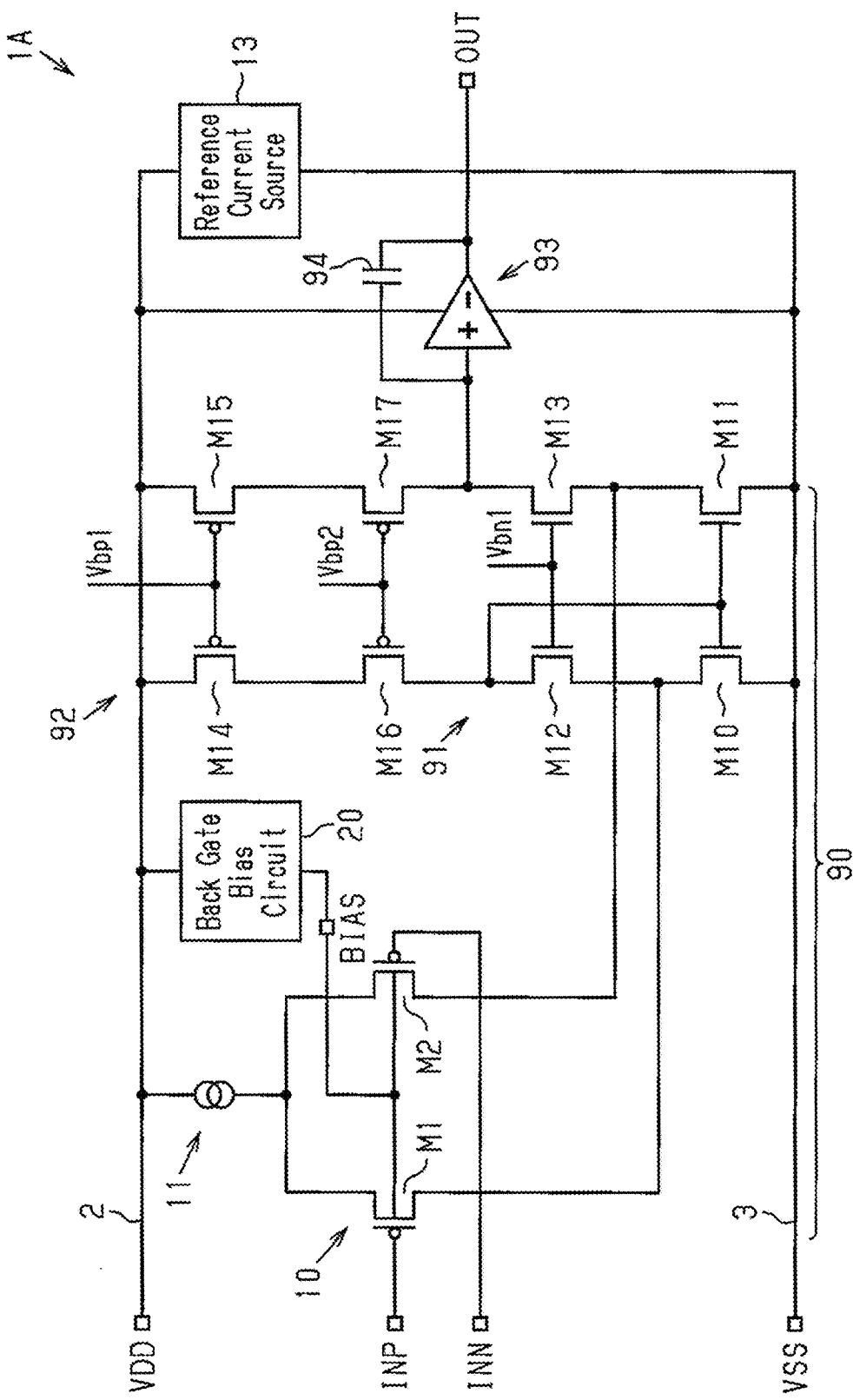
FIG. 15 is a circuit diagram of an operational amplifier according to a fourth embodiment.
Figure 16:
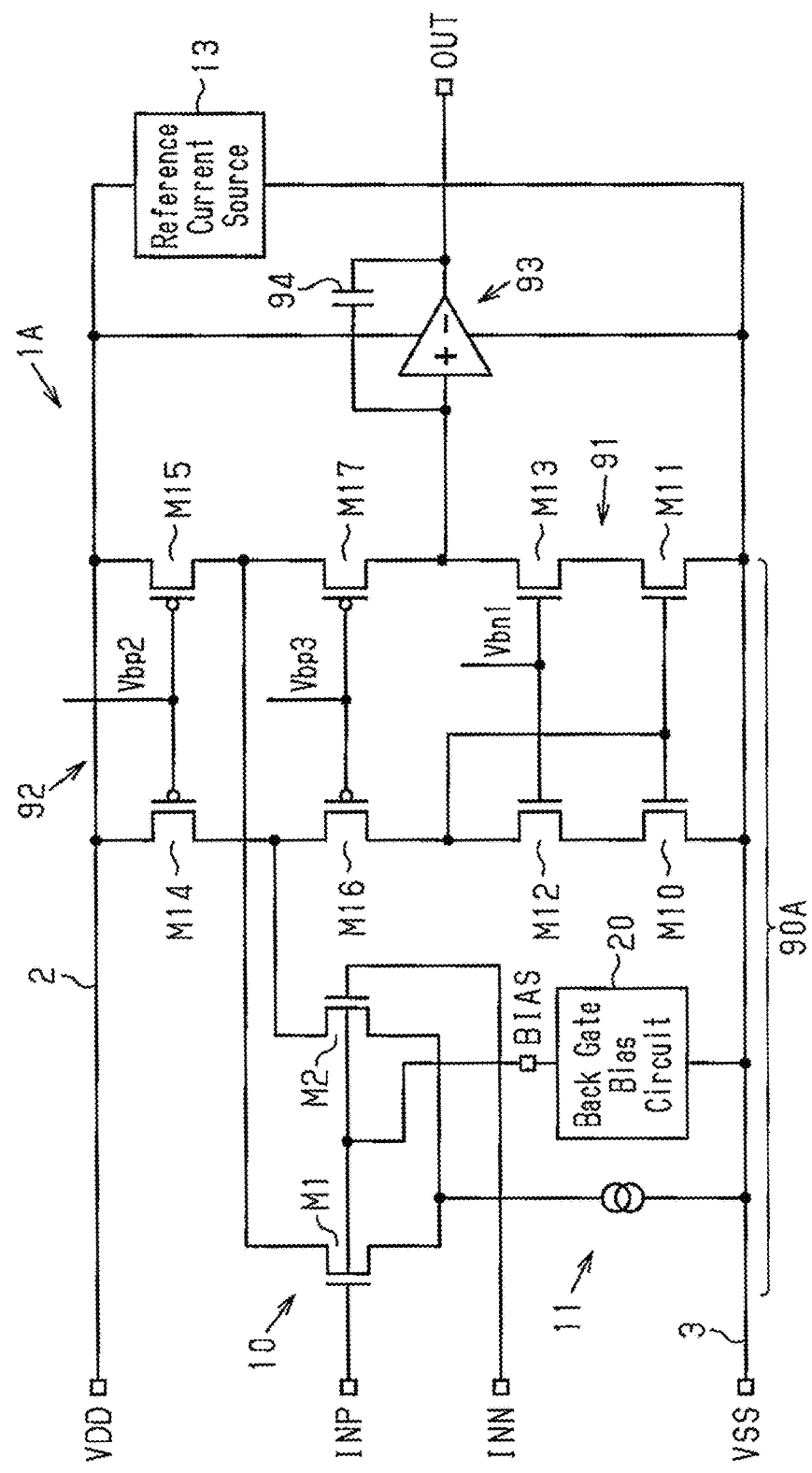
FIG. 16 is a circuit diagram of an operational amplifier according to a modification of the fourth embodiment.

The operational amplifier 1A shown in FIG. 15 can be modified into the operational amplifier 1A including a differential amplifier stage 90A as shown in FIG. 16. The operational amplifier 1A in FIG. 16 is chiefly different from the operational amplifier 1A of FIG. 15 in the conductivity type of the channel region and the connection configuration of the back gate bias circuit 20 in each of the transistors configuring the operational amplifier 1A.

The first transistor M1 and the second transistor M2 of the differential pair 10, the transistor of the constant current source 11, and the transistor of the reference current source 13 are N-channel MOSFETs. The drains of the first transistor M1 and the second transistor M2 are connected to the bias circuit 92. More specifically, the drain of the first transistor M1 is connected to the drain of the eighth transistor M8, while the drain of the second transistor M2 is connected to the drain of the ninth transistor M9. The source of the third transistor M3 is connected to the second power supply line 3, while the drain of the third transistor M3 is connected to the sources of the first transistor M1 and the second transistor M2. A bias voltage Vbn2 is input from a first bias circuit (not shown) to the transistor of the constant current source 11. Each of the first transistor M1, the second transistor M2, the third transistor M3, and the fourth transistor M4 may have either a depletion-type or an enhancement type structure. In FIG. 16, each of the first transistor M1, the second transistor M2, the third transistor M3, and the fourth transistor M4 has an enhancement type structure. When the first transistor M1 and the second transistor M2 are of depletion-type, input full swing (rail-to-rail) can be implemented by a circuit configuration shown in FIG. 16.

The back gate bias circuit 20 is connected to the common back gate of the first transistor M1 and the second transistor M2, and to the second power supply line 3. The back gate bias circuit 20 applies the bias voltage VB, which is closer to the second power supply voltage VSS than the source potentials of the first transistor M1 and the second transistor M2, to the back gates of the first transistor M1 and the second transistor M2. In other words, the back gate bias circuit 20 applies the bias voltage VB, which is closer to the second power supply voltage VSS than an intermediate voltage between the source potentials of the first transistor M1 and the second transistor M2 and the second power supply voltage VSS, to the back gates of the first transistor M1 and the second transistor M2. That is, the back gate bias circuit 20 applies, to the back gates of the first transistor M1 and the second transistor M2, the bias voltage VB which increases the back gate-to-source voltage VBS. As a result, the back gate-to-source voltage VBS becomes a voltage close to the back gate-to-source voltage VBSH. The bias voltage VB is preferably lower than the second power supply voltage VSS. It is preferable that the bias voltage VB be a voltage within a predetermined range including the second power supply voltage VSS and excluding a voltage equal to the second power supply voltage VSS. In one example, it is preferable that the bias voltage VB be a voltage within ±20% of the second power supply voltage VSS and excluding a voltage equal to the second power supply voltage VSS. In this configuration, the transconductance gm12 of each of the first transistor M1 and the second transistor M2 increases. Accordingly, noise of the output signal Sout of the operational amplifier 1 can be reduced.

In the operational amplifier 1A in FIG. 16, similarly to the operational amplifier 1A in FIG. 15, the impurity concentrations of the P-type well layer 62 and the N-type well layer 70 of each of the transistors M1, M2, M10, M11, M14, and M15 is made lower than the impurity concentrations of the P-type well layer 41 and the N-type well layer 63 of each of the transistors of the constant current sources 11 and 21, the transistor of the reference current source 13, the transistor of the output stage 93, and the transistors M5, M6, M7, M8, M9, M12, M13, M16, and M17. Accordingly, effects similar to the effects (4-1) to (4-4) of the operational amplifier 1A in FIG. 15 can be obtained by the operational amplifier 1A in FIG. 16.

Instead of lowering the impurity concentration in the channel region of each of the transistors M1, M2, M10, M11, M14, and M15 in the operational amplifier 1A shown in FIGS. 15 and 16, the embedded channel type MOSFET such as the transistors M1 to M4 of the second embodiment may be adopted. In this case, effects similar to the effects of the second embodiment can be obtained. Any one or two of the pair of transistors M1 and M2 configuring the differential pair 10, the pair of transistors M10 and M11 configuring the current source of the cascode current mirror circuit 91, and the pair of the transistors M14 and M15 configuring the current source of the bias circuit 92 may be changed to the embedded channel type MOSFETs of the second embodiment.

In addition to lowering the impurity concentration in the channel region of each of the transistors M1, M2, M10, M11, M14, and M15 in the operational amplifier 1A shown in FIGS. 15 and 16, embedded channel type MOSFETs may be adopted. That is, each of the transistors M1, M2, M10, M11, M14, and M15 may have a structure similar to the structure of the transistors M1 to M4 of the third embodiment. In this case, effects similar to the effects of the third embodiment can be obtained. Any one or two of the pair of transistors M1 and M2 configuring the differential pair 10 in the operational amplifier 1A shown in FIGS. 15 and 16, the pair of transistors M10 and M11 configuring the current source of the cascode current mirror circuit 91, and the pair of the transistors M14 and M15 configuring the current source of the bias circuit 92 may be changed to structures similar to the structures of the transistors M1 to M4 of the third embodiment. Furthermore, any one or two of the pair of transistors M1 and M2 configuring the differential pair 10 in the operational amplifier 1A shown in FIGS. 15 and 16, the pair of transistors M10 and M11 configuring the current source of the cascode current mirror circuit 91, and the pair of the transistors M14 and M15 configuring the current source of the bias circuit 92 may be changed to structures similar to the structures of the embedded channel type MOSFETs of the second embodiment or the transistors M1 to M4 of the third embodiment. In short, the operational amplifier 1A shown in FIGS. 15 and 16 may have a configuration which includes a mixture of structures similar to the structures of the low concentration transistors of the first embodiment, the embedded channel type MOSFETs of the second embodiment, and the transistors M1 to M4 of the third embodiment.

Fifth Embodiment

An operational amplifier 1B according to a fifth embodiment will be described with reference to FIG. 17A. The operational amplifier 1B of the present embodiment is different from the operational amplifier 1 of the first embodiment in that a step-down circuit 100, which is an example of a voltage conversion circuit, and the output stage 93 and the capacitor 94 of the fourth embodiment are added.

Figure 17A:
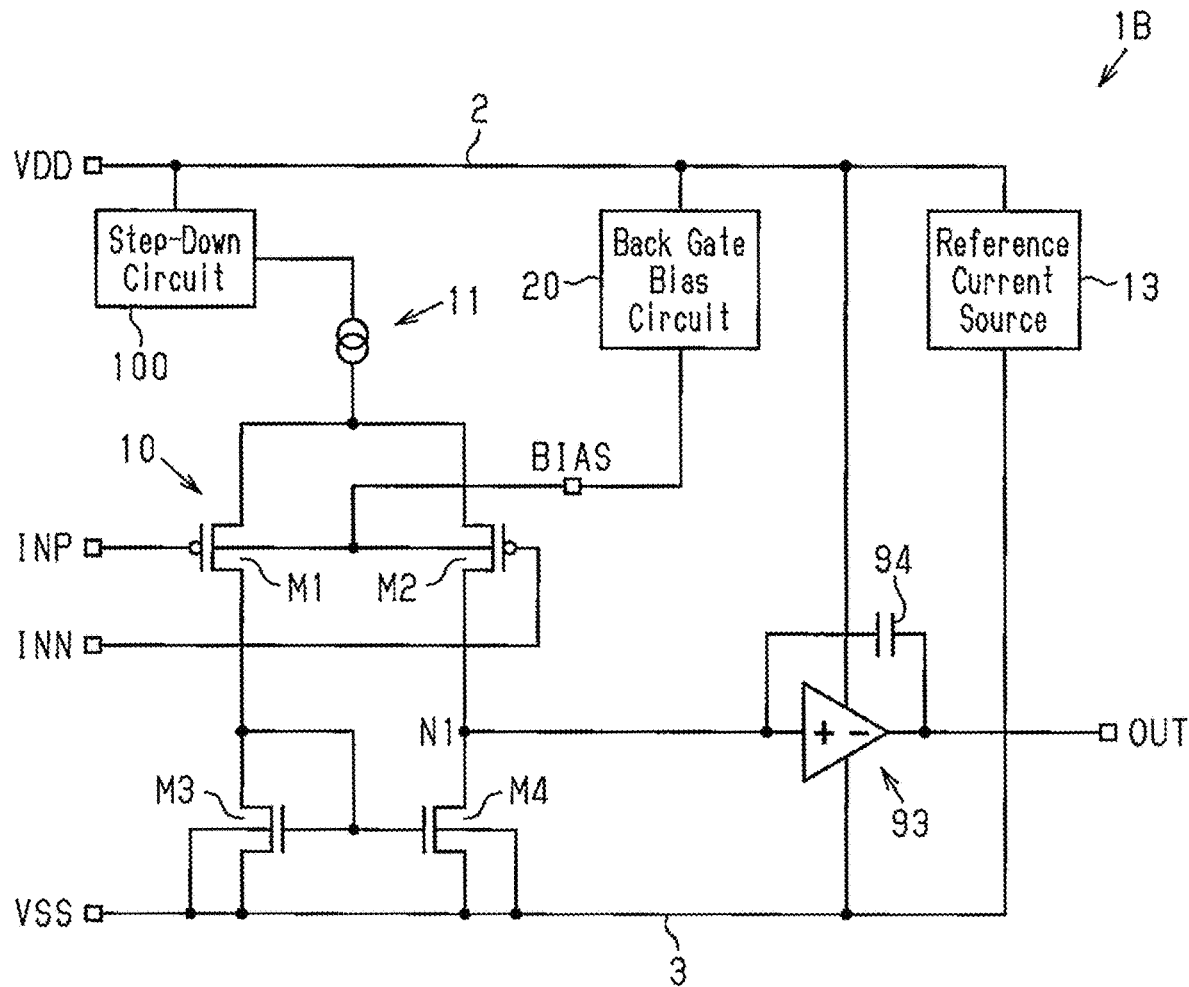
FIG. 17A is a circuit diagram of an operational amplifier as an example of a differential circuit of a fifth embodiment.

As shown in FIG. 17A, the output stage 93 is connected to a node N1 between the drain of the second transistor M2 and the drain of the fourth transistor M4. The output stage 93 is connected to the output terminal OUT, inverts and amplifies the output signal Sout of the node N1, and outputs the output signal Sout to the output terminal OUT. An example of the output stage 93 is a source-grounded circuit. A configuration of the output stage 93 is identical to the configuration of the output stage 93 of the fourth embodiment.

The step-down circuit 100 is provided between the first power supply line 2 and the differential pair 10, more specifically between the first power supply line 2 and the constant current source 11. The step-down circuit 100 steps down the first power supply voltage VDD of the first power supply line 2 to a predetermined voltage, and applies the stepped down first power supply voltage VDD to the constant current source 11.

Figure 17B:
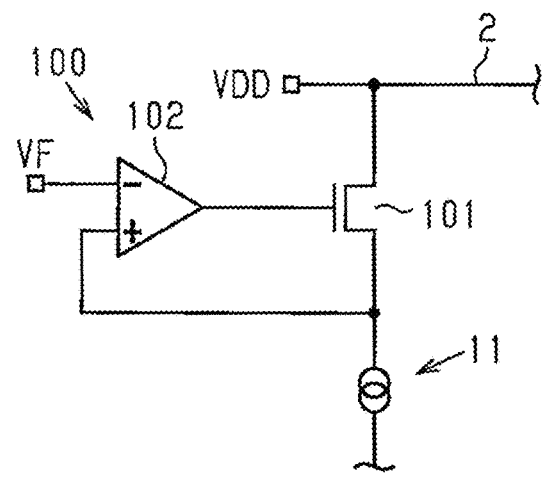
FIG. 17B is a circuit diagram of a step-down circuit in the differential circuit of the fifth embodiment.

As shown in FIG. 17B, the step-down circuit 100 is a series regulator type semiconductor step-down circuit, for example. The step-down circuit 100 includes a transistor 101 and an operational amplifier 102. The transistor 101 is an N-channel MOSFET. The drain of the transistor 101 is connected to the first power supply line 2, while the source of the transistor 101 is connected to the constant current source 11. The gate of the transistor 101 is connected to the output terminal of the operational amplifier 102. A noninverting input terminal of the operational amplifier 102 is connected to the source of the operational amplifier 102. A predetermined voltage VF lower than the first power supply voltage VDD is applied to an inverting input terminal of the operational amplifier 102. Accordingly, the step-down circuit 100 operates in such a manner as to apply a voltage VF to the constant current source 11.

The back gate bias circuit 20 is connected to the first power supply line 2, and the common back gate of the first transistor M1 and the second transistor M2 configuring the differential pair 10. The back gate bias circuit 20 of the present embodiment is similar to the back gate bias circuit 20 of the first embodiment (see FIG. 2).

Accordingly, effects similar to the effects (1-1) to (1-4) of the first embodiment can be obtained.

An operation of the present embodiment will be described.

The back gate bias circuit 20 applies the bias voltage VB, which is closer to the first power supply voltage VDD than the source potentials of the first transistor M1 and the second transistor M2, to the common back gate of the first transistor M1 and the second transistor M2. Furthermore, the step-down circuit 100 applies the voltage VF lower than the first power supply voltage VDD to the constant current source 11. Accordingly, source potentials of the first transistor M1 and the second transistor M2 become lower in comparison with a case where the first power supply voltage VDD is applied to the constant current source 11. In this manner, the back gate-to-source voltage VBS is raised by the back gate bias circuit 20 and the step-down circuit 100. According to the present embodiment, the back gate-to-source voltage VBS is higher than the back gate-to-source voltage VBSH. In this case, as can be seen from FIG. 3, the transconductance gm12 of each of the first transistor M1 and the second transistor M2 increases. Accordingly, noise of the output signal Sout decreases.

The voltage VF of the step-down circuit 100 and the bias voltage VB of the back gate bias circuit 20 are preferably higher than the first power supply voltage VDD within a range where the parasitic diodes of the first transistor M1 and the second transistor M2 are not turned on. That is, the bias voltage VB is preferably lower than a voltage at which parasitic diodes of the first transistor M1 and the second transistor M2 are turned on. An example of the voltage at which the parasitic diodes of the first transistor M1 and the second transistor M2 are turned on is a voltage 0.5 V to 0.6 V higher than the first power supply voltage VDD (VDD+ 0.5 to 0.6). The voltage VF of the step-down circuit 100 and the bias voltage VB of the back gate bias circuit 20 are preferably controlled such that the back gate-to-source voltage VBS becomes lower than or equal to a voltage 20% higher than the back gate-to-source voltage VBSH.

Further, each transistor of the operational amplifier 1B has the same configuration and manufacturing method as the configuration and manufacturing method of each transistor of the operational amplifier 1 of the first embodiment. Accordingly, effects similar to the effects (1-5) to (1-8) of the first embodiment can be obtained.

According to the present embodiment, following effects are achievable.

(5-1) The operational amplifier 1B includes the step-down circuit 100 and the back gate bias circuit 20. In this case, the back gate-to-source voltage VBS can be raised by the voltage VF of the step-down circuit 100 and the bias voltage VB of the back gate bias circuit 20. Accordingly, noise of the output signal Sout of the operational amplifier 1B can be reduced. In addition, the magnitude of the back gate-to-source voltage VBS can be controlled by two voltages of the voltage VF of the step-down circuit 100 and the bias voltage VB of the back gate bias circuit 20. Accordingly, the back gate-to-source voltage VBS can be easily raised.

Modifications of Fifth Embodiment

The operational amplifier 1B of the present embodiment can be modified in following manners.

Figure 18:
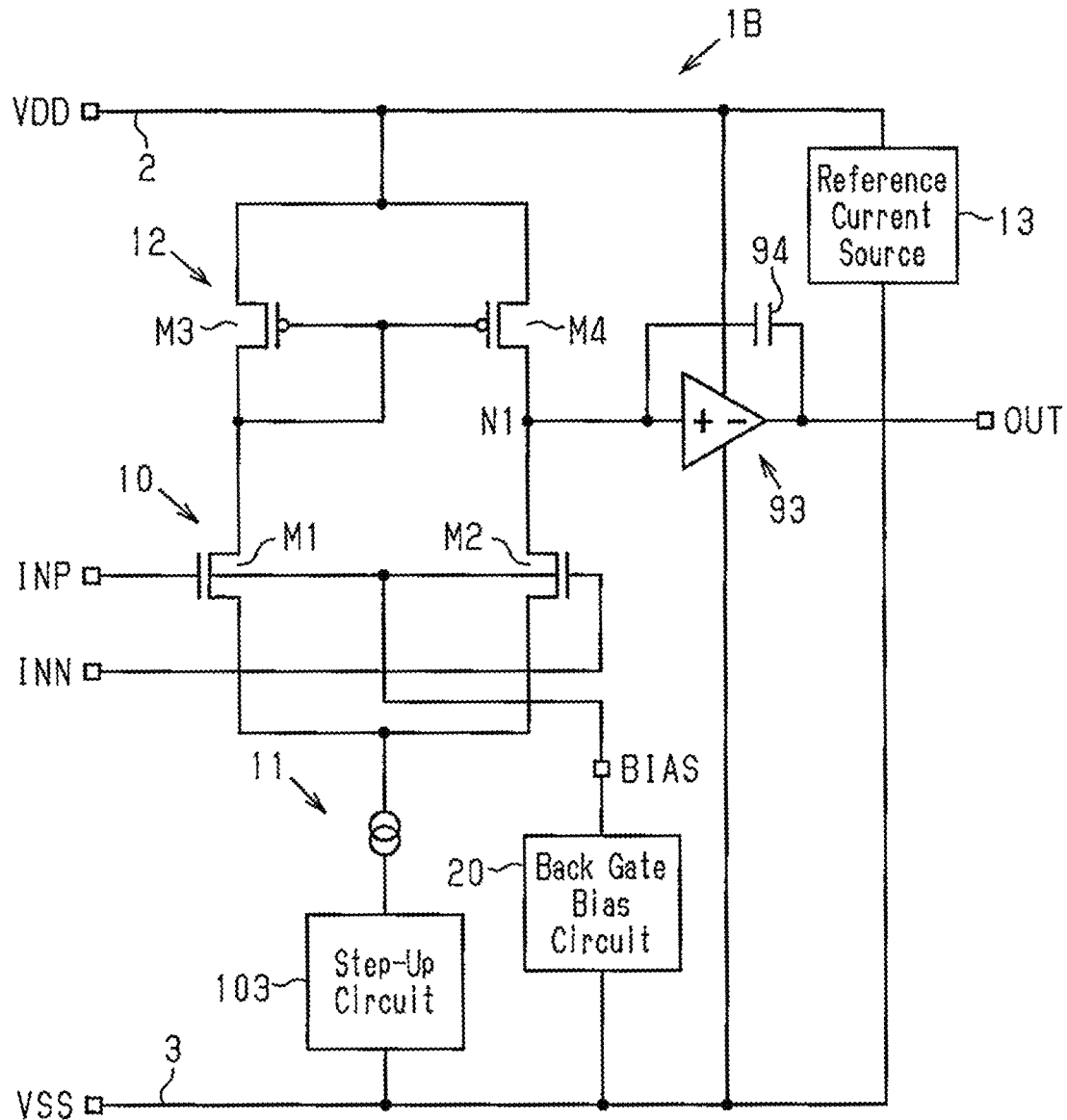
FIG. 18 is a circuit diagram of an operational amplifier according to a modification of the fifth embodiment.

The operational amplifier 1B shown in FIG. 17A can be modified into the operational amplifier 1B shown in FIG. 18. The operational amplifier 1B in FIG. 18 is different from the operational amplifier 1B shown in FIG. 17A in the point of the conductivity type of the transistors configuring the operational amplifier 1B. Moreover, the operational amplifier 1B shown in FIG. 18 is different from the operational amplifier 1B shown in FIG. 17A in that a step-up circuit 103, which is an example of a voltage conversion circuit, is provided instead of the step-down circuit 100.

The first transistor M1 and the second transistor M2 of the differential pair 10, the transistor of the constant current source 11, and the transistor of the reference current source 13 are N-channel MOSFETs. The source of the transistor of the constant current source 11 is connected to the second power supply line 3, while the drain of the transistor of the constant current source 11 is connected to the sources of the first transistor M1 and the second transistor M2.

The third transistor M3 and the fourth transistor M4 of the current mirror circuit 12 are P-channel MOSFETs. The sources of the third transistor M3 and the fourth transistor M4 are connected to the first power supply line 2, the drain of the third transistor M3 is connected to the drain of the first transistor M1, the drain of the fourth transistor M4 is connected to the drain of the second transistor M2.

Similarly to the operational amplifier 1B in FIG. 17A, the impurity concentration in the channel region of each of the first transistor M1 to the fourth transistor M4 according to the operational amplifier 1B in FIG. 18 is made lower than the impurity concentration in the channel region of each of the transistor of the constant current source 11, the transistor of the reference current source 13, and the plurality of transistors of the gate bias circuit 20. Effects similar to the effects of the operational amplifier 1B in FIG. 17A can also be obtained by the operational amplifier 1B in FIG. 18 thus configured.

The back gate bias circuit 20 is connected to the common back gate of the first transistor M1 and the second transistor M2, and to the second power supply line 3. The back gate bias circuit 20 applies the bias voltage VB, which is closer to the second power supply voltage VSS than the source potentials of the first transistor M1 and the second transistor M2, to the back gates of the first transistor M1 and the second transistor M2. In other words, the back gate bias circuit 20 applies the bias voltage VB, which is closer to the second power supply voltage VSS than an intermediate voltage between the source potentials of the first transistor M1 and the second transistor M2 and the second power supply voltage VSS, to the back gates of the first transistor M1 and the second transistor M2. The bias voltage VB may be lower than the second power supply voltage VSS. It is preferable that the bias voltage VB be a voltage within a predetermined range including the second power supply voltage VSS and excluding a voltage equal to the second power supply voltage VSS. In one example, it is preferable that the bias voltage VB be a voltage within ±20% of the second power supply voltage VSS and excluding a voltage equal to the second power supply voltage VSS. In this configuration, the transconductance gm12 of each of the first transistor M1 and the second transistor M2 increases. Accordingly, noise of the output signal Sout of the operational amplifier 1 can be reduced.

The step-up circuit 103 is provided between the second power supply line 3 and the differential pair 10, more specifically between the second power supply line 3 and the constant current source 11. The step-up circuit 103 steps up the second power supply voltage VSS of the second power supply line 3 to a predetermined voltage, and applies the stepped-up second power supply voltage VSS to the constant current source 11. Examples of the step-up circuit 103 include a known charge pump type step-up circuit.

According to the operational amplifier 1B in FIG. 18, the back gate bias circuit 20 applies the bias voltage VB, which is closer to the second power supply voltage VSS than the source potentials of the first transistor M1 and the second transistor M2, to the common back gate of the first transistor M1 and the second transistor M2. The step-up circuit 103 applies a voltage higher than the second power supply voltage VSS to the constant current source 11. Accordingly, source potentials of the first transistor M1 and the second transistor M2 become higher in comparison with a case where the second power supply voltage VSS is applied to the constant current source 11. In this manner, the back gate-to-source voltage VBS is raised by the back gate bias circuit 20 and the step-up circuit 103. According to the present embodiment, the back gate-to-source voltage VBS is higher than the back gate-to-source voltage VBSH. In this case, as can be seen from FIG. 3, the transconductance gm12 of each of the first transistor M1 and the second transistor M2 increases. Accordingly, noise of the output signal Sout decreases.

According to the operational amplifier 1B in FIG. 18, following effects can be further obtained.

The operational amplifier 1B includes the step-up circuit 103 and the back gate bias circuit 20. In this case, the back gate-to-source voltage VBS can be raised by the voltage applied by the step-up circuit 103 to the constant current source 11, and the bias voltage VB of the back gate bias circuit 20. Accordingly, noise of the output signal Sout of the operational amplifier 1B can be reduced. In addition, the magnitude of the back gate-to-source voltage VBS can be controlled by two voltages of the voltage applied by the step-up circuit 103 to the constant current source 11 and the bias voltage VB of the back gate bias circuit 20. Accordingly, the back gate-to-source voltage VBS can be easily raised.

Instead of lowering the impurity concentration in the channel region of each of the transistors M1 to M4 in the operational amplifier 1B shown in FIGS. 17A and 18, the embedded channel type MOSFET such as the transistors M1 to M4 of the second embodiment may be adopted. In this case, effects similar to the effects of the second embodiment can be obtained. Any one or two of the pairs of the transistors M1 and M2 configuring the differential pair 10, and the pair of the transistors M3 and M4 of the current mirror circuit 12 may be changed to the embedded channel type MOSFETs of the second embodiment.

In addition to lowering the impurity concentration in the channel region of each of the transistors M1 to M4 in the operational amplifier 1B shown in FIGS. 17A and 18, embedded channel type MOSFETs may be adopted. That is, the transistors M1 to M4 may have structures similar to the structure of the transistors M1 to M4 of the third embodiment. In this case, effects similar to the effects of the third embodiment can be obtained. Any one or two of the pair of transistors M1 and M2 configuring the differential pair 10 in the operational amplifier 1B shown in FIGS. 17A and 18, and the pair of the transistors M3 and M4 of the current mirror circuit 12 may be changed to the structures of the transistors M1 to M4 of the third embodiment. Moreover, any one or two of the pair of transistors M1 and M2 configuring the differential pair 10 in the operational amplifier 1B shown in FIGS. 17A and 18, and the pair of the transistors M3 and M4 of the current mirror circuit 12 may be changed to the structures of the embedded channel type MOSFETs of the second embodiment, or the transistors M1 to M4 of the third embodiment. In short, the operational amplifier 1B shown in FIGS. 17A and 18 may have a configuration which includes a mixture of structures similar to the structures of the low concentration transistor of the first embodiment, the embedded channel type MOSFETs of the second embodiment, and the transistors M1 to M4 of the third embodiment.

Sixth Embodiment

An operational amplifier 1C according to a sixth embodiment will be described with reference to FIG. 19. The operational amplifier 1C of the present embodiment is different from the operational amplifier 1 of the first embodiment in that a voltage input to the back gate bias circuit 20 is different, and that the output stage 93 and the capacitor 94 are added. The configurations of the output stage 93 and the capacitor 94 are the same as the configurations of the output stage 93 and the capacitor 94 of the fifth embodiment.

Figure 19:
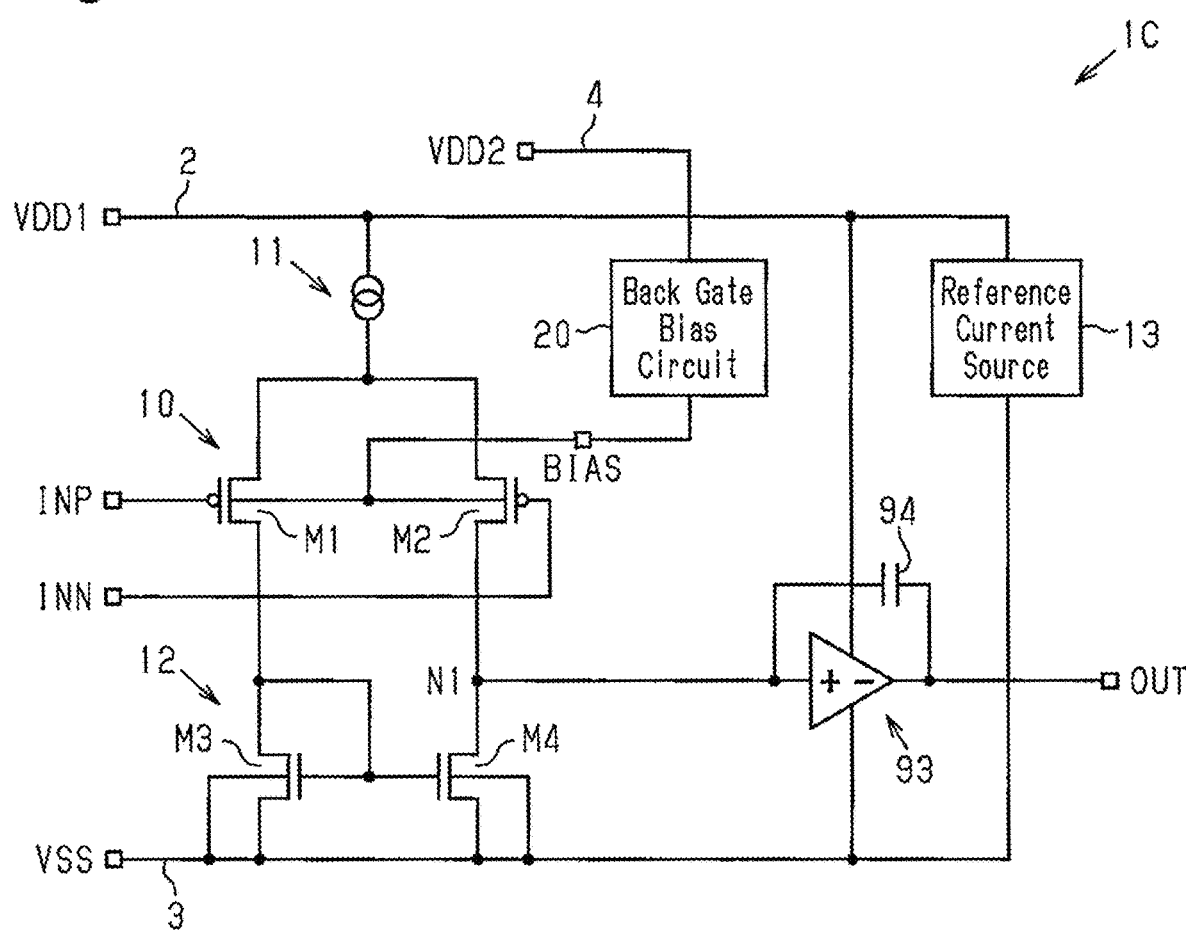
FIG. 19 is a circuit diagram of an operational amplifier according to a sixth embodiment.

As shown in FIG. 19, the back gate bias circuit 20 is connected to a third power supply line 4 to which a third power supply voltage VDD2 higher than the first power supply voltage VDD1 of the first power supply line 2 is applied. Specifically, the back gate bias circuit 20 of the present embodiment has the fifth transistor M5 to the ninth transistor M9 and the constant current source 21 (see FIG. 2), similarly to the back gate bias circuit 20 of the first embodiment. The sources of the fifth transistor M5, the eighth transistor M8, and the ninth transistor M9 are connected to the third power supply line 4.

The back gate bias circuit 20 connected to the third power supply line 4 applies the bias voltage VB to the common back gate of the first transistor M1 and the second transistor M2. The bias voltage VB is set by a voltage (VDD2−Vgs) dropped from the third power supply voltage VDD2 by the gate-to-source voltage Vgs of the fifth transistor M5, and a current Ibg flowing through the sixth transistor M6. Accordingly, the bias voltage VB can be made higher than the first power supply voltage VDD1 depending on the third power supply voltage VDD2. The bias voltage VB of the present embodiment is higher than the first power supply voltage VDD1. In this case, it is preferable that the bias voltage VB be higher than the first power supply voltage VDD1 within a range where parasitic diodes of the first transistor M1 and the second transistor M2 are not turned on. That is, the bias voltage VB is preferably lower than a voltage at which parasitic diodes of the first transistor M1 and the second transistor M2 are turned on. An example of the voltage at which the parasitic diodes of the first transistor M1 and the second transistor M2 are turned on is a voltage 0.5 V to 0.6 V higher than the first power supply voltage VDD (VDD+ 0.5 to 0.6). The bias voltage VB of the present embodiment is controlled such that the back gate-to-source voltage VBS becomes lower than or equal to a voltage 20% higher than the first power supply voltage VDD1. The bias voltage VB is controlled in this manner, wherefore the back gate-to-source voltage VBS becomes larger than the back gate-to-source voltage VBSH. Accordingly, as can be seen from FIG. 3, the transconductance gm12 of each of the first transistor M1 and the second transistor M2 increases. Accordingly, noise of the output signal Sout decreases.

Furthermore, according to the present embodiment, the transistors configuring the operational amplifier 1C have the same configuration and manufacturing method as the configuration and manufacturing method of the transistors configuring the operational amplifier 1 of the first embodiment. Accordingly, effects similar to the effects (1-5) to (1-8) can be obtained.

Modifications of Sixth Embodiment

The operational amplifier 1C of the present embodiment can be modified in following manners.

Figure 20:
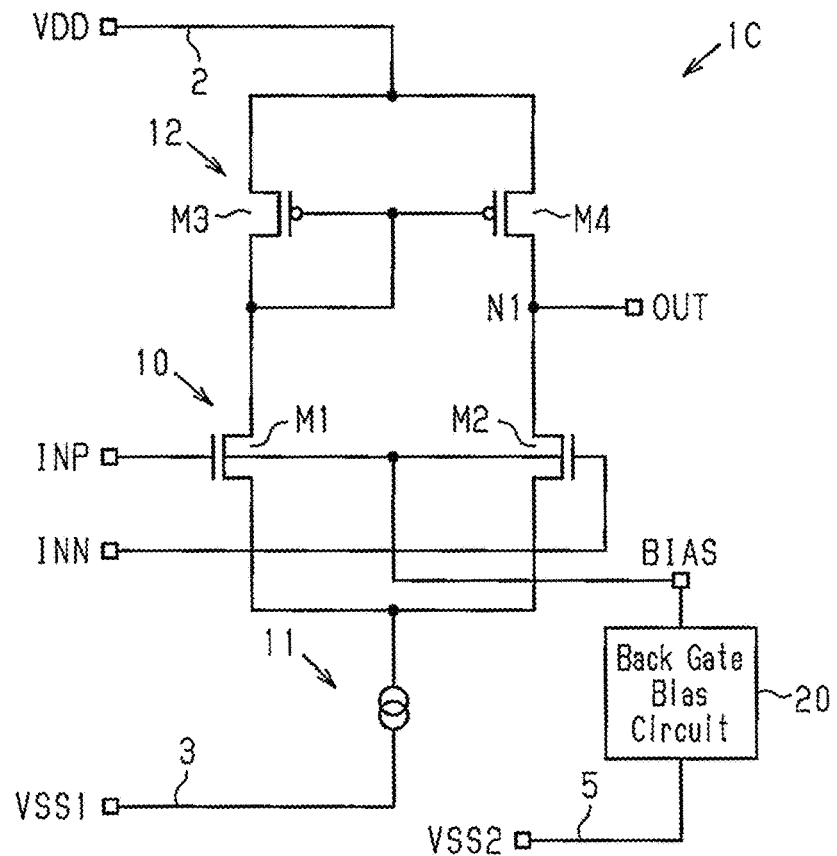
FIG. 20 is a circuit diagram of an operational amplifier according to a modification of the sixth embodiment.

The operational amplifier 1C shown in FIG. 19 can be changed to the operational amplifier 1C shown in FIG. 20. According to the operational amplifier 1C in FIG. 20, the conductivity type of each of the transistors configuring the operational amplifier 1C, and the connection configuration of the back gate bias circuit 20 are different. The reference current source 13, the output stage 93, and the capacitor 94 in the operational amplifier 1C are not shown in FIG. 20 for convenience of description.

The first transistor M1 and the second transistor M2 of the differential pair 10, and the transistor of the constant current source 11 are N-channel MOSFETs. The source of the transistor of the constant current source 11 is connected to the second power supply line 3, while the drain of the transistor of the constant current source 11 is connected to the sources of the first transistor M1 and the second transistor M2.

The third transistor M3 and the fourth transistor M4 of the current mirror circuit 12 are P-channel MOSFETs. The sources of the third transistor M3 and the fourth transistor M4 are connected to the first power supply line 2, the drain of the third transistor M3 is connected to the drain of the first transistor M1, the drain of the fourth transistor M4 is connected to the drain of the second transistor M2.

Similarly to the operational amplifier 1C in FIG. 19, the impurity concentration in the channel region of each of the first transistor M1 to the fourth transistor M4 according to the operational amplifier 1C in FIG. 20 is made lower than the impurity concentration in the channel region of each of the transistors of the constant current source 11 and the gate bias circuit 20. Effects similar to the effects (1-5) to (1-8) of the first embodiment can be obtained by the operational amplifier 1C in FIG. 20 thus configured.

The back gate bias circuit 20 is connected to the common back gate of the first transistor M1 and the second transistor M2, and to a fourth power supply line 5 to which a fourth power supply voltage VSS2 lower than the second power supply voltage VSS1 of the second power supply line 3 is applied. The back gate bias circuit 20 applies the bias voltage VB, which is closer to the fourth power supply voltage VSS2 than the source potentials of the first transistor M1 and the second transistor M2, to the back gates of the first transistor M1 and the second transistor M2. In other words, the back gate bias circuit 20 applies the bias voltage VB, which is closer to the fourth power supply voltage VSS2 than an intermediate voltage between the source potentials of the first transistor M1 and the second transistor M2 and the fourth power supply voltage VSS2, to the back gates of the first transistor M1 and the second transistor M2. That is, the back gate bias circuit 20 applies, to the back gates of the first transistor M1 and the second transistor M2, the bias voltage VB which increases the back gate-to-source voltage VBS. As a result, the back gate-to-source voltage VBS becomes a voltage close to the back gate-to-source voltage VBSH. It is preferable that the bias voltage VB be a voltage within a predetermined range including the second power supply voltage VSS1 and excluding a voltage equal to the second power supply voltage VSS1. In one example, it is preferable that the bias voltage VB be a voltage within ±20% of the second power supply voltage VSS1 and excluding a voltage equal to the second power supply voltage VSS1. In this configuration, the transconductance gm12 of each of the first transistor M1 and the second transistor M2 increases. Accordingly, noise of the output signal Sout of the operational amplifier 1 can be reduced.

Instead of lowering the impurity concentration in the channel region of each of the transistors M1 to M4 in the operational amplifier 1C shown in FIGS. 19 and 20, embedded channel type MOSFETs such as the transistors M1 to M4 of the second embodiment may be adopted. In this case, effects similar to the effects of the second embodiment can be obtained. Any one or two of the pairs of the transistors M1 and M2 configuring the differential pair 10, and the pair of the transistors M3 and M4 configuring the current mirror circuit 12 may be changed to the embedded channel type MOSFETs of the second embodiment.

In addition to lowering the impurity concentration in the channel region of each of the transistors M1 to M4 in the operational amplifier 1C in FIGS. 19 and 20, embedded channel type MOSFETs may be adopted.

That is, the transistors M1 to M4 may have structures similar to the structures of the transistors M1 to M4 of the third embodiment. In this case, effects similar to the effects of the third embodiment can be obtained. Any one or two of the pair of transistors M1 and M2 configuring the differential pair 10 in the operational amplifier 1C shown in FIGS. 19 and 20, and the pair of the transistors M3 and M4 configuring the current mirror circuit 12 may be changed to the structures of the transistors M1 to M4 of the third embodiment. Any one or two of the pair of transistors M1 and M2 configuring the differential pair 10 in the operational amplifier 1C shown in FIGS. 19 and 20, and the pair of the transistors M3 and M4 configuring the current mirror circuit 12 may be changed to the structures of the embedded channel type MOSFETs of the second embodiment, or the transistors M1 to M4 of the third embodiment. In short, the operational amplifier 1C shown in FIGS. 19 and 20 may have a configuration which includes a mixture of structures similar to the structures of the low concentration transistor of the first embodiment, the embedded channel type MOSFETs of the second embodiment, and the transistors M1 to M4 of the third embodiment.

Seventh Embodiment

An operational amplifier 1D according to a seventh embodiment will be described with reference to FIGS. 21 and 22.

Figure 21:
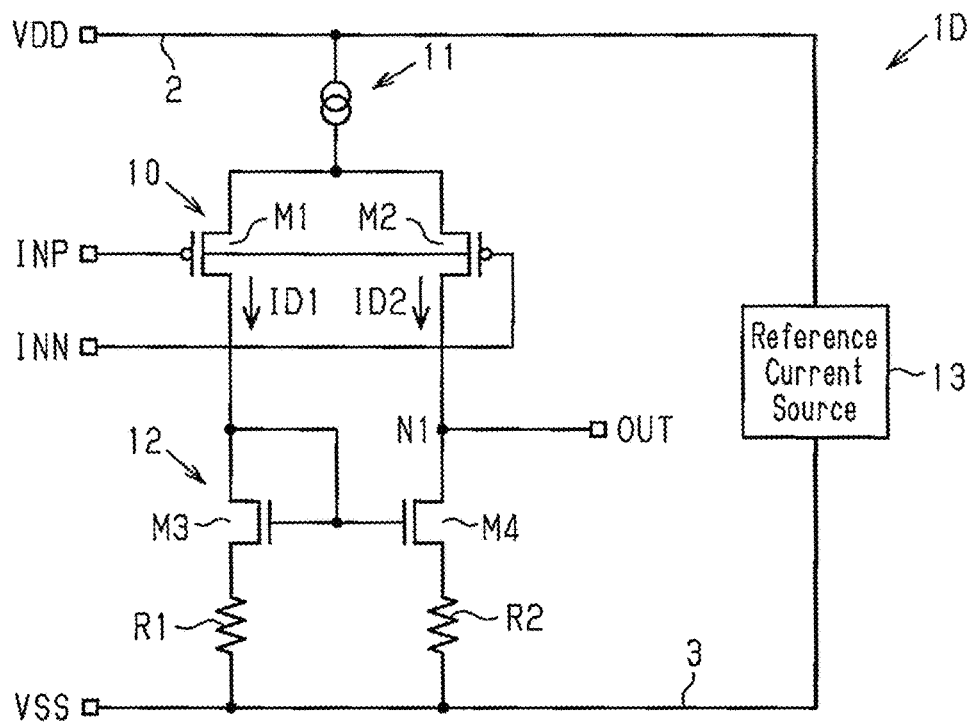
FIG. 21 is a circuit diagram of an operational amplifier according to a seventh embodiment.

As shown in FIG. 21, the operational amplifier 1D of the present embodiment decreases the transconductance gm34 of each of the third transistor M3 and the fourth transistor M4 to reduce noise of the output signal Sout, instead of increasing the transconductance gm12 of each of the first transistor M1 and the second transistor M2.

Specifically, the operational amplifier 1D is different from the operational amplifier 1 of the first embodiment in that the back gate bias circuit 20 is eliminated, and that a first resistor R1 as an example of a first resistance portion and a second resistor R2 as an example of a second resistance portion are added between the current mirror circuit 12 and the second power supply line 3.

Specifically, the first resistor R1 is provided between the third transistor M3 and the second power supply line 3. The first terminal of the first resistor R1 is connected to the source of the third transistor M3, while the second terminal of the first resistor R1 is connected to the second power supply line 3. The second resistor R2 is provided between the fourth transistor M4 and the second power supply line 3. The first terminal of the second resistor R2 is connected to the source of the fourth transistor M4, while the second terminal of the second resistor R2 is connected to the second power supply line 3. According to the present embodiment, a current ratio of the third transistor M3 and the fourth transistor M4 is 1:1. The resistance value of the first resistance R1 and the resistance value of the second resistance R2 are equal to each other.

In this configuration, the first resistor R1 and the second resistor R2 raise source potentials of the transistors M3 and M4 when the gate-to-source voltage Vgs rises with a flow of a drain current through the third transistor M3 and the fourth transistor M4. In this case, an increase in the drain current flowing through each of the transistors M3 and M4 is prevented. More specifically, the gate-source voltage Vgs of each of the transistors M3 and M4 decreases in accordance with the first resistor R1 and the second resistor R2 as viewed from the drain side of the transistors M3 and M4 as the effective transconductance gm34. In this case, the transistors M3 and M4 operate to reduce the drain current. Therefore, the transconductance gm34 on the circuit decreases.

The transistors M1 to M4 and the transistor of the constant current source 11 of the operational amplifier 1D according to the present embodiment have the same configuration and manufacturing method as the configuration and manufacturing method the transistors M1 to M4 and the transistor of the constant current source 11 of the operational amplifier 1 of the first embodiment.

Accordingly, effects similar to the effects (1-5) and (1-6) of the first embodiment can be obtained.

Operations and effects of the present embodiment will be described. In the following description, an operational amplifier 1D from which the first resistor R1 and the second resistor R2 are eliminated is referred to as a comparative operational amplifier.

An input referred noise voltage as noise of the output signal Sout of the operational amplifier 1D of the present embodiment is represented by Equation 1 of the first embodiment. As can be seen from Equation 1, at least one of an increase in at least one of the channel width W and the channel length L of each of the first transistor M1 to the fourth transistor M4, decrease in the transconductance gm34, and increase in the transconductance gm12 is necessary to reduce the input referred noise voltage $Vn^2$. Moreover, as can be seen from Equation 2 of the first embodiment, at least one of increase in the channel length L and decrease in the channel width W is necessary in order to reduce the transconductance gm34. In addition, at least one of increase in the channel width W, decrease in the channel length L, and increase in the drain current ID is necessary to increase the transconductance gm12.

In case of the increase in the channel width W of each of the first transistor M1 and the second transistor M2, or the increase in the channel length L of each of the third transistor M3 and the fourth transistor M4, an element area increases. The increase in the element area may cause degradation of transistor characteristics, such as increase in parasitic capacitance. On the other hand, in case of the decrease in the channel length L of each of the first transistor M1 and the second transistor M2, or in case of the decrease in the channel width W of each of the third transistor M3 and the fourth transistor M4, a threshold voltage may be varied by short channel effect or narrow channel effect. In case of increase in the drain current I (ID1, ID2) of each of the first transistor M1 and the second transistor M2, current consumption of the operational amplifier 1 increases.

Accordingly, reduction of the transconductance gm34 of each transistor M3 and M4 of the active load is considered to reduce noise of the output signal Sout. As can be seen from Equation 2, reduction of the drain current ID is considered to reduce the transconductance gm. Therefore, reduction of currents flowing through the transistors M3 and M4 is considered to reduce the transconductance gm34. However, in case of the comparative operational amplifier, the current flowing through each of the transistors M1 and M2 of the differential pair 10 similarly decreases when the current flowing through each of the transistors M3 and M4 decreases. As a result, the transconductance gm12 of each of the transistor M1 and M2 in the comparative operational amplifier decreases, preventing reduction of noise of the output signal of the comparative operational amplifier as can be seen from Equation 1.

However, the operational amplifier 1D of the present embodiment is operated to reduce the current flowing through each of the transistor M3 and M4 by raising the source potentials of each of the transistors M3 and M4 when a current is caused to flow through each of the transistors M3 and M4 by the first resistor R1 and the second resistor R2. Accordingly, the transconductance gm34 of each of the transistors M3 and M4 on the circuit decreases, wherefore reduction of noise of the output signal Sout of the operational amplifier 1D is achievable.

Figure 22:
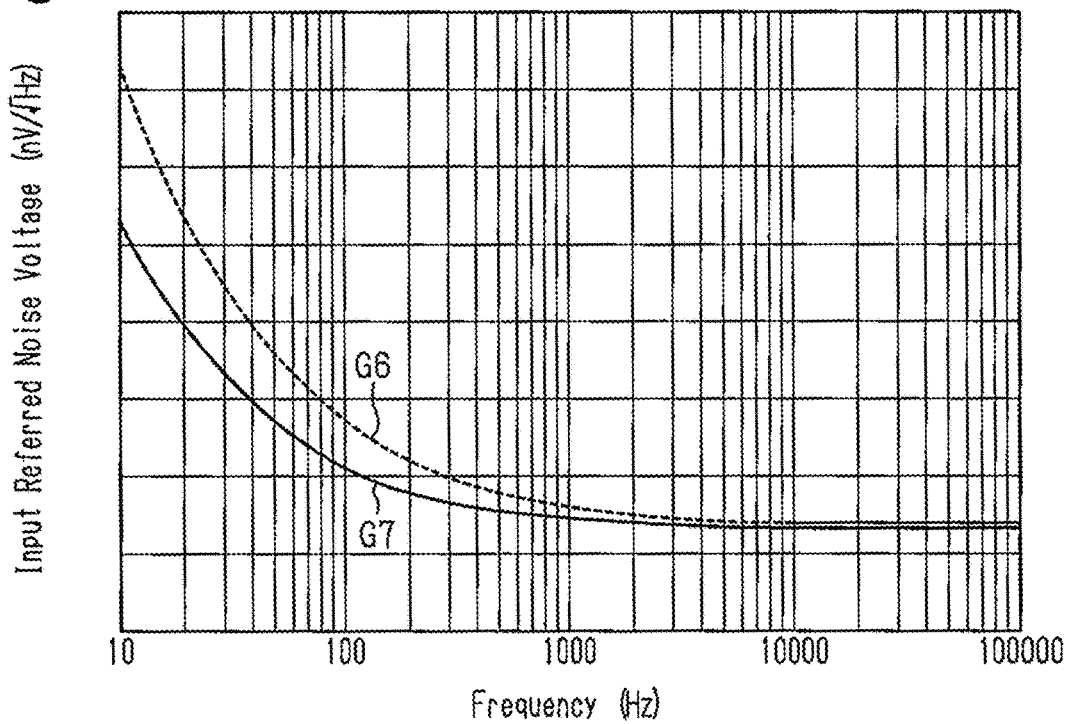
FIG. 22 is a graph showing the relationship between frequency and input referred noise voltage.

FIG. 22 shows the relationship between input referred noise voltage of the comparative operational amplifier and input referred noise voltage of the operational amplifier 1D, and a frequency. A graph G6 indicated by a broken line in FIG. 22 shows input referred noise voltage of the comparative operational amplifier, while a graph G7 indicated by a solid line in FIG. 22 shows input referred noise voltage of the operational amplifier 1D. As can be seen from the graphs G6 and G7 in FIG. 22, the input referred noise voltage of the operational amplifier 1D is lower than that of the comparative operational amplifier.

Modifications of Seventh Embodiment

The operational amplifier 1D of the present embodiment can be modified in following manners. Following modified examples can be combined with each other as long as technical contradiction does not occur.

The operational amplifier 1D may have the cascode current mirror circuit 91 and the bias circuit 92 of the fourth embodiment in place of the current mirror circuit 12. In this case, the first resistor R1 is provided between the tenth transistor M10 of the cascode current mirror circuit 91 and the second power supply line 3, while the second resistor R2 is provided between the eleventh transistor M11 and the second power supply line 3.

The resistance value of the first resistor R1 and the resistance value of the second resistor R2 may be changed in accordance with a ratio of the third transistor M3 and the fourth transistor M4.

Instead of lowering the impurity concentration in the channel region of each of the transistors M1 to M4 in the operational amplifier 1D, embedded channel type MOSFETs such as the transistors M1 to M4 of the second embodiment may be adopted. In this case, effects similar to the effects of the second embodiment can be obtained. Any one or two of the pairs of the transistors M1 and M2 configuring the differential pair 10 of the operational amplifier 1D, and the pair of the transistors M3 and M4 configuring the current mirror circuit 12 may be changed to the embedded channel type MOSFETs of the second embodiment.

In addition to lowering the impurity concentration in the channel region of each of the transistors M1 to M4 in the operational amplifier 1D, embedded channel type MOSFETs may be adopted. That is, the transistors M1 to M4 may have structures similar to the structures of the transistors M1 to M4 of the third embodiment. In this case, effects similar to the effects of the third embodiment can be obtained. Any one or two of the pair of transistors M1 and M2 configuring the differential pair 10 in the operational amplifier 1D, and the pair of the transistors M3 and M4 configuring the current mirror circuit 12 may be changed to structures similar to the structures of the transistors M1 to M4 of the third embodiment. Any one or two of the pair of transistors M1 and M2 configuring the differential pair 10, and the pair of the transistors M3 and M4 configuring the current mirror circuit 12 may be changed to structures similar to the structures of the embedded channel type MOSFETs of the second embodiment, or the transistors M1 to M4 of the third embodiment. In short, the operational amplifier 1D may have a configuration which includes a mixture of structures similar to the structures of the low concentration transistor of the first embodiment, the embedded channel type MOSFET of the second embodiment, and the transistors M1 to M4 of the third embodiment.

Eighth Embodiment

Figure 23:
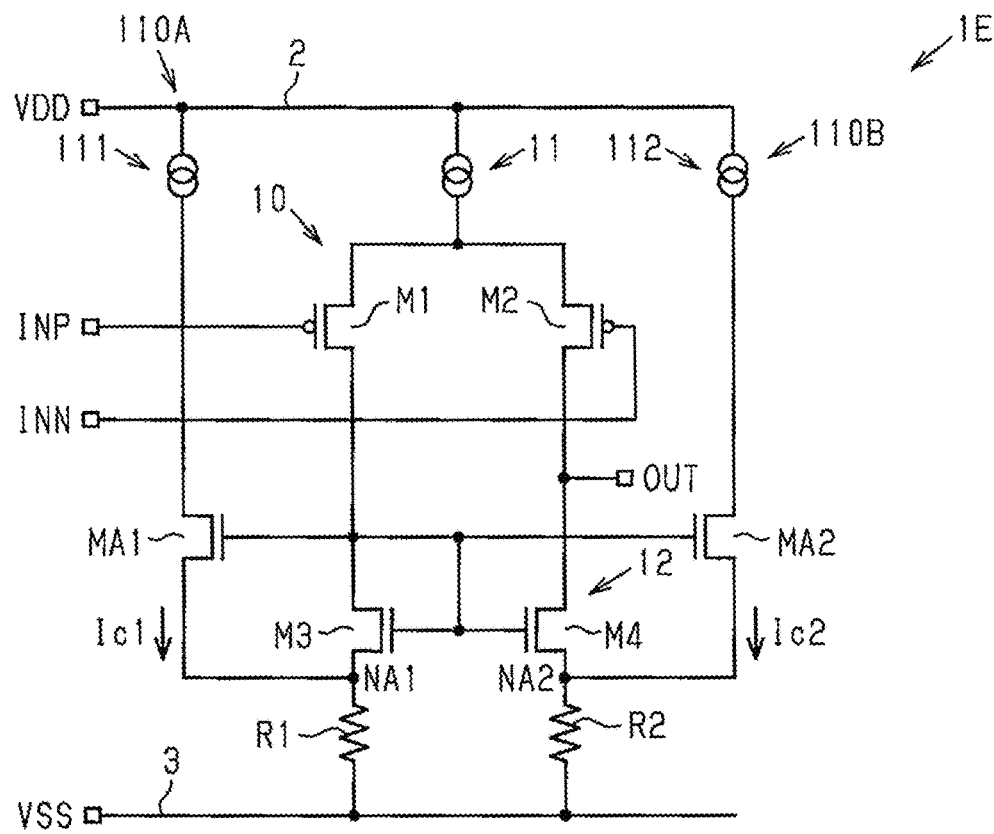
FIG. 23 is a circuit diagram of an operational amplifier according to an eighth embodiment.

An operational amplifier 1E according to an eighth embodiment will be described with reference to FIG. 23. The operational amplifier 1E of the present embodiment has a different control method of source potentials of the third transistor M3 and the fourth transistor M4 from the corresponding method the operational amplifier 1D of the seventh embodiment.

The operational amplifier 1E has a configuration which adds a first control unit 110A for controlling the source potential of the third transistor M3, and a second control unit 110B for controlling the source potential of the fourth transistor M4 to the operational amplifier 1D of the seventh embodiment.

The first control unit 110A controls the source potential of the third transistor M3 by controlling a current supplied to a node NA1 disposed between the source of the third transistor M3 and the first resistor R1. The first control unit 110A includes a first constant current source 111 and a first control transistor MA1. The first control transistor MA1 of the present embodiment is an N-channel MOSFET. The first constant current source 111 is provided between the first power supply line 2 and the first control transistor MA1. The first constant current source 111 includes a transistor (not shown). The transistor of the first constant current source 111 is a P-channel MOSFET. The drain of the transistor of the first constant current source 111 is connected to the drain of the first control transistor MA1, while the source of the transistor is connected to the first power supply line 2. The source of the first control transistor MA1 is connected to the node NA1 between the source of the third transistor M3 and the first resistor R1, while the gate of the first control transistor MA1 is connected to the gate and the drain of the third transistor M3. According to the first control unit 110A having this configuration, the gate voltage of the first control transistor MA1 is controlled by a gate voltage of the third transistor M3, while a first current Ic1, which is proportional to a constant current It of the constant current source 11, is supplied to the node NA1. The gate of the first control transistor corresponds to the "control terminal of the first control transistor", while the gate of the second control transistor corresponds to the "control terminal of the second control transistor".

The second control unit 110B controls the source potential of the fourth transistor M4 by controlling a current supplied to a node NA2 between the source of the fourth transistor M4 and the second resistor R2. The second control unit 110B includes a second constant current source 112 and a second control transistor MA2. The second control transistor MA2 of the present embodiment is an N-channel MOSFET. The second constant current source 112 is provided between the first power supply line 2 and the second control transistor MA2. The second constant current source 112 includes a transistor (not shown). The transistor of the second constant current source 112 is a P-channel MOSFET. The drain of the transistor of the second constant current source 112 is connected to the drain of the second control transistor MA2, while the source of the transistor is connected to the first power supply line 2. The source of the second control transistor MA2 is connected to the node NA2 between the source of the fourth transistor M4 and the second resistor R2, while the gate of the second control transistor MA2 is connected to the gate and the drain of the third transistor M3. According to the second control unit 110B having this configuration, the gate voltage of the second control transistor MA2 is controlled by the gate voltage of the third transistor M3, while a second current Ic2, which is proportional to the constant current It of the constant current source 11, is supplied to the node NA2.

In this manner, the first current Ic1 is supplied from the first control unit 110A to the source of the third transistor M3, while the second current Ic2 is supplied from the second control unit 110B to the source of the fourth transistor M4. As a result, the source potential of the third transistor M3 and the source potential of the fourth transistor M4 are raised. In addition, as described in the seventh embodiment, the source potentials of the third transistor M3 and the fourth transistor M4 are raised by the first resistor R1 and the second resistor R2. In this manner, the source potential of each transistor M3 and M4 are more raised in the present embodiment than in the seventh embodiment. Accordingly, the transconductance gm34 on the circuit further decreases.

The transistors M1 to M4 and the transistor of the constant current source 11 according to the present embodiment have the same configuration and manufacturing method as the configuration and manufacturing method of the transistors M1 to M4 and the transistor of the constant current source 11 of the first embodiment. Accordingly, as described in (1-5) and (1-6) of the first embodiment, noise of the output signal Sout can be effectively reduced.

The transistors MA1 and MA2 and the transistors of the constant current sources 111 and 112 are not easily affected by 1/f noise of the output signal Sout. Accordingly, the impurity concentration in the channel region of each of the transistors MA1 and MA2 and the transistor of the constant current sources 111 and 112 is made higher than the impurity concentration in the channel region of each of the transistors M1 to M4. In other words, the impurity concentration in the channel region of each of the transistors M1 to M 4 is lower than the impurity concentration in the channel region of each of the transistors MA1 and MA2 and the transistors of the constant current sources 111 and 112. That is, the transistors M1 to M4 are low concentration transistors, while the transistors MA1 and MA2 and the transistors of the constant current sources 111 and 112 are high concentration transistors. The impurity concentration in the channel region of each of the transistors M1 to M4 is preferably about ½ or lower of the impurity concentration in the channel region of each of the transistors MA1 and MA2 and the transistors of the constant current sources 111 and 112. According to the present embodiment, the impurity concentration in the channel region of each of the transistors M1 to M4 is about ⅒ of the impurity concentration in the channel region of each of the transistors MA1 and MA2 and the transistors of the constant current sources 111 and 112. The transistors MA1, MA2 and the transistors of the constant current sources 111 and 112 are surface channel type MOSFETs.

According to the present embodiment, following effects can be further produced.

(8-1) The impurity concentration in the channel region of each of the first control transistor MA1 and the second control transistor MA2 is higher than the impurity concentration in the channel region of each of the transistors M1 to M4. Accordingly, fluctuations of threshold voltages of the transistors MA1 and MA2 can be reduced, wherefore operations of the first control unit 110A and the second control unit 110B can be stabilized.

(8-2) The impurity concentration in the channel region of each of the transistor of the first constant current source 111 and the transistor of the second constant current source 112 is higher than the impurity concentration in the channel region in each of the transistors M1 to M4. Accordingly, fluctuations of threshold voltages of the transistors of the constant current sources 111 and 112 can be reduced, wherefore operations of the first control unit 110A and the second control unit 110B can be stabilized.

(8-3) The impurity concentration in the channel region of each of the transistors, which are P-channel MOSFETs, of the first constant current source 111 of the first control unit 110A and of the second constant current source 112 of the second control unit 110B is equal to the impurity concentration in the channel region of the transistor, which is a P-channel MOSFET, of the constant current source 11. According to this configuration, the step of forming the N-type well layer 63 of the transistors of the constant current sources 111 and 112, and the step of forming the N-type well layer 63 of the transistor of the constant current source 11 can be collectively performed. Accordingly, the step of manufacturing the operational amplifier 1E can be simplified.

Modifications of Eighth Embodiment

The operational amplifier 1E of the present embodiment can be modified in following manners. Following modified examples can be combined with each other as long as technical contradiction does not occur.

Instead of lowering the impurity concentration in the channel region of each of the transistors M1 to M4 in the operational amplifier 1E, embedded channel type MOSFETs such as the transistors M1 to M4 of the second embodiment may be adopted. In this case, effects similar to the effects of the second embodiment can be obtained. Any one or two of the pairs of the transistors M1 and M2 configuring the differential pair 10 of the operational amplifier 1E, and the pair of the transistors M3 and M4 configuring the current mirror circuit 12 may be changed to the embedded channel type MOSFETs of the second embodiment.

In addition to lowering the impurity concentration in the channel region of each of the transistors M1 to M4 in the operational amplifier 1E, embedded channel type MOSFETs may be adopted. That is, the transistors M1 to M4 may have structures similar to the structures of the transistors M1 to M4 of the third embodiment. In this case, effects similar to the effects of the third embodiment can be obtained. Any one or two of the pair of transistors M1 and M2 configuring the differential pair 10 in the operational amplifier 1E, and the pair of the transistors M3 and M4 configuring the current mirror circuit 12 may be changed to structures similar to the structures of the transistors M1 to M4 of the third embodiment. Moreover, any one or two of the pair of transistors M1 and M2 configuring the differential pair 10 in the operational amplifier 1E, and the pair of the transistors M3 and M4 configuring the current mirror circuit 12 may be changed to structures similar to the structures of the embedded channel type MOSFETs of the second embodiment, or the transistors M1 to M4 of the third embodiment. In short, the operational amplifier 1E may have a configuration which includes a mixture of structures similar to the structures of the low concentration transistor of the first embodiment, the embedded channel type MOSFET of the second embodiment, and the transistors M1 to M4 of the third embodiment.

The operational amplifier 1E may have the cascode current mirror circuit 91 and the bias circuit 92 of the fourth embodiment in place of the current mirror circuit 12. In this case, the first resistor R1 is provided between the tenth transistor M10 of the cascode current mirror circuit 91 and the second power supply line 3, while the second resistor R2 is provided between the eleventh transistor M11 and the second power supply line 3. The source of the first control transistor MA1 of the first control unit 110A is connected to a node (not shown) between the source of the tenth transistor M10 and the first resistor R1, while the source of the second control transistor MA2 of the second control unit 110B is connected to a node (not shown) between the source of the eleventh transistor M11 and the second resistor R2.

The impurity concentration in the channel region of each of the transistors, which are P-channel MOSFETs, of the first constant current source 111 of the first control unit 110A and the transistor of the second constant current source 112 of the second control unit 110B, is equal to the impurity concentration in the channel region of each of the sixteenth transistor M16 and the seventeenth transistor M17, which are P-channel MOSFETs, of the bias circuit 92. According to this configuration, the step of forming the N-type well layer 63 of the transistors of the constant current sources 111 and 112, and the step of forming the N-type well layer 63 of each of the transistors M16 and M17 can be collectively performed. Accordingly, the step of manufacturing the operational amplifier 1E can be simplified.

The impurity concentration in the channel region of each of the first control transistor MA1 of the first control unit 110A and the second control transistor MA2 of the second control unit 110B is equal to the impurity concentration in the channel region of each of the twelfth transistor M12 and the thirteenth transistor M13 of the cascode current mirror circuit 91. According to this configuration, the step of forming the P-type well layer 41 of each of the transistors MA1 and MA2, and the step of forming the P-type well layer 41 of each of the transistors M12 and M13 can be collectively performed. Accordingly, the step of manufacturing the operational amplifier 1E can be simplified.

Ninth Embodiment

An operational amplifier 1F according to a ninth embodiment will be described with reference to FIGS. 24 and 25. The operational amplifier 1F of the present embodiment is different from the operational amplifier 1 of the first embodiment in that the back gate bias circuit 20 is eliminated, and that a current adjustment unit 120 is added.

Figure 24:
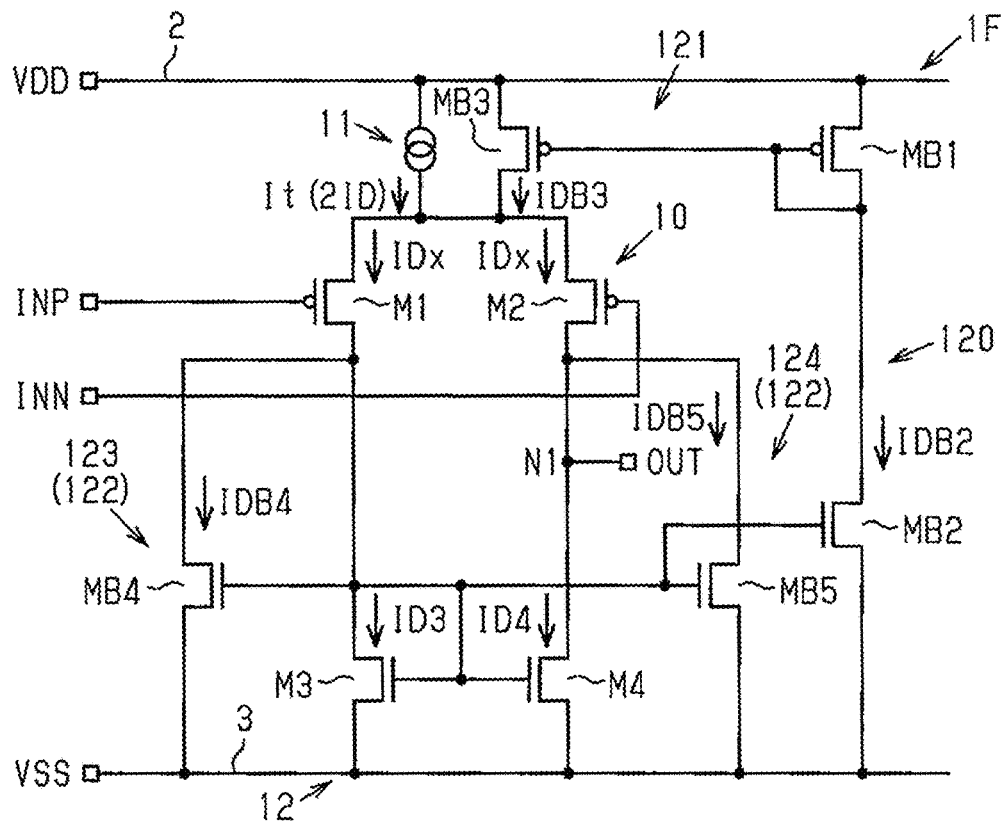
FIG. 24 is a circuit diagram of an operational amplifier according to a ninth embodiment.

As shown in FIG. 24, the current adjustment unit 120 causes larger currents to flow through the first transistor M1 and the second transistor M2 than currents flowing through the third transistor M3 and the fourth transistor M4. More specifically, the current adjustment unit 120 increases currents flowing through the first transistor M1 and the second transistor M2 to be larger than the constant current It of the constant current source 11 to prevent flow of currents toward the third transistor M3 and the fourth transistor M4 by an amount of increase in the currents flowing through the transistors M1 and M2. The current adjustment unit 120 includes a current supplying unit 121 and a branching portion 122.

The current supplying unit 121 supplies currents to the first transistor M1 and the second transistor M2 separately from the constant current It of the constant current source 11. The current supplying unit 121 includes a first supply transistor MB1, a second supply transistor MB2, and a third supply transistor MB3. The first supply transistor MB1 and the third supply transistor MB3 of the present embodiment are P-channel MOSFETs, while the second supply transistor MB2 is an N-channel MOSFET.

The first supply transistor MB1 and the second supply transistor MB2 configure a series circuit between the first power supply line 2 and the second power supply line 3. The source of the first supply transistor MB1 is connected to the first power supply line 2, the gate of the first supply transistor MB1 is connected to the drain of the first supply transistor MB1, and the drain of the first supply transistor MB1 is connected to the drain of the second supply transistor MB2. The source of the second supply transistor MB2 is connected to the second power supply line 3. The gate of the second supply transistor corresponds to the "control terminal of the second supply transistor".

The third supply transistor MB3 is provided between the first power supply line 2 and the differential pair 10. The source of the third supply transistor MB3 is connected to the first power supply line 2, the drain of the third supply transistor MB3 is connected to the sources of the first transistor M1 and the second transistor M2, and the gate of the third supply transistor MB3 is connected to the gate of the first supply transistor MB1. In this manner, the first supply transistor MB1 and the third supply transistor MB3 configure a current mirror circuit.

In the present embodiment, a current amount of the first supply transistor MB1 is equal to a current amount of the second supply transistor MB2. A size ratio (current ratio) of the first supply transistor MB1 to the third supply transistor MB3 is 1:1.

The branching portion 122 supplies a current equivalent to the increase of the drain current flowing through the first transistor M1, and a current equivalent to the increase of the drain current flowing through the second transistor M2 to the second power supply line 3. The branching portion 122 includes a first branching circuit 123 and a second branching circuit 124.

The first branching circuit 123 includes a first branching transistor MB4 which is an example of a first adjustment transistor connected in parallel with the third transistor M3. The first branching transistor MB4 of the present embodiment is an N-channel MOSFET. The drain of the first branching transistor MB4 is connected to the drain of the first transistor M1, the source of the first branching transistor MB4 is connected to the second power supply line 3, and the gate of the first branching transistor MB4 is connected to the drain (gate) of the third transistor M3.

The second branching circuit 124 includes a second branching transistor MB5 which is an example of a second adjustment transistor connected in parallel with the fourth transistor M4. The second branching transistor MB5 of the present embodiment is an N-channel MOSFET. The drain of the second branching transistor MB5 is connected to the drain of the second transistor M2, the source of the second branching transistor MB5 is connected to the second power supply line 3, and the gate of the second branching transistor MB5 is connected to the drain (gate) of the third transistor M3. The drain of the second branching transistor MB5 is connected to the second transistor M2 side with respect to the node N1 to which the output terminal OUT is connected.

The gate of the second supply transistor MB2 is connected to the gate of the second branching transistor MB5. In this manner, the branching transistors MB4 and MB5, the second supply transistor MB2, and the third transistor M3 configure a current mirror circuit. The gate of the first branching transistor MB4 corresponds to a "control terminal of a first adjustment transistor", and the gate of the second branching transistor MB5 corresponds to a "control terminal of a second adjustment transistor".

The first branching transistor MB4 of the first branching circuit 123 and the second branching transistor MB5 of the second branching circuit 124 have the same electrical characteristics. In addition, the transistors MB2, MB4, and MB5 have a common gate voltage. In this case, the current amount of the second supply transistor MB2 is twice larger than the current amount of the first branching transistor MB4 (second branching transistor MB5). Accordingly, a sum of currents flowing through the transistors MB4 and MB5 is generated in the second supply transistor MB2.

According to the present embodiment, settings of electric characteristics of the transistors MB4 and MB5, and settings of electric characteristics of the third transistor M3 and the fourth transistor M4 are equalized. In addition, the gates of the transistors MB4 and MB5 are connected to the gate of the third transistor M3, wherefore a current flowing through the first branching transistor MB4 and a current flowing through the second branching transistor MB5 are equalized with a current flowing through the third transistor M3 (current flowing through fourth transistor M4).

A current flowing through the operational amplifier 1F, in particular, a current flowing through the current adjustment unit 120 will be described. In the following description, a constant current flowing through the constant current source 11 is referred to as 2ID.

In the operational amplifier 1F, the constant current 2ID, and a supply current IDB3 from the third supply current transistor MB3 are supplied to the differential pair 10. The supply current IDB3 is a current proportional to a current IDB2 caused to flow through the second supply transistor MB2 by the current mirror circuit including the transistors MB1 and MB3. In the present embodiment, a current ratio of the first supply transistor MB1 to the third supply transistor MB3 is 1:1, wherefore the supply current IDB3 is equal to the current IDB2. More specifically, the current IDB2 is a current proportional to the current ID3 caused to flow through the third transistor M3 by the current mirror circuit configured by the transistors M3, MB4, MB5, and MB2. In the present embodiment, a current ratio of each of the transistors MB4 and MB5 to each of the transistors M3 and M4 is 1:1, wherefore currents IDB4 and IDB5 flowing through the transistors MB4, MB5 are equalized with the current ID3. In addition, the second supply transistor MB2 and the transistors MB4 and MB5 configure a current mirror circuit, wherefore the current IDB2 flowing through the second supply transistor MB2 is a sum of the currents flowing through the transistors MB4 and MB5 (IDB4+IDB5). That is, the supply current IDB3 supplied to the differential pair 10 is a sum of the currents flowing through the transistors MB4 and MB5 (IDB4+IDB5). Further, the currents flowing through the transistors M3, M4, MB4, and MB5 are equal to each other, wherefore a sum of the currents flowing through the transistors M3 and M4 (ID3+ID4), that is, the constant current 2ID is equal to a sum of the currents flowing through the transistors MB4 and MB5 (IDB4+IDB5). Accordingly, in the present embodiment, the supply current IDB3 and the constant current 2ID are equal to each other.

The current IDx flowing through each of the transistors M1 and M2 is expressed as IDx=(2ID+IDB3)/2 when inputs of the constant current 2ID and the supply current IDB3 are in the same phase, that is, when gate voltages as input signals are in the same phase. In this manner, the current IDx flowing through each of the transistors M1 and M2 becomes larger than the current ID (constant current 2ID/2) by ½ of the current IDB3. On the other hand, the current IDB4 and IDB5 are extracted from the drains of the transistors M1 and M2 by the transistors MB4, MB5 of the branching portion 122 configuring the current mirror circuit in cooperation with the third transistor M3. As a result, the current ID3 flowing through the third transistor M3 becomes IDx−IDB4, while the current ID4 flowing through the fourth transistor M4 becomes IDx−IDB5. Accordingly, each of the currents IDB4 and IDB5 of the present embodiment becomes ½ of the current IDB3. That is, the amount of increase in the current flowing through each of the transistors M1 and M2, that is, the amount of current supplied from the current supplying unit 121 is caused to flow through the transistors MB4 and MB5. In this manner, the current adjustment unit 120 supplies a current equal to the constant current 2ID of the constant current source 11 to the differential pair 10, and a current of ½ of the constant current 2ID to the transistors MB4 and MB5. In this case, only the current ID flows in each of the transistors M3 and M4. Accordingly, the current adjustment unit 120 increases the currents flowing through the transistors M1 and M2, but does not increase the currents flowing through the transistors M3 and M4.

An operation of the present embodiment will be described. A comparative operational amplifier to be compared with the operational amplifier 1F of the present embodiment has a configuration configured by only the differential pair 10 and the current mirror circuit 12 as an active load.

The input referred noise voltage as noise of the output signal Sout having a configuration similar to the configuration of the operational amplifier 1F or the comparative operational amplifier according to the present embodiment is expressed by Equation 1 of the first embodiment. As can be seen from Equation 1, at least one of an increase in at least one of the channel width W and the channel length L of each of the first transistor M1 to the fourth transistor M4, decrease in the transconductance gm34, and increase in the transconductance gm12 is necessary to reduce the input referred noise voltage $Vn^2$. Moreover, as can be seen from Equation 2 of the first embodiment, at least one of increase in the channel length L and decrease in the channel width W is necessary in order to reduce the transconductance gm34. In addition, any one of increase in the channel width W, decrease in the channel length L, and increase in the drain current ID is necessary to increase the transconductance gm12.

In case of the increase in the channel width W of each of the first transistor M1 and the second transistor M2, or the increase in the channel length L of each of the third transistor M3 and the fourth transistor M4, an element area increases. The increase in the element area may cause degradation of transistor characteristics, such as increase in parasitic capacitance. On the other hand, in case of the decrease in the channel length L of each of the first transistor M1 and the second transistor M2, or in case of the decrease in the channel width W of each of the third transistor M3 and the fourth transistor M4, a threshold voltage may be varied by short channel effect or narrow channel effect.

Accordingly, as can be seen from Equation 1, increase in the transconductance gm12 of the transistors M1 and M2 of the differential pair 10 is considered to reduce noise of the output signal Sout. On the other hand, noise of the output signal Sout increases as the transconductance gm34 of each of the transistors M3 and M4 of the current mirror circuit 12 is raised.

As can be seen from Equation 2, increase in the drain current ID is considered to raise the transconductance gm. Therefore, increase in a current IDx flowing through each of the transistors M1 and M2 is considered to raise the transconductance gm12. In case of the comparative operational amplifier, currents ID3 and ID4 flowing through the transistors M3 and M4 increase when the current IDx flowing through each of the transistors M1 and M2 increases. As a result, the transconductance gm34 of each of the transistors M3 and M4 increases, in which condition reduction of noise of the output signal Sout is difficult to achieve as can be seen from Equation 1.

Generally, a slew rate SR of an operational amplifier is defined by SR=ID/Cc based on a phase compensation capacitance Cc and a drain current ID. Therefore, the slew rate SR increases as the drain current ID increases. Accordingly, an operation speed of the operational amplifier 1F increases, in which condition problems such as oscillation are likely to occur. On the other hand, when the phase compensation capacitance Cc is raised to reduce the slew rate SR, a chip area increases.

However, according to the present embodiment, the current adjustment unit 120 increases currents flowing through the transistors M1 and M2 of the differential pair 10 to prevent increase in currents flowing through the transistors M3 and M4 of the current mirror circuit 12 as the active load. In this case, the transconductance gm12 of each of the transistors M1 and M2 increases, while the transconductance gm34 of each of the transistors M3 and M4 does not increase. Therefore, reduction of noise of the output signal Sout is achievable. In addition, a current contributing to an output current to the output terminal OUT via the branching portion 122 becomes the current 2ID in total, wherefore this current does not change even when a current supplied to the differential pair 10 increases. Therefore, increase in the slew rate SR is avoidable.

Figure 25:
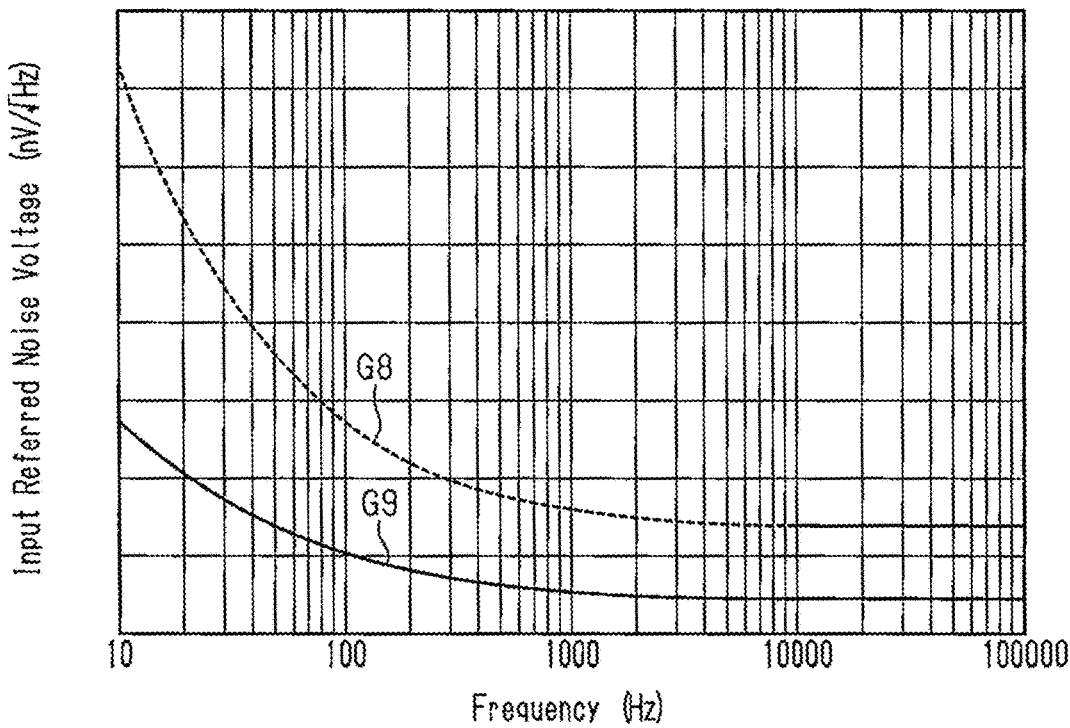
FIG. 25 is a graph showing the relationship between frequency and input referred noise voltage.

FIG. 25 shows the relationship between an input referred noise voltage and a frequency for each of the comparative operational amplifier and the operational amplifier 1F. A graph G8 indicated by a broken line in FIG. 25 shows the input referred noise voltage of the comparative operational amplifier, while a graph G9 indicated by a solid line in FIG. 25 shows the input referred noise voltage of the operational amplifier 1F. As can be seen from the graphs G8 and G9 in FIG. 25, the input referred noise voltage of the operational amplifier 1F is lower than that of the comparative operational amplifier.

The transistors M1 to M4 and the transistor of the constant current source 11 of the operational amplifier 1F according to the present embodiment have the same configuration and manufacturing method as the configuration and manufacturing method of the transistors of the transistors M1 to M4 and the transistor of the constant current source 11 of the operational amplifier 1 of the first embodiment. Accordingly, as described in (1-5) and (1-6) of the first embodiment, 1/f noise of the output signal Sout can be effectively reduced.

The transistors MB1 to MB5 of the current adjustment unit 120 are not easily affected by 1/f noise of the output signal Sout. Accordingly, the impurity concentration in the channel region of each of the transistors MB1 to MB5 is raised higher than the impurity concentration in the channel region of each of the transistors M1 to M4. In other words, the impurity concentration in the channel region of each of the transistors M1 to M4 is lower than the impurity concentration in the channel region of each of the transistors MB1 to MB5. That is, each of the transistors M1 to M4 is a low concentration transistor, while each of the transistors MB1 to MB5 is a high concentration transistor. The impurity concentration in the channel region of each of the transistors M1 to M4 is preferably about ½ or lower of the impurity concentration in the channel region of each of the transistors MB1 to MB5. In the present embodiment, the impurity concentration in the channel region of each of the transistors M1 to M4 is about 1/10 of the impurity concentration in the channel region of each of the transistors MB1 to MB5. The transistors MB1 to MB5 are surface channel type MOSFETs.

According to the present embodiment, following effects are achievable.

(9-1) The current supplying unit 121 can make each of currents supplied to the first transistor M1 and the second transistor M2 configuring the differential pair 10 larger than the constant current 2ID. Accordingly, the transconductance gm12 of each of the first transistor M1 and the second transistor M2 is allowed to increase. On the other hand, a part of the currents from the first transistor M1 and the second transistor M2 is caused to flow toward the branching portion 122 by the branching portion 122, wherefore the currents flowing through the third transistor M3 and the fourth transistor M4 become smaller than the currents flowing through the first transistor M1 and the second transistor M2. Accordingly, reduction of an increase in the transconductance gm34 of each of the third transistor M3 and the fourth transistor M4 is achievable. Therefore, noise of the output signal Sout of the operational amplifier 1F can decrease.

(9-2) A difference between the current IDB4 flowing through the first branching transistor MB4 and the current IDB5 flowing through the second branching transistor MB5, produced by element variations of the first branching transistor MB4 and the second branching transistor MB5, affects the currents ID3 and ID4 flowing through the third transistor M3 and the fourth transistor M4, and may generate offset voltages of the third transistor M3 and the fourth transistor M4.

In the present embodiment, the current IDB4 flowing through the first branching transistor MB4 and the current IDB5 flowing through the second branching transistor MB5 are equalized with the current ID. Accordingly, effects produced by element variations of the first branching transistor MB4 and the second branching transistor MB5 and imposed on the currents ID3 and ID4 flowing through the third transistor M3 and the fourth transistor M4 can decrease.

(9-3) The impurity concentration in the channel region of each of the transistors MB1 to MB5 of the current adjustment unit 120 is higher than the impurity concentration in the channel region of each of the transistors M1 to M4. Accordingly, variations of the threshold voltages of the transistors MB1 to MB5 can be reduced, wherefore the current adjustment unit 120 can be operated in a stable manner.

(9-4) The impurity concentration in the channel region of each of the transistors MB1 and MB3 in the current adjustment unit 120 is equal to the impurity concentration in the channel region of the transistor of the constant current source 11. According to this configuration, the step of forming the N-type well layer 63 of each of the transistors MB1 and MB3, and the step of forming the N-type well layer 63 of the transistor of the constant current source 11 can be performed collectively. Accordingly, the step of manufacturing the operational amplifier 1F can be simplified.

Modifications of Ninth Embodiment

The operational amplifier 1F of the present embodiment can be modified in following manners. Following modified examples can be combined with each other as long as technical contradiction does not occur.

According to the current adjustment unit 120 of the operational amplifier 1F, the magnitude of the supply current IDB3 from the current supplying unit 121 may be changed to any magnitude within a range not exceeding the constant current 2ID. For example, the current ratio of the first supply transistor MB1 to the third supply transistor MB3 may be set to 2:1. In this case, the supply current IDB3 of the third supply transistor MB3 becomes ½ of the supply current IDB2. In this manner, the supply current IDB3 can be made smaller than the constant current 2ID. Accordingly, the current IDB4 flowing through the first branching transistor MB4 and the current IDB5 flowing through the second branching transistor MB5 become smaller than the current ID, wherefore effects produced by element variations of the branching transistor MB4 and MB5 and imposed on the currents ID3 and ID4 flowing through the third transistor M3 and the fourth transistor M4 can further decrease.

Instead of lowering the impurity concentration in the channel region of each of the transistors M1 to M4 of the operational amplifier 1F, embedded channel type MOSFETs such as the transistors M1 to M4 of the second embodiment may be adopted. In this case, effects similar to the effects of the second embodiment can be obtained. Any one or two of the pairs of the transistors M1 and M2 configuring the differential pair 10 of the operational amplifier 1F, and the pair of the transistors M3 and M4 configuring the current mirror circuit 12 may be changed to the embedded channel type MOSFETs of the second embodiment.

In addition to lowering the impurity concentration in the channel region of each of the transistors M1 to M4 in the operational amplifier 1F, embedded channel type MOSFETs may be adopted. That is, the transistors M1 to M4 may have structures similar to the structures of the transistors M1 to M4 of the third embodiment. In this case, effects similar to the effects of the third embodiment can be obtained. Any one or two of the pair of transistors M1 and M2 configuring the differential pair 10 in the operational amplifier 1F, and the pair of the transistors M3 and M4 configuring the current mirror circuit 12 may be changed to structures similar to the structures of the transistors M1 to M4 of the third embodiment.

Furthermore, any one or two of the pair of transistors M1 and M2 configuring the differential pair 10, and the pair of the transistors M3 and M4 configuring the current mirror circuit 12 may be changed to structures similar to the structures of the embedded channel type MOSFETs of the second embodiment, or the transistors M1 to M4 of the third embodiment. In short, the operational amplifier 1F may have a configuration which includes a mixture of structures similar to the structures of the low concentration transistors of the first embodiment, the embedded channel type MOSFETs of the second embodiment, and the transistors M1 to M4 of the third embodiment.

Tenth Embodiment

Figure 26:
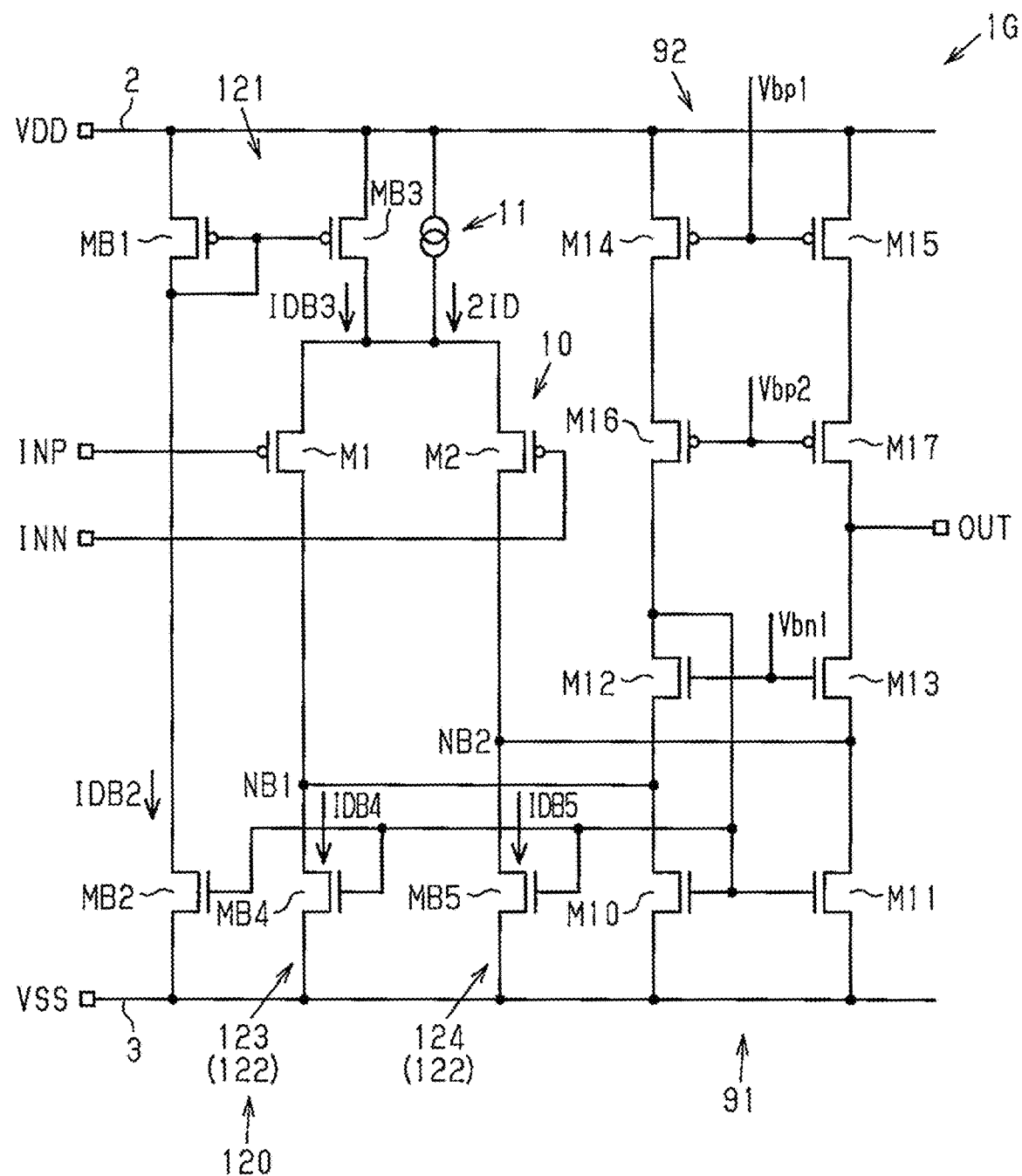
FIG. 26 is a circuit diagram of an operational amplifier according to a tenth embodiment.

An operational amplifier 1G according to a tenth embodiment will be described with reference to FIG. 26. The operational amplifier 1G of the present embodiment is different from the operational amplifier 1F of the ninth embodiment chiefly in that the active load is changed from the current mirror circuit to the cascode current mirror circuit, and that a bias circuit is added. The cascode current mirror circuit and the bias circuit of the present embodiment are similar to the cascode current mirror circuit 91 and the bias circuit 92 of the fourth embodiment, and therefore are given similar reference numbers and not repeatedly described herein.

In the operational amplifier 1G, following differences of the connection configuration of the first branching circuit 123 and the second branching circuit 124 of the branching portion 122 in the current adjustment unit 120 are produced by changing from the current mirror circuit 12 to the cascode current mirror circuit 91.

The first branching transistor MB4 of the first branching circuit 123 is connected to a node NB1 between the drain of the first transistor M1 and the drain of the tenth transistor M10. More specifically, the drain of the first branching transistor MB4 is connected to the node NB1, while the source of the first branching transistor MB4 is connected to the second power supply line 3. The second branching transistor MB5 of the second branching circuit 124 is connected to a node NB2 between the drain of the second transistor M2 and the drain of the eleventh transistor M11. More specifically, the drain of the second branching transistor MB5 is connected to the node NB2, while the source of the second branching transistor MB5 is connected to the second power supply line 3. The gates of the transistors MB4 and MB5 are connected in common to the gate of the tenth transistor M10. The gate of the second supply transistor MB2 of the current supplying unit 121 of the current adjustment unit 120 is connected to the gate of the tenth transistor M10. The transistors MB2, MB4, and MB5 thus configure a current mirror circuit in cooperation with the tenth transistor M10.

The current flowing through the operational amplifier 1G, particularly the current flowing through the current adjustment unit 120, is similar to the current flowing through the current adjustment unit 120 of the ninth embodiment except that the third transistor M3 and the fourth transistor M4 of the ninth embodiment are replaced with the tenth transistor M10 and the eleventh transistor M11. Accordingly, effects similar to the effects (9-1) and (9-2) of the ninth embodiment can be obtained.

Further, the structure and manufacturing method of the transistors configuring the operational amplifier 1G are similar to the structure and manufacturing method of the transistors configuring the operational amplifier 1A of the fourth embodiment except for the transistor of the back gate bias circuit 20. That is, the impurity concentration in the channel region of each of the transistors M1, M2, M10 to M17 is equal to the impurity concentration in the channel region of each of the transistors M1, M2, M10 to M17 of the fourth embodiment. The impurity concentration in the channel region of each of the transistor of the constant current source 11 and the transistors M12, M13, M16, and M17 is equal to the impurity concentration in the channel region of each of the transistor of the constant current source 11 and the transistors of the transistors M12, M13, M16, and M17 of the fourth embodiment. Accordingly, effects similar to the effects (4-1) to (4-3) of the fourth embodiment can be obtained.

The structure and manufacturing method of the transistors MB1 to MB5 of the present embodiment are similar to the structure and manufacturing method of the transistors MB1 to MB5 of the ninth embodiment. That is, the impurity concentration in the channel region of each of the transistors MB1 to MB5 is equal to the impurity concentration in the channel region of each of the transistors MB1 to MB5 of the ninth embodiment, and the transistors MB1 to MB5 are surface channel type MOSFETs similarly to the transistors MB1 to MB5 of the ninth embodiment. Accordingly, effects similar to the effects (9-3) and (9-4) of the ninth embodiment can be obtained.

According to the present embodiment, following effects are achievable.

(10-1) The impurity concentration in the channel region of each of the transistors MB1 and MB3 in the current adjustment unit 120 is equal to the impurity concentration in the channel region of each of the transistor of the constant current source 11 and the transistors M16 and M17 of the bias circuit 92. According to this configuration, the step of forming the N-type well layer 63 of the transistors MB1 and MB3, the step of forming the N-type well layer 63 of the constant current source 11, and the step of forming the N-type well layer 63 of each of the transistors M16 and M17 of the bias circuit 92 can be collectively performed. Accordingly, the step of manufacturing the operational amplifier 1G can be simplified.

(10-2) The impurity concentration in the channel region of each of the transistors MB2, MB4, and MB5 in the current adjustment unit 120 is equal to the impurity concentration in the channel region of each of the transistors M12 and M13 of the cascode current mirror circuit 91. According to this configuration, the step of forming the P-type well layer 41 of each of the transistors MB2, MB4, and MB5, and the step of forming the P-type well layer 41 of each of the transistors M12 and M13 can be collectively performed. Accordingly, the step of manufacturing the operational amplifier 1G can be simplified.

Modifications of Tenth Embodiment

The operational amplifier 1G of the present embodiment can be modified in following manners. Following modified examples can be combined with each other as long as technical contradiction does not occur.

According to the current adjustment unit 120 of the operational amplifier 1G, the magnitude of the supply current IDB3 from the current supplying unit 121 may be changed to any magnitude within a range not exceeding the constant current 2ID. For example, the current ratio of the first supply transistor MB1 to the third supply transistor MB3 may be set to 2:1. In this case, the supply current IDB3 of the third supply transistor MB3 becomes ½ of the supply current IDB2. In this manner, the supply current IDB3 can be made smaller than the constant current 2ID. Accordingly, the current IDB4 flowing through the first branching transistor MB4 and the current IDB5 flowing through the second branching transistor MB5 become smaller than the current ID. Accordingly, effects caused by element variations of the first branching transistor MB4 and the second branching transistor MB5 and imposed on the currents flowing through the tenth transistor M10 and the eleventh transistor M11 can further decrease.

Instead of lowering the impurity concentration in the channel region of each of the transistors M1, M2, M10, M11, M14, and M15 in the operational amplifier 1G, embedded channel type MOSFETs such as the transistors M1 to M4 of the second embodiment may be adopted. In this case, effects similar to the effects of the second embodiment can be obtained. Any one or two of the pair of transistors M1 and M2 configuring the differential pair 10, the pair of transistors M10 and M11 configuring the current source of the cascode current mirror circuit 91, and the pair of the transistors M14 and M15 configuring the current source of the bias circuit 92 may be changed to the embedded channel type MOSFETs of the second embodiment.

In addition to lowering the impurity concentration in the channel region of each of the transistors M1, M2, M10, M11, M14, and M15 in the operational amplifier 1G, embedded channel type MOSFETs may be adopted. That is, each of the transistors M1, M2, M10, M11, M14, and M15 may have a structure similar to the structure of each of the transistors M1 to M4 of the third embodiment. In this case, effects similar to the effects of the third embodiment can be obtained. Any one or two of the pair of transistors M1 and M2 configuring the differential pair 10 in the operational amplifier 1G, the pair of transistors M10 and M11 configuring the current source of the cascode current mirror circuit 91, and the pair of the transistors M14 and M15 configuring the current source of the bias circuit 92 may be changed to structures similar to the structures of the transistors M1 to M4 of the third embodiment. Furthermore, any one or two of the pair of transistors M1 and M2 configuring the differential pair 10 in the operational amplifier 1G, the pair of transistors M10 and M11 configuring the current source of the cascode current mirror circuit 91, and the pair of the transistors M14 and M15 configuring the current source of the bias circuit 92 may be changed to the embedded channel type MOSFETs of the second embodiment or the structures of the transistors M1 to M4 of the third embodiment. In short, the operational amplifier 1G may have a configuration which includes a mixture of structures similar to the structures of the low concentration transistor of the first embodiment, the embedded channel type MOSFETs of the second embodiment, and the transistors M1 to M4 of the third embodiment.

Eleventh Embodiment

Figure 27:
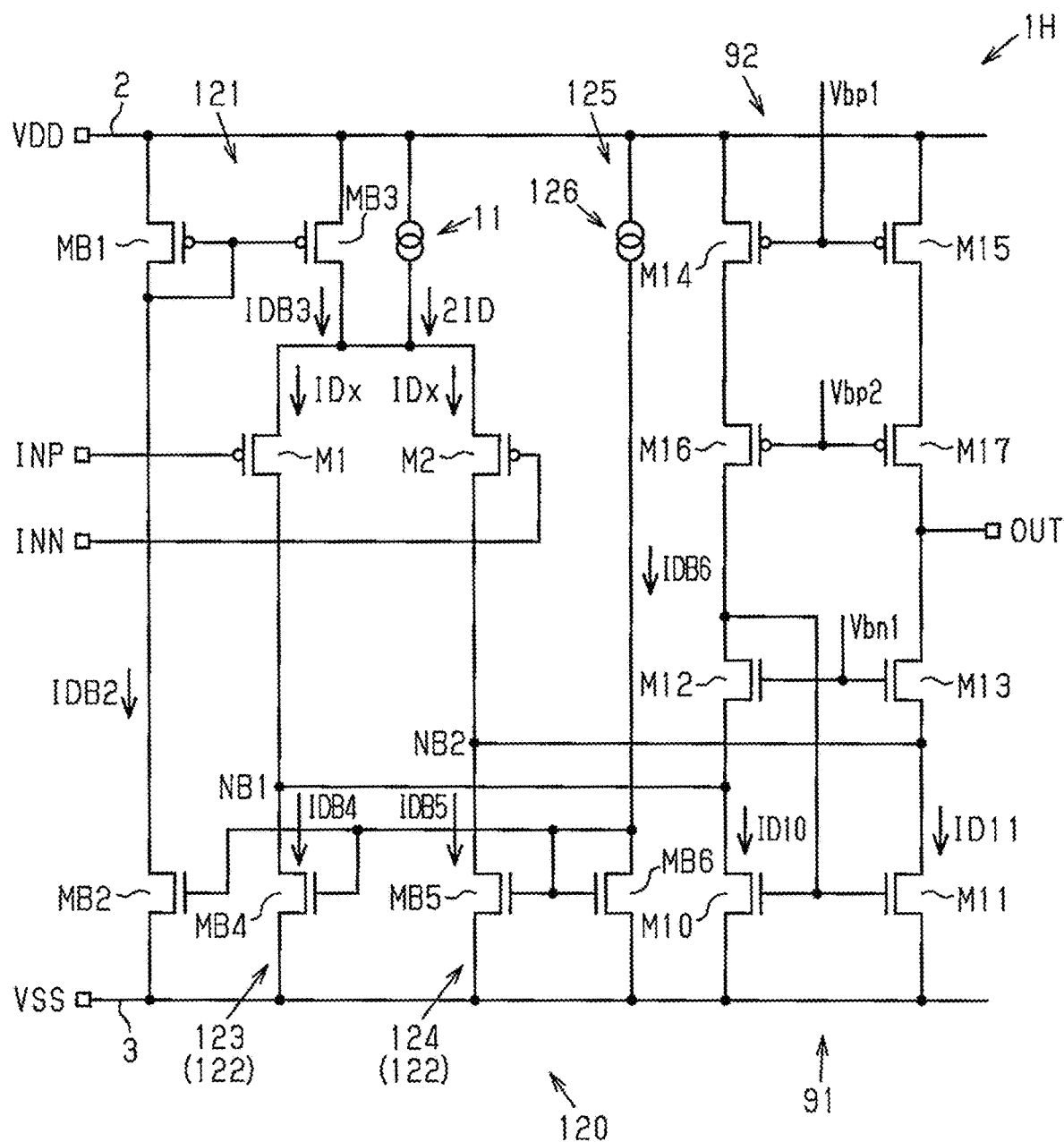
FIG. 27 is a circuit diagram of an operational amplifier according to an eleventh embodiment.

An operational amplifier 1H according to an eleventh embodiment will be described with reference to FIG. 27. The operational amplifier 1H of the present embodiment is different from the operational amplifier 1G of the tenth embodiment chiefly in that a current amount of the current adjustment unit 120 is adjusted separately from the transistors M10 and M11 configuring an active load.

The current adjustment unit 120 includes an adjustment current source 125. The adjustment current source 125 adjusts an amount of current supplied to the differential pair 10 by the current supplying unit 121, and a current amount branched from the current from the differential pair 10 and supplied to the second power supply line 3 by the branching portion 122. The adjustment current source 125 is provided between the first power supply line 2 and the second power supply line 3, and includes a constant current source 126 and a transistor MB6.

The constant current source 126 is provided between the first power supply line 2 and the transistor MB6. The constant current source 126 includes a transistor. The transistor of the present embodiment is a P-channel MOSFET.

The transistor MB6 is connected to the constant current source 126. The transistor of the present embodiment is an N-channel MOSFET. The drain of the transistor MB6 is connected to the constant current source 126, the source of the transistor MB6 is connected to the second power supply line 3, and the gate of the transistor MB6 is connected to the drain of the transistor MB6.

According to the present embodiment, the gate of the second supply transistor MB2 of the current supplying unit 121, and the gates of the transistors MB4 and MB5 of the branching portion 122 are connected in common to the gate of the transistor MB6. That is, the transistors MB2, and MB4 to MB6 configure a current mirror circuit. The gate voltages of the transistors MB2, and MB4 to MB6 are controlled by the gate voltage of the transistor MB6.

A current flowing through the operational amplifier 1H, particularly a current flowing through the current adjustment unit 120 will be described. In the following description, a constant current flowing through the constant current source 11 is referred to as 2ID.

In the operational amplifier 1H, the constant current 2ID and the supply current IDB3 from the third supply current transistor MB3 are supplied to the differential pair 10. The current ratio of the first supply transistor MB1 to the third supply transistor MB3 is 1:1 also in the present embodiment, wherefore the supply current IDB3 is equal to the current IDB2. More specifically, the supply current IDB3 is a current proportional to the current IDB2 caused to flow through the second supply transistor MB2 by the current mirror circuit including the transistors MB1 and MB3. According to the present embodiment, the transistors MB4 and MB5 and the second supply transistor MB2 configure a current mirror circuit, wherefore the current IDB2 flowing through the second supply transistor MB2 is a sum of the currents flowing through the transistors MB4 and MB5 (IDB4+IDB5). The gate voltages of the transistors MB4 and MB5 are controlled by the gate voltage of the transistor MB6. Accordingly, the magnitude of the current IDB2 is proportional to the current IDB6 flowing through the transistor MB6.

In this case, the current IDx flowing through each of the transistors M1 and M2 is expressed as IDx=(2ID+IDB3)/2 when inputs of the constant current 2ID and the supply current IDB3 are in the same phase, that is, when gate signals as input signals are in the same phase. In this manner, the current IDx flowing through each of the transistors M1 and M2 becomes larger than the current ID (constant current 2ID/2) by ½ of the IDB3. On the other hand, the currents IDB4 and IDB5 are extracted from the drains of the transistors M1 and M2 by the transistors MB4 and MB5 of the branching portion 122 configuring a current mirror circuit in cooperation with the tenth transistor M10. As a result, the current ID10 flowing through the tenth transistor M10 becomes IDx−IDB4, while the current ID11 flowing through the eleventh transistor M11 becomes IDx−IDB5. Accordingly, each of the currents IDB4 and IDB5 of the present embodiment becomes ½ of the current IDB3. That is, the amount of increase in the current flowing through each of the transistors M1 and M2 is caused to flow through each of the transistors MB4 and MB5. Accordingly, the current adjustment unit 120 increases the currents flowing through the transistors M1 and M2, but does not increase the currents flowing through the transistors M10 and M11. As a result, the transconductance gm of each of the transistors M1 and M2 of the differential pair 10 increases, while the transconductance gm of each of the transistors M10 and M11 of the active load does not increase. Accordingly, reduction of noise of the output signal Sout of the operational amplifier 1H is achievable.

The structure and manufacturing method of the transistors M1, M2, M10 to M17 and the transistor of the constant current source 11 are similar to the structure and manufacturing method of the transistors of the transistors M1, M2, M10 to M17 and the transistor of the constant current source 11 of the fourth embodiment. That is, the impurity concentration in the channel region of each of the transistors M1, M2, M10 to M17 and the transistor of the constant current source 11 is equal to the impurity concentration in the channel region of each of the transistors M1, M2, M10 to M17 and the transistor of the constant current source 11 of the fourth embodiment.

The structure of each of the transistors MB1 to MB5 is similar to the structure of each of the transistors MB1 to MB5 of the ninth and tenth embodiments. That is, the impurity concentration of the channel region in each of the transistors MB1 to MB5 is equal to the impurity concentration of the channel region in each of the transistors MB1 to MB5 in the ninth and tenth embodiments. Accordingly, effects similar to the effects of (9-3) and (9-4) of the ninth embodiment and the effects of (10-1) and (10-2) of the tenth embodiment can be obtained.

The impurity concentration in the channel region of each of the transistor of the constant current source 126 and the transistor MB6 of the adjustment current source 125 is equal to the impurity concentration in the channel region of each of the transistors MB1 to MB5. Each of the transistor of the constant current source 126 and the transistor MB6 is a surface channel type MOSFET.

According to the present embodiment, following effects are achievable.

(11-1) The current caused to flow from the differential pair 10 to the branching portion 122 by the adjustment current source 125 is a current proportional to the current flowing from the constant current source 126 of the adjustment current source 125 to the transistor MB6. Therefore, the current flowing from the differential pair 10 to the branching portion 122 can be set independently from the third transistor M3 and the fourth transistor M4 by the adjustment current source 125.

(11-2) The impurity concentration in the channel region of each of the transistor of the constant current source 126 and the transistor of the adjustment current source 125 is higher than the impurity concentration in the channel region of each of the transistors M1 to M4. Accordingly, variations of the threshold voltages of the transistors MB1 to MB5 can be reduced, wherefore the current adjustment unit 120 can be operated in a stable manner.

(11-3) The impurity concentration in the channel region of the transistor of the constant current source 126 is equal to the impurity concentration in the channel region of each of the transistor of the constant current source 11 and the transistors M16 and M17 of the bias circuit 92. According to this configuration, the step of forming the N-type well layer 63 of the transistor of the constant current source 126, the step of forming the N-type well layer 63 of the transistor of the constant current source 11, and the step of forming the N-type well layer 63 of each of the transistors M16 and M17 of the bias circuit 92 can be collectively performed. Accordingly, the step of manufacturing the operational amplifier 1H can be simplified.

(11-4) The impurity concentration in the channel region of the transistor MB6 is equal to the impurity concentration in the channel region of each of the transistors M12 and M13 of the cascode current mirror circuit 91. According to this configuration, the step of forming the P-type well layer 41 of the transistor MB6, and the step of forming the P-type well layer 41 of each of the transistors M12 and M13 can be collectively performed. Accordingly, the step of manufacturing the operational amplifier 1H can be simplified.

Modifications of Eleventh Embodiment

The operational amplifier 1H of the present embodiment can be modified in following manners. Following modified examples can be combined with each other as long as technical contradiction does not occur.

In the current adjustment unit 120 of the operational amplifier 1H, the magnitude of the supply current IDB3 from the current supplying unit 121 may be changed to any magnitude within a range not exceeding the constant current 2ID. For example, the current ratio of the first supply transistor MB1 to the third supply transistor MB3 may be set to 2:1. In this case, the supply current IDB3 of the third supply transistor MB3 becomes ½ of the supply current IDB2. In this manner, the supply current IDB3 can be made smaller than the constant current 2ID. Accordingly, the current IDB4 flowing through the first branching transistor MB4 and the current IDB5 flowing through the second branching transistor MB5 become smaller than the current ID. Accordingly, effects caused by element variations of the branching transistors MB4 and MB5 and imposed on the currents flowing through the tenth transistor M10 and the eleventh transistor M11 can decrease.

The operational amplifier 1H may include the current mirror circuit 12 in place of the cascode current mirror circuit 91 and the bias circuit 92.

Instead of lowering the impurity concentration in the channel region of each of the transistors M1, M2, M10, M11, M14, and M15 in the operational amplifier 1H, embedded channel type MOSFETs such as the transistors M1 to M4 of the second embodiment may be adopted. In this case, effects similar to the effects of the second embodiment can be obtained. Any one or two of the pair of transistors M1 and M2 configuring the differential pair 10, the pair of transistors M10 and M11 configuring the current source of the cascode current mirror circuit 91, and the pair of the transistors M14 and M15 configuring the current source of the bias circuit 92 may be changed to the embedded channel type MOSFETs of the second embodiment.

In addition to lowering the impurity concentration in the channel region of each of the transistors M1, M2, M10, M11, M14, and M15 in the operational amplifier 1H, embedded channel type MOSFETs may be adopted. That is, each of the transistors M1, M2, M10, M11, M14, and M15 may have a structure similar to the structure of each of the transistors M1 to M4 of the third embodiment. In this case, effects similar to the effects of the third embodiment can be obtained. Any one or two of the pair of transistors M1 and M2 configuring the differential pair 10 in the operational amplifier 1H, the pair of transistors M10 and M11 configuring the current source of the cascode current mirror circuit 91, and the pair of the transistors M14 and M15 configuring the current source of the bias circuit 92 may be changed to structures similar to the structures of the transistors M1 to M4 of the third embodiment. Furthermore, any one or two of the pair of transistors M1 and M2 configuring the differential pair 10 in the operational amplifier 1H, the pair of transistors M10 and M11 configuring the current source of the cascode current mirror circuit 91, and the pair of the transistors M14 and M15 configuring the current source of the bias circuit 92 may be changed to structures similar to the structures of the embedded channel type MOSFETs of the second embodiment or the structures of the transistors M1 to M4 of the third embodiment. In short, the operational amplifier 1H may have a configuration which includes a mixture of structures similar to the structures of the low concentration transistors of the first embodiment, the embedded channel type MOSFETs of the second embodiment, and the transistors M1 to M4 of the third embodiment.

Twelfth Embodiment

Figure 28:
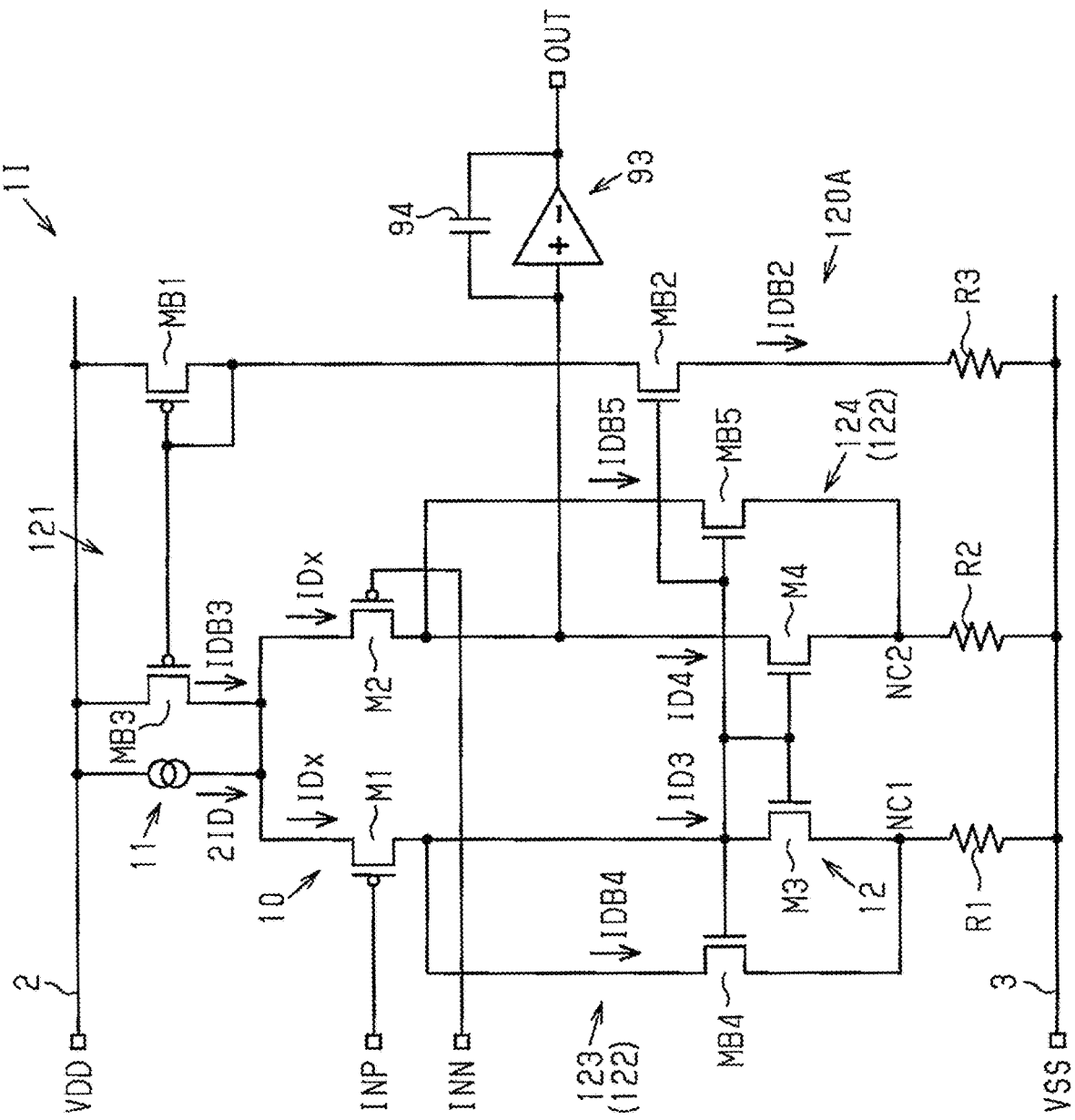
FIG. 28 is a circuit diagram of an operational amplifier according to a twelfth embodiment.

An operational amplifier 1I according to a twelfth embodiment will be described with reference to FIG. 28. The operational amplifier 1I according to the present embodiment includes a current adjustment unit 120A, and the output stage 93 and the capacitor 94 of the fourth embodiment in addition to the operational amplifier 1D of the seventh embodiment.

The current adjustment unit 120A is different from the current adjustment unit 120 of the tenth embodiment in that a third resistor R3 is added to the current supplying unit 121, and that the connection configurations of the first branching circuit 123 and the second branching circuit 124 are different.

The third resistor R3 of the current supplying unit 121 is provided between the second supply transistor MB2 and the second power supply line 3. The first terminal of the third resistor R3 is connected to the source of the second supply transistor MB2, while the second terminal of the third resistor R3 is connected to the second power supply line 3. The third resistor R3 increases the source potential of the second supply transistor MB2. The resistance value of the third resistor R3 is determined according to the ratio of the third transistor M3 and the fourth transistor M4 to the second supply transistor MB2. The resistance value of the third resistor R3 of the present embodiment is equal to the resistance value of each of the first resistor R1 and the second resistor R2.

The first branching circuit 123 is connected to the drain of the first transistor M1, and a node NC1 between the third transistor M3 and the first resistor R1. More specifically, the drain of the first branching transistor MB4 of the first branching circuit 123 is connected to the drain of the first transistor M1, while the source of the first branching transistor MB4 is connected to the node NC1.

The second branching circuit 124 is connected to the drain of the second transistor M2, and a node NC2 between the fourth transistor M4 and the second resistor R2. More specifically, the drain of the second branching transistor MB5 of the second branching circuit 124 is connected to the drain of the second transistor M2, while the source of the second branching transistor MB5 is connected to the node NC2.

A current flowing through the operational amplifier 1I, particularly a current flowing through the current adjustment unit 120A will be described. In the following description, a constant current flowing through the constant current source 11 is referred to as 2ID. The magnitudes of the supply current IDB3, the currents IDB2, IDB4, and IDB5, and the currents ID3 and ID4 are similar to the magnitudes of the supply current IDB3, the currents IDB2, IDB4, and IDB5, and the currents ID3 and ID4 of the ninth embodiment. Accordingly, these currents are not repeatedly described.

As described in the ninth embodiment, the supply current IDB3 having the same current amount as the current IDB2 which is the sum of the currents IDB4 and IDB5 flowing through the transistors MB4 and MB5 is supplied to the differential pair 10. In this case, the current supplied to the differential pair 10 is the sum of the supply current IDB3 and the constant current 2ID, wherefore the transconductance gm12 of each of the transistors M1 and M2 increases. Meanwhile, the currents IDB4 and IDB5 are extracted from the current IDx flowing through the transistors M1 and M2 by the transistors MB4 and MB5. Accordingly, an increase in the transconductance gm34 of each of the transistors M3 and M4 is suppressed.

The current IDB4 flowing through the first branching transistor MB4 flows to the node NC1 between the third transistor M3 and the first resistor R1, while the current IDB5 flowing through the second branching transistor MB5 flows to the node NC2 between the fourth transistor M4 and the second resistor R2. Therefore, the source potential of the third transistor M3 and the source potential of the fourth transistor M4 rise. In addition, as described in the seventh embodiment, the source potentials of the third transistor M3 and the fourth transistor M4 are raised by the first resistor R1 and the second resistor R2. In this manner, the source potential of each transistor M3 and M4 are more raised in the present embodiment than in the seventh embodiment. Accordingly, transconductance gm34 on the circuit decreases. In this manner, the transconductance gm12 of each of the transistors M1 and M2 increases, while the transconductance gm34 of each of the transistors M3 and M4 decreases. Accordingly, reduction of noise of the output signal Sout of the operational amplifier 1I is achievable.

The transistors M1 to M4 and the transistor of the constant current source 11 of the operational amplifier 1I according to the present embodiment have the same configuration and manufacturing method as the configuration and manufacturing method of the transistors of the transistors M1 to M4 and the transistor of the constant current source 11 of the first embodiment. Accordingly, as described in (1-5) and (1-6) of the first embodiment, 1/f noise of the output signal Sout can be effectively reduced. The structure and manufacturing method of the transistors MB1 to MB5 of the current adjustment unit 120A of the present embodiment are similar to the structure and manufacturing method of the transistors MB1 to MB5 of the current adjustment unit 120 of the ninth embodiment. That is, the impurity concentration in the channel region of each of the transistors MB1 to MB5 of the present embodiment is equal to the impurity concentration in the channel region of each of the transistors MB1 to MB5 of the ninth embodiment, and the transistors MB1 to MB5 are surface channel type MOSFETs similarly to the transistors MB1 to MB5 of the ninth embodiment.

Modifications of Twelfth Embodiment

The operational amplifier 1I of the present embodiment can be changed as follows. Following modified examples can be combined with each other as long as technical contradiction does not occur.

In the current adjustment unit 120A of the operational amplifier 1I, the magnitude of the supply current IDB3 from the current supplying unit 121 may be changed to any magnitude within a range not exceeding the constant current 2ID. For example, the current ratio of the first supply transistor MB1 to the third supply transistor MB3 may be set to 2:1. In this case, the supply current IDB3 of the third supply transistor MB3 becomes ½ of the supply current IDB2. In this manner, the supply current IDB3 can be made smaller than the constant current 2ID. Accordingly, the current IDB4 flowing through the first branching transistor MB4 and the current IDB5 flowing through the second branching transistor MB5 become smaller than the current ID, wherefore effects produced by element variations of the branching transistor MB4 and MB5 and imposed on the currents ID3 and ID4 flowing through the third transistor M3 and the fourth transistor M4 can further decrease.

The resistance value of the first resistor R1, the resistance value of the second resistor R2, and the resistance value of the third resistor R3 may be changed according to the ratio of the third transistor M3, the fourth transistor M4, and the second supply transistor MB2.

Instead of lowering the impurity concentration in the channel region of each of the transistors M1 to M4 in the operational amplifier 1I, embedded channel type MOSFETs such as the transistors M1 to M4 of the second embodiment may be adopted. In this case, effects similar to the effects of the second embodiment can be obtained. Any one or two of the pairs of the transistors M1 and M2 configuring the differential pair 10 of the operational amplifier 1I, and the pair of the transistors M3 and M4 configuring the current mirror circuit 12 may be changed to the embedded channel type MOSFETs of the second embodiment.

In addition to lowering the impurity concentration in the channel region of each of the transistors M1 to M4 in the operational amplifier 1I, embedded channel type MOSFETs may be adopted. That is, the transistors M1 to M4 may have structures similar to the structures of the transistors M1 to M4 of the third embodiment. In this case, effects similar to the effects of the third embodiment can be obtained. Any one or two of the pair of transistors M1 and M2 configuring the differential pair 10 in the operational amplifier 1I, and the pair of the transistors M3 and M4 configuring the current mirror circuit 12 may be changed to structures similar to the structures of the transistors M1 to M4 of the third embodiment.

Furthermore, any one or two of the pair of transistors M1 and M2 configuring the differential pair 10 in the operational amplifier 1I, and the pair of the transistors M3 and M4 configuring the current mirror circuit 12 may be changed to structures similar to the structures of the embedded channel type MOSFETs of the second embodiment, or the transistors M1 to M4 of the third embodiment. In short, the operational amplifier 1I may have a configuration which includes a mixture of structures similar to the structures of the low concentration transistors of the first embodiment, the embedded channel type MOSFETs of the second embodiment, and the transistors M1 to M4 of the third embodiment.

Thirteenth Embodiment

Figure 29:
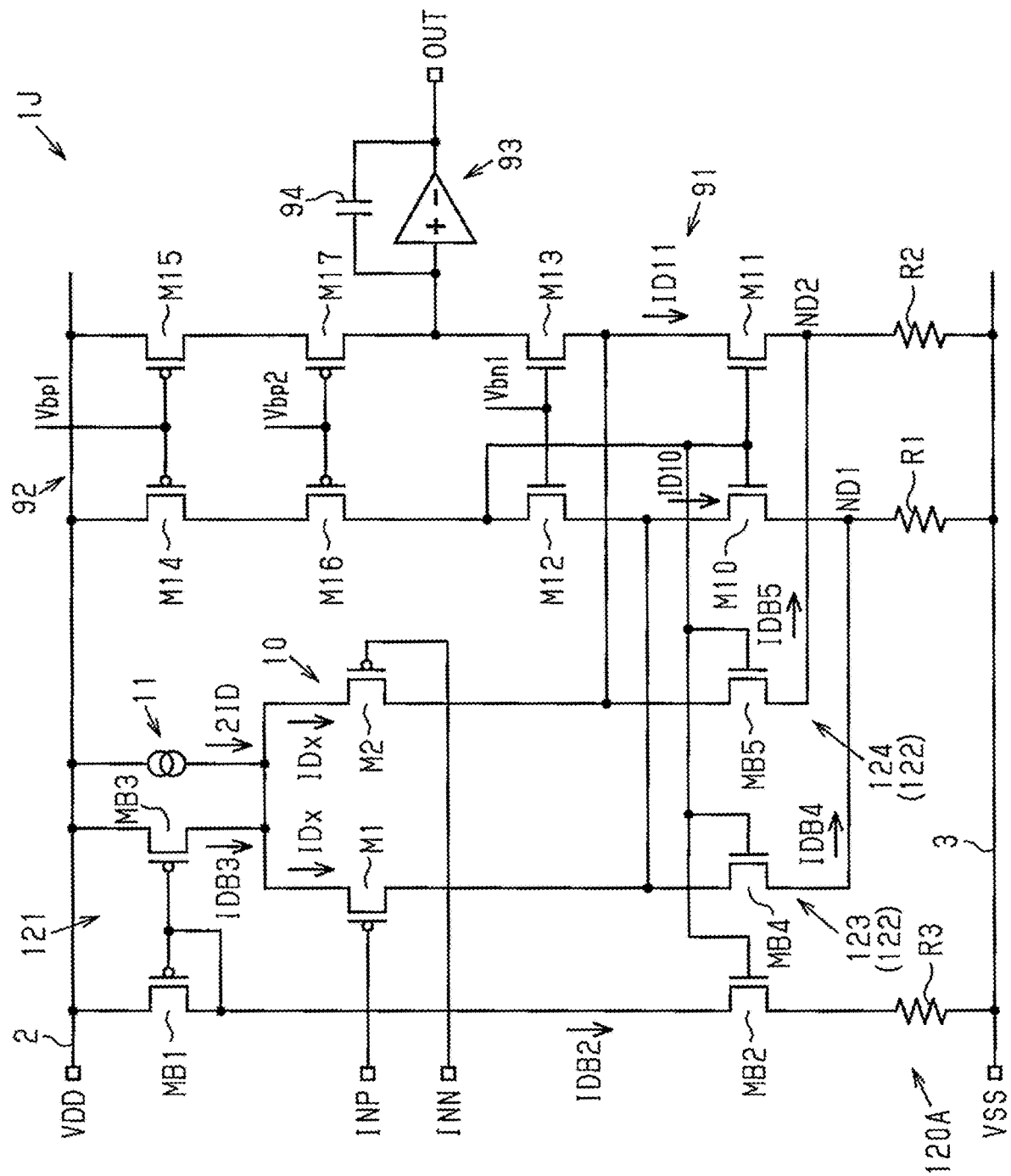
FIG. 29 is a circuit diagram of an operational amplifier according to a thirteenth embodiment.

An operational amplifier 1J according to a thirteenth embodiment will be described with reference to FIG. 29.

The operational amplifier 1J of the present embodiment is different from the operational amplifier 1I of the twelfth embodiment chiefly in that the active load is changed from the current mirror circuit to the cascode current mirror circuit, and that a bias circuit is added. The cascode current mirror circuit and the bias circuit of the present embodiment are similar to the cascode current mirror circuit 91 and the bias circuit 92 of the fourth embodiment, and therefore are given similar reference numbers and not repeatedly described herein.

Following differences of the connection configuration of the first resistor R1 and the second resistor R2, and the connection configurations of the first branching circuit 123 and the second branching circuit 124 of the branching portion 122 in the current adjustment unit 120A of the operational amplifier 1J are produced by changing from the current mirror circuit 12 to the cascode current mirror circuit 91.

The first resistor R1 is provided between the tenth transistor M10 and the second power supply line 3, while the second resistor R2 is provided between the eleventh transistor M11 and the second power supply line 3. More specifically, the first terminal of the first resistor R1 is connected to the source of the tenth transistor M10, while the second terminal of the first resistor R1 is connected to the second power supply line 3. The first terminal of the second resistor R2 is connected to the source of the eleventh transistor M11, while the second terminal of the second resistor R2 is connected to the second power supply line 3.

The first branching circuit 123 is connected to the drain of the first transistor M1, and a node ND1 between the tenth transistor M10 and the first resistor R1. More specifically, the drain of the first branching transistor MB4 of the first branching circuit 123 is connected to the drain of the first transistor M1, while the source of the first branching transistor MB4 is connected to the node ND1.

The second branching circuit 124 is connected to the drain of the second transistor M2, and a node ND2 between the eleventh transistor M11 and the second resistor R2. More specifically, the drain of the second branching transistor MB5 of the second branching circuit 124 is connected to the drain of the second transistor M2, while the source of the second branching transistor MB5 is connected to the node ND2.

The gates of the transistors MB4 and MB5 are connected in common to the gate of the tenth transistor M10. The gate of the second supply transistor MB2 of the current supplying unit 121 of the current adjustment unit 120A is connected to the gate of the tenth transistor M10. The transistors MB2, MB4, and MB5 thus configure a current mirror circuit in cooperation with the tenth transistor M10. In this manner, the gate voltages of the transistors MB2, MB4, and MB5 are controlled by the gate voltage of the tenth transistor M10.

A current flowing through the operational amplifier 1J, particularly a current flowing through the current adjustment unit 120A will be described. In the following description, a constant current flowing through the constant current source 11 is referred to as 2ID. The magnitudes of the supply current IDB3, the currents IDB2, IDB4, and IDB5, and the currents ID10 and ID11 are similar to the magnitudes of the supply current IDB3, the currents IDB2, IDB4, and IDB5, and the currents ID3 and ID4 of the ninth embodiment, and therefore are not repeatedly described herein.

As described in the ninth embodiment, the supply current IDB3 having the same current amount as the current IDB2 which is the sum of the currents IDB4 and IDB5 flowing through the transistors MB4 and MB5 is supplied to the differential pair 10. In this case, the current supplied to the differential pair 10 is the sum of the supply current IDB3 and the constant current 2ID, wherefore the transconductance gm12 of each of the transistors M1 and M2 increases. Meanwhile, the currents IDB4 and IDB5 are extracted from the current IDx flowing through each of the transistors M1 and M2 by the transistors MB4 and MB5. Accordingly, an increase in transconductance gm34 of each of the transistors M10 and M11 is suppressed.

In addition, the current IDB4 flowing through the first branching transistor MB4 flows to the node NC1 between the tenth transistor M10 and the first resistor R1, while the current IDB5 flowing through the second branching transistor MB5 flows to the node ND2 between the eleventh transistor M11 and the second resistor R2. Accordingly, the source potential of the tenth transistor M10 and the source potential of the eleventh transistor M11 rise. In addition, the source potentials of the tenth transistor M10 and the eleventh transistor M11 are further raised by the first resistor R1 and the second resistor R2. In this manner, the source potential of each of the transistors M10 and M11 are raised in the present embodiment similarly to the twelfth embodiment. Accordingly, the transconductance gm on the circuit decreases. In this manner, the transconductance gm12 of each of the transistors M1 and M2 increases, while the transconductance gm of each of the transistors M10 and M11 decreases. Accordingly, reduction of noise of the output signal Sout of the operational amplifier 1J is achievable.

Further, the structure and manufacturing method of the transistors configuring the operational amplifier 1J are similar to the structure and manufacturing method of the transistors configuring the operational amplifier 1A of the fourth embodiment except for the transistor of the back gate bias circuit 20 in the transistors configuring the operational amplifier 1A. That is, the impurity concentration in the channel region of each of the transistors M1, M2, M10 to M17 is equal to the impurity concentration in the channel region of each of the transistors M1, M2, M10 to M17 of the fourth embodiment. Accordingly, 1/f noise of the output signal Sout can be effectively reduced. The impurity concentration in the channel region of each of the transistor of the constant current source 11 and the transistors M12, M13, M16, and M17 is equal to the impurity concentration in the channel region of each of the transistor of the constant current source 11 and the transistors of the transistors M12, M13, M16, and M17 of the fourth embodiment. Accordingly, effects similar to effects (4-1) to (4-3) of the fourth embodiment can be obtained.

The structure of each of the transistors MB1 to MB5 is similar to the structure of each of the transistors MB1 to MB5 of the ninth and tenth embodiments. That is, the impurity concentration in the channel region of each of the transistors MB1 to MB5 is equal to the impurity concentration in the channel region of each of the transistors MB1 to MB5 in the ninth and tenth embodiments. Accordingly, effects similar to the effects of (9-3) and (9-4) of the ninth embodiment and the effects of (10-1) and (10-2) of the tenth embodiment can be obtained.

Modifications of Thirteenth Embodiment

The operational amplifier 1J of the present embodiment can be modified in following manners. Following modified examples can be combined with each other as long as technical contradiction does not occur.

According to the current adjustment unit 120A of the operational amplifier 1J, the magnitude of the supply current IDB3 from the current supplying unit 121 may be changed to any magnitude within a range not exceeding the constant current 2ID. For example, the current ratio of the first supply transistor MB1 to the third supply transistor MB3 may be set to 2:1. In this case, the supply current IDB3 of the third supply transistor MB3 becomes ½ of the supply current IDB2. In this manner, the supply current IDB3 can be made smaller than the constant current 2ID. Accordingly, the current IDB4 flowing through the first branching transistor MB4 and the current IDB5 flowing through the second branching transistor MB5 become smaller than the current ID. Accordingly, effects caused by element variations of the branching transistors MB4 and MB5 and imposed on the currents flowing through the tenth transistor M10 and the eleventh transistor M11 can decrease.

The resistance value of the first resistor R1, the resistance value of the second resistor R2, and the resistance value of the third resistor R3 may be changed according to the ratio of the tenth transistor M10, the eleventh transistor M11, and the second supply transistor MB2.

Instead of lowering the impurity concentration in the channel region of each of the transistors M1, M2, M10, M11, M14, and M15 in the operational amplifier 1J, embedded channel type MOSFETs such as the transistors M1 to M4 of the second embodiment may be adopted. In this case, effects similar to the effects of the second embodiment can be obtained. Any one or two of the pair of transistors M1 and M2 configuring the differential pair 10, the pair of transistors M10 and M11 configuring the current source of the cascode current mirror circuit 91, and the pair of the transistors M14 and M15 configuring the current source of the bias circuit 92 may be changed to the embedded channel type MOSFETs of the second embodiment.

In addition to lowering the impurity concentration in the channel region of each of the transistors M1, M2, M10, M11, M14, and M15 in the operational amplifier 1J, embedded channel type MOSFETs may be adopted. That is, each of the transistors M1, M2, M10, M11, M14, and M15 may have a structure similar to the structure of each of the transistors M1 to M4 of the third embodiment. In this case, effects similar to the effects of the third embodiment can be obtained. Any one or two of the pair of transistors M1 and M2 configuring the differential pair 10 in the operational amplifier 1J, the pair of transistors M10 and M11 configuring the current source of the cascode current mirror circuit 91, and the pair of the transistors M14 and M15 configuring the current source of the bias circuit 92 may be changed to structures similar to the structures of the transistors M1 to M4 of the third embodiment. Furthermore, any one or two of the pair of transistors M1 and M2 configuring the differential pair 10 in the operational amplifier 1J, the pair of transistors M10 and M11 configuring the current source of the cascode current mirror circuit 91, and the pair of the transistors M14 and M15 configuring the current source of the bias circuit 92 may be changed to structures similar to the structures of the embedded channel type MOSFETs of the second embodiment or the transistors M1 to M4 of the third embodiment. In short, the operational amplifier 1J may have a configuration which includes a mixture of structures similar to the structures of the low concentration transistors of the first embodiment, the embedded channel type MOS-FETs of the second embodiment, and the transistors M1 to M4 of the third embodiment.

Fourteenth Embodiment

Figure 30:
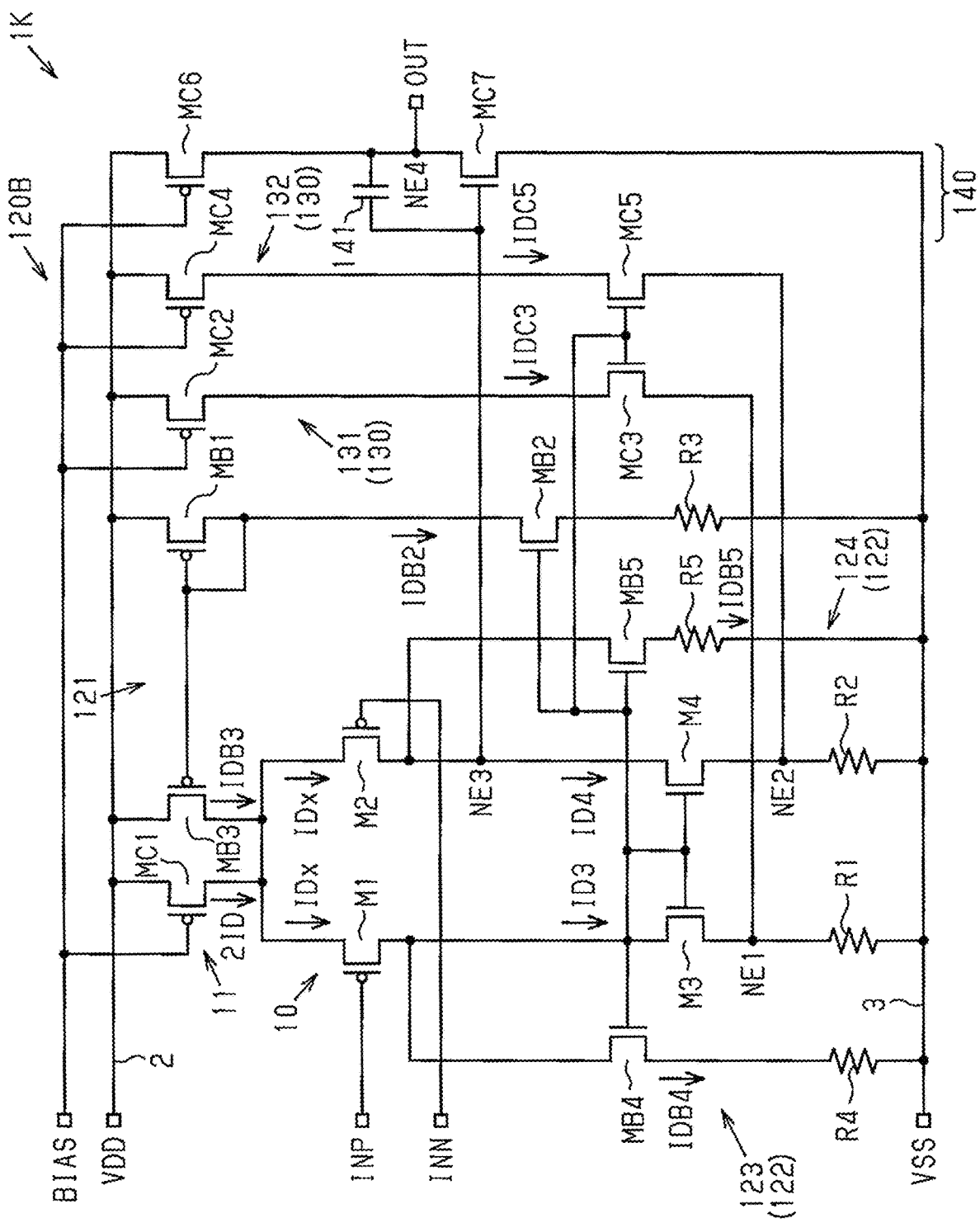
FIG. 30 is a circuit diagram of an operational amplifier according to a fourteenth embodiment.

An operational amplifier 1K according to a fourteenth embodiment will be described with reference to FIG. 30. The operational amplifier 1K of the present embodiment is different from the operational amplifier 1I of the twelfth embodiment chiefly in the method of controlling source potentials of the third transistor M3 and the fourth transistor M4 as the active load, and the configuration of the current adjustment unit.

The constant current source 11 of the operational amplifier 1K includes a transistor MC1. The transistor MC1 of the present embodiment is a P-channel MOSFET. The source of the transistor MC1 is connected to the first power supply line 2, the drain of the transistor MC1 is connected to the sources of the first transistor M1 and the second transistor M2, and the gate of the transistor MC1 is connected to the bias terminal BIAS.

The operational amplifier 1K further includes a current adjustment unit 120B having a configuration different from that of the current adjustment unit 120A of the operational amplifier 1I according to the twelfth embodiment (see FIG. 28), a current control unit 130, and an output stage 140. A capacitor 141 for phase compensation is connected to the output stage 140.

The current adjustment unit 120B is different from the current adjustment unit 120A of the operational amplifier 1I in the connection configuration of the first branching circuit 123 and the second branching circuit 124, and that a fourth resistor R4 and a fifth resistor R5 are added to the first branching circuit 123 and the second branching circuit 124.

The first branching circuit 123 is connected to the drain of the first transistor M1 and the second power supply line 3, and includes the first branching transistor MB4 and the fourth resistance R4. The first branching transistor MB4 and the fourth resistor R4 configure a series circuit. The drain of the first branching transistor MB4 is connected to the drain of the first transistor M1, while the source of the first branching transistor MB4 is connected to the first terminal of the fourth resistor R4. The second terminal of the fourth resistor R4 is connected to the second power supply line 3. The resistance value of the fourth resistor R4 of the present embodiment is equal to each resistance value of the first resistor R1 and the second resistor R2.

The second branching circuit 124 is connected to the drain of the second transistor M2 and the second power supply line 3, and includes the second branching transistor MB5 and the fifth resistor R5. The second branching transistor MB5 and the fifth resistor R5 configure a series circuit. The drain of the second branching transistor MB5 is connected to the drain of the second transistor M2, while the source of the second branching transistor MB5 is connected to the first terminal of the fifth resistor R5. The second terminal of the fifth resistor R5 is connected to the second power supply line 3. The resistance value of the fifth resistor R5 of the present embodiment is equal to the resistance value of the fourth resistor R4. That is, the resistance value of the fifth resistor R5 is equal to each resistance value of the first resistor R1 and the second resistor R2.

The current control unit 130 supplies a current to each of a node NE1 between the source of the third transistor M3 and the first resistor R1, and a node NE2 between the source of the fourth transistor M4 and the second resistor R2 to raise the source potentials of the third transistor M3 and the fourth transistor M4. The current control unit 130 includes a first control unit 131 for controlling the source potential of the third transistor M3, and a second control unit 132 for controlling the source potential of the fourth transistor M4.

The first control unit 131 is provided between the first power supply line 2 and the node NE1, and configures a series circuit including the transistor MC2 and the transistor MC3. In the present embodiment, the transistor MC2 is a P-channel MOSFET, while the transistor MC3 is an N-channel MOSFET. The transistor MC2 is provided between the first power supply line 2 and the transistor MC3. The source of the transistor MC2 is connected to the first power supply line 2, the drain of the transistor MC2 is connected to the drain of the transistor MC3, and the gate of the transistor MC2 is connected in common to the gate of the transistor MC1, and connected to the bias terminal BIAS. The source of transistor MC3 is connected to the node NE1.

The second control unit 132 is provided between the first power supply line 2 and the node NE2, and configures a series circuit including the transistor MC4 and the transistor MC5. In the present embodiment, the transistor MC4 is a P-channel MOSFET, while the transistor MC5 is an N-channel MOSFET. The transistor MC4 is provided between the first power supply line 2 and the transistor MC5. The source of the transistor MC4 is connected to the first power supply line 2, the drain of the transistor MC4 is connected to the drain of the transistor MC5, and the gate of the transistor MC4 is connected to the gate of the transistor MC1, and connected to the bias terminal BIAS. The source of transistor MC5 is connected to the node NE2. The gate of the transistor MC5 is connected to the gate of the transistor MC4, and connected to the gate of the third transistor M3 of the current mirror circuit 12. That is, the transistors MC3 and MC5 configure a current mirror circuit in cooperation with the third transistor M3, similarly to the transistors MB2, MB4, and MB5.

The output stage 140 is a source-grounded circuit, and configures a series circuit including a transistor MC6 and a transistor MC7. In the present embodiment, the transistor MC6 is a P-channel MOSFET, while the transistor MC 7 is an N-channel MOSFET. The transistor MC6 is provided between the first power supply line 2 and the transistor MC7. The source of the transistor MC6 is connected to the first power supply line 2, the drain of the transistor MC6 is connected to the drain of the transistor MC7, and the gate of the transistor MC6 is connected in common to the gate of the transistor MC1, and connected to the bias terminal BIAS. The source of the transistor MC7 is connected to the second power supply line 3, while the gate of the transistor MC7 is connected to a node NE3 between the drain of the second transistor M2 and the drain of the fourth transistor M4. The output terminal OUT is connected to a node NE4 between the drain of the transistor MC6 and the drain of the transistor MC7.

A current flowing through the operational amplifier 1K, in particular, a current flowing through the current adjustment unit 120B and the current control unit 130, will be described. In the following description, a constant current flowing through the constant current source 11 is referred to as a constant current 2ID. The magnitudes of the supply current IDB3, the currents IDB2, IDB4, and IDB5, and the currents ID3 and ID4 of the current adjustment unit 120B are similar to the magnitudes of the supply current IDB3, the currents IDB2, IDB4, and IDB5, and the currents ID3 and ID4 of the ninth embodiment, and therefore not repeatedly described herein.

As described in the ninth embodiment, the supply current IDB3, which has the same current amount as the current IDB2 which is a sum of the currents IDB4 and IDB5 flowing through the transistors MB4 and MB5, is supplied to the differential pair 10. In this case, the current supplied to the differential pair 10 is the sum of the supply current IDB3 and the constant current 2ID, wherefore the transconductance gm12 of each of the transistors M1 and M2 increases. Meanwhile, the currents IDB4 and IDB5 are extracted from the current IDx flowing through each of the transistors M1 and M2 by the transistors MB4 and MB5. Accordingly, an increase in the transconductance gm34 of each of the transistors M3 and M4 is suppressed.

The transistors MC3 and MC5 of the current control unit 130 configure a current mirror circuit in cooperation with the third transistor M3 of the active load, wherefore a current IDC3 proportional to the current ID3 flowing through the third transistor M3 flows through the transistor MC3, and a current IDC5 proportional to the current ID3 flows through the transistor MC5. The current IDC3 flows to the node NE1 between the third transistor M3 and the first resistor R1, while the current IDC5 flows to the node NE2 between the fourth transistor M4 and the second resistor R2. As a result, the source potential of each of the transistors M3 and M4 rises. Accordingly, the transconductance gm34 on the circuit further decreases.

Furthermore, the configuration and manufacturing method of the transistors M1 to M4 and the transistor MC1 of the constant current source 11 of the present embodiment are the same as the configuration and manufacturing method of the transistors of the transistors M1 to M4 and the transistor of the constant current source 11 of the first embodiment. Accordingly, 1/f noise of the output signal Sout can be effectively reduced as described in (1-5) and (1-6) of the first embodiment.

The structures of the transistors MB1 to MB5 in the present embodiment are similar to the structures of the transistors MB1 to MB5 in the ninth embodiment. That is, the impurity concentration in the channel region of each of the transistors MB1 to MB5 is equal to the impurity concentration in the channel region of each of the transistors MB1 to MB5 in the ninth embodiment. Accordingly, effects similar to (9-3) and (9-4) of the ninth embodiment can be obtained.

In addition, the transistor MC1 of the constant current source 11, the transistors MC2 to MC5 of the current control unit 130, and the transistors MC6 and MC7 of the output stage 140 are not easily affected by 1/f noise of the output signal Sout. Accordingly, the impurity concentration in the channel region of each of the transistors MC1 to MC7 is made higher than the impurity concentration in the channel region of each of the transistors M1 to M4. In other words, the impurity concentration in the channel region of each of the transistors M1 to M4 is lower than the impurity concentration in the channel region of each of the transistors MC1 to MC7. That is, the transistors MC1 to MC7 are high concentration transistors. The impurity concentration in the channel region of each of the transistors M1 to M4 is preferably about ½ or lower of the impurity concentration in the channel region of each of the transistors MC1 to MC7. In the present embodiment, the impurity concentration in the channel region of each of the transistors M1 to M4 is about 1/10 of the impurity concentration in the channel region of each of the transistors MC1 to MC7. In the present embodiment, the impurity concentration in the channel region of each of the transistors MC1 to MC7 is approximately equal to the impurity concentration in the channel region of each of the transistors MB1 to MB5. The transistors MC1 to MC7 are surface channel type MOSFETs.

According to the present embodiment, following effects are achievable.

(14-1) The impurity concentration in the channel region of the transistor MC1 of the constant current source 11, the impurity concentration in the channel region of each of the transistors MC2, MC4, and MC6 of the current control unit 130, and the impurity concentration in the channel region of each of the transistors MB1 and MB3 of the current adjustment unit 120B are equal to each other. According to this configuration, the step of forming the N-type well layer 63 of the transistor MC1, the step of forming the N-type well layer 63 of each of the transistors MC2, MC4, and MC6, and the step of forming the N-type well layer 63 of each of the transistors MB1 and MB3 can be collectively performed. Accordingly, the step of manufacturing the operational amplifier 1K can be simplified.

(14-2) The impurity concentration in the channel region of each of the transistors MC3 and MC5 of the current control unit 130 is equal to the impurity concentration in the channel region of the second supply transistor MB2 of the current adjustment unit 120B. According to this configuration, the step of forming the P-type well layer 41 of each of the transistors MC3 and MC5, and the step of forming the P-type well layer 41 of the second supply transistor MB2 can be collectively performed. Accordingly, the step of manufacturing the operational amplifier 1K can be simplified.

Modifications of Fourteenth Embodiment

The operational amplifier 1K of the present embodiment can be modified in following manners. Following modified examples can be combined with each other as long as technical contradiction does not occur.

According to the current adjustment unit 120B of the operational amplifier 1K, the magnitude of the supply current IDB3 from the current supplying unit 121 may be changed to any magnitude within a range not exceeding the constant current 2ID. For example, the current ratio of the first supply transistor MB1 to the third supply transistor MB3 may be set to 2:1. In this case, the supply current IDB3 of the third supply transistor MB3 becomes ½ of the supply current IDB2. In this manner, the supply current IDB3 can be made smaller than the constant current 2ID. Accordingly, the current IDB4 flowing through the first branching transistor MB4 and the current IDB5 flowing through the second branching transistor MB5 become smaller than the current ID, wherefore effects produced by element variations of the branching transistor MB4 and MB5 and imposed on the currents ID3 and ID4 flowing through the third transistor M3 and the fourth transistor M4 can further decrease.

The resistance value of the first resistor R1, the resistance value of the second resistor R2, the resistance value of the third resistor R3, the resistance value of the fourth resistor R4, and the resistance value of the fifth resistor R5 may be changed in accordance with the ratio of the third transistor M3, the fourth transistor M4, the second supply transistor MB2, the first branching transistor MB4, and the second branching transistor MB5.

Instead of lowering the impurity concentration in the channel region of each of the transistors M1 to M4 in the operational amplifier 1K, embedded channel type MOSFETs such as the transistors M1 to M4 of the second embodiment may be adopted. In this case, effects similar to the effects of the second embodiment can be obtained. Any one or two of the pairs of the transistors M1 and M2 configuring the differential pair 10 of the operational amplifier 1K, and the pair of the transistors M3 and M4 configuring the current mirror circuit 12 may be changed to the embedded channel type MOSFETs of the second embodiment.

In addition to lowering the impurity concentration in the channel region of each of the transistors M1 to M4 in the operational amplifier 1K, embedded channel type MOSFETs may be adopted. That is, the transistors M1 to M4 may have structures similar to the structures of the transistors M1 to M4 of the third embodiment. In this case, effects similar to the effects of the third embodiment can be obtained. Any one or two of the pair of transistors M1 and M2 configuring the differential pair 10 in the operational amplifier 1K, and the pair of the transistors M3 and M4 configuring the current mirror circuit 12 may be changed to structures similar to the structures of the transistors M1 to M4 of the third embodiment. Any one or two of the pair of transistors M1 and M2 configuring the differential pair 10 in the operational amplifier 1K, and the pair of the transistors M3 and M4 configuring the current mirror circuit 12 may be changed to structures similar to the structures of the embedded channel type MOSFETs of the second embodiment, or the transistors M1 to M4 of the third embodiment. In short, the operational amplifier 1K may have a configuration which includes a mixture of structures similar to the structures of the low concentration transistors of the first embodiment, the embedded channel type MOSFETs of the second embodiment, and the transistors M1 to M4 of the third embodiment.

Fifteenth Embodiment

An operational amplifier 1L according to a fifteenth embodiment will be described with reference to FIG. 31.

The operational amplifier 1L amplifies a potential difference between the inverting input terminal INN and the noninverting input terminal INP, and outputs the output signal Sout from the output terminal OUT. The operational amplifier 1L includes a differential amplifier stage 150, an output stage 155, the back gate bias circuit 20, and a correction circuit 156, all integrated on a single semiconductor substrate.

The differential amplifier stage 150 includes a differential pair 151, a constant current source 152, a phase compensation circuit 153, and a constant current circuit 154.

The differential pair 151 includes a first transistor MD1 and a second transistor MD2. In the present embodiment, the first transistor MD1 and the second transistor MD2 are P-channel MOSFETs. Each of the first transistor MD1 and the second transistor MD2 may have either a depletion type structure or an enhancement type structure. In the present embodiment, each of the first transistor MD1 and the second transistor MD2 has an enhancement type structure. The gate of the first transistor MD1 is connected to the inverting input terminal INN, while the gate of the second transistor MD2 is connected to the noninverting input terminal INP. The differential pair 151 generates differential currents Imb1 and Imb2 corresponding to input voltages Vinn and Vinp of the inverting input terminal INN and the noninverting input terminal INP, respectively.

The constant current source 152 supplies the constant current It to the differential pair 151. The constant current source 152 includes a third transistor MD3 which is a P-channel MOSFET. The gate of the third transistor MD3 is connected to a first bias terminal BIAS1. The source of the third transistor MD3 is connected to the first power supply line 2. The drain of the third transistor MD3 is connected to the phase compensation circuit 153.

The phase compensation circuit 153 is provided between the differential pair 151 and the constant current source 152. The phase compensation circuit 153 includes a first compensation resistor RD1, a second compensation resistor RD2, and a compensation capacitor CD1. The first compensation resistor RD1 is provided between the source of the first transistor MD1 and the constant current source 152, while the second compensation resistor RD2 is provided between the source of the second transistor MD2 and the constant current source 152. The compensation capacitor CD1 is connected between the source of the first transistor MD1 and the source of the second transistor MD2.

The constant current circuit 154 is connected to the drain of the first transistor MD1 and the drain of the second transistor MD2, and generates constant currents Imb4 and Imb5. The constant current circuit 154 includes a fourth transistor MD4 and a fifth transistor MD5. In the present embodiment, the fourth transistor MD4 and the fifth transistor MD5 are N-channel MOSFETs. In particular, each of the fourth transistor MD4 and the fifth transistor MD5 has an enhancement type structure. The gate of the fourth transistor MD4 and the gate of the fifth transistor MD5 are connected in common. The drain of the fourth transistor MD4 is connected to the drain of the first transistor MD1, while the source of the fourth transistor MD4 is connected to the second power supply line 3. The drain of the fifth transistor MD 5 is connected to the drain of the second transistor MD2, while the source of the fifth transistor MD5 is connected to the second power supply line 3. The fourth transistor MD4 and the fifth transistor MD5 are biased by a voltage corresponding to a voltage Vbias1 of the first bias terminal BIAS1 to cause flows of the currents Imb4 and Imb5 proportional to the constant current It generated by the constant current source 152.

In a specific configuration, the operational amplifier 1L includes an eleventh transistor MD11 and a twelfth transistor MD12. The twelfth transistor MD12 is a P-channel MOSFET, while the eleventh transistor MD11 is an N-channel MOSFET. The source of the twelfth transistor MD12 is connected to the first power supply line 2, while the drain of the twelfth transistor MD12 is connected to the drain of the eleventh transistor MD11. The gate of the twelfth transistor MD12 is connected to the first bias terminal BIAS1. The source of the eleventh transistor MD11 is connected to the second power supply line 3, and the gate of the eleventh transistor MD11 is connected to the gates of the fourth transistor MD4 and the fifth transistor MD5, and also connected to the drain of the eleventh transistor MD11. That is, the eleventh transistor MD11 configures a current mirror circuit in cooperation with the fourth transistor MD4 and the fifth transistor MD5. A current Imb12 proportional to the constant current It flows through the twelfth transistor MD12. Accordingly, there is a proportional relationship between the constant current It and the currents Imb4 and Imb5 flowing through the fourth transistor MD4 and the fifth transistor MD5 which configure a current mirror circuit in cooperation with the eleventh transistor MD11.

The output stage 155 is connected to the drain of the first transistor MD1 and the drain of the second transistor MD2, and generates the output signal Sout. The output stage 155 includes four transistors, i.e., a sixth transistor MD6 to a ninth transistor MD9. In the present embodiment, the sixth transistor MD6 and the seventh transistor MD7 are N-channel MOSFETs, while the eighth transistor MD8 and the ninth transistor MD9 are P-channel MOSFETs. In particular, each of the eighth transistor MD8 and the ninth transistor MD9 has an enhancement type structure.

The gates of the sixth transistor MD6 and the seventh transistor MD7 are connected to a second bias terminal BIAS2 to apply a predetermined bias voltage Vbias 2 to these gates. The source of the sixth transistor MD6 is connected to the drain of the first transistor MD1, while the source of the seventh transistor MD 7 is connected to the drain of the second transistor MD2. The drain of the sixth transistor MD6 is connected to the drain of the eighth transistor MD8, while the drain of the seventh transistor MD7 is connected to the drain of the ninth transistor MD9. The drain of the sixth transistor MD6 is connected to the output terminal OUT.

The eighth transistor MD8 and the ninth transistor MD9 configure a current mirror circuit. Specifically, the gate of the eighth transistor MD8 and the gate of the ninth transistor MD9 are connected in common, and the gate of the ninth transistor MD9 is connected to the drain of the ninth transistor MD9. The source of the eighth transistor MD8 and the source of the ninth transistor MD9 are connected to the first power supply line 2.

The correction circuit 156 corrects a current flowing through the constant current circuit 154 based on a source voltage Vs1 of the first transistor MD1 and a source voltage Vs2 of the second transistor MD2. The two outputs of the correction circuit 156 are connected to the drain of the first transistor MD1 and the drain of the second transistor MD2, and generates differential correction currents Icmp1 and Icmp2 corresponding to a potential difference between the source voltage Vs1 of the first transistor MD1 and the source voltage Vs2 of the second transistor MD2.

The correction circuit 156 includes a correction differential pair 157 and a correction current source 158.

The correction differential pair 157 includes PNP-type first correction transistor Q1 and second correction transistor Q2. A PNP-type bipolar transistor has the same polarity as that of the P-channel MOSFET of the differential pair 151. The source voltage Vs1 of the first transistor MD1 is input to the base of the first correction transistor Q1, while the source voltage Vs2 of the second transistor MD2 is input to the base of the second correction transistor Q2. The collector of the first correction transistor Q1 is connected to the drain of the first transistor MD1, while the collector of the second correction transistor Q2 is connected to the drain of the second transistor MD2. The emitters of the first correction transistor Q1 and the second correction transistor Q2 are connected to the correction current source 158.

The correction current source 158 includes a tenth transistor MD10 that is a P-channel MOSFET. The source of the tenth transistor MD10 is connected to the first power supply line 2, while the drain of the tenth transistor MD 10 is connected to the correction differential pair 157. The gate of the tenth transistor MD10 is connected to the first bias terminal BIAS1. Accordingly, there is a proportional relationship between a constant current I2 generated by the correction current source 158 and the constant current It of the constant current source 152.

An operation of the operational amplifier 1L will be described.

It is assumed that RD1=R and RD2=R+ΔR hold as a result of a mismatch between the resistance value of the first compensation resistor RD1 and the resistance value of the second compensation resistor RD2. In this case, the differential current Imb1 of the first transistor MD1 increases by ΔI (Imb1=I/2+ΔI), while the differential current Imb2 of the second transistor MD2 decreases by ΔI (Imb2=I/2−ΔI). Therefore, the source voltage Vs2 of the second transistor MD2 becomes lower than the source voltage Vs1 of the first transistor MD1. Accordingly, the correction current Icmp2 flowing through the second correction transistor Q2 of the correction differential pair 157 increases (Icmp2=I2/2+ΔI'), and the correction current Icmp1 flowing through the first correction transistor Q1 decreases (Icmp1=I2/2−ΔI').

A correction current of the correction circuit 156 is superimposed on a differential current flowing from the differential pair 151 to the constant current circuit 154. Therefore, the corrected differential currents become Imb1+Icmp1, and Imb2+Icmp2. That is, an increase ΔI of the current Imb1 of the first transistor MD1 is canceled by a decrease ΔI' of the current Icmp1 of the first correction transistor Q1, while a decrease ΔI of the current Imb2 of the second transistor MD2 is canceled by an increase ΔI' of the current Icmp2 of the second correction transistor Q2. In this manner, the correction circuit 156 converts a difference between the source voltages Vs1 and Vs2, which is produced by the mismatch between the first compensation resistor RD1 and the second compensation resistor RD2, in other words, an input offset voltage Vos of the operational amplifier 1L, into the differential correction currents Icmp1 and Icmp2, and achieves feedback so that the drain currents Imb1+Icmp1 and Imb2+Icmp2 flowing through the constant current circuit 154 become constant.

The back gate bias circuit 20 is connected to the common back gate of the first transistor MD1 and the second transistor MD2, and to the first power supply line 2. The back gate bias circuit 20 is connected to the back gates of the first transistor MD1 and the second transistor MD2 via a third bias terminal BIAS3. The configuration of the back gate bias circuit 20 is the same as the configuration of the back gate bias circuit 20 of the first embodiment (see FIG. 2). The back gate bias circuit 20 applies a bias voltage VB, which is closer to the first power supply voltage VDD than the source potentials of the first transistor MD1 and the second transistor MD2, to the back gates of the first transistor MD1 and the second transistor MD2. In other words, the back gate bias circuit 20 applies a bias voltage VB, which is closer to the first power supply voltage VDD than an intermediate voltage between the source potentials of the first transistor MD1 and the second transistor MD2 and the first power supply voltage VDD, to the back gates of the first transistor MD1 and the second transistor MD2. That is, the back gate bias circuit 20 applies, to the first transistor MD1 and the second transistor MD2, the bias voltage VB which increases the back gate-to-source voltage VBS. As a result, the back gate-to-source voltage VBS becomes a voltage close to the back gate-to-source voltage VBSH. The bias voltage VB may be higher than the first power supply voltage VDD. In this case, it is preferable that the bias voltage VB be higher than the first power supply voltage VDD within a range where parasitic diodes of the first transistor MD1 and the second transistor MD2 are not turned on. That is, the bias voltage VB is preferably lower than a voltage at which parasitic diodes of the first transistor MD1 and the second transistor MD2 are turned on. An example of the voltage at which the parasitic diodes of the first transistor MD1 and the second transistor MD2 are turned on is a voltage 0.5 V to 0.6 V higher than the first power supply voltage VDD (VDD+0.5 to 0.6). It is preferable that the bias voltage VB be a voltage within a predetermined range including the first power supply voltage VDD and excluding a voltage equal to the first power supply voltage VDD. More specifically, it is more preferable that the bias voltage VB is a voltage within ±20% of the first power supply voltage VDD and excluding a voltage equal to the first power supply voltage VDD. As a result, the back gate-to-source voltage VBS becomes a voltage within the range of ±20% of the back gate-to-source voltage VBSH and excluding the back gate-to-source voltage VBSH.

Furthermore, according to the present embodiment, the impurity concentration in a channel region of some transistors of the plurality of transistors of the operational amplifier 1L is made lower than then impurity concentration in a channel region of the other transistors to further reduce 1/f noise of the output signal Sout of the output stage 155. That is, the plurality of transistors of the operational amplifier 1L include high concentration transistors whose impurity concentration in the channel region is a first concentration, and low concentration transistors whose impurity concentration in the channel region is a second concentration lower than the first concentration. More specifically, the impurity concentration in the channel region of the transistors easily affected by 1/f noise of the output signal Sout is made lower than the impurity concentration in the channel region of the transistors not easily affected by 1/f noise of the output signal Sout. That is, rather than high concentration transistors, low concentration transistors are used as transistors more easily affected by 1/f noise of the output signal Sout among the plurality of transistors. On the other hand, rather than low concentration transistors, high concentration transistors are used as transistors not easily affected by 1/f noise of the operational amplifier 1L among the plurality of transistors. Specifically, in the operational amplifier 1L, a section easily affected by 1/f noise of the output signal Sout includes the differential pair 151, the constant current circuit 154, and a part of the output stage 155, while a section not easily affected by 1/f noise of the output signal Sout includes the constant current source 152, the other part of the output stage 155, the correction circuit 156, and the back gate bias circuit 20.

In the present embodiment, the impurity concentration in the channel region of each of the transistors of the differential pair 151, the constant current circuit 154, and a part of the output stage 155 is made lower than the impurity concentration in the channel region in each of the transistors of the constant current source 152, the back gate bias circuit 20, the other part of the output stage 155, and the correction circuit 156. That is, the transistors configuring the differential pair 151, the constant current circuit 154, and a part of the output stage 155 are low concentration transistors, while the transistors of the constant current source 152, the back gate bias circuit 20, the other part of the output stage 155, and the correction circuit 156 are high concentration transistors. Specifically, the impurity concentration in the channel region of each of the first transistor MD1, the second transistor MD2, the fourth transistor MD4, the fifth transistor MD5, the eighth transistor MD8, the ninth transistor MD9, and the eleventh transistor MD11 is made lower than the impurity concentration in the channel region of each of the transistors M5 to M9 of the back gate bias circuit 20, the transistor of the constant current source 21, the third transistor MD3, the sixth transistor MD6, the seventh transistor MD7, the tenth transistor MD10, and the twelfth transistor MD12. That is, the first transistor MD1, the second transistor MD2, the fourth transistor MD4, the fifth transistor MD5, the eighth transistor MD8, the ninth transistor MD9, and the eleventh transistor MD11 are low concentration transistors, while the transistors M5 to M9 of the back gate bias circuit, the transistor of the constant current source 21, the third transistor MD3, the sixth transistor MD6, the seventh transistor MD7, the tenth transistor MD10, and the twelfth transistor MD12 are high concentration transistors.

The impurity concentration in the channel region of each of the transistors MD1, MD2, MD4, MD5, MD8, MD9, and MD11 is preferably about ½ or lower of the impurity concentration in the channel region of each of the transistors M5 to M9, MD3, MD6, MD7, MD10 and MD12, and the transistor of the constant current source 21. In the present embodiment, the impurity concentration in the channel region of each of the transistors MD1, MD2, MD4, MD5, MD8, MD9, and MD11 is about 1/10 of the impurity concentration in the channel region of each of the transistors M5 to M9, MD3, MD6, MD7, MD10, and MD12, and the transistor of the constant current source 21.

The structure and manufacturing method of the N-channel MOSFETs and the P-channel MOSFETs of the transistors MD1 to MD12 are similar to the structure and manufacturing method of the N-channel MOSFETs and the P-channel MOSFETs of the first transistor M1 and the like of the first embodiment.

According to the present embodiment, following effects are achievable.

(15-1) The back gate bias circuit 20 applies a bias voltage VB, which is closer to the first power supply voltage VDD than the source potentials of the first transistor MD1 and the second transistor MD2, to the back gates of the first transistor MD1 and the second transistor MD2 (contact areas for applying bias voltage VB to back gates of N-type well layers 39 of the first transistor MD1 and the second transistor MD2). In this case, the back gate-to-source voltage VBS of each of the first transistor MD1 and the second transistor MD2 rises, wherefore the transconductance gm12 of each of the first transistor MD1 and the second transistor MD2 increases. Therefore, noise of the output signal Sout of the operational amplifier 1L can be reduced.

(15-2) The back gate bias circuit 20 can further reduce noise of the output signal Sout of the operational amplifier 1L by making the bias voltage VB higher than the first power supply voltage VDD, and thereby further increasing the transconductance gm12 of each of the first transistor MD1 and the second transistor MD2.

(15-3) The first transistor MD1 and the second transistor MD2 can be operated in a stable manner by setting the bias voltage VB to a voltage lower than such a voltage at which parasitic diodes of the first transistor MD1 and the second transistor MD2 are turned on.

(15-4) Increase in the transconductance gm12 of each of the first transistor MD1 and the second transistor MD2, and stable operation of the first transistor MD1 and the second transistor MD2 can be achieved by setting the bias voltage VB to a voltage within a predetermined range including the first power supply voltage VDD and excluding a voltage equal to the first power supply voltage VDD, and thereby increasing the back gate-to-source voltage VBS. In particular, the back gate-to-source voltage VBS is made closer to the back gate-to-source voltage VBSH by setting the bias voltage VB to a voltage within ±20% of the first power supply voltage VDD and excluding a voltage equal to the first power supply voltage VDD. Accordingly, the transconductance gm12 of each of the first transistor MD1 and the second transistor MD2 increases, and the first transistor MD1 and the second transistor MD2 can be operated in a more stable manner.

(15-5) The operational amplifier 1L includes the correction circuit 156. According to this configuration, the correction circuit 156 causes a correction current to flow into a differential current which flows from the differential pair 151 to the constant current circuit 154. Accordingly, the input offset voltage Vos of the operational amplifier 1L generated by a mismatch between the first compensation resistor RD1 and the second compensation resistor RD2 for phase compensation can be reduced.

(15-6) The impurity concentration in the channel region of each of the first transistor MD1 and the second transistor MD2 configuring the differential pair 151 is lower than the impurity concentration in the channel region of the sixth transistor MD6 and the impurity concentration in the channel region of each of the plurality of transistors of the back gate bias circuit 20. According to this configuration, fluctuations of mobility and fluctuations of the drain current can be reduced by decreasing the impurity concentration in the channel region of each of the transistors MD1 and MD2 configuring the differential pair 151 and easily affected by 1/f noise of the output signal Sout of the operational amplifier 1L. Therefore, 1/f noise of the output signal Sout of the operational amplifier 1L can effectively decrease.

(15-7) The impurity concentration in the channel region of each of the fourth transistor MD4 and the fifth transistor MD5 configuring the current source of the constant current circuit 154, and the impurity concentration in the channel region of the eleventh transistor MD 11 are lower than the impurity concentration in the channel region of the sixth transistor MD6, and the impurity concentration in the channel region of each of the plurality of transistors included in the back gate bias circuit 20. According to this configuration, fluctuations of mobility and fluctuations of the drain current can be reduced by lowering the impurity concentration in the channel region of each of the transistors MD4 and MD5 configuring the current source of the constant current circuit 154 and the impurity concentration in the channel region of the eleventh transistor MD11, easily affected by 1/f noise of the output signal Sout of the operational amplifier 1L. Therefore, 1/f noise of the output signal Sout of the operational amplifier 1L can effectively decrease.

(15-8) The impurity concentration in the channel region of each of the eighth transistor MD8 and the ninth transistor MD9 configuring the current mirror circuit is lower than the impurity concentration in the channel region of the sixth transistor MD6 and the impurity concentration in the channel region of each of the plurality of transistors of the back gate bias circuit 20. According to this configuration, fluctuations of mobility and fluctuations of the drain current can be reduced by lowering the impurity concentration of each of the transistors MD8 and MD9 configuring the current mirror circuit and easily affected by 1/f noise of the output signal Sout from the operational amplifier 1L. Therefore, 1/f noise of the output signal Sout of the operational amplifier 1L can effectively decrease.

(15-9) The impurity concentration in the channel region of each of the first transistor MD1 and the second transistor MD2 configuring the differential pair 151 is equal to the impurity concentration in the channel region of each of the eighth transistor MD8 and the ninth transistor MD9 configuring the current mirror circuit. According to this configuration, the step of forming the N-type well layer 70 of each of the transistors MD1 and MD2, and the step of forming the N-type well layer 70 of each of the transistors MD8 and MD9 can be collectively performed. Therefore, the step of manufacturing the operational amplifier 1L can be simplified.

(15-10) The impurity concentration in the channel region of the third transistor MD3 in the constant current source 152, the impurity concentration in the channel region of the tenth transistor MD 10 in the correction current source 158, the impurity concentration in the channel region of the twelfth transistor MD 12, and the impurity concentration in the channel regions of each of the transistors M5, M8, and M9 in the back gate bias circuit 20 are equal to each other. According to this configuration, the step of forming the N-type well layer 63 of the third transistor MD3, the step of forming the N-type well layer 63 of the tenth transistor MD10, the step of forming the N-type well layer 63 of the twelfth transistor MD12, and the step of forming the N-type well layer 63 of each of the transistors M6 and M7 can be collectively performed. Therefore, the step of manufacturing the operational amplifier 1L can be simplified.

(15-11) The impurity concentration in the channel region of each of the sixth transistor MD6 and the seventh transistor MD7 in the output stage 155, and the impurity concentration in the channel region of each of the transistors M6 and M7 in the back gate bias circuit 20 and the transistor of the constant current source 21 are equal to each other. According to this configuration, the step of forming the P-type well layer 41 of each of the transistors MD6 and MD7, and the step of forming the P-type well layer 41 of each of the transistors M6 and M7 and the transistor of the constant current source 21 can be collectively performed. Therefore, the step of manufacturing the operational amplifier 1L can be simplified.

Modifications of Fifteenth Embodiment

The operational amplifier 1L of the present embodiment can be modified in following manners. Following modified examples can be combined with each other as long as technical contradiction does not occur.

In the operational amplifier 1L, the step-down circuit 100 of the fifth embodiment may be added between the first power supply line 2 and the differential pair 151, more specifically between the first power supply line 2 and the constant current source 152. According to this configuration, effects similar to those of the fifth embodiment can be obtained. In addition, the back gate bias circuit 20 may also be connected to the third power supply line 4 as in the back gate bias circuit 20 of the sixth embodiment. According to this configuration, the same effect as that of the sixth embodiment can be obtained.

Figure 31:
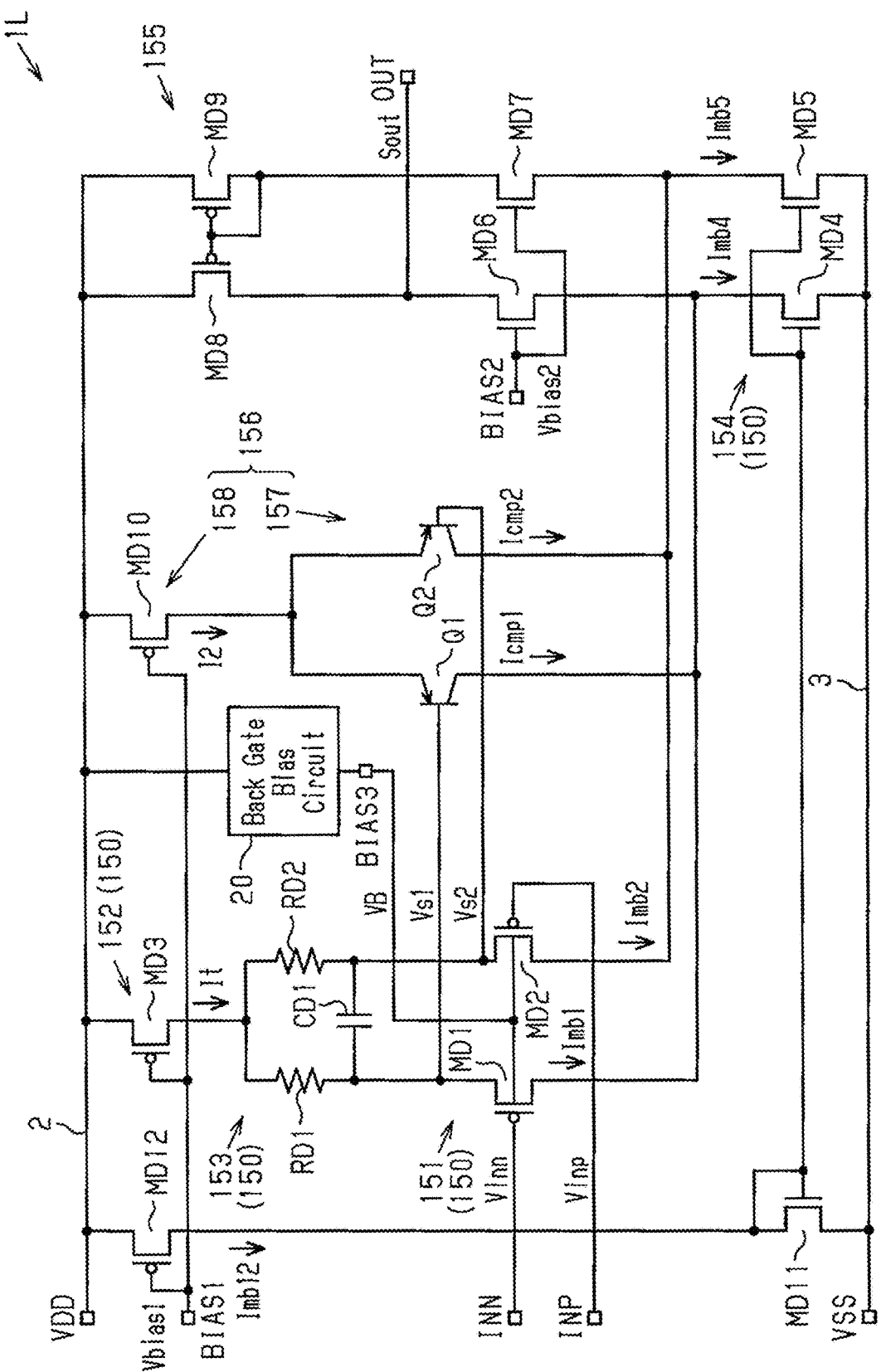
FIG. 31 is a circuit diagram of an operational amplifier according to a fifteenth embodiment.
Figure 32:
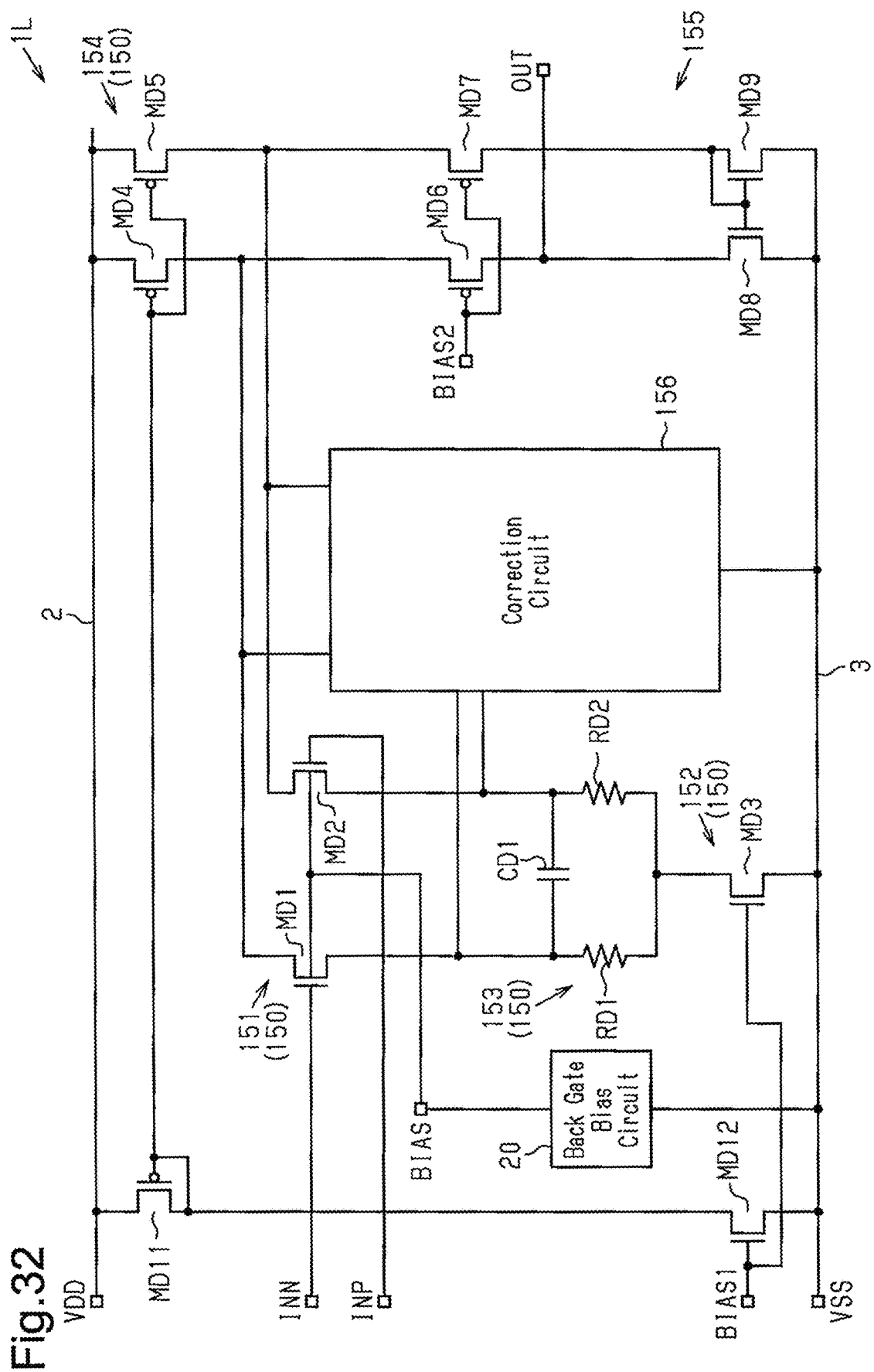
FIG. 32 is a circuit diagram of an operational amplifier according to a modification of the fifteenth embodiment.

The operational amplifier 1L shown in FIG. 31 may be changed to the operational amplifier 1L shown in FIG. 32. The operational amplifier 1L in FIG. 32 is different from the operational amplifier 1L in FIG. 31 chiefly in the conductivity type of the channel region in the MOSFET of each of the differential amplifier stage 150 and the output stage 155. In FIG. 32, the correction circuit 156 is simplified for convenience of explanation.

As shown in FIG. 32, the first transistor MD1 and the second transistor MD2 of the differential pair 151, and the third transistor MD3 of the constant current source 152 are N-channel MOSFETs, while the fourth transistor MD4 and the fifth transistor MD5 of the constant current circuit 154 are P-channel MOSFETs. The sixth transistor MD6 and the seventh transistor MD7 of the output stage 155 are P-channel MOSFETs, while the eighth transistor MD8 and the ninth transistor MD9 are N-channel MOSFETs. The eleventh transistor MD11 is a P-channel MOSFET, while the twelfth transistor MD12 is an N-channel MOSFET.

The drain of the first transistor MD1 is connected to the drain of the fourth transistor MD4, while the drain of the second transistor MD2 is connected to the drain of the fifth transistor MD5. The source of the first transistor MD1 is connected to the first compensation resistor RD1, while the source of the second transistor MD2 is connected to the second compensation resistor RD2. The drain of the third transistor MD3 is connected to the first compensation resistor RD1 and the second compensation resistor RD2, while the source of the third transistor MD3 is connected to the second power supply line 3. The sources of the fourth transistor MD4, the fifth transistor MD5, and the eleventh transistor MD11 are connected to the first power supply line 2. The sources of the eighth transistor MD8, the ninth transistor MD9, and the twelfth transistor MD12 are connected to the second power supply line 3. The drain of the eighth transistor MD8 is connected to the drain of the sixth transistor MD6, the drain of the ninth transistor MD9 is connected to the drain of the seventh transistor MD7, and the drain of the twelfth transistor MD12 is connected to the drain of the eleventh transistor MD11.

The back gate bias circuit 20 is connected to the common back gate of the first transistor MD1 and the second transistor MD2, and to the second power supply line 3. The back gate bias circuit 20 applies a bias voltage VB, which is closer to the second power supply voltage VSS than the source potentials of the first transistor MD1 and the second transistor MD2, to the back gates of the first transistor MD1 and the second transistor MD2. In other words, the back gate bias circuit 20 applies a bias voltage VB, which is closer to the second power supply voltage VSS than an intermediate voltage between the source potentials of the first transistor MD1 and the second transistor MD2 and the second power supply voltage VSS, to the back gates of the first transistor MD1 and the second transistor MD2. That is, the back gate bias circuit 20 applies, to the back gates of the first transistor MD1 and the second transistor MD2, the bias voltage VB which increases the back gate-to-source voltage VBS. As a result, the back gate-to-source voltage VBS becomes a voltage close to the back gate-to-source voltage VBSH. The bias voltage VB may be lower than the second power supply voltage VSS. It is preferable that the bias voltage VB be a voltage within a predetermined range including the second power supply voltage VSS and excluding a voltage equal to the second power supply voltage VSS. In one example, it is preferable that the bias voltage VB be a voltage within ±20% of the second power supply voltage VSS and excluding a voltage equal to the second power supply voltage VSS. According to this configuration, the transconductance gm12 of each of the first transistor MD1 and the second transistor MD2 increases. Accordingly, reduction of noise of the output signal Sout of the operational amplifier 1 is achievable. Effects similar to the effects of the operational amplifier 1L of the present embodiment can also be obtained by the operational amplifier 1L in FIG. 32.

The step-up circuit 103 of the operational amplifier 1B in FIG. 18 may be added to the operational amplifier 1L in FIG. 32. According to this configuration, effects similar to the effects of the operational amplifier 1B in FIG. 18 can be obtained. Further, the back gate bias circuit 20 of the operational amplifier 1L in FIG. 32 may also be connected to the fourth power supply line 5 as in the operational amplifier 1C in FIG. 20. According to this configuration, effects similar to the operational amplifier 1C in FIG. 20 can be obtained.

Instead of lowering the impurity concentration in the channel region of each of the transistors MD1, MD2, MD4, MD5, MD8, MD9, and MD11 in the operational amplifier 1L shown in FIGS. 31 and 32, embedded channel type MOSFETs such as the transistors M1 to M4 of the second embodiment may be adopted. In this case, effects similar to the effects of the second embodiment can be obtained. Any one or two of the pair of transistors MD1 and MD2 configuring the differential pair 151 in the operational amplifier 1L shown in FIGS. 31 and 32, the pair of the transistors MD8 and MD9 configuring the current mirror circuit, and the set of the transistors MD4, MD5, and MD11 configuring the current mirror circuit may be changed to the embedded channel type MOSFETs of the second embodiment.

In addition to lowering the impurity concentration in the channel region of each of the transistors MD1, MD2, MD4, MD5, MD8, MD9, and MD11 in the operational amplifier 1L shown in FIGS. 31 and 32, embedded channel type MOSFETs may be adopted. That is, the transistors MD1, MD2, MD4, MD5, MD8, MD9, and MD11 may have a structure similar to the structure of each of the transistors M1 to M4 of the third embodiment. In this case, effects similar to the effects of the third embodiment can be obtained. Any one or two of the pair of transistors MD1 and MD2 configuring the differential pair 151 in the operational amplifier 1L shown in FIGS. 31 and 32, the pair of the transistors MD8 and MD9 configuring the current mirror circuit, and the set of the transistors MD4, MD5, and MD11 configuring the current mirror circuit may be changed to structures similar to the structures of the transistors M1 to M4 of the third embodiment. Furthermore, any one or two of the pair of transistors MD1 and MD2 configuring the differential pair 151 in the operational amplifier 1L shown in FIGS. 31 and 32, the pair of the transistors M8 and M9 configuring the current mirror circuit, and the set of the transistors MD4, MD5, and MD11 configuring the current mirror circuit may be changed to structures similar to the structures of the embedded channel type MOSFETs of the second embodiment, or the transistors M1 to M4 of the third embodiment. In short, the operational amplifier 1L shown in FIGS. 31 and 32 may have a configuration which includes a mixture of structures similar to the structures of the low concentration transistors of the first embodiment, the embedded channel type MOSFETs of the second embodiment, and the transistors M1 to M4 of the third embodiment.

Sixteenth Embodiment

Figure 33:
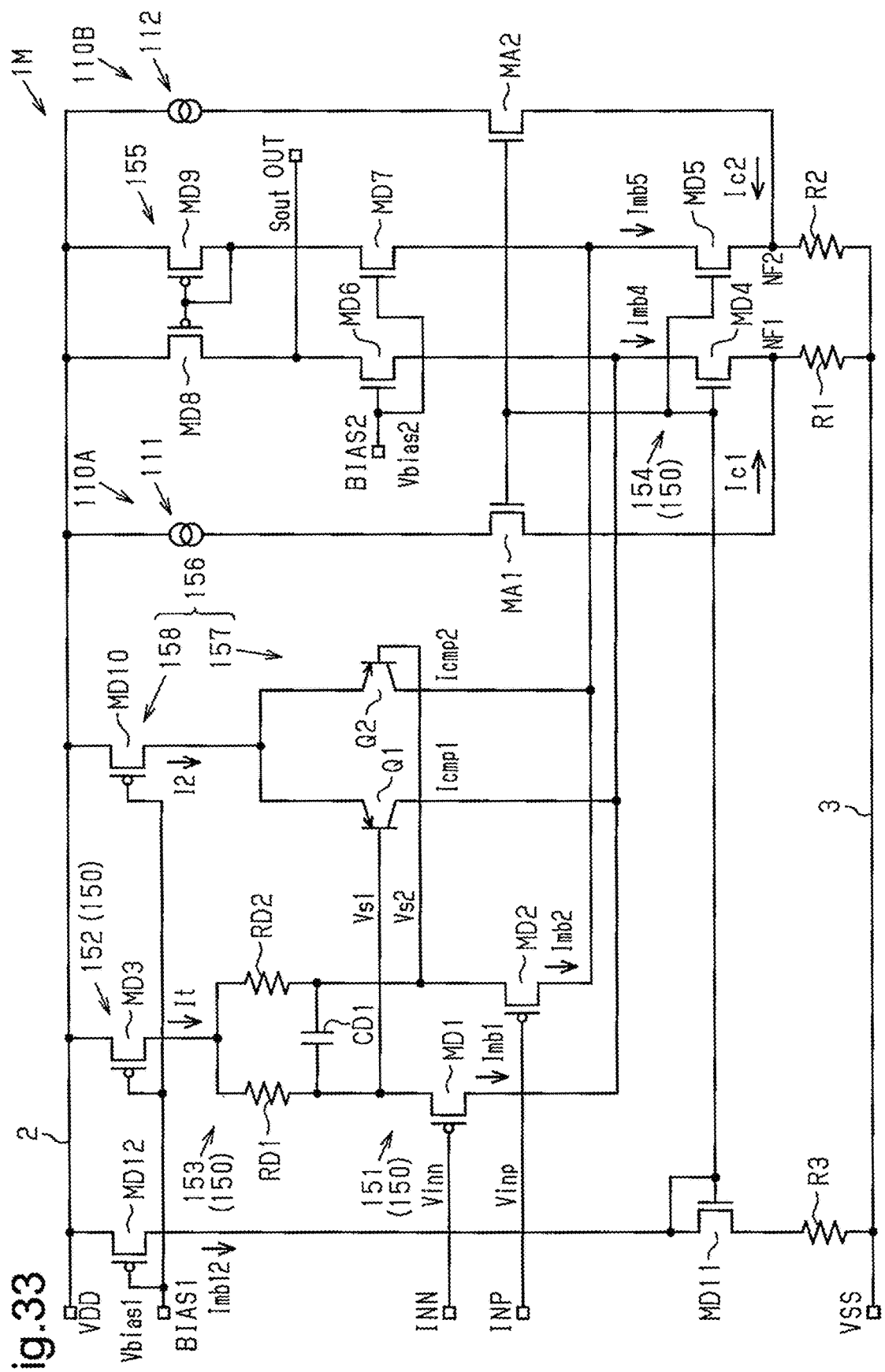
FIG. 33 is a circuit diagram of an operational amplifier according to a sixteenth embodiment.

An operational amplifier 1M according to a sixteenth embodiment will be described with reference to FIG. 33. The operational amplifier 1M of the present embodiment is different from the operational amplifier 1L of the fifteenth embodiment in that the back gate bias circuit 20 is eliminated, and that the first control unit 110A, the second control unit 110B, the first resistor R1, the second resistor R2, and the third resistor R3 of the eighth embodiment are added.

The first resistor R1 is provided between the second power supply line 3 and the fourth transistor MD4. The first terminal of the first resistor R1 is connected to the source of the fourth transistor MD4, while the second terminal of the first resistor R1 is connected to the second power supply line 3.

The second resistor R2 is provided between the second power supply line 3 and the fifth transistor MD5. The first terminal of the second resistor R2 is connected to the source of the fifth transistor MD5, while the second terminal of the second resistor R2 is connected to the second power supply line 3.

The third resistor R3 is provided between the second power supply line 3 and the eleventh transistor MD11. The first terminal of the third resistor R3 is connected to the source of the eleventh transistor MD11, while the second terminal of the third resistor R3 is connected to the second power supply line 3.

The first control unit 110A is connected to the first power supply line 2, and a node NF1 between the fourth transistor MD4 and the first resistor R1. The first control unit 110A controls the source potential of the fourth transistor MD4 by controlling a current supplied to the node NF1 between the source of the fourth transistor MD4 and the first resistor R1. The first control transistor MA1 of the first control unit 110A of the present embodiment is an N-channel MOSFET. The first constant current source 111 includes a transistor (not shown). The transistor of the first constant current source 111 is a P-channel MOSFET. The drain of the transistor of the first constant current source 111 is connected to the drain of the first control transistor MA1, while the source of the transistor is connected to the first power supply line 2. The source of the first control transistor MA1 is connected to the node NF1 between the source of the fourth transistor MD4 and the first resistor R1, while the gate of the first control transistor MA1 is connected to the gate and the drain of the fourth transistor MD4. In this configuration, the first control unit 110A supplies, to the node NF1, the first current Ic1 proportional to the constant current It of the constant current source 152.

The second control unit 110B is connected to the first power supply line 2, and a node NF2 between the fifth transistor MD5 and the second resistor R2. The second control unit 110B controls the source potential of the fifth transistor MD5 by controlling a current supplied to the node NF2 between the source of the fifth transistor MD5 and the second resistor R2. The second control transistor MA2 of the second control unit 110B of the present embodiment is an N-channel MOSFET. The second constant current source 112 includes a transistor (not shown). The transistor of the second constant current source 112 is a P-channel MOSFET. The drain of the transistor of the second constant current source 112 is connected to the drain of the second control transistor MA2, while the source of the transistor is connected to the first power supply line 2. The source of the second control transistor MA2 is connected to the node NF2 between the source of the fifth transistor MD5 and the second resistor R2, while the gate of the second control transistor MA2 is connected to the gate and the drain of the fourth transistor MD4. In this configuration, the second control unit 110B supplies, to the node NF2, the second current Ic2 proportional to the constant current It of the constant current source 152.

In this manner, the first current Ic1 is supplied from the first control unit 110A to the source of the fourth transistor MD4, while the second current Ic2 is supplied from the second control unit 110B to the source of the fifth transistor MD5. As a result, the source potential of the fourth transistor MD4 and the source potential of the fifth transistor MD5 are raised. In addition, the source potentials of the fourth transistor MD4 and the fifth transistor MD5 are raised by the first resistor R1 and the second resistor R2. According to the present embodiment described above, the source potentials of the transistors MD4 and MD5 are further raised. Accordingly, the transconductance gm34 on the circuit decreases.

Further, each of the transistors MD1 to MD12 of the operational amplifier 1M according to the present embodiment has the same configuration as the configuration of the transistors MD1 to MD12 of the fifteenth embodiment. Therefore, effects similar to the effects (15-6) to (15-11) of the fifteenth embodiment can be obtained.

Moreover, the first control transistor MA1 and the second control transistor MA2 are not easily affected by 1/f noise of the output signal Sout. Accordingly, the impurity concentration in the channel region of each of the transistors MA1 and MA2 is made higher than the impurity concentration in the channel region of each of the transistor MD1, MD2, MD4, MD5, MD8, MD9, and MD11. In other words, the impurity concentration in the channel region of each of the transistors M1 to M4 is lower than the impurity concentration in the channel region of each of the transistors MA1 and MA2. That is, the transistors MD1, MD2, MD4, MD5, MD8, MD9, and MD11 are low concentration transistors, while the transistors MA1 and MA2 are high concentration transistors. The impurity concentration in the channel region of each of the transistors MD1, MD2, MD4, MD5, MD8, MD9, and MD11 is preferably about ½ or lower of the impurity concentration in the channel region of each of the transistors MA1 and MA2. In the present embodiment, the impurity concentration in the channel region of each of the transistors MD1, MD2, MD4, MD5, MD8, MD 9, and MD11 is about 1/10 of the impurity concentration in the channel region of each of the transistors MA1 and MA2. The transistors MA1 and MA2 are surface channel type MOSFETs.

According to the present embodiment, following effects can be obtained in addition to the effect (15-5) of the fifteenth embodiment.

(16-1) The control units 110A and 110B raise the source potentials of the transistors MD4 and MD5 of the active load to decrease currents flowing through the transistors MD4 and MD5. In this case, the transconductance gm of each of the transistors MD4 and MD5 on the circuit decreases. Accordingly, noise of the output signal Sout of the operational amplifier 1M can be reduced.

(16-2) The impurity concentration in the channel region of the third transistor MD3 in the constant current source 152, the impurity concentration in the channel region of the tenth transistor MD10 in the correction current source 158, the impurity concentration in the channel region of the twelfth transistor MD12, and the impurity concentration in the channel region of each of the transistor of the constant current source 111 of the first control unit 110A and the transistor of the constant current source 112 of the second control unit 110B are equal to each other. According to this configuration, the step of forming the N-type well layer 63 of the third transistor MD3, the step of forming the N-type well layer 63 of the tenth transistor MD 10, the step of forming the N-type well layer 63 of the twelfth transistor MD12, and the step of forming the N-type well layer 63 of each of the transistors of the constant current sources 111 and 112 can be collectively performed. Therefore, the step of manufacturing the operational amplifier 1M can be simplified.

(16-3) The impurity concentration in the channel region of each of the sixth transistor MD6 and the seventh transistor MD7 in the output stage 155, and the impurity concentration in the channel region of each of the first control transistor MA1 and the second control transistor MA2 are equal to each other. According to this configuration, the step of forming the P-type well layer 41 of each of the transistors MD6 and MD7, and the step of forming the P-type well layer 41 of each of the transistors MA1 and MA2 can be collectively performed. Therefore, the step of manufacturing the operational amplifier 1M can be simplified.

Modifications of Sixteenth Embodiment

The operational amplifier 1M of the present embodiment can be modified in following manners. Following modified examples can be combined with each other as long as technical contradiction does not occur.

The first control unit 110A and the second control unit 110B may be eliminated from the operational amplifier 1M. In this case, the source potentials of the transistors MD4 and MD5 are raised by the first resistor R1 and the second resistor R2.

The resistance value of the first resistor R1, the resistance value of the second resistor R2, and the resistance value of the third resistor R3 may be changed in accordance with a ratio of the fourth transistor MD4, the fifth transistor MD5, and the eleventh transistor MD11.

Instead of lowering the impurity concentration in the channel region of each of the transistors MD1, MD2, MD4, MD5, MD8, MD9, and MD11 in the operational amplifier 1M, embedded channel type MOSFETs such as the transistors M1 to M4 of the second embodiment may be adopted. In this case, effects similar to the effects of the second embodiment can be obtained. Any one or two of the pair of transistors MD1 and MD2 configuring the differential pair 151 in the operational amplifier 1M, the pair of the transistors MD8 and MD9 configuring the current mirror circuit, and the set of the transistors MD4, MD5, and MD11 configuring the current mirror circuit may be changed to the embedded channel type MOSFETs of the second embodiment.

In addition to lowering the impurity concentration in the channel region of each of the transistors MD1, MD2, MD4, MD5, MD8, MD9, and MD11 in the operational amplifier 1M, embedded channel type MOSFETs may be adopted. That is, the transistors MD1, MD2, MD4, MD5, MD8, MD9, and MD11 may have a structure similar to the structure of each of the transistors M1 to M4 of the third embodiment. In this case, effects similar to the effects of the third embodiment can be obtained. Any one or two of the pair of transistors MD1 and MD2 configuring the differential pair 151 in the operational amplifier 1M, the pair of the transistors MD8 and MD9 configuring the current mirror circuit, and the set of the transistors MD4, MD5, and MD11 configuring the current mirror circuit may be changed to structures similar to the structures of the transistors M1 to M4 of the third embodiment. Furthermore, any one or two of the pair of transistors MD1 and MD2 configuring the differential pair 151 in the operational amplifier 1M, the pair of the transistors MD8 and MD9 configuring the current mirror circuit, and the set of the transistors MD4, MD5, and MD11 configuring the current mirror circuit may be changed to structures similar to the structures of the embedded channel type MOSFETs of the second embodiment, or the transistors M1 to M4 of the third embodiment. In short, the operational amplifier 1M may have a configuration which includes a mixture of structures similar to the structures of the low concentration transistors of the first embodiment, the embedded channel type MOSFETs of the second embodiment, and the transistors M1 to M4 of the third embodiment.

Seventeenth Embodiment

Figure 34:
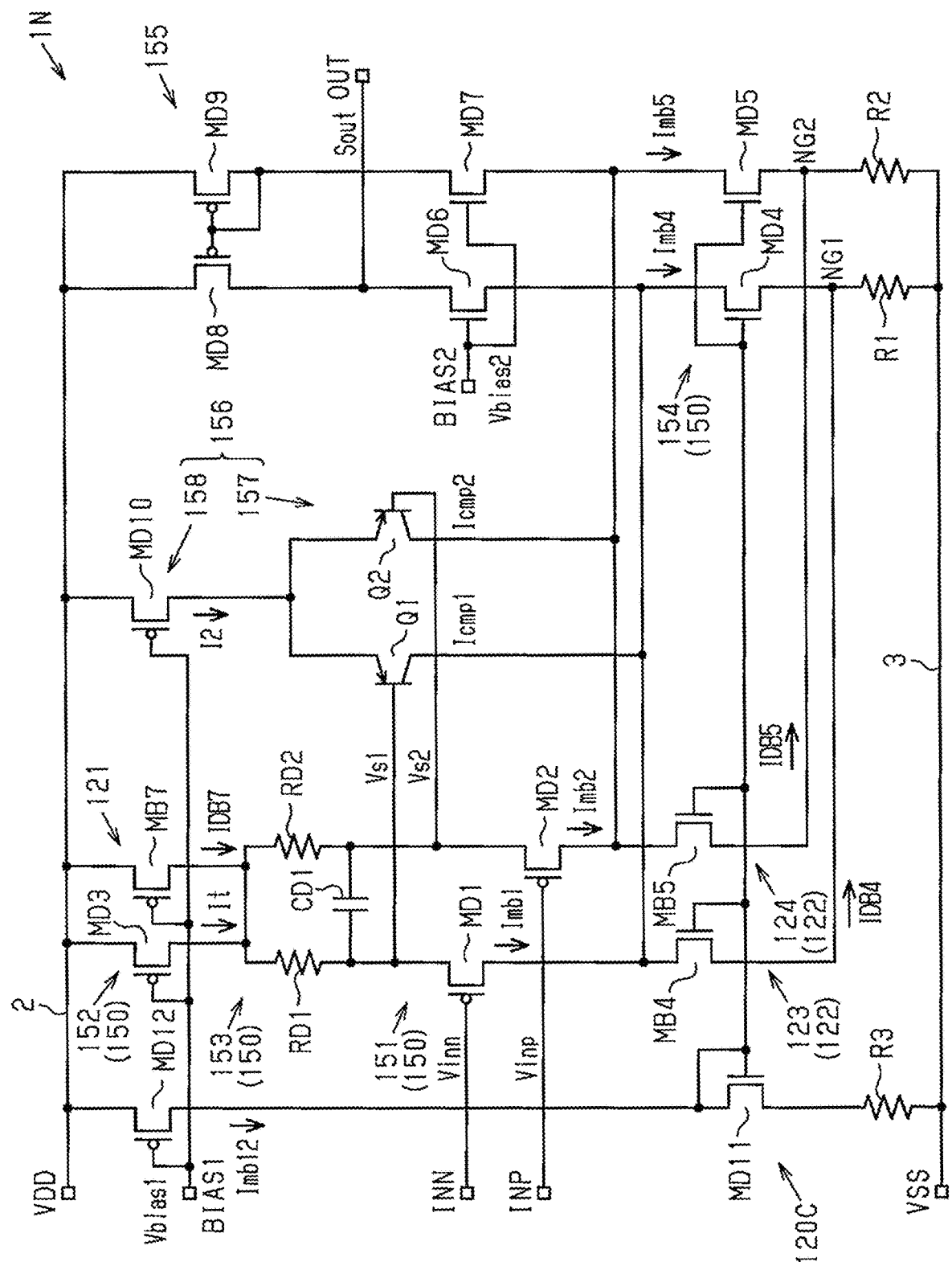
FIG. 34 is a circuit diagram of an operational amplifier according to a seventeenth embodiment.

An operational amplifier 1N according to a seventeenth embodiment will be described with reference to FIG. 34. The operational amplifier 1N of the present embodiment is different from the operational amplifier 1M of the sixteenth embodiment in that the first control unit 110A and the second control unit 110B are eliminated, and that a current adjustment unit 120C is added.

The current adjustment unit 120C includes the current supplying unit 121 that supplies a current to the differential pair 151, and the branching portion 122 that extracts a part of a current from the differential pair 151.

The current supplying unit 121 includes a transistor MB7, an eleventh transistor MD11, and a twelfth transistor MD12. The transistor MB7 of the present embodiment is a P-channel MOSFET. The transistor MB7 is provided between the differential pair 151 and the first power supply line 2. The source of the transistor MB7 is connected to the first power supply line 2, the drain of the transistor MB7 is connected to the sources of the transistors MD1 and MD2 of the differential pair 151, and the gate of the transistor MB7 is connected to the first bias terminal BIAS1.

In the present embodiment, a current amount of the twelfth transistor MD12 is equal to a current amount of the eleventh transistor MD11. A size ratio (current ratio) of the twelfth transistor MD12 to the transistor MB7 is 1:1.

The branching portion 122 of the current adjustment unit 120C has a configuration similar to the configuration of the branching portion 122 of the current adjustment unit 120B of the fourteenth embodiment.

The first branching circuit 123 includes a first branching transistor MB4 which is an example of a first adjustment transistor connected in parallel with the fourth transistor MD4 corresponding to a third transistor of an active load. The first branching circuit 123 is connected to the drain of the first transistor MD1, and a node NG1 between the fourth transistor MD4 and the first resistor R1. More specifically, the drain of the first branching transistor MB4 is connected to the drain of the first transistor MD1, and the source of the first branching transistor MB4 is connected to the node NG1.

The second branching circuit 124 includes a second branching transistor MB5 which is an example of a second adjustment transistor connected in parallel with the fifth transistor MD5 corresponding to a fourth transistor of an active load. The second branching circuit 124 is connected to the drain of the second transistor MD2, and a node NG2 between the fifth transistor MD5 and the second resistor R2. More specifically, the drain of the second branching transistor MB5 is connected to the drain of the second transistor MD2, while the source of the second branching transistor MB5 is connected to the node NG2.

The gates of the transistors MB4 and MB5 are connected in common to the gates of the fourth transistor MD4 and the eleventh transistor MD11. The transistors MD4, MB4, and MB5 thus configure a current mirror circuit in cooperation with the eleventh transistor MD11. That is, the gate voltages of the transistors MD4, MB4, and MB5 are controlled by the gate voltage of the eleventh transistor MD11.

The first branching transistor MB4 of the first branching circuit 123 and the second branching transistor MB5 of the second branching circuit 124 have the same electrical characteristics. In addition, the transistors MD11, MB4, and MB5 have a common gate voltage. In this case, the current amount of the eleventh transistor MD11 becomes twice larger than the current amount of the first branching transistor MB4 (second branching transistor MB5). Accordingly, a sum of currents flowing through the transistors MB4 and MB5 is generated in the eleventh transistor MD11.

According to the present embodiment, settings of electric characteristics of the transistors MB4 and MB5, and settings of electric characteristics of the fourth transistor MD4 and the fifth transistor MD5 are equalized. In addition, the gates of the transistors MB4 and MB5 are connected to the gate of the fourth transistor MD4, wherefore a current flowing through the first branching transistor MB4 and a current flowing through the second branching transistor MB5 are equalized with a current flowing through the third transistor M3 (current flowing through fourth transistor M4).

A current flowing through the operational amplifier 1N, particularly, a current flowing through the current adjustment unit 120C will be described.

In the operational amplifier 1N, the constant current It, and a supply current IDB7 generated from the transistor MB7 are supplied to the differential pair 151. The supply current IDB7 is a current proportional to the current Imb12. In the present embodiment, the current ratio of the eleventh transistor MD11 to the twelfth transistor MD12 is 1:1, wherefore the current Imb12 flows through the eleventh transistor MD11. The supply current IDB7 is a current proportional to the current Imb12 and caused to flow through the eleventh transistor MD11 by the current mirror circuit including the transistors MD12 and MB7. In the present embodiment, the current ratio of the twelfth transistor MD12 to the transistor MB7 is 1:1. Accordingly, the supply current IDB7 is equal to the current Imb12. More specifically, the current Imb12 is a current proportional to the current Imb4 and caused to flow by the current mirror circuit including the transistors MD4, MD11, MB4, and MB5. In the present embodiment, the current ratio of the transistors MB4 and MB5 to the transistors MD4 and MD5 is 1:1. Accordingly, the currents IDB4 and IDB5 flowing through the transistors MB4 and MB5 are equal to the current Imb4. In addition, the eleventh transistor MD11 and the transistors MB4 and MB5 configure a current mirror circuit. Accordingly, the current Imb12 flowing through the eleventh transistor MD11 becomes a sum of currents flowing through the transistors MB4 and MB5 (IDB4+IDB5). That is, the supply current IDB7 supplied to the differential pair 151 is the sum of the currents flowing through the transistors MB4 and MB5 (IDB4+IDB5). Further, the currents flowing through the transistors M4, M5, MB4, and MB5 are equal to each other, wherefore a sum of the currents flowing through the transistors M4 and M5 (ID3+ID4), that is, the constant current It, and the currents flowing through the transistors MB4 and MB5 (IDB4+IDB5) are equal to each other. Accordingly, in the present embodiment, the supply current IDB7 and the constant current It are equal to each other.

The currents Imb1 and Imb2 flowing through the transistors MD1 and MD2, respectively, are expressed as Imb1, Ibm2=(It+IDB7)/2 when inputs of the constant current It and the supply current IDB7 are in the same phase, that is, when gate voltages as input signals are in the same phase. In this manner, the currents Imb1 and Imb2 flowing through the transistors MD1 and MD2 become larger than ½ of the constant current It by ½ of the supply current IDB7. On the other hand, the current IDB4 and IDB5 are extracted from the drains of the transistors MD1 and MD2 by the transistors MB4 and MB5 of the branching portion 122 configuring the current mirror circuit in cooperation with the fourth transistor MD4. In this case, without consideration of the correction currents Icmp1 and Icmp2, the current Imb4 flowing through the fourth transistor MD4 becomes Imb1−IDB4, while the current Imb5 flowing through the fifth transistor MD5 becomes Imb2−IDB5. Therefore, each of the currents IDB4 and IDB5 of the present embodiment becomes ½ of the supply current IDB7. In other words, an increase of currents flowing through the transistors MD1 and MD2 is caused to flow through each of the transistors MB4 and MB5. Accordingly, the current adjustment unit 120C increases the currents flowing through the transistors MD1 and MD2 of the differential pair 151, but does not increase the currents flowing through the transistors MD4 and MD5 of the active load.

In addition, the current IDB4 flowing through the first branching transistor MB4 flows to the node NG1 between the fourth transistor M4 and the first resistor R1, while the current IDB5 flowing through the second branching transistor MB5 flows to the node NG2 between the fifth transistor M5 and the second resistor R2. Therefore, the source potential of the fourth transistor MD4 and the source potential of the fifth transistor MD5 rise. In addition, the source potentials of the fourth transistor MD4 and the fifth transistor MD5 are raised by the first resistor R1 and the second resistor R2. In this manner, the source potential of each of the transistors MD4 and MD5 of the present embodiment is more raised similarly to the sixteenth embodiment. Accordingly, the transconductance gm34 on the circuit further decreases.

Further, each of the transistors MD1 to MD12 of the operational amplifier 1M according to the present embodiment has the same configuration as the configuration of each of the transistors MD1 to MD12 of the fifteenth embodiment. Therefore, effects similar to the effects (15-6) to (15-11) of the fifteenth embodiment can be obtained.

Moreover, each of the transistors MB4, MB5, and MB7 has the same configuration as the configuration of each of the transistors MB1 to MB5 of the ninth embodiment. More specifically, the transistors MB4, MB5, and MB7 are not easily affected by 1/f noise of the output signal Sout. Accordingly, the impurity concentration in the channel region of each of the transistors MB4, MB5, and MB7 is made higher than the impurity concentration in the channel region of each of the transistor MD1, MD2, MD4, MD5, MD8, MD9, and MD11. In other words, the impurity concentration in the channel region of each of the transistors MD1, MD2, MD4, MD5, MD8, MD9, and MD11 is lower than the impurity concentration in the channel region of each of the transistors MB4, MB5, and MB7. That is, the transistors MD1, MD2, MD4, MD5, MD8, MD9, and MD11 are low concentration transistors, while the transistors MB4, MB5, and MB7 are high concentration transistors. The impurity concentration of the channel region in each of the transistors MD1, MD2, MD4, MD5, MD8, MD9, and MD11 is preferably about ½ or lower of the impurity concentration in the channel region of each of the transistors MB4, MB5, and MB7. In the present embodiment, the impurity concentration in the channel region of each of the transistors MD1, MD2, MD4, MD5, MD8, MD 9, and MD11 is about 1/10 of the impurity concentration in the channel region of each of the transistors MB4, MB5, and MB7. The transistors MB4, MB5, and MB7 are surface channel type MOSFETs.

According to the present embodiment, following effects can be obtained in addition to the effect (15-5) of the fifteenth embodiment.

(17-1) The current adjustment unit 120C increases the current supplied to the differential pair 151, but does not increase the current supplied to the active load. Accordingly, the transconductance of each of the transistors MD1 and MD2 of the differential pair 151 increases, suppressing increase in the transconductance of each of the transistors MD4 and MD5 of the active load. Therefore, reduction of noise of the output signal Sout of the operational amplifier 1N is achievable.

(17-2) The source potentials of the transistors MD4 and MD5 of the active load can be raised by the first resistor R1 and the second resistor R2 connected to the active load. In this case, currents flowing through the transistors MD4 and MD5 decrease. Accordingly, the transconductance gm of each of the transistors MD4 and MD5 on the circuit decreases, wherefore noise of the output signal Sout of the operational amplifier 1N can be reduced.

(17-3) The impurity concentration in the channel region of the third transistor MD3 in the constant current source 152, the impurity concentration in the channel region of the tenth transistor MD10 in the correction current source 158, the impurity concentration in the channel region of the twelfth transistor MD12, and the impurity concentration in the channel region of the transistor MB6 of the current supplying unit 121 are equal to each other. According to this configuration, the step of forming the N-type well layer 63 of the third transistor MD3, the step of forming the N-type well layer 63 of the tenth transistor MD10, the step of forming the N-type well layer 63 of the twelfth transistor MD12, and the step of forming the N-type well layer 63 of the transistor MB6 can be collectively performed. Therefore, the step of manufacturing the operational amplifier 1N can be simplified.

(17-4) The impurity concentration in the channel region of each of the sixth transistor MD6 and the seventh transistor MD7 in the output stage 155, and the impurity concentration in the channel region of each of the first branching transistor MB4 and the second branching transistor MB5 are equal to each other. According to this configuration, the step of forming the P-type well layer 41 of each of the transistors MD6 and MD7, and the step of forming the P-type well layer 41 of each of the transistors MB4 and MB5 can be collectively performed. Therefore, the step of manufacturing the operational amplifier 1N can be simplified.

Modifications of Seventeenth Embodiment

The operational amplifier 1N of the present embodiment can be modified in following manners. Following modified examples can be combined with each other as long as technical contradiction does not occur.

The resistance value of the first resistor R1, the resistance value of the second resistor R2, and the resistance value of the third resistor R3 may be changed in accordance with the ratio of the fourth transistor MD4, the fifth transistor MD5, and the eleventh transistor MD11.

The first resistor R1, the second resistor R2, and the third resistor R3 may be eliminated from the operational amplifier 1N, and the source of the first branching transistor MB4 of the first branching circuit 123 and the source of the second branching transistor MB5 of the second branching circuit 124 may be connected to the second power supply line 3. In this case, the adjustment current source 125 may be added to the operational amplifier 1N similarly to the operational amplifier 1H of the eleventh embodiment. The connection configuration between the transistor MB6 of the adjustment current source 125 and the transistors MD11, MB4, and MB5 is similar to the corresponding connection configuration of the eleventh embodiment.

The current control unit 130 of the fourteenth embodiment may be added to the operational amplifier 1N. The first control unit 131 of the current control unit 130 is connected to the node NG1, while the second control unit 132 is connected to the node NG2. In this case, the source of the first branching transistor MB4 of the first branching circuit 123 of the branching portion 122 and the source of the second branching transistor MB5 of the second branching circuit 124 are connected to the second power supply line 3.

Instead of lowering the impurity concentration in the channel region of each of the transistors MD1, MD2, MD4, MD5, MD8, MD9, and MD11 in the operational amplifier 1N, embedded channel type MOSFETs such as the transistors M1 to M4 of the second embodiment may be adopted. In this case, effects similar to the effects of the second embodiment can be obtained. Furthermore, any one or two of the pair of transistors MD1 and MD2 configuring the differential pair 151 in the operational amplifier 1N, the pair of the transistors MD8 and MD9 configuring the current mirror circuit, and the set of the transistors MD4, MD5, and MD11 configuring the current mirror circuit may be changed to the embedded channel type MOSFETs of the second embodiment.

In addition to lowering the impurity concentration in the channel region of each of the transistors MD1, MD2, MD4, MD5, MD8, MD9, and MD11 in the operational amplifier 1N, embedded channel type MOSFETs may be adopted. That is, each of the transistors MD1, MD2, MD4, MD5, MD8, MD9, and MD11 may have a structure similar to the structure of each of the transistors M1 to M4 of the third embodiment. In this case, effects similar to the effects of the third embodiment can be obtained. Furthermore, any one or two of the pair of transistors MD1 and MD2 configuring the differential pair 151 in the operational amplifier 1N, the pair of the transistors MD8 and MD9 configuring the current mirror circuit, and the set of the transistors MD4, MD5, and MD11 configuring the current mirror circuit may be changed to structures similar to the structures of the transistors M1 to M4 of the third embodiment. Moreover, any one or two of the pair of transistors MD1 and MD2 configuring the differential pair 151 in the operational amplifier 1N, the pair of the transistors MD8 and MD9 configuring the current mirror circuit, and the set of the transistors MD4, MD5, and MD11 configuring the current mirror circuit may be changed to structures similar to the structures of the embedded channel type MOSFETs of the second embodiment, or the transistors M1 to M4 of the third embodiment. In short, the operational amplifier 1N may have a configuration which includes a mixture of structures similar to the structures of the low concentration transistors of the first embodiment, the embedded channel type MOSFETs of the second embodiment, and the transistors M1 to M4 of the third embodiment.

Eighteenth Embodiment

Figure 35:
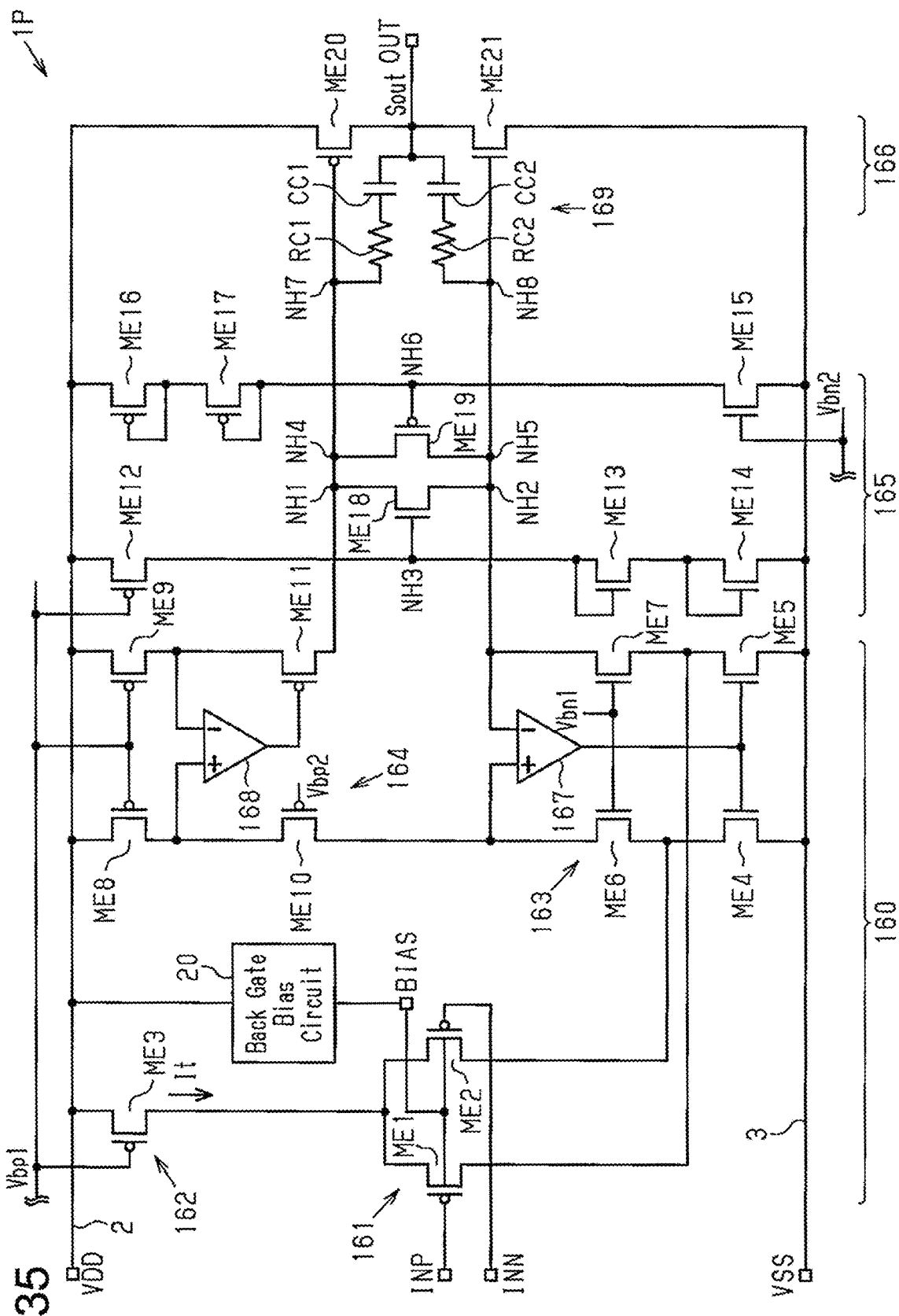
FIG. 35 is a circuit diagram of an operational amplifier according to an eighteenth embodiment.

An operational amplifier 1P according to an eighteenth embodiment will be described with reference to FIG. 35.

The operational amplifier 1P amplifies a potential difference between the inverting input terminal INN and the noninverting input terminal INP, and outputs the output signal Sout from the output terminal OUT. The operational amplifier 1P includes a differential amplifier stage 160, a class AB bias circuit 165, the back gate bias circuit 20, and an output stage 166. The differential amplifier stage 160 includes a differential pair 161, a constant current source 162, a cascode current mirror circuit 163, and a bias circuit 164. The operational amplifier 1P is integrated on one semiconductor substrate.

The differential pair 161 includes a first transistor ME1 connected to the noninverting input terminal INP, and a second transistor ME2 connected to the inverting input terminal INN. The differential pair 161 of the present embodiment is configured by a P-channel MOSFET. Each of the first transistor ME1 and the second transistor ME2 may have either a depletion-type or an enhancement type structure. In the present embodiment, each of the first transistor ME1 and the second transistor ME2 has an enhancement type structure. The gate of the first transistor ME1 is connected to the noninverting input terminal INP, while the gate of the second transistor ME2 is connected to the inverting input terminal INN. The source of the first transistor ME1 and the source of the second transistor ME2 are connected in common.

The constant current source 162 includes a third transistor ME3 connected to the differential pair 161. The third transistor ME3 of the present embodiment is a P-channel MOSFET. The drain of the third transistor ME3 is connected to the sources of the transistors ME1 and ME2, while the source of the third transistor ME3 is connected to the first power supply line 2. A bias voltage Vbp1 from a first bias circuit (not shown) is input to the gate of the third transistor ME3. The constant current source 162 supplies the constant current It based on the bias voltage Vbp1.

The cascode current mirror circuit 163 is an active load connected to the differential pair 161. The cascode current mirror circuit 163 is configured by two stacked transistors of the same type, and includes a fourth transistor ME4 to a seventh transistor ME7. In the present embodiment, the fourth transistor ME4 to the seventh transistor ME7 are configured by N-channel MOSFETs. In particular, each of the fourth transistor ME4 and the fifth transistor ME5 has an enhancement type structure.

The fourth transistor ME4 is provided in series with the second transistor ME2. More specifically, the fourth transistor ME4 is provided between the drain of the second transistor ME2 and the second power supply line 3. The fifth transistor ME5 is provided in series with the first transistor ME1. More specifically, the fifth transistor ME5 is provided between the drain of the first transistor ME1 and the second power supply line 3. The sixth transistor ME6 is vertically stacked on the fourth transistor ME4, while the seventh transistor ME7 is vertically stacked on the fifth transistor ME5. More specifically, the source of the sixth transistor ME6 is connected to the drain of the fourth transistor ME4, while the source of the seventh transistor ME7 is connected to the drain of the fifth transistor ME5. The gates of the sixth transistor ME6 and the seventh transistor ME7 are connected in common, and connected to a second bias circuit (not shown). The gates of the sixth transistor ME6 and the seventh transistor ME7 are appropriately biased by the bias voltage Vbn1 from the second bias circuit. The gates of the fourth transistor ME4 and the fifth transistor ME5 are connected to the drain of the sixth transistor ME6. When the first transistor ME1 and the second transistor ME2 are of depletion-type, input full swing (rail-to-rail) can be implemented by a circuit configuration shown in FIG. 35.

The fourth transistor ME4 to the seventh transistor ME7 are connected to a first comparator 167. Specifically, the drain of the sixth transistor ME6 is connected to the non-inverting input terminal of the first comparator 167, the drain of the seventh transistor ME7 is connected to the inverting input terminal of the first comparator 167, and the gates of the fourth transistor ME4 and the fifth transistor ME5 are connected to the output terminal of the first comparator 167. The first comparator 167 therefore outputs output signals to the gates of the fourth transistor ME4 and the fifth transistor ME5 to equalize the drain voltage of the sixth transistor ME6 and the drain voltage of the seventh transistor ME7.

The bias circuit 164 is a constant current circuit that maintains the cascode current mirror circuit 163 in an appropriate biased state. In one example, the bias circuit 164 is configured by two stacked transistors of the same type, and includes an eighth transistor ME8 to an eleventh transistor ME11. In the present embodiment, the eighth transistor ME8 to the eleventh transistor ME11 are P-channel MOSFETs. In particular, each of the eighth transistor ME8 and the ninth transistor ME9 has an enhancement type structure. The eighth transistor ME8 and the ninth transistor ME9 configure a current source for generating a predetermined current. The gates of the eighth transistor ME8 and the ninth transistor ME9 are appropriately biased by the first bias circuit. The gate of the tenth transistor ME10 is connected to a third bias circuit (not shown). The gate of the tenth transistor ME10 is appropriately biased by the bias voltage Vbp2 from the third bias circuit. The eighth transistor ME8, the ninth transistor ME9, and the eleventh transistor ME11 are connected to a second comparator 168. Specifically, the drain of the eighth transistor ME8 is connected to a noninverting input terminal of the second comparator 168, the drain of the ninth transistor ME9 is connected to an inverting input terminal of the second comparator 168, and the gate of the eleventh transistor ME11 is connected to an output terminal of the second comparator 168. Accordingly, when a difference between the drain voltage of the eighth transistor ME8 and the drain voltage of the ninth transistor ME9 is greater than or equal to a predetermined value, the second comparator 168 turns on the eleventh transistor ME11 to stop supply of currents to the class AB bias circuit 165 and the output stage 166 via the eleventh transistor ME11.

The class AB bias circuit 165 includes a twelfth transistor ME12 to a nineteenth transistor ME19, and functions as an output buffer circuit which generates a large drive current during operation from a small bias current during biasing.

The twelfth transistor ME12 to the fourteenth transistor ME14 are connected in series between the first power supply line 2 and the second power supply line 3. The twelfth transistor ME12 is a P-channel MOSFET, while the thirteenth transistor ME13 and the fourteenth transistor ME14 are N-channel MOSFETs. The source of the twelfth transistor ME12 is connected to the first power supply line 2, while the bias voltage Vbp1 is input from the first bias circuit to the gate of the twelfth transistor ME12. The drain of the thirteenth transistor ME13 is connected to the drain of the twelfth transistor ME12, the source of the thirteenth transistor ME13 is connected to the drain of the fourteenth transistor ME14, and the gate of the thirteenth transistor ME13 is connected to the drain of the thirteenth transistor ME13. The gate of the fourteenth transistor ME14 is connected to the drain of the fourteenth transistor ME14, while the source of the fourteenth transistor ME14 is connected to the second power supply line 3.

The fifteenth transistor ME15 to the seventeenth transistor ME17 are connected in series between the first power supply line 2 and the second power supply line 3. The fifteenth transistor ME15 to seventeenth transistor ME17 are provided on the output stage 166 side with respect to the twelfth transistor ME12 to the fourteenth transistor ME14. The fifteenth transistor ME15 is an N-channel MOSFET, while the sixteenth transistor ME16 and the seventeenth transistor ME17 are P-channel MOSFETs. The source of the fifteenth transistor ME15 is connected to the second power supply line 3, while the gate of the fifteenth transistor ME15 is connected to a fourth bias circuit (not shown). The gate of the fifteenth transistor ME15 is appropriately biased by the bias voltage Vbn2 input from the fourth bias circuit. The source of the sixteenth transistor ME16 is connected to the first power supply line 2, the drain of the sixteenth transistor ME16 is connected to the source of the seventeenth transistor ME17, and the gate of the sixteenth transistor ME16 is connected to the drain of the sixteenth transistor ME16. The gate of the seventeenth transistor ME17 is connected to the drain of the seventeenth transistor ME17, while the drain of the seventeenth transistor ME17 is connected to the drain of the fifteenth transistor ME15.

An eighteenth transistor ME18 and a nineteenth transistor ME19 are connected to the bias circuit 164, the cascode current mirror circuit 163, and the output stage 166. The eighteenth transistor ME18 is an N-channel MOSFET, while the nineteenth transistor ME19 is a P-channel MOSFET. The drain of the eighteenth transistor ME18 is connected to a node NH1 between the drain of the eleventh transistor ME11 and the output stage 166, while the source of the eighteenth transistor ME18 is connected to a node NH2 between the drain of the seventh transistor ME7 and the output stage 166. The gate of the eighteenth transistor ME18 is connected to a node NH3 between the drain of the twelfth transistor ME12 and the drain of the thirteenth transistor ME13. The source of the nineteenth transistor ME19 is connected to a node NH4 between the drain of the eleventh transistor ME11 and the output stage 166, while the drain of the nineteenth transistor ME19 is connected to a node NH5 between the drain of the seventh transistor ME7 and the output stage 166. The gate of the nineteenth transistor ME19 is connected to a node NH6 between the drain of the fifteenth transistor ME15 and the drain of the seventeenth transistor ME17. The node NH4 is disposed closer to the output stage 166 than the node NH1 is, and the node NH5 is disposed closer to the output stage 166 than the node NH2 is.

The output stage 166 is the source-grounded circuit using a twentieth transistor ME20 and a twenty-first transistor ME21, amplifies an output signal of the cascode current mirror circuit 163 which is an active load, and outputs the output signal Sout from the output terminal OUT.

In the present embodiment, the twentieth transistor ME20 is a P-channel MOSFET, while the twenty-first transistor ME21 is an N-channel MOSFET. The source of the twentieth transistor ME20 is connected to the first power supply line 2, while the drain of the twentieth transistor ME20 is connected to the output terminal OUT. The gate of the twentieth transistor ME20 is connected to the drain of the eleventh transistor ME11. The source of the twenty-first transistor ME21 is connected to the second power supply line 3, while the drain of the twenty-first transistor ME21 is connected to the output terminal OUT. The gate of the twenty-first transistor ME21 is connected to the drain of the seventh transistor ME7.

The output stage 166 further includes a phase compensation circuit 169. The phase compensation circuit 169 includes a first compensation resistor RC1, a second compensation resistor RC2, a first compensation capacitor CC1, and a second compensation capacitor CC2. The first compensation resistor RC1 and the first compensation capacitor CC1 are connected in series. The first terminal of the first compensation resistor RC1 is connected to a node NH7 between the drain of the eleventh transistor ME11 and the gate of the twentieth transistor ME20, while the second terminal of the first compensation resistor RC1 is connected to the first terminal of the first compensation capacitor CC1. The second terminal of the first compensation capacitor CC1 is connected to the output terminal OUT. The second compensation resistor RC2 and the second compensation capacitor CC2 are connected in series. The first terminal of the second compensation resistor RC2 is connected to a node NH8 between the drain of the seventh transistor ME7 and the gate of the twenty-first transistor ME21, while the second terminal of the second compensation resistor RC2 is connected to the first terminal of the second compensation capacitor CC2. The second terminal of the second compensation capacitor CC2 is connected to the output terminal OUT.

The back gate bias circuit 20 is connected to the common back gate of the first transistor ME1 and the second transistor ME2 of the differential pair 161, and to the first power supply line 2. The configuration of the back gate bias circuit 20 is the same as the configuration of the back gate bias circuit 20 of the first embodiment (see FIG. 2). The back gate bias circuit 20 applies a bias voltage VB, which is closer to the first power supply voltage VDD than the source potentials of the first transistor ME1 and the second transistor ME2, to the back gates of the first transistor ME1 and the second transistor ME2. In other words, the back gate bias circuit 20 applies a bias voltage VB, which is closer to the first power supply voltage VDD than an intermediate voltage between the source potentials of the first transistor ME1 and the second transistor ME2 and the first power supply voltage VDD, to the back gates of the first transistor ME1 and the second transistor ME2. That is, the back gate bias circuit 20 applies, to the first transistor ME1 and the second transistor ME2, the bias voltage VB which increases the back gate-to-source voltage VBS. As a result, the back gate-to-source voltage VBS becomes a voltage close to the back gate-to-source voltage VBSH. The bias voltage VB may be higher than the first power supply voltage VDD. In this case, it is preferable that the bias voltage VB be higher than the first power supply voltage VDD within a range where parasitic diodes of the first transistor ME1 and the second transistor ME2 are not turned on. That is, the bias voltage VB is preferably lower than a voltage at which parasitic diodes of the first transistor ME1 and the second transistor ME2 are turned on. An example of the voltage at which the parasitic diodes of the first transistor ME1 and the second transistor ME2 are turned on is a voltage 0.5 V to 0.6 V higher than the first power supply voltage VDD (VDD+ 0.5 to 0.6). It is preferable that the bias voltage VB be a voltage within a predetermined range including the first power supply voltage VDD and excluding a voltage equal to the first power supply voltage VDD. More specifically, it is more preferable that the bias voltage VB be a voltage within ±20% of the first power supply voltage VDD and excluding a voltage equal to the first power supply voltage VDD. As a result, the back gate-to-source voltage VBS becomes a voltage within the range of ±20% of the back gate-to-source voltage VBSH and excluding the back gate-to-source voltage VBSH.

Furthermore, according to the present embodiment, the impurity concentration in a channel region of some transistors of the transistors of the operational amplifier 1P is made lower than then impurity concentration in a channel region of the other transistors to further reduce 1/f noise of the output signal Sout of the output stage 166. That is, the plurality of transistors of the operational amplifier 1P include high concentration transistors whose impurity concentration in the channel region is a first concentration, and low concentration transistors whose impurity concentration in the channel region is a second concentration lower than the first concentration. More specifically, the impurity concentration in the channel region of the transistors easily affected by 1/f noise of the output signal Sout is made lower than the impurity concentration in the channel region of the transistors not easily affected by 1/f noise of the output signal Sout. That is, rather than high concentration transistors, low concentration transistors are used as transistors more easily affected by 1/f noise of the output signal Sout among the plurality of transistors. On the other hand, rather than low concentration transistors, high concentration transistors are used as transistors not easily affected by 1/f noise of the output signal Sout among the plurality of transistors. Specifically, in the operational amplifier 1P, a section easily affected by 1/f noise of the output signal Sout includes the differential pair 161, a part of the cascode current mirror circuit 163, and a part of the bias circuit 164. On the other hand, a section not easily affected by 1/f noise of the output signal Sout includes the constant current source 162, the other part of the cascode current mirror circuit 163, the other part of the bias circuit 164, the class AB bias circuit 165, the back gate bias circuit 20, and the output stage 166.

In the present embodiment, the impurity concentration in the channel region of each of the transistors of the differential pair 161, a part of the cascode current mirror circuit 163, and a part of the bias circuit 164 is made lower than the impurity concentration in the channel region of each of the transistors of the constant current source 162, the other part of the cascode current mirror circuits 163, the other part of the bias circuit 164, the class AB bias circuit 165, the back gate bias circuit 20, and the output stage 166. That is, the transistors of the differential pair 161, a part of the cascode current mirror circuit 163, and a part of the bias circuit 164 are low concentration transistors, while the transistors of the constant current source 162, the other part of the cascode current mirror circuit 163, the other part of the bias circuit 164, the transistors of the class AB bias circuit 165, the back gate bias circuit 20, and the output stage 166 are high concentration transistors. Specifically, the impurity concentration in the channel region of each of the first transistor ME1, the second transistor ME2, the fourth transistor ME4, the fifth transistor ME5, the eighth transistor ME8, and the ninth transistor ME9 is made lower than the impurity concentration in the channel region of each of the third transistor ME3, the sixth transistor ME6, the seventh transistor ME7, the transistors M5 to M9 of the back gate bias circuit 20, the transistor of the constant current source 21, and the tenth transistor ME10 to the twenty-first transistor ME21.

The impurity concentration in the channel region of each of the transistors ME1, ME2, ME4, ME5, ME8, and ME9 is preferably about ½ or lower of the impurity concentration in the channel region of each of the transistors ME3, ME6, ME7, M5 to M9, ME10 to ME21 and the transistor of the constant current source 21. In the present embodiment, the impurity concentration in the channel region of each of the transistors ME1, ME2, ME4, ME5, ME8, and ME9 is about 1/10 of the impurity concentration in the channel of each of the transistors ME3, ME6, ME7, M5 to M9, ME10 to ME21 and the transistor of the constant current source 21.

A structure and a manufacturing method of the N-channel MOSFETs and the P-channel MOSFETs of the transistor configuring the operational amplifier 1P are similar to the structure and manufacturing method of the N-channel MOSFETs and the P-channel MOSFETs of the first transistor M1 and the like of the first embodiment.

According to the present embodiment, following effects are achievable.

(18-1) The back gate bias circuit 20 applies a bias voltage VB, which is closer to the first power supply voltage VDD than the source potentials of the first transistor ME1 and the second transistor ME2, to the back gates of the first transistor ME1 and the second transistor ME2 (contact areas for applying bias voltage VB from back gate bias circuit 20 to N-type well layers 39 of the first transistor ME4 and the second transistor ME2). In this case, the back gate-to-source voltage VBS of each of the first transistor ME1 and the second transistor ME2 increases. The transconductance gm12 of each of the first transistor ME1 and the second transistor ME2 therefore increases. Accordingly, reduction of noise of the output signal Sout of the operational amplifier 1P is achievable.

(18-2) The back gate bias circuit 20 can further reduce noise of the output signal Sout of the operational amplifier 1P by setting the bias voltage VB higher than the first power supply voltage VDD, and thereby further increasing the transconductance gm12 of each of the first transistor ME1 and the second transistor ME2.

(18-3) The first transistor ME1 and the second transistor ME2 can be operated in a stable manner by setting the bias voltage VB to a voltage lower than such a voltage at which parasitic diodes of the first transistor ME1 and the second transistor ME2 are turned on.

(18-4) Increase in the transconductance gm12 of each of the first transistor ME1 and the second transistor ME2, and stable operation of the first transistor ME1 and the second transistor ME2 can be achieved by setting the bias voltage VB to a voltage within a predetermined range including the first power supply voltage VDD and excluding a voltage equal to the first power supply voltage VDD, and thereby increasing the back gate-to-source voltage VBS. In particular, the back gate-to-source voltage VBS is made closer to the back gate-to-source voltage VBSH by setting the bias voltage VB to a voltage within ±20% of the first power supply voltage VDD and excluding a voltage equal to the first power supply voltage VDD. Accordingly, the transconductance gm12 of each of the first transistor ME1 and the second transistor ME2 increases, and the first transistor ME1 and the second transistor ME2 can be operated in a more stable manner.

(18-5) The impurity concentration in the channel region of each of the first transistor ME1 and the second transistor ME2 configuring the differential pair 161 is lower than the impurity concentration in the channel region of each of twentieth transistor ME20 configuring the output stage 166, and the transistors M5, M8, and M9 of the back gate bias circuit 20. According to this configuration, fluctuations of mobility and fluctuations of the drain current can be reduced by lowering the impurity concentration in the channel region of each of the transistors ME1 and ME2 configuring the differential pair 161 and easily affected by 1/f noise of the output signal Sout of the operational amplifier 1P. Therefore, 1/f noise of the output signal Sout of the operational amplifier 1P can effectively decrease.

(18-6) The impurity concentration in the channel region of each of the fourth transistor ME4 and the fifth transistor ME5 configuring the current source of the cascode current mirror circuit 163 is lower than the impurity concentration in the channel region of each of the twenty-first transistor ME21 configuring the output stage 166, the transistors M6 and M7 of the back gate bias circuit 20, and the transistor of the constant current source 21. According to this configuration, fluctuations of mobility and fluctuations of the drain current can be reduced by lowering the impurity concentration in the channel regions of each of the transistors ME4 and ME5 configuring the current source of the cascode current mirror circuit 163 and easily affected by 1/f noise of the output signal Sout of the operational amplifier 1P. Therefore, 1/f noise of the output signal Sout of the operational amplifier 1P can effectively decrease.

(18-7) The impurity concentration in the channel region of each of the eighth transistor ME8 and the ninth transistor ME9 configuring the current source of the bias circuit 164 is lower than the impurity concentration in the channel region of each of the twentieth transistor ME20 configuring the output stage 166, and the transistors M5, M8, and M9 of the back gate bias circuit 20. According to this configuration, fluctuations of mobility and fluctuations of the drain current can be reduced by lowering the impurity concentration in the channel region of each of the transistors ME8 and ME9 configuring the current source of the bias circuit 164 and easily affected by 1/f noise of the output signal Sout of the operational amplifier 1P. Therefore, 1/f noise of the output signal Sout of the operational amplifier 1P can effectively decrease.

(18-8) The impurity concentration in the channel region of each of the eighth transistor ME8 and the ninth transistor ME9 configuring the current source of the bias circuit 164, and the impurity concentration in the channel region of each of the first transistor ME1 and the second transistor ME2 configuring the differential pair 161 are equal to each other. According to this structure, the step of forming the N-type well layer 70 of each of the transistors ME1 and ME2 configuring the differential pair 161, and the step of forming the N-type well layer 70 of each of the transistors ME8 and ME9 configuring the current source of the bias circuit 164 can be collectively performed. Therefore, the step of manufacturing the operational amplifier 1P can be simplified.

(18-9) The impurity concentration in the channel region of the third transistor ME3 of the constant current source 162, the impurity concentration in the channel region of each of the transistors ME10 and ME11 of the bias circuit 164, the impurity concentration in the channel region of each of the transistors ME12, ME16, ME17, and ME19 of the class AB bias circuit 165, the impurity concentration in the channel region of the twentieth transistor ME20 of the output stage 166, and the impurity concentration in the channel region of each of the transistors M5, M8, and M9 of the back gate bias circuit 20 are equal to each other. According to this configuration, the step of forming the N-type well layer 63 of the third transistor ME3, the step of forming the N-type well layer 63 of each of the transistors ME10 and ME11, the step of forming the N-type well layer 63 of each of the transistors ME12, ME16, ME17, and ME 19, the step of forming the N-type well layer 63 of the twentieth transistor ME20, and the step of forming the N-type well layer 63 of each of the transistors M5, M8, and M9 can be collectively performed. Therefore, the step of manufacturing the operational amplifier 1P can be simplified.

(18-10) The impurity concentration in the channel region of each of the transistors ME6 and ME7 of the cascode current mirror circuit 163, the impurity concentration in the channel region of each of the transistors ME13 to ME15 of the class AB bias circuit 165, the impurity concentration in the channel region of the twenty-first transistor ME21 of the output stage 166, and the impurity concentration in the channel region of each of the transistors M6 and M7 of the back gate bias circuit 20 and the transistor of the constant current source 21 are equal to each other. According to this configuration, the step of forming the P-type well layer 41 of each of the transistors ME6 and ME7, the step of forming the P-type well layer 41 of each of the transistors ME13 to ME15, the step of forming the P-type well layer 41 of the twenty-first transistor ME 21, and the step of forming the P-type well layer 41 of each of the transistors M6 and M7 and the transistor of the constant current source 21 can be collectively performed. Therefore, the step of manufacturing the operational amplifier 1P can be simplified.

Modifications of Eighteenth Embodiment

The operational amplifier 1P of the present embodiment can be modified in following manners. Following modified examples can be combined with each other as long as technical contradiction does not occur.

In the operational amplifier 1P, the step-down circuit 100 of the fifth embodiment may be added between the first power supply line 2 and the differential pair 161, more specifically between the first power supply line 2 and the constant current source 162. According to this configuration, effects similar to those of the fifth embodiment can be obtained. In addition, the back gate bias circuit 20 may also be connected to the third power supply line 4 as in the back gate bias circuit 20 of the sixth embodiment. According to this configuration, effects similar to the effects of the sixth embodiment can be obtained.

Instead of lowering the impurity concentration in the channel region of each of the transistors ME1, ME2, ME4, ME5, ME8, and ME9, embedded channel type MOSFETs such as the transistors M1 to M4 of the second embodiment may be adopted. In this case, effects similar to the effects of the second embodiment can be obtained. Furthermore, any one or two of the pair of transistors ME1 and ME2 configuring the differential pair 161, the pair of transistors ME4 and ME5 configuring the current source of the cascode current mirror circuit 163, and the pair of the transistors ME8 and ME9 configuring the current source of the bias circuit 164 may be changed to the embedded channel type MOSFETs of the second embodiment.

In addition to lowering the impurity concentration in the channel region of each of the transistors ME1, ME2, ME4, ME5, ME8, and ME9, embedded channel type MOSFETs may be adopted. That is, the transistors ME1, ME2, ME4, ME5, ME8, and ME9 may have structures similar to the structures of the transistors M1 to M4 of the third embodiment. In this case, effects similar to the effects of the third embodiment can be obtained. Furthermore, any one or two of the pair of transistors ME1 and ME2 configuring the differential pair 161, the pair of transistors ME4 and ME5 configuring the current source of the cascode current mirror circuit 163, and the pair of the transistors ME8 and ME9 configuring the current source of the bias circuit 164 may be changed to structures similar to the structures of the transistors M1 to M4 of the third embodiment. Furthermore, any one or two of the pair of transistors ME1 and ME2 configuring the differential pair 161, the pair of transistors ME4 and ME5 configuring the current source of the cascode current mirror circuit 163, and the pair of the transistors ME8 and ME9 configuring the current source of the bias circuit 164 may be changed to structures similar to the structures of the embedded channel type MOSFETs of the second embodiment or the transistors M1 to M4 of the third embodiment. In short, the operational amplifier 1P may have a configuration which includes a mixture of structures similar to the structures of the low concentration transistors of the first embodiment, the embedded channel type MOSFETs of the second embodiment, and the transistors M1 to M4 of the third embodiment.

Nineteenth Embodiment

Figure 36:
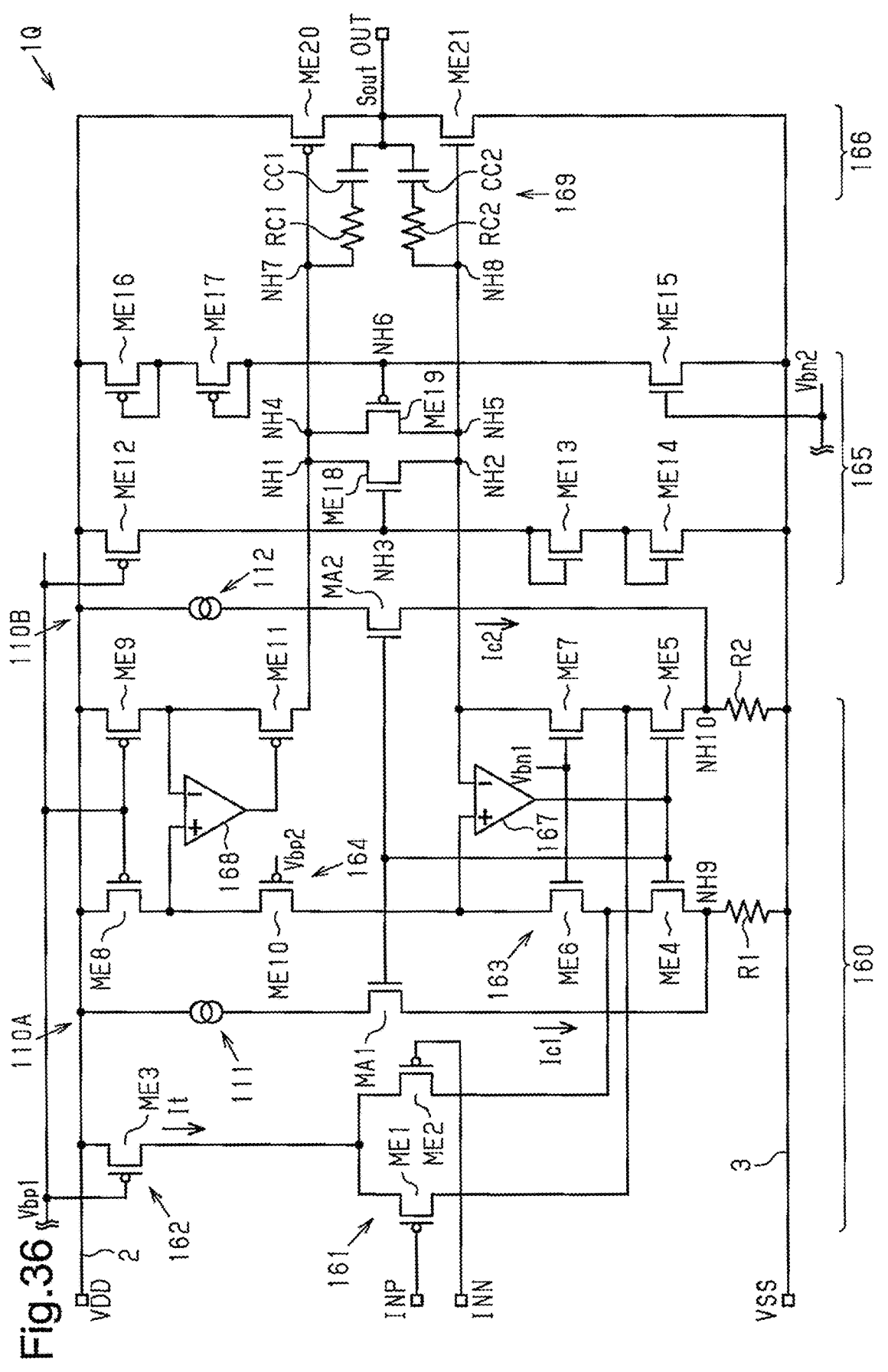

An operational amplifier 1Q according to a nineteenth embodiment will be described with reference to FIG. 36. The operational amplifier 1Q of the present embodiment is different from the operational amplifier 1P of the eighteenth embodiment in that the back gate bias circuit 20 is eliminated, and that the first control unit 110A, the second control unit 110B, the first resistor R1, and the second resistor R2 of the eighth embodiment are added.

The first resistor R1 is provided between the second power supply line 3 and the fourth transistor ME4. The first terminal of the first resistor R1 is connected to the source of the fourth transistor ME4, while the second terminal of the first resistor R1 is connected to the second power supply line 3.

The second resistor R2 is provided between the second power supply line 3 and the fifth transistor ME5. The first terminal of the second resistor R2 is connected to the source of the fifth transistor ME5, while the second terminal of the second resistor R2 is connected to the second power supply line 3.

The first control unit 110A controls the source potential of the fourth transistor ME4 by controlling a current supplied to a node NH9 between the source of the fourth transistor ME4 and the first resistor R1. The first control transistor MA1 of the first control unit 110A of the present embodiment is an N-channel MOSFET. The first constant current source 111 includes a transistor (not shown). The transistor of the first constant current source 111 is a P-channel MOSFET. The drain of the transistor of the first constant current source 111 is connected to the drain of the first control transistor MA1, while the source of the transistor is connected to the first power supply line 2. The source of the first control transistor MA1 is connected to the node NH9 between the source of the fourth transistor ME4 and the first resistor R1, while the gate of the first control transistor MA1 is connected to the gate and the drain of the fourth transistor ME4. In this configuration, the first control unit 110A supplies, to the node NH9, the first current Ic1 proportional to the constant current It of the constant current source 162.

The second control unit 110B controls the source potential of the fifth transistor ME5 by controlling a current supplied to a node NH10 between the source of the fifth transistor ME5 and the second resistor R2. The second control transistor MA2 of the second control unit 110B of the present embodiment is an N-channel MOSFET. The second constant current source 112 includes a transistor (not shown). The transistor of the second constant current source 112 is a P-channel MOSFET. The drain of the transistor of the second constant current source 112 is connected to the drain of the second control transistor MA2, while the source of the transistor is connected to the first power supply line 2. The source of the second control transistor MA2 is connected to the node NH10 between the source of the fifth transistor ME5 and the second resistor R2, while the gate of the second control transistor MA2 is connected to the gate and the drain of the fourth transistor ME4. In this configuration, the second control unit 110B supplies, to the node NH10, the second current Ic2 proportional to the constant current It of the constant current source 162.

In this manner, the first current Ic1 is supplied from the first control unit 110A to the source of the fourth transistor ME4, while the second current Ic2 is supplied from the second control unit 110B to the source of the fifth transistor ME5. As a result, the source potential of the fourth transistor ME4 and the source potential of the fifth transistor ME5 are raised. In addition, the source potentials of the fourth transistor ME4 and the fifth transistor ME5 are raised by the first resistor R1 and the second resistor R2. According to the present embodiment described above, the source potentials of the transistors ME4 and ME5 are further raised. Accordingly, the transconductance gm on the circuit decreases.

The structure and manufacturing method of the transistors ME1 to ME21 of the operational amplifier 1Q of the present embodiment are similar to the structure and manufacturing method of the transistors ME1 to ME21 of the eighteenth embodiment. Therefore, effects similar to effects (18-5) to (18-8) of the eighteenth embodiment can be obtained.

Moreover, the first control transistor MA1 and the second control transistor MA2 are not easily affected by 1/f noise of the output signal Sout. Accordingly, the impurity concentration in the channel region of each of the transistors MA1 and MA2 is made higher than the impurity concentration in the channel region of each of the transistor ME1, ME2, ME4, ME5, ME8, and ME9. In other words, the impurity concentration in the channel region of each of the transistors M1 to M4 is lower than the impurity concentration in the channel region of each of the transistors MA1 and MA2. That is, the transistors ME1, ME2, ME4, ME5, ME8, ME9 are low concentration transistors, while the transistors MA1 and MA2 are high concentration transistors. The impurity concentration in the channel region of each of the transistors ME1, ME2, ME4, ME5, ME8, and ME9 is preferably about ½ or lower of the impurity concentration in the channel region of each of the transistors MA1 and MA2. In the present embodiment, the impurity concentration in the channel region of each of the transistors ME1, ME2, ME4, ME5, ME8, and ME9 is about 1/10 of the impurity concentration in the channel region of each of the transistors MA1 and MA2.

According to the present embodiment, following effects are achievable.

(19-1) The control units 110A and 110B raise the source voltages of the transistors ME4 and ME5 of the active load to decrease currents flowing through the transistors ME4 and ME5. Accordingly, the transconductance gm of each of the transistors ME4 and ME5 on the circuit decreases, wherefore noise of the output signal Sout of the operational amplifier 1Q can be reduced.

(19-2) The impurity concentration in the channel region of the third transistor ME3 of the constant current source 162, the impurity concentration in the channel region of each of the transistors ME10 and ME11 of the bias circuit 164, the impurity concentration of each of the transistors ME12, ME16, ME17, and ME19 of the class AB bias circuit 165, the impurity concentration in the channel region of the twentieth transistor ME20 of the output stage 166, and the impurity concentration in the channel region of each of the transistor of the constant current source 111 of the first control unit 110A and the transistor of the constant current source 112 of the second control unit 110B are equal to each other. According to this configuration, the step of forming the N-type well layer 63 of the third transistor ME3, the step of forming the N-type well layer 63 of each of the transistors ME10 and ME11, the step of forming the N-type well layer 63 of each of the transistors ME12, ME16, ME17, and ME19, the step of forming the N-type well layer 63 of the twentieth transistor ME20, and the step of forming the N-type well layer 63 of each of the transistors of the constant current sources 111 and 112 can be collectively performed. Therefore, the step of manufacturing the operational amplifier 1Q can be simplified.

(19-3) The impurity concentration in the channel region of each of the transistors ME6 and ME7 of the cascode current mirror circuit 163, the impurity concentration in the channel region of each of the transistors ME13 to ME15 of the class AB bias circuit 165, the impurity concentration in the channel region of the twenty-first transistor ME21 of the output stage 166, and the impurity concentration in the channel region of each of the transistors MA1 and MA2 of the control units 110A and 110B are equal to each other. According to this configuration, the step of forming the P-type well layer 41 of each of the transistors ME6 and ME7, the step of forming the P-type well layer 41 of each of the transistors ME13 to ME15, the step of forming the P-type well layer 41 of the twenty-first transistor ME 21, and the step of forming the P-type well layer 41 of each of the transistors MA1 and MA2 can be collectively performed. Therefore, the step of manufacturing the operational amplifier 1Q can be simplified.

Modifications of Nineteenth Embodiment

The operational amplifier 1Q of the present embodiment can be modified in following manners. Following modified examples can be combined with each other as long as technical contradiction does not occur.

The first control unit 110A and the second control unit 110B may be eliminated from the operational amplifier 1Q. In this case, the source potentials of the transistors ME4 and ME5 are raised by the first resistor R1 and the second resistor R2.

In the operational amplifier 1Q, the resistance value of the first resistor R1 and the resistance value of the second resistor R2 may be changed in accordance with the ratio of the fourth transistor ME4 to the fifth transistor ME5.

Instead of lowering the impurity concentration in the channel region of each of the transistors ME1, ME2, ME4, ME5, ME8, and ME9, embedded channel type MOSFETs such as the transistors M1 to M4 of the second embodiment may be adopted. In this case, effects similar to the effects of the second embodiment can be obtained. Furthermore, any one or two of the pair of transistors ME1 and ME2 configuring the differential pair 161, the pair of transistors ME4 and ME5 configuring the current source of the cascode current mirror circuit 163, and the pair of the transistors ME8 and ME9 configuring the current source of the bias circuit 164 may be changed to the embedded channel type MOSFETs of the second embodiment.

In addition to lowering the impurity concentration in the channel region of each of the transistors ME1, ME2, ME4, ME5, ME8, and ME9, embedded channel type MOSFETs may be adopted. That is, the transistors ME1, ME2, ME4, ME5, ME8, and ME9 may have structures similar to the structures of the transistors M1 to M4 of the third embodiment. In this case, effects similar to the effects of the third embodiment can be obtained. Furthermore, any one or two of the pair of transistors ME1 and ME2 configuring the differential pair 161, the pair of transistors ME4 and ME5 configuring the current source of the cascode current mirror circuit 163, and the pair of the transistors ME8 and ME9 configuring the current source of the bias circuit 164 may be changed to structures similar to the structures of the transistors M1 to M4 of the third embodiment. Furthermore, any one or two of the pair of transistors ME1 and ME2 configuring the differential pair 161, the pair of transistors ME4 and ME5 configuring the current source of the cascode current mirror circuit 163, and the pair of the transistors ME8 and ME9 configuring the current source of the bias circuit 164 may be changed to structures similar to the structures of the embedded channel type MOSFETs of the second embodiment or the transistors M1 to M4 of the third embodiment. In short, the operational amplifier 1Q may have a configuration which includes a mixture of structures similar to the structures of the low concentration transistors of the first embodiment, the embedded channel type MOSFETs of the second embodiment, and the transistors M1 to M4 of the third embodiment.

Twentieth Embodiment

Figure 37:
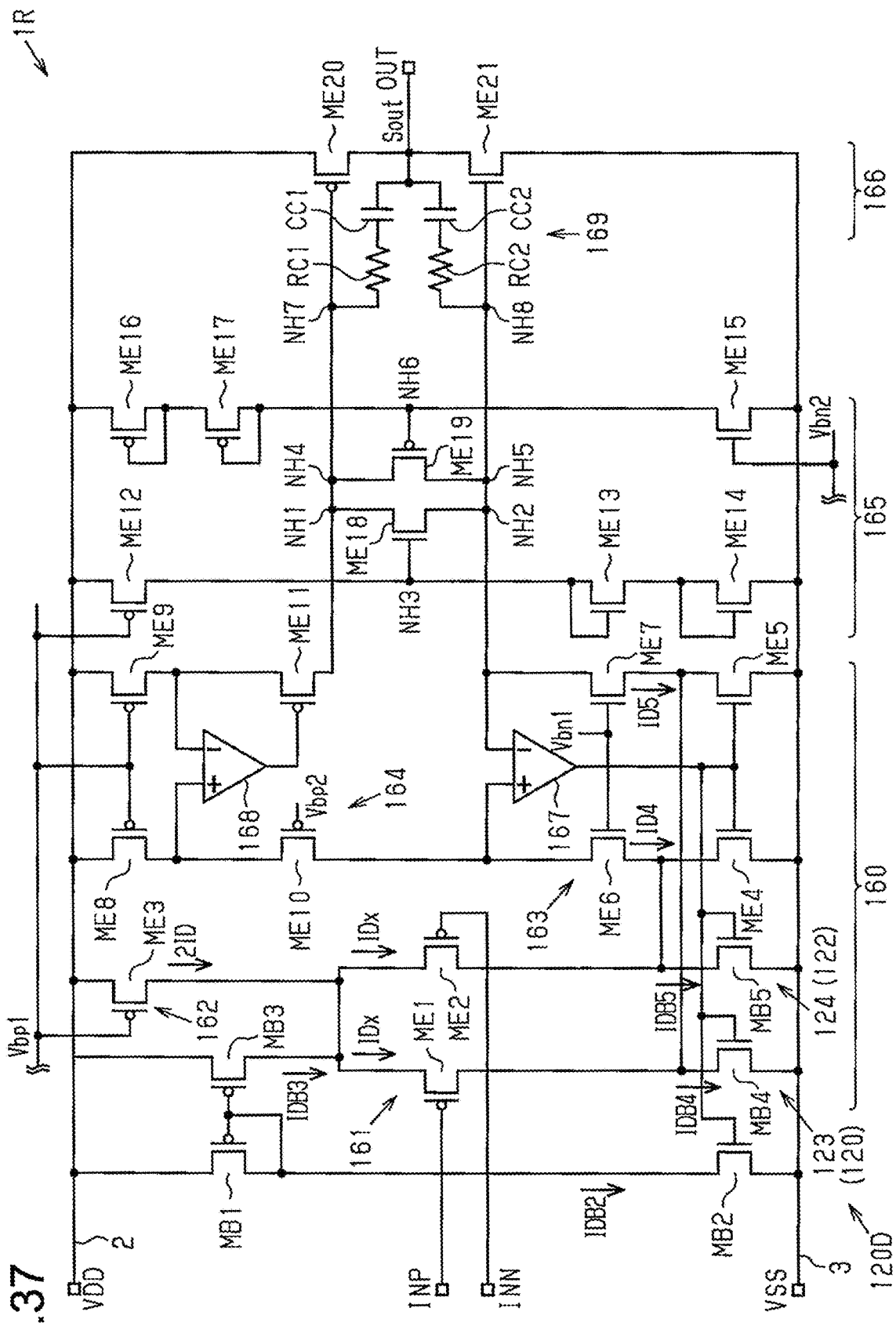
FIG. 37 is a circuit diagram of an operational amplifier according to a twentieth embodiment.

An operational amplifier 1R according to a twentieth embodiment will be described with reference to FIG. 37. The operational amplifier 1R of the present embodiment is different from the operational amplifier 1P of the eighteenth embodiment in that the back gate bias circuit 20 is eliminated, and that a current adjustment unit 120D is added.

The current adjustment unit 120D has a configuration similar to the configuration of the current adjustment unit 120 of the tenth embodiment.

The first branching circuit 123 of the current adjustment unit 120D is connected to the drain of the first transistor ME1 and the second power supply line 3. More specifically, the drain of the first branching transistor MB4 of the first branching circuit 123 is connected to the drain of the first transistor ME1, while the source of the first branching transistor MB4 is connected to the second power supply line 3.

The second branching circuit 124 of the current adjustment unit 120D is connected to the drain of the second transistor ME2 and the second power supply line 3. More specifically, the drain of the second branching transistor MB5 of the second branching circuit 124 is connected to the drain of the second transistor ME2, while the source of the second branching transistor MB5 is connected to the second power supply line 3.

The gates of the transistors MB4 and MB5 are connected in common to the gate of the fourth transistor ME4. The gate of the second supply transistor MB2 is connected to the gate of the fourth transistor ME4. The transistors MB2, MB4, and MB5 thus configure a current mirror circuit in cooperation with the fourth transistor ME4. That is, the gate voltages of the transistors MB2, MB4, and MB5 of the current adjustment unit 120D are controlled by the gate voltage of the fourth transistor ME4.

The first branching transistor MB4 of the first branching circuit 123 and the second branching transistor MB5 of the second branching circuit 124 have the same electrical characteristics. In addition, the transistors MB2, MB4, and MB5 have a common gate voltage. In this case, the current amount of the second supply transistor MB2 is twice larger than the current amount of the first branching transistor MB4 (second branching transistor MB5). Accordingly, a sum of currents flowing through the transistors MB4 and MB5 is generated in the second supply transistor MB2.

According to the present embodiment, settings of electric characteristics of the transistors MB4 and MB5, and settings of electric characteristics of the fourth transistor ME4 and the fifth transistor ME5 are equalized. In addition, the gates of the transistors MB4 and MB5 are connected to the gate of the fourth transistor ME4, wherefore a current flowing through the first branching transistor MB4 and a current flowing through the second branching transistor MB5 are equalized with a current flowing through the fourth transistor ME4 (current flowing through fifth transistor ME5).

A current flowing through the operational amplifier 1R, particularly a current flowing through the current adjustment unit 120D will be described. In the following description, a constant current flowing through the constant current source 11 is referred to as a constant current 2ID. The magnitudes of the supply current IDB3, the currents IDB2, IDB4, IDB5, and the currents ID4 and ID5 are similar to the magnitudes of the supply current IDB3, the currents IDB2, IDB4, IDB5, and the currents ID3 and ID4 of the ninth embodiment, and therefore are not repeatedly described herein.

As described in the ninth embodiment, the supply current IDB3, which has the same current amount as the current IDB2 which is a sum of the currents IDB4 and IDB5 flowing through the transistors MB4 and MB5, is supplied to the differential pair 10. In this case, the current supplied to the differential pair 10 is the sum of the supply current IDB3 and the constant current 2ID, wherefore the transconductance gm12 of each of the transistors ME1 and ME2 of the differential pair 161 increases. Meanwhile, the currents IDB4 and IDB5 are extracted from the current IDx flowing through each of the transistors M1 and M2 by each of the transistors MB4 and MB5. In this case, an increase in transconductance gm34 of each of the transistors ME4 and ME5 of the active load is suppressed. Accordingly, the current adjustment unit 120D increases the currents flowing through the transistors ME1 and ME2, but does not increase the currents flowing through the transistors ME4 and ME5. As a result, the transconductance gm of each of the transistors ME1 and ME2 of the differential pair 161 increases, while the transconductance gm34 of each of the transistor ME4 and ME5 of the cascode current mirror circuit 163 as the active load does not increase. Therefore, reduction of noise of the output signal Sout of the operational amplifier 1R is achievable.

Moreover, the structure and manufacturing method of the transistors ME1 to ME21 of the operational amplifier 1R of the present embodiment are similar to the structure and manufacturing method of the transistors ME1 to ME21 of the eighteenth embodiment. Therefore, effects similar to effects (18-5) to (18-8) of the eighteenth embodiment can be obtained.

Each of the transistors MB1 to MB5 of the present embodiment has the same configuration as the configuration of each of the transistors MB1 to MB5 of the tenth embodiment. That is, the transistors MB1 to MB5 are not easily affected by 1/f noise of the output signal Sout. Accordingly, the impurity concentration in the channel region of each of the transistors MB1 to MB5 is made higher than the impurity concentration in the channel region of each of the transistor ME1, ME2, ME4, ME5, ME8, and ME9. In other words, the impurity concentration in the channel region of each of the transistors ME1, ME2, ME4, ME5, ME8, and ME9 is lower than the impurity concentration in the channel region of each of the transistors MB1 to MB5. That is, the transistors ME1, ME2, ME4, ME5, ME8, ME9 are low concentration transistors, while the transistors MB1 to MB5 are high concentration transistors. The impurity concentration in the channel region of each of the transistors ME1, ME2, ME4, ME5, ME8, and ME9 is preferably about ½ or lower of the impurity concentration in the channel region of each of the transistors MB1 to MB5. In the present embodiment, the impurity concentration in the channel region of each of the transistors ME1, ME2, ME4, ME5, ME8, and ME9 is about ¹/₁₀ of the impurity concentration in the channel region of each of the transistors MB1 to MB5. In addition, the transistors MB1 to MB5 are surface channel type MOSFETs.

According to the present embodiment, following effects are achievable.

(20-1) The current adjustment unit 120D increases the current supplied to the differential pair 161, but does not increase the current supplied to the active load. Accordingly, the transconductance of each of the transistors ME1 and ME2 of the differential pair 161 increases, suppressing increase in the transconductance of each of the transistors ME4 and ME5 of the active load. Therefore, reduction of noise of the output signal Sout of the operational amplifier 1R is achievable.

(20-2) The impurity concentration in the channel region of the third transistor ME3 of the constant current source 162, the impurity concentration in the channel region of each of the transistors ME10 and ME11 of the bias circuit 164, the impurity concentration of each of the transistors ME12, ME16, ME17, and ME19 of the class AB bias circuit 165, the impurity concentration in the channel region of the twentieth transistor ME20 of the output stage 166, and the impurity concentration in the channel region of each of the transistors MB1 and MB3 of the current adjustment unit 120D are equal to each other. According to this configuration, the step of forming the N-type well layer 63 of the third transistor ME3, the step of forming the N-type well layer 63 of each of the transistors ME10 and ME11, the step of forming the N-type well layer 63 of each of the transistors ME12, ME16, ME17, and ME19, the step of forming the N-type well layer 63 of the twentieth transistor ME20, and the step of forming the N-type well layer 63 of each of the transistors MB1 and MB3 can be collectively performed. Therefore, the step of manufacturing the operational amplifier 1R can be simplified.

(20-3) The impurity concentration in the channel region of each of the transistors ME6 and ME7 of the cascode current mirror circuit 163, the impurity concentration in the channel region of each of the transistors ME13 to ME15 of the class AB bias circuit 165, the impurity concentration in the channel region of the twenty-first transistor ME21 of the output stage 166, and the impurity concentration in the channel region of each of the transistors MB2, MB4, and MB5 of the current adjustment unit 120D are equal to each other. According to this configuration, the step of forming the P-type well layer 41 of each of the transistors ME6 and ME7, the step of forming the P-type well layer 41 of each of the transistors ME13 to ME15, the step of forming the P-type well layer 41 of the twenty-first transistor ME 21, and the step of forming the P-type well layer 41 of each of the transistors MB2, MB4, and MB5 can be collectively performed. Therefore, the step of manufacturing the operational amplifier 1R can be simplified.

Modifications of Twentieth Embodiment

The operational amplifier 1R of the present embodiment can be modified in following manners. Following modified examples can be combined with each other as long as technical contradiction does not occur.

The adjustment current source 125 may be added to the operational amplifier 1R similarly to the operational amplifier 1H of the eleventh embodiment. The connection configuration between the transistor MB6 of the adjustment current source 125 and each of the transistors MB2, MB4, and MB5 is similar to the connection configuration of the eleventh embodiment.

The first resistor R1, the second resistor R2, and the third resistor R3 may be added to the operational amplifier 1R. In this case, the connection configuration of the current adjustment unit 120A of the twelfth embodiment may be adopted. That is, the first resistor R1 is provided between the fourth transistor ME4 and the second power supply line 3, the second resistor R2 is provided between the fifth transistor ME5 and the second power supply line 3, and the resistor R3 is provided between the second supply transistor MB2 and the second power supply line 3. The drain of the first branching transistor MB4 is connected to the drain of the first transistor ME1, the source of the first branching transistor MB4 is connected between the source of the fourth transistor ME4 and the first resistor R1, and the gate of the first branching transistor MB4 is connected to the gate of the fourth transistor ME4. The drain of the second branching transistor MB5 is connected to the drain of the second transistor ME2, the source of the second branching transistor MB5 is connected between the source of the fifth transistor ME5 and the second resistor R2, and the gate of the second branching transistor MB5 is connected to the gate of the fourth transistor ME4. According to this configuration, the source potentials of the transistors ME4 and ME5 of the active load can be raised by the first resistor R1 and the second resistor R2 connected to the active load. In this case, currents flowing through the transistors ME4 and ME5 decrease. Accordingly, the transconductance gm of each of the transistors ME4 and ME5 on the circuit decreases, wherefore noise of the output signal Sout of the operational amplifier 1R can be reduced.

When the first resistor R1, the second resistor R2, and the third resistor R3 are added to the operational amplifier 1R, the connection configuration of the current adjustment unit 120B of the fourteenth embodiment may be adopted. In this case, the fourth resistor R4 and the fifth resistor R5 are further added to the operational amplifier 1R. The fourth resistor R4 is provided between the source of the first branching transistor MB4 and the second power supply line 3, while the fifth resistor R5 is provided between the source of the second branching transistor MB5 and the second power supply line 3.

Instead of lowering the impurity concentration in the channel region of each of the transistors ME1, ME2, ME4, ME5, ME8, and ME9, embedded channel type MOSFETs such as the transistors M1 to M4 of the second embodiment may be adopted. In this case, effects similar to the effects of the second embodiment can be obtained. Furthermore, any one or two of the pair of transistors ME1 and ME2 configuring the differential pair 161, the pair of transistors ME4 and ME5 configuring the current source of the cascode current mirror circuit 163, and the pair of the transistors ME8 and ME9 configuring the current source of the bias circuit 164 may be changed to the embedded channel type MOSFETs of the second embodiment.

In addition to lowering the impurity concentration in the channel region of each of the transistors ME1, ME2, ME4, ME5, ME8, and ME9, embedded channel type MOSFETs may be adopted. That is, the transistors ME1, ME2, ME4, ME5, ME8, and ME9 may have structures similar to the structures of the transistors M1 to M4 of the third embodiment. In this case, effects similar to the effects of the third embodiment can be obtained. Furthermore, any one or two of the pair of transistors ME1 and ME2 configuring the differential pair 161, the pair of transistors ME4 and ME5 configuring the current source of the cascode current mirror circuit 163, and the pair of the transistors ME8 and ME9 configuring the current source of the bias circuit 164 may be changed to structures similar to the structures of the transistors M1 to M4 of the third embodiment. Furthermore, any one or two of the pair of transistors ME1 and ME2 configuring the differential pair 161, the pair of transistors ME4 and ME5 configuring the current source of the cascode current mirror circuit 163, and the pair of the transistors ME8 and ME9 configuring the current source of the bias circuit 164 may be changed to structures similar to the structures of the embedded channel type MOSFETs of the second embodiment or the transistors M1 to M4 of the third embodiment. In short, the operational amplifier 1R may have a configuration which includes a mixture of structures similar to the structures of the low concentration transistors of the first embodiment, the embedded channel type MOSFETs of the second embodiment, and the transistors M1 to M4 of the third embodiment.

Twenty-First Embodiment

Figure 38:
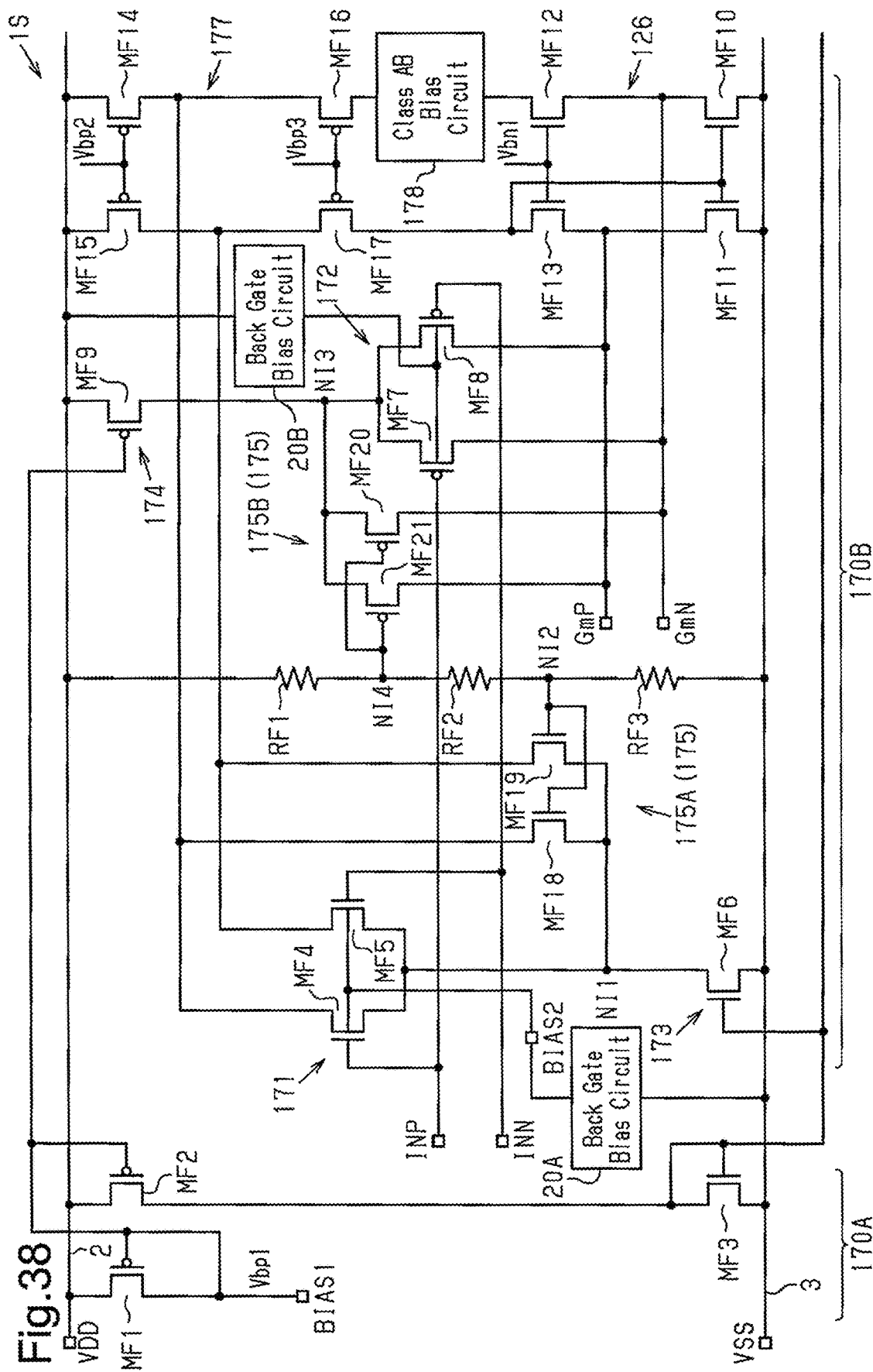
FIG. 38 is a circuit diagram of an operational amplifier according to a twenty-first embodiment.

An operational amplifier 1S according to a twenty-first embodiment will be described with reference to FIG. 38.

The operational amplifier 1S amplifies a potential difference between the inverting input terminal INN and the noninverting input terminal INP, and outputs the output signal Sout from an output terminal (not shown). The operational amplifier 1S includes a constant current generator 170A, a differential amplifier stage 170B, a first back gate bias circuit 20A, and a second back gate bias circuit 20B. The operational amplifier 1S is integrated on one semiconductor substrate.

The constant current generator 170A includes a first transistor MF1 to a third transistor MF3. In the present embodiment, the first transistor MF1 and the second transistor MF2 are P-channel MOSFETs, while the third transistor MF3 is an N-channel MOSFET. The source of the first transistor MF1 and the source of the second transistor MF2 are connected to the first power supply line 2. The drain of the first transistor MF1 is connected to the bias terminal BIAS. The drain of the second transistor MF2 is connected to the drain of the third transistor MF3. The source of the third transistor MF3 is connected to the second power supply line 3, while the gate of the third transistor MF3 is connected to the drain of the third transistor MF3. The bias voltage Vbp1 is input to the source and the gate of the first transistor MF1 and the gate of the second transistor MF2 by a first bias circuit (not shown) connected to the bias terminal BIAS.

The differential amplifier stage 170B includes a first differential pair 171, a second differential pair 172, a first constant current source 173, a second constant current source 174, a current switching unit 175, a cascode current mirror circuit 176, a bias circuit 177, and a class AB bias circuit 178.

The first differential pair 171 includes a fourth transistor MF4 and a fifth transistor MF5. The fourth transistor MF4 and the fifth transistor MF5 of the present embodiment are N-channel MOSFETs. Each of the fourth transistor MF4 and the fifth transistor MF5 may have either a depletion-type structure or an enhancement type structure. In the present embodiment, each of the fourth transistor MF4 and the fifth transistor MF5 has an enhancement type structure. The source of the fourth transistor MF4 and the source of the fifth transistor MF5 are connected in common. The drain of the fourth transistor MF4 and the drain of the fifth transistor MF5 are connected to the bias circuit 177. The gate of the fourth transistor MF4 is connected to the noninverting input terminal INP, while the gate of the fifth transistor MF5 is connected to the inverting input terminal INN.

The first constant current source 173 includes a sixth transistor MF6 connected to the first differential pair 171. The sixth transistor MF6 of the present embodiment is an N-channel MOSFET. The drain of the sixth transistor MF6 is connected to the sources of the fourth transistor MF4 and the fifth transistor MF5, while the source of the sixth transistor MF6 is connected to the second power supply line 3. The gate of the sixth transistor MF6 is connected to the gate of the third transistor MF3. The third transistor MF3 and the sixth transistor MF6 thus configure a current mirror circuit.

The second differential pair 172 includes a seventh transistor MF7 and an eighth transistor MF8. The seventh transistor MF7 and the eighth transistor MF8 of the present embodiment are P-channel MOSFETs. Each of the seventh transistor MF7 and the eighth transistor MF8 may have either a depletion-type structure or an enhancement type structure. In the present embodiment, each of the seventh transistor MF7 and the eighth transistor MF8 has an enhancement type structure. The source of the seventh transistor MF7 and the source of the eighth transistor MF8 are connected in common. The drains of the seventh transistor MF7 and the eighth transistor MF8 are connected to the cascode current mirror circuit 176. The gate of the seventh transistor MF7 is connected to the noninverting input terminal INP, while the gate of the eighth transistor MF8 is connected to the inverting input terminal INN.

The second constant current source 174 includes a ninth transistor M9 connected to the second differential pair 172. The ninth transistor MF9 of the present embodiment is a P-channel MOSFET. The drain of the ninth transistor MF9 is connected to the sources of the seventh transistor MF7 and the eighth transistor MF8, while the source of the ninth transistor MF9 is connected to the first power supply line 2. The gate of the ninth transistor MF9 is connected to the gate of the second transistor MF2. The second transistor MF2 and the ninth transistor MF9 thus configure a current mirror circuit. The bias voltage Vbp1 is input from the first bias circuit to the gate of the second transistor MF2.

The cascode current mirror circuit 176 is connected to the second differential pair 172. The cascode current mirror circuit 176 is configured by two stacked transistors of the same type, and includes a tenth transistor MF10 to a thirteenth transistor MF13. In the present embodiment, the tenth transistor MF10 to the thirteenth transistor MF13 are configured by N-channel MOSFETs. In particular, each of the tenth transistor MF10 and the eleventh transistor MF11 has an enhancement type structure.

The tenth transistor MF10 is provided in series with the seventh transistor MF7. More specifically, the tenth transistor MF10 is provided between the drain of the seventh transistor MF7 and the second power supply line 3. The eleventh transistor MF11 is provided in series with the eighth transistor MF8. More specifically, the eleventh transistor MF11 is provided between the drain of the eighth transistor MF8 and the second power supply line 3. The twelfth transistor MF12 is vertically stacked on the tenth transistor MF10, while the thirteenth transistor MF13 is vertically stacked on the eleventh transistor MF11. More specifically, the source of the tenth transistor MF10 and the source of the eleventh transistor MF11 are connected to the second power supply line 3. The drain of the tenth transistor MF10 is connected to the source of the twelfth transistor MF12, while the drain of the eleventh transistor MF11 is connected to the source of the thirteenth transistor MF13. The gates of the twelfth transistor MF12 and the thirteenth transistor MF13 are connected to a second bias circuit (not shown). The gates of the twelfth transistor M12 and the thirteenth transistor M13 are appropriately biased by the bias voltage Vbn1 input from the second bias circuit. The gate of the tenth transistor MF10 and the gate of the eleventh transistor MF11 are connected to the drain of the thirteenth transistor MF13. This connection implements lowering of voltage and input full swing (rail-to-rail) even when the fourth transistor MF4, the fifth transistor MF5, the seventh transistor MF7, and the eighth transistor MF8 are of the enhancement type.

The bias circuit 177 is a constant current circuit that maintains the cascode current mirror circuit 176 in an appropriate biased state. In one example, the bias circuit 177 is configured by two stacked transistors of the same type, and includes a fourteenth transistor MF14 to a seventeenth transistor ME17. In the present embodiment, the fourteenth transistor MF14 to the seventeenth transistor MF17 are P-channel MOSFETs. In particular, the fourteenth transistor MF14 and the fifteenth transistor MF15 are of enhancement type.

The fourteenth transistor MF14 and the fifteenth transistor MF15 configure a current source for generating a predetermined current. The fourteenth transistor MF14 is provided in series with the fourth transistor MF4. More specifically, the fourteenth transistor MF14 is provided between the drain of the fourth transistor MF4 and the first power supply line 2. The fifteenth transistor MF15 is provided in series with the fifth transistor MF5. More specifically, the fifteenth transistor MF15 is provided between the drain of the fifth transistor MF5 and the first power supply line 2. The gates of the fourteenth transistor MF14 and fifteenth transistor MF15 are connected to a second bias circuit (not shown). The gates of the fourteenth transistor M14 and the fifteenth transistor M15 are appropriately biased by the bias voltage Vbp2 input from the third bias circuit. The sixteenth transistor MF16 is vertically stacked on the fourteenth transistor MF14, while the seventeenth transistor MF17 is vertically stacked on the fifteenth transistor MF15. More specifically, the drain of the sixteenth transistor MF16 is connected to the source of the fourteenth transistor MF14, while the drain of the seventeenth transistor MF17 is connected to the source of the fifteenth transistor MF15. The gates of the sixteenth transistor MF16 and the seventeenth transistor MF17 are connected to a fourth bias circuit (not shown). The gates of the sixteenth transistor M16 and the seventeenth transistor M17 are appropriately biased by a bias voltage Vbp3 input from the third bias circuit.

The current switching unit 175 includes a first resistor RF1, a second resistor RF2, and a third resistor RF3, which are three resistors connected in series between the first power supply line 2 and the second power supply line 3. The first terminal of the first resistor RF1 is connected to the first power supply line 2, while the second terminal of the first resistor RF1 is connected to the first terminal of the second resistor RF2. The second terminal of the second resistor RF2 is connected to the first terminal of the third resistor RF3, while the second terminal of the third resistor RF3 is connected to the second power supply line 3.

The current switching unit 175 includes a first switching section 175A connected to the first differential pair 171, and a second switching section 175B connected to the second differential pair 172.

The first switching section 175A includes an eighteenth transistor MF18 and a nineteenth transistor MF19. In the present embodiment, each of the eighteenth transistor MF18 and the nineteenth transistor MF19 is an enhancement type N-channel MOSFET. The drain of the eighteenth transistor MF18 is connected to the drain of the fourth transistor MF4, while the drain of the nineteenth transistor MF19 is connected to the drain of the fifth transistor MF5. The source of the eighteenth transistor MF18 and the source of the nineteenth transistor MF19 are connected in common, and connected to a node NI1 between the sources of the fourth transistor MF4 and the fifth transistor MF5 and the drain of the sixth transistor MF6. The gate of the eighteenth transistor MF18 and the gate of the nineteenth transistor MF19 are connected in common, and connected to a node NI2 between the second resistor RF2 and the third resistor RF3.

The second switching section 175B includes a twentieth transistor MF20 and a twenty-first transistor MF21. In the present embodiment, each of the twentieth transistor MF20 and the twenty-first transistor MF21 is an enhancement type P-channel MOSFET. The drain of the twentieth transistor MF20 is connected to the drain of the seventh transistor MF7, while the drain of the twenty-first transistor MF21 is connected to the drain of the eighth transistor MF8. The source of the twentieth transistor MF20 and the source of the twenty-first transistor MF21 are connected in common, and connected to a node NI3 between the drain of the ninth transistor MF9 and the sources of the seventh transistor MF7 and the eighth transistor MF8. The gate of the twentieth transistor MF20 and the gate of the twenty first transistor MF21 are connected in common, and connected to a node N14 between the first resistor RF1 and the second resistor RF2. The drain of the twentieth transistor MF20 is connected to a first switching terminal GmP, while the drain of the twenty-first transistor MF21 is connected to a second switching terminal GmN. The first switching terminal GmP is connected to the drain of the seventh transistor MF7, while the second switching terminal GmN is connected to the drain of the eighth transistor MF8.

The class AB bias circuit 178 is provided between the cascode current mirror circuit 176 and the bias circuit 177. More specifically, the class AB bias circuit 178 is provided between the drain of the sixteenth transistor MF16 of the bias circuit 177 and the drain of the twelfth transistor MF12 of the cascode current mirror circuit 176. The class AB bias circuit 178 is an output buffer circuit that includes a plurality of transistors, and extracts a large drive current during operation from a small bias current during biasing. The class AB bias circuit 178 is connected to an output stage (not shown) of the operational amplifier 1S.

The first back gate bias circuit 20A is connected to the common back gate of the fourth transistor MF4 and the fifth transistor MF5 of the first differential pair 171, and to the second power supply line 3. The first back gate bias circuit 20A of the present embodiment includes transistors whose conductivity types have been changed from the conductivity types of the transistors of the back gate bias circuit 20 of the first embodiment (see FIG. 2). The first back gate bias circuit 20A applies a bias voltage VB, which is closer to the second power supply voltage VSS than the source potentials of the fourth transistor MF4 and the fifth transistor MF5, to the back gates of the fourth transistor MF4 and the fifth transistor MF5. In other words, the first back gate bias circuit 20A applies a bias voltage VB, which is closer to the second power supply voltage VSS than an intermediate voltage between the source potentials of the fourth transistor MF4 and the fifth transistor MF5 and the second power supply voltage VSS, to the back gates of the fourth transistor MF4 and the fifth transistor MF5. That is, the first back gate bias circuit 20A applies, to the back gates of the fourth transistor MF4 and the fifth transistor MF5, the bias voltage VB which increases the back gate-to-source voltage VBS. As a result, the back gate-to-source voltage VBS becomes a voltage close to the back gate-to-source voltage VBSH. The bias voltage VB may be lower than the second power supply voltage VSS. In this case, it is preferable that the bias voltage VB be lower than the second power supply voltage VSS within a range where parasitic diodes of the fourth transistor MF4 and the fifth transistor MF5 are not turned on. It is preferable that the bias voltage VB be a voltage within a predetermined range including the second power supply voltage VSS and excluding a voltage equal to the second power supply voltage VSS. In one example, it is preferable that the bias voltage VB be a voltage within ±20% of the second power supply voltage VSS and excluding a voltage equal to the second power supply voltage VSS. As a result, the back gate-to-source voltage VBS becomes a voltage within the range of ±20% of the back gate-to-source voltage VBSH and excluding the back gate-to-source voltage VBSH.

The second back gate bias circuit 20B is connected to the common back gate of the seventh transistor MF7 and the eighth transistor MF8 of the second differential pair 172, and to the first power supply line 2. The second back gate bias circuit 20B of the present embodiment has the same configuration as the configuration of the back gate bias circuit 20 of the first embodiment (see FIG. 2). The second back gate bias circuit 20B applies a bias voltage VB, which is closer to the first power supply voltage VDD than the source potentials of the seventh transistor MF7 and the eighth transistor MF8, to the back gates of the seventh transistor MF7 and the eighth transistor MF8. In other words, the second back gate bias circuit 20B applies a bias voltage VB, which is closer to the first power supply voltage VDD than an intermediate voltage between the source potentials of the seventh transistor MF7 and the eighth transistor MF8 and the first power supply voltage VDD, to the back gates of the seventh transistor MF7 and the eighth transistor MF8. That is, the second back gate bias circuit 20B applies, to the back gates of the seventh transistor MF7 and the eighth transistor MF8, the bias voltage VB which increases the back gate-to-source voltage VBS. As a result, the back gate-to-source voltage VBS becomes a voltage close to the back gate-to-source voltage VBSH. The bias voltage VB may be higher than the first power supply voltage VDD. In this case, it is preferable that the bias voltage VB be higher than the first power supply voltage VDD within a range where parasitic diodes of the seventh transistor MF7 and the eighth transistor MF8 are not turned on. An example of the voltage at which the parasitic diodes of the seventh transistor MF7 and the eighth transistor MF8 are turned on is a voltage 0.5 V to 0.6 V higher than the first power supply voltage VDD (VDD+0.5 to 0.6). It is preferable that the back gate-to-source voltage VBS be a voltage within a predetermined range including the first power supply voltage VDD and excluding a voltage equal to the first power supply voltage VDD. More specifically, it is more preferable that the bias voltage VB be a voltage within ±20% of the first power supply voltage VDD and excluding a voltage equal to the first power supply voltage VDD. As a result, the back gate-to-source voltage VBS becomes a voltage within the range of ±20% of the back gate-to-source voltage VBSH and excluding the back gate-to-source voltage VBSH.

Furthermore, according to the present embodiment, the impurity concentration in a channel region of some transistors of the transistors of the operational amplifier 1S is made lower than then impurity concentration in a channel region of the other transistors to further reduce 1/f noise of the output signal Sout of the operational amplifier 1S. That is, the plurality of transistors of the operational amplifier 1S include high concentration transistors whose impurity concentration in the channel region is a first concentration, and low concentration transistors whose impurity concentration in the channel region is a second concentration lower than the first concentration. More specifically, the impurity concentration in the channel region of each of the transistors easily affected by the 1/f noise of the output signal Sout is made lower than the impurity concentration in the channel region of each of transistors not easily affected by the 1/f noise of the output signal Sout in the transistors of the operational amplifier 1S. That is, rather than high concentration transistors, low concentration transistors are used as transistors more easily affected by 1/f noise of the output signal Sout among the plurality of transistors. On the other hand, rather than low concentration transistors, high concentration transistors are used as transistors not easily affected by 1/f noise of the output signal Sout among the plurality of transistors. More specifically, in the operational amplifier 1S, a section easily affected by 1/f noise of the output signal Sout includes the first differential pair 171, the second differential pair 172, the current switching unit 175, a part of the cascode current mirror circuit 176, and a part of the bias circuit 177. On the other hand, in the operational amplifier 1S, a section not easily affected by 1/f noise of the output signal Sout includes the constant current generator 170A, the first constant current source 173, the second constant current source 174, the class AB bias circuit 178, and the back gate bias circuits 20A and 20B.

In the present embodiment, the impurity concentration in the channel region configuring the first differential pair 171, the second differential pair 172, the current switching unit 175, a part of the cascode current mirror circuit 176, and a part of the bias circuit 177 is made lower than the impurity concentration in the channel region of each of the transistors configuring the constant current generator 170A, the first constant current source 173, the second constant current source 174, the class AB bias circuit 178, and the back gate bias circuits 20A and 20B. That is, the transistors of the first differential pair 171, the second differential pair 172, the current switching unit 175, a part of the cascode current mirror circuit 176, and a part of the bias circuit 177 are low concentration transistors, while the transistors of the current generator 170A, the first constant current source 173, the second constant current source 174, the class AB bias circuit 178, and the back gate bias circuits 20A and 20B are high concentration transistors. More specifically, the impurity concentration in the channel region of each of the fourth transistor MF4, the fifth transistor MF5, the seventh transistor MF7, the eighth transistor MF8, the tenth transistor MF10, the eleventh transistor MF11, the fourteenth transistor MF14, the fifteenth transistor MF15, and the eighteenth transistor MF18 to the twenty-first transistor MF21 is made lower than the impurity concentration in the channel region of each of the first transistor MF1 to the third transistor MF3, the sixth transistor MF6, the ninth transistor MF9, the twelfth transistor MF12, the thirteenth transistor MF13, the sixteenth transistor MF16, the seventeenth transistor MF17, and the transistors of the back gate bias circuits 20A and 20B. That is, the fourth transistor MF4, the fifth transistor MF5, the seventh transistor MF7, the eighth transistor MF8, the tenth transistor MF10, the eleventh transistor MF11, the fourteenth transistor MF14, the fifteenth transistor MF15, and the eighteenth transistor MF18 to the twenty-first MF21 are low concentration transistors. On the other hand, the first transistor MF1 to the third transistor MF3, the sixth transistor MF6, the ninth transistor MF9, the twelfth transistor MF12, the thirteenth transistor MF13, the sixteenth transistor MF16, the seventeenth transistor MF17, and the transistors of the back gate bias circuits 20A and 20B are high concentration transistors.

The impurity concentration in the channel region of each of the transistors MF4, MF5, MF7, MF8, MF10, MF11, MF14, MF15, MF18 to MF21 is preferably about ½ or lower of the impurity concentration in the channel region of each of the transistors MF1 to MF3, MF6, MF9, MF12, MF13, MF16, and MF17, and the transistors of the back gate bias circuits 20A and 20B. In the present embodiment, the impurity concentration in the channel region of each of the transistors MF4, MF5, MF7, MF8, MF10, MF11, MF14, MF15, and MF18 to MF21 is about ¹⁄₁₀ of the impurity concentration in the channel region of each of the transistors MF1 to MF3, MF6, MF9, MF12, MF13, MF16, and MF17, and the transistors of the back gate bias circuits 20A and 20B. The plurality of transistors of the back gate bias circuits 20A and 20B are surface channel type MOSFETs.

The structure and manufacturing method of the N-channel MOSFET and the P-channel MOSFET of the transistor MF1 to MF21 are similar to the structure and manufacturing method of the N-channel MOSFET and the P-channel MOSFET of the first transistor M1 and the like of the first embodiment.

According to the present embodiment, following effects are achievable.

(21-1) The first back gate bias circuit 20A applies a bias voltage VB, which is closer to the second power supply voltage VSS than the source potentials of the fourth transistor MF4 and the fifth transistor MF5, to the back gates of the fourth transistor MF4 and the fifth transistor MF5 of the first differential pair 171 (contact areas for applying bias voltage VB from first back gate bias circuit 20A to N-type well layers 39 of the fourth transistor MF4 and the fifth transistor MF5). In this case, the back gate-to-source voltage VBS of each of the fourth transistor MF4 and the fifth transistor MF5 increases. According to this configuration, the transconductance gm of each of the fourth transistor MF4 and the fifth transistor MF5 increases. Accordingly, reduction of noise of the output signal Sout of the operational amplifier 1S is achievable.

The second back gate bias circuit 20B applies a bias voltage VB, which is closer to the first power supply voltage VDD than the source potentials of the seventh transistor MF7 and the eighth transistor MF8, to the back gates of the seventh transistor MF7 and the eighth transistor MF8 of the second differential pair 172 (contact areas for applying bias voltage VB from second back gate bias circuit 20B to N-type well layers 39 of the seventh transistor MF7 and the eighth transistor MF8). According to this configuration, the transconductance gm of each of the seventh transistor MF7 and the eighth transistor MF8 increases. Accordingly, reduction of noise of the output signal Sout of the operational amplifier 1S is achievable.

(21-2) The first back gate bias circuit 20A can further reduce noise of the output signal Sout of the operational amplifier 1S by designating the bias voltage VB higher than the second power supply voltage VSS, and thereby further increasing the transconductance gm of the fourth transistor MF4 and the fifth transistor MF5.

In addition, the second back gate bias circuit 20B can further reduce noise of the output signal Sout of the operational amplifier 1S by making the bias voltage VB higher than the first power supply voltage VDD, and thereby further increasing the transconductance gm of the seventh transistor MF7 and the eighth transistor MF8.

(21-3) The seventh transistor MF7 and the eighth transistor MF8 can be operated in a stable manner by setting the bias voltage VB to a voltage lower than such a voltage at which parasitic diodes of the seventh transistor MF7 and the eighth transistor MF8 are turned on.

(21-4) Increase in the transconductance gm of each of the seventh transistor MF7 and the eighth transistor MF8, and stable operation of the seventh transistor MF7 and the eighth transistor MF8 can be achieved by setting the bias voltage VB to a voltage within a predetermined range including the first power supply voltage VDD and excluding a voltage equal to the first power supply voltage VDD, and thereby increasing the back gate-to-source voltage VBS. In particular, the back gate-to-source voltage VBS is made closer to the back gate-to-source voltage VBSH by setting the bias voltage VB to a voltage within ±20% of the first power supply voltage VDD and excluding a voltage equal to the first power supply voltage VDD. Accordingly, the transconductance gm of each of the seventh transistor MF7 and the eighth transistor MF8 increases, and the seventh transistor MF7 and the eighth transistor MF8 can be operated in a more stable manner.

(21-5) The impurity concentration in the channel region of each of the fourth transistor MF4 and the fifth transistor MF5 configuring the first differential pair 171 is lower than the impurity concentration in the channel region of each of the sixth transistor MF6 configuring the first constant current source 173 and the transistor of the first back gate bias circuit 20A. The impurity concentration in the channel region of each of the seventh transistor MF7 and the eighth transistor MF8 configuring the second differential pair 172 is lower than the impurity concentration in the channel region of each of the ninth transistor MF9 configuring the second constant current source 174 and the transistor of the second back gate bias circuit 20B. According to this configuration, fluctuations of mobility and fluctuations of the drain current can be reduced by lowering the impurity concentration in the channel region of each of the transistors MF4, MF5, MF7, and MF8 configuring the differential pairs 171 and 172 and easily affected by 1/f noise of the output signal Sout from the operational amplifier 1S. Therefore, 1/f noise of the output signal Sout of the operational amplifier 1S can effectively decrease.

(21-6) The impurity concentration in the channel region of each of the tenth transistor MF10 and the eleventh transistor MF11 configuring the current source of the cascode current mirror circuit 176 is lower than the impurity concentration in the channel region of each of the sixth transistor MF6 configuring the first constant current source 173 and the transistor of the back gate bias circuit 20A. According to this configuration, fluctuations of mobility and fluctuations of the drain current can be reduced by lowering the impurity concentration in the channel regions of each of the transistors MF10 and MF11 configuring the current source of the cascode current mirror circuit 176 and easily affected by 1/f noise of the output signal Sout from the operational amplifier 1S. Therefore, 1/f noise of the output signal Sout of the operational amplifier 1S can effectively decrease.

(21-7) The impurity concentration in the channel region of each of the fourteenth transistor MF14 and the fifteenth transistor MF15 configuring the current source of the bias circuit 177 is lower than the impurity concentration in the channel region of each of the ninth transistor MF9 configuring the second constant current source 174 and the transistor of the second back gate bias circuit 20B. According to this configuration, fluctuations of mobility and fluctuations of the drain current can be reduced by lowering the impurity concentration in the channel region of each of the transistors MF14 and MF15 configuring the current source of the bias circuit 177 and easily affected by 1/f noise of the output signal Sout from the operational amplifier 1S. Therefore, 1/f noise of the output signal Sout of the operational amplifier 1S can effectively decrease.

(21-8) The impurity concentration in the channel region of each of the eighteenth transistor MF18 and the nineteenth transistor MF19 configuring the first switching section 175A of the current switching unit 175 is lower than the impurity concentration in the channel region of each of the sixth transistor MF6 configuring the first constant current source 173 and the transistor of the first back gate bias circuit 20A. The impurity concentration in the channel region of each of the twentieth transistor MF20 and the twenty-first transistor MF21 configuring the second switching section 175B is lower than the impurity concentration in the channel region of each of the ninth transistor MF9 configuring the second constant current source 174 and the transistor of the second back gate bias circuit 20B. According to this configuration, fluctuations of mobility and fluctuations of the drain current can be reduced by lowering the impurity concentration in the channel region of each of the transistors MF18 to MF21 configuring the current switching unit 175 and easily affected by 1/f noise of the output signal Sout of the operational amplifier 1S. Therefore, 1/f noise of the output signal Sout of the operational amplifier 1S can effectively decrease.

(21-9) The impurity concentration in the channel region of each of the transistors MF10 and MF11 configuring the current source of the cascode current mirror circuit 176, the impurity concentration in the channel region of each of the transistors MF1 and MF2 configuring the first differential pair 171, and the impurity concentration in the channel region of each of the transistors MF18 and MF19 configuring the first switching section 175A are equal to each other. According to this configuration, the step of forming the P-type well layer 62 of each of the transistors MF1 and MF2, the step of forming the P-type well layer 62 of each of the transistors MF10 and MF11, and the step of forming the P-type well layer 62 of each of the transistors MF18 and MF19 can be collectively performed. Therefore, the step of manufacturing the operational amplifier 1S can be simplified.

(21-10) The impurity concentration in the channel region of each of the transistors MF14 and MF15 configuring the current source of the bias circuit 177, the impurity concentration in the channel region of each of the transistors MF7 and MF8 configuring the second differential pair 172, and the impurity concentration in the channel region of each of the transistors MF20 and MF21 configuring the second switching section 175B are equal to each other. According to this configuration, the step of forming the N-type well layer 70 of each of the transistors MF14 and MF15, the step of forming the N-type well layer 70 of each of the transistors MF7 and MF8, and the step of forming the N-type well layer 70 of each of the transistors MF20 and MF21 can be collectively performed. Therefore, the step of manufacturing the operational amplifier 1S can be simplified.

Modifications of Twenty-First Embodiment

The operational amplifier 1S of the present embodiment can be modified in following manners. Following modified examples can be combined with each other as long as technical contradiction does not occur.

Either the first back gate bias circuit 20A or the second back gate bias circuit 20B may be eliminated.

In the operational amplifier 1S, a step-up circuit 103 (see FIG. 18) of the operational amplifier 1B in FIG. 18, which is a modification of the fifth embodiment, may be added between the first power supply line 2 and the first differential pair 171, more specifically between the first power supply line 2 and the first constant current source 173. According to this configuration, effects similar to the effects of the operational amplifier 1B in FIG. 18 can be obtained. Moreover, in the operational amplifier 1S, the step-down circuit 100 of the fifth embodiment (see FIG. 17A) may be added between the first power supply line 2 and the second differential pair 172, more specifically between the first power supply line 2 and the second constant current source 174. According to this configuration, effects similar to those of the fifth embodiment can be obtained.

The first back gate bias circuit 20A may also be connected to the fourth power supply line 5 as in the back gate bias circuit 20 of the operational amplifier 1C shown in FIG. 20 as the modification of the sixth embodiment. According to this configuration, effects similar to the operational amplifier 1C in FIG. 20 can be obtained. In addition, the second back gate bias circuit 20B may also be connected to the third power supply line 4 as in the back gate bias circuit 20 of the sixth embodiment shown in FIG. 19. According to this configuration, effects similar to the effects of the sixth embodiment can be obtained.

The specific circuit configuration of the current switching unit 175 is not limited to the circuit configuration of the present embodiment as long as the function of the current switching unit 175 can be implemented.

Instead of lowering the impurity concentration in the channel region of each of the transistors MF4, MF5, MF7, MF8, MF10, MF11, MF14, MF15, and MF18 to MF21, embedded channel type MOSFETs such as the transistors M1 to M4 of the second embodiment may be adopted. In this case, effects similar to the effects of the second embodiment can be obtained. The transistors MF4 and MF5 configuring the first differential pair 171, the transistors MF7 and MF8 configuring the second differential pair 172, the transistors MF10 and MF11 configuring the current source of the cascode current mirror circuit 176, the transistors MF14 and MF15 configuring the current source of the bias circuit 177, the transistors MF18 and MF19 configuring the first switching section 175A, and the transistors MF20 and MF21 configuring the second switching section 175B may be changed to a mixture of the low concentration transistors of the first embodiment and the embedded channel type MOSFETs of the second embodiment.

In addition to lowering the impurity concentration in the channel region of each of the transistors MF4, MF5, MF7, MF8, MF10, MF11, MF14, MF15, and MF18 to MF21, embedded channel type MOSFETs may be adopted. That is, each of the transistors MF4, MF5, MF7, MF8, MF10, MF11, MF14, MF15, and MF18 to MF21 may have a structure similar to the structure of each of the transistors M1 to M4 of the third embodiment. In this case, effects similar to the effects of the third embodiment can be obtained. The transistors MF4 and MF5 configuring the first differential pair 171, the transistors MF7 and MF8 configuring the second differential pair 172, the transistors MF10 and MF11 configuring the current source of the cascode current mirror circuit 176, the transistors MF14 and MF15 configuring the current source of the bias circuit 177, the transistors MF18 and MF19 configuring the first switching section 175A, and the transistors MF20 and MF21 configuring the second switching section 175B may be changed to a mixture of structures similar to the structures of the low concentration transistors of the first embodiment and the transistors M1 to M4 of the third embodiment. Furthermore, the transistors MF4 and MF5 configuring the first differential pair 171, the transistors MF7 and MF8 configuring the second differential pair 172, the transistors MF10 and MF11 configuring the current source of the cascode current mirror circuit 176, the transistors MF14 and MF15 configuring the current source of the bias circuit 177, the transistors MF18 and MF19 configuring the first switching section 175A, and the transistors MF20 and MF21 configuring the second switching section 175B may be changed to a mixture of structures similar to the structures of the low concentration transistors of the first embodiment, the embedded channel type MOSFETS of the second embodiment, and the transistors M1 to M4 of the third embodiment. In short, the operational amplifier 1S may have a configuration which includes a mixture of structures similar to the structures of the low concentration transistors of the first embodiment, the embedded channel type MOSFETs of the second embodiment, and the transistors M1 to M4 of the third embodiment.

Twenty-Second Embodiment

Figure 39:
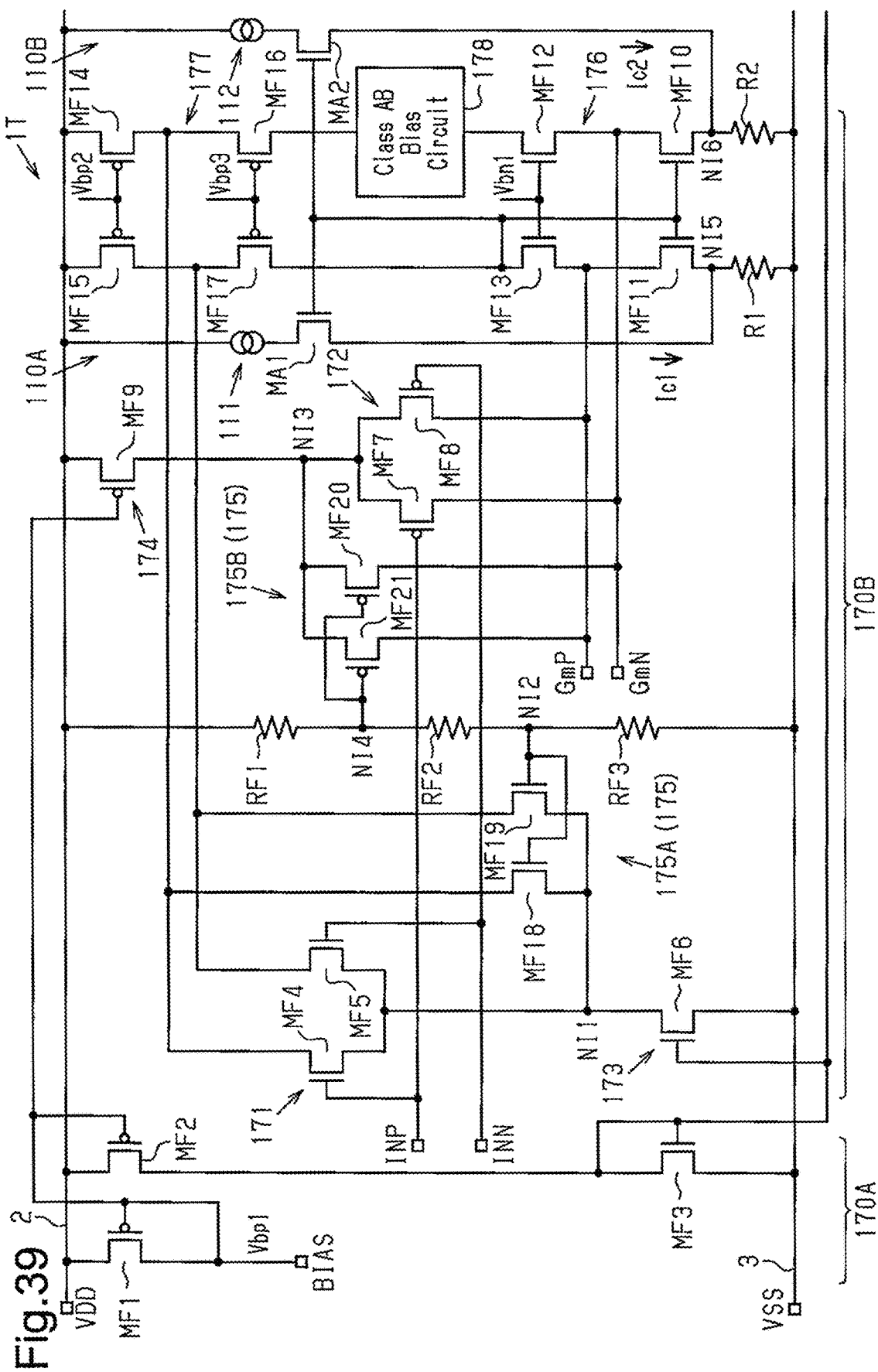
FIG. 39 is a circuit diagram of an operational amplifier according to a twenty-second embodiment.

An operational amplifier 1T according to a twenty-second embodiment will be described with reference to FIG. 39. The operational amplifier 1T of the present embodiment is different from the operational amplifier 1S of the twenty-first embodiment in that the back gate bias circuits 20A and 20B are eliminated, and that the first control unit 110A, the second control unit 110B, the first resistor R1, the second resistor R2, and the third resistor R3 of the eighth embodiment are added.

The first control unit 110A controls a source potential of the eleventh transistor MD11 by controlling a current supplied to the node NI5 between the source of the eleventh transistor MF11 and the first resistor R1. The first control transistor MA1 of the first control unit 110A of the present embodiment is an N-channel MOSFET. The first constant current source 111 includes a transistor (not shown). The transistor of the first constant current source 111 is a P-channel MOSFET. The drain of the transistor of the first constant current source 111 is connected to the drain of the first control transistor MA1, while the source of the transistor is connected to the first power supply line 2. The source of the first control transistor MA1 is connected to a node NI5 between the source of the eleventh transistor MF11 and the first resistor R1, while the gate of the first control transistor MA1 is connected to the gate and the drain of the eleventh transistor MF11. In this configuration, the first control unit 110A supplies, to the node NI5, the first current Ic1 proportional to the constant current It of the constant current source 174.

The second control unit 110B controls a source potential of the tenth transistor MF10 by controlling a current supplied to a node NI6 between the source of the tenth transistor MF10 and the second resistor R2. The second control transistor MA2 of the second control unit 110B of the present embodiment is an N-channel MOSFET. The second constant current source 112 includes a transistor (not shown). The transistor of the second constant current source 112 is a P-channel MOSFET. The drain of the transistor of the second constant current source 112 is connected to the drain of the second control transistor MA2, while the source of the transistor is connected to the first power supply line 2. The source of the second control transistor MA2 is connected to the node NI6 between the source of the tenth transistor MF10 and the second resistor R2, while the gate of the second control transistor MA2 is connected to the gate and the drain of the eleventh transistor MF11. In this configuration, the second control unit 110B supplies, to the node NI6, the second current Ic2 proportional to the constant current It of the constant current source 174.

In this manner, the first current Ic1 is supplied from the first control unit 110A to the source of the eleventh transistor MF11, while the second current Ic2 is supplied from the second control unit 110B to the source of the tenth transistor MF10. As a result, the source potential of the eleventh transistor MF11 and the source potential of the tenth transistor MF10 are raised. In addition, the source potentials of the eleventh transistor MF11 and the tenth transistor MF10 are raised by the first resistor R1 and the second resistor R2. According to the present embodiment described above, the source potentials of the transistors MF10 and MF11 are further raised. Accordingly, the transconductance gm on the circuit decreases.

Furthermore, the structure and manufacturing method of the transistors MF1 to MF21 of the operational amplifier 1T of the present embodiment are similar to the structure and manufacturing method of the transistors MF1 to MF21 of the twenty-first embodiment. Therefore, effects similar to the effects (21-5) to (21-10) of the twenty-first embodiment can be obtained.

Moreover, the first control transistor MA1 and the second control transistor MA2 are not easily affected by 1/f noise of the output signal Sout. Accordingly, the impurity concentration in the channel region of each of the transistors MA1 and MA2 is made higher than the impurity concentration in the channel region of each of the transistor MF4, MF5, MF7, MF8, MF10, MF11, MF14, MF15, and MF18 to MF21. In other words, the impurity concentration in the channel region of each of the transistors MF4, MF5, MF7, MF8, MF10, MF11, MF14, MF15, and MF18 to MF21 is lower than the impurity concentration in the channel region of each of the transistors MA1 and MA2. That is, the transistors MF4, MF5, MF7, MF8, MF10, MF11, MF14, MF15, and MF18 to MF21 are low concentration transistors, while the transistors MA1 and MA2 are high concentration transistors. The impurity concentration in the channel region of each of the transistors MF4, MF5, MF7, MF8, MF10, MF11, MF14, MF15, and MF18 to MF21 is preferably about ½ or lower of the impurity concentration in the channel region of each of the transistors MA1 and MA2. In the present embodiment, the impurity concentration in the channel region of each of the transistors MF4, MF5, MF7, MF8, MF10, MF11, MF14, MF15, and MF18 to MF21 is about 1/10 of the impurity concentration in the channel region of each of the transistors MA1 and MA2. The transistors MA1 and MA2 are surface channel type MOSFETs.

According to the present embodiment, following effects are achievable.

(22-1) The control units 110A and 110B raise the source potentials of the transistors MF10 and MF11 of the active load to decrease currents flowing through the transistors MF10 and MF11. Accordingly, the transconductance gm of each of the transistors MF10 and MF11 on the circuit decreases, wherefore noise of the output signal Sout of the operational amplifier 1T can be reduced.

(22-2) The impurity concentration in the channel region of each of the first transistor MF1 and the second transistor MF2, the impurity concentration in the channel region of the ninth transistor MF9 of the second constant current source 174, the impurity concentration in the channel region of each of the transistors MF16 and MF17 of the bias circuit 177, and the impurity concentration in the channel region of each of the transistor of the constant current source 111 of the first control unit 110A and the transistor of the constant current source 112 of the second control unit 110B are equal to each other. According to this configuration, the step of forming the N-type well layer 63 of each of the transistors MF1 and MF2, the step of forming the N-type well layer 63 of the ninth transistor MF9, the step of forming the N-type well layer 63 of each of the transistors MF16 and MF17, and the step of forming the N-type well layer 63 of each of the transistors of the constant current sources 111 and 112 can be collectively performed. Therefore, the step of manufacturing the operational amplifier 1T can be simplified.

(22-3) The impurity concentration in the channel region of the third transistor MF3, the impurity concentration in the channel region of the sixth transistor MF6 of the first constant current source 173, the impurity concentration in the channel region of each of the transistors MF12 and MF13 of the cascode current mirror circuit 176, and the impurity concentration in the channel region of each of the control transistors MA1 and MA2 are equal to each other. According to this configuration, the step of forming the P-type well layer 41 of the third transistor MF3, the step of forming the P-type well layer 41 of the sixth transistor MF6, the step of forming the P-type well layer 41 of each of the transistors MF12 and MF13, and the step of forming the P-type well layer 41 of each of the transistors MA1 and MA2 can be collectively performed. Therefore, the step of manufacturing the operational amplifier 1T can be simplified.

Modifications of Twenty-Second Embodiment

The operational amplifier 1T of the present embodiment can be modified in following manners. Following modified examples can be combined with each other as long as technical contradiction does not occur.

The first control unit 110A and the second control unit 110B may be eliminated from the operational amplifier 1T. In this case, the source potential of each of the transistors MF11 and MF10 are raised by the first resistor R1 and the second resistor R2.

In the operational amplifier 1T, the resistance value of the first resistor R1 and the resistance value of the second resistor R2 may be changed in accordance with the ratio of the tenth transistor MF10 and the eleventh transistor MF11.

Instead of lowering the impurity concentration in the channel region of each of the transistors MF4, MF5, MF7, MF8, MF10, MF11, MF14, MF15, and MF18 to MF21, embedded channel type MOSFETs such as the transistors M1 to M4 of the second embodiment may be adopted. In this case, effects similar to the effects of the second embodiment can be obtained. The transistors MF4 and MF5 configuring the first differential pair 171, the transistors MF7 and MF8 configuring the second differential pair 172, the transistors MF10 and MF11 configuring the current source of the cascode current mirror circuit 176, the transistors MF14 and MF15 configuring the current source of the bias circuit 177, the transistors MF18 and MF19 configuring the first switching section 175A, and the transistors MF20 and MF21 configuring the second switching section 175B may be changed to a mixture of the low concentration transistors of the first embodiment and the embedded channel type MOSFETs of the second embodiment.

In addition to lowering the impurity concentration in the channel region of each of the transistors MF4, MF5, MF7, MF8, MF10, MF11, MF14, MF15, and MF18 to MF21, embedded channel type MOSFETs may be adopted. That is, each of the transistors MF4, MF5, MF7, MF8, MF10, MF11, MF14, MF15, and MF18 to MF21 may have a structure similar to the structure of each of the transistors M1 to M4 of the third embodiment. In this case, effects similar to the effects of the third embodiment can be obtained. The transistors MF4 and MF5 configuring the first differential pair 171, the transistors MF7 and MF8 configuring the second differential pair 172, the transistors MF10 and MF11 configuring the current source of the cascode current mirror circuit 176, the transistors MF14 and MF15 configuring the current source of the bias circuit 177, the transistors MF18 and MF19 configuring the first switching section 175A, and the transistors MF20 and MF21 configuring the second switching section 175B may be changed to a mixture of structures similar to the structures of the low concentration transistors of the first embodiment and the transistors M1 to M4 of the third embodiment. The transistors MF4 and MF5 configuring the first differential pair 171, the transistors MF7 and MF8 configuring the second differential pair 172, the transistors MF10 and MF11 configuring the current source of the cascode current mirror circuit 176, the transistors MF14 and MF15 configuring the current source of the bias circuit 177, the transistors MF18 and MF19 configuring the first switching section 175A, and the transistors MF20 and MF21 configuring the second switching section 175B may be changed to a mixture of structures similar to the structures of the low concentration transistors of the first embodiment, the embedded channel type MOSFETS of the second embodiment, and the transistors M1 to M4 of the third embodiment. In short, the operational amplifier 1T may have a configuration which includes a mixture of structures similar to the structures of the low concentration transistors of the first embodiments, the embedded channel type MOSFETs of the second embodiment, and the transistors M1 to M4 of the third embodiment.

Twenty-Third Embodiment

Figure 40:
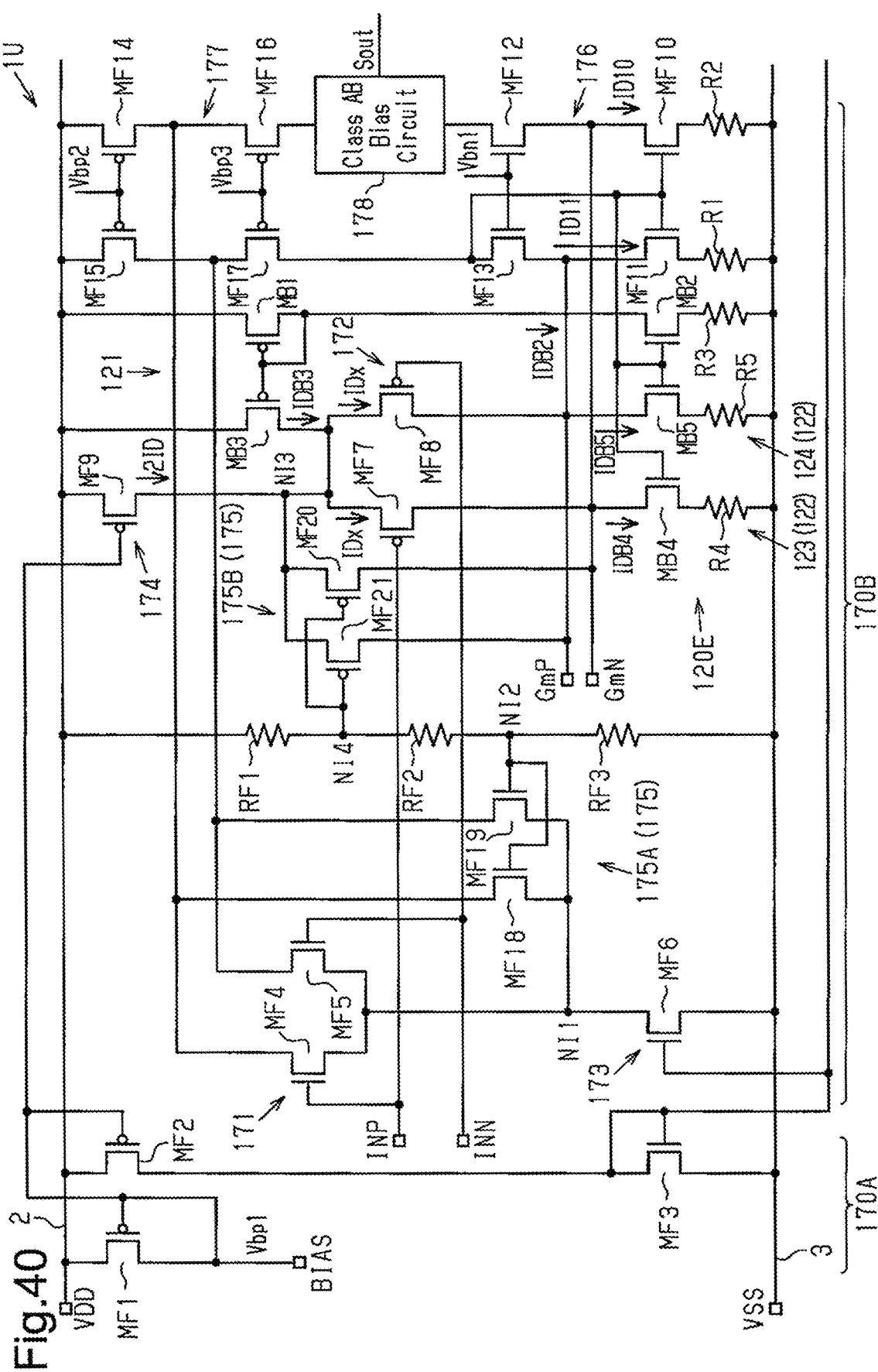
FIG. 40 is a circuit diagram of an operational amplifier according to a twenty-third embodiment.

An operational amplifier 1U according to a twenty-third embodiment will be described with reference to FIG. 40. The operational amplifier 1U of the present embodiment is different from the operational amplifier 1T of the twenty-second embodiment in that the control units 110A and 110B are eliminated, and that a current adjustment unit 120E is added.

The current adjustment unit 120E causes larger currents to flow through the seventh transistor MF7 and the eighth transistor MF8 of the second differential pair 172 than currents flowing through the tenth transistor MF10 and the eleventh transistor MF11 of the active load. More specifically, the current adjustment unit 120 increases currents flowing through the seventh transistor MF7 and the eighth transistor MF8 more than the constant current It of the constant current source 174 to prevent flow of currents toward the tenth transistor MF10 and the eleventh transistor MF11 by an amount of increase in the currents flowing through the transistors MF7 and MF8. The current adjustment unit 120E has the same configuration as the configuration of the current adjustment unit 120B of the fourteenth embodiment, and includes the current supplying unit 121, the branching portion 122, the third resistor R3, the fourth resistor R4, and the fifth resistor R5.

The current supplying unit 121 of the current adjustment unit 120E is a current source provided separately from the constant current source 174, and supplies a current to the seventh transistor MF7 and the eighth transistor MF8. The source of the second supply transistor MB2 is connected to the first terminal of the third resistor R3, while the gate of the second supply transistor MB2 is connected to the gate of the eleventh transistor MF11. The second terminal of the third resistor R3 is connected to the second power supply line 3.

The branching portion 122 causes a current equivalent to the increase of the drain current flowing through the seventh transistor MF7, and a current equivalent to the increase of the drain current flowing through the eighth transistor MF8 to flow toward the second power supply line 3. The branching portion 122 includes a first branching circuit 123 and a second branching circuit 124.

The first branching circuit 123 is connected to the drain of the seventh transistor MF7 and the second power supply line 3, and includes the first branching transistor MB4 and the fourth resistor R4. The first branching transistor MB4 and the fourth resistor R4 configure a series circuit. The drain of the first branching transistor MB4 is connected to the drain of the seventh transistor MF7, while the source of the first branching transistor MB4 is connected to the first terminal of the fourth resistor R4. The second terminal of the fourth resistor R4 is connected to the second power supply line 3. The resistance value of the fourth resistor R4 of the present embodiment is equal to each resistance value of the first resistor R1 and the second resistor R2.

The second branching circuit 124 is connected to the drain of the eighth transistor MF8 and the second power supply line 3, and includes the second branching transistor MB5 and the fifth resistor R5. The second branching transistor MB5 and the fifth resistor R5 configure a series circuit. The drain of the second branching transistor MB5 is connected to the drain of the eighth transistor MF8, while the source of the second branching transistor MB5 is connected to the first terminal of the fifth resistor R5. The second terminal of the fifth resistor R5 is connected to the second power supply line 3. The resistance value of the fifth resistor R5 of the present embodiment is equal to the resistance value of the fourth resistor R4. That is, the resistance value of the fifth resistor R5 is equal to each resistance value of the first resistor R1 and the second resistor R2.

The first branching transistor MB4 of the first branching circuit 123 and the second branching transistor MB5 of the second branching circuit 124 have the same electrical characteristics. In addition, the transistors MB2, MB4, and MB5 have a common gate voltage. In this case, the current amount of the second supply transistor MB2 is twice larger than the current amount of the first branching transistor MB4 (second branching transistor MB5). Accordingly, a sum of currents flowing through the transistors MB4 and MB5 is generated in the second supply transistor MB2.

According to the present embodiment, settings of electric characteristics of the transistors MB4 and MB5, and settings of electric characteristics of the tenth transistor MF10 and the eleventh transistor MF11 are equalized. In addition, the gates of the transistors MB4 and MB5 are connected to the gate of the eleventh transistor MF11, wherefore a current flowing through the first branching transistor MB4 and a current flowing through the second branching transistor MB5 are equalized with a current flowing through the eleventh transistor MF11 (current flowing through tenth transistor MF10).

A current flowing through the operational amplifier 1U, particularly, a current flowing through the current adjustment unit 120E will be described. In the following description, a constant current flowing through the second constant current source 174 is referred to as a constant current 2ID. The magnitudes of the supply current IDB3, the currents IDB2, IDB4, and IDB5, and the currents ID10 and ID11 are similar to the magnitudes of the supply current IDB3, the currents IDB2, IDB4 and IDB5, and the current ID3 and ID4 of the fourteenth embodiment (ninth embodiment), and therefore are not repeatedly described herein.

As described in the ninth embodiment, the supply current IDB3, which has the same current amount as the current IDB2 which is a sum of the currents IDB4 and IDB5 flowing through the transistors MB4 and MB5, is supplied to the differential pair 10. In this case, the current supplied to the differential pair 10 is the sum of the supply current IDB3 and the constant current 2ID, wherefore the transconductance gm of each of the transistors MF7 and MF8 increases. Meanwhile, the currents IDB4 and IDB5 are extracted from the current IDx flowing through each of the transistors MF7 and MF8 by the transistors MB4 and MB5. Accordingly, an increase in transconductance gm of each of the transistors MF10 and MF11 is suppressed. Therefore, reduction of noise of the output signal Sout of the operational amplifier 1U is achievable.

In addition, the source potentials of the tenth transistor MF10 and the eleventh transistor MF11 are raised by the first resistor R1 and the second resistor R2. According to the present embodiment described above, the source potentials of the transistors MF10 and MF11 are further raised. Accordingly, transconductance gm on the circuit of the active load decreases. Therefore, reduction of noise of the output signal Sout of the operational amplifier 1U is further achievable.

The structure and manufacturing method of the transistors MF1 to MF21 of the operational amplifier 1U of the present embodiment are similar to the structure and manufacturing method of the transistors MF1 to MF21 of the twenty-first embodiment. Therefore, effects similar to the effects (21-5) to (21-10) of the twenty-first embodiment can be obtained.

Moreover, the transistors MB1 to MB5 of the current adjustment unit 120E are not easily affected by 1/f noise of the output signal Sout. Accordingly, the impurity concentration in the channel region of each of the transistors MA1 and MA2 is made higher than the impurity concentration in the channel region of each of the transistor MF4, MF5, MF7, MF8, MF10, MF11, MF14, MF15, and MF18 to MF21. In other words, the impurity concentration in the channel region of each of the transistors MF4, MF5, MF7, MF8, MF10, MF11, MF14, MF15, and MF18 to MF21 is lower than the impurity concentration in the channel region of each of the transistors MB1 to MB5. That is, the transistors MF4, MF5, MF7, MF8, MF10, MF11, MF14, MF15, and MF18 to MF21 are low concentration transistors, while the transistors MB1 to MB5 are high concentration transistors. The impurity concentration in the channel region of each of the transistors MF4, MF5, MF7, MF8, MF10, MF11, MF14, MF15, and MF18 to MF21 is preferably about ½ or lower of the impurity concentration in the channel region of each of the transistors MB1 to MB5. In the present embodiment, the impurity concentration in the channel region of each of the transistors MF4, MF5, MF7, MF8, MF10, MF11, MF14, MF15, and MF18 to MF21 is about 1/10 of the impurity concentration in the channel region of each of the transistors MB1 to MB5. The transistors MB1 to MB5 are surface channel type MOSFETs.

According to the present embodiment, following effects are achievable.

(23-1) The current adjustment unit 120E increases the current supplied to the second differential pair 172, but does not increase the current supplied to the active load. Accordingly, transconductance of each of the transistors MF7 and MF8 of the second differential pair 172 increases, suppressing increase in the transconductance of each of the transistors MF10 and MF11 of the active load. Therefore, reduction of noise of the output signal Sout of the operational amplifier 1U is achievable.

(23-2) The source potentials of the transistors MF10 and MF11 of the active load can be raised by the first resistor R1 and the second resistor R2 connected to the active load. In this case, currents flowing through the transistors MF10 and MF11 decrease. Accordingly, the transconductance gm of each of the transistors MF10 and MF11 on the circuit decreases, wherefore noise of the output signal Sout of the operational amplifier 1U can be reduced.

(23-3) The impurity concentration in the channel region of each of the first transistor MF1 and the second transistor MF2, the impurity concentration in the channel region of the ninth transistor MF9 of the second constant current source 174, the impurity concentration in the channel region of each of the transistors MF16 and MF17 of the bias circuit 177, and the impurity concentration in the channel region of each of the transistors MB1 and MB3 of the current adjustment unit 120E are equal to each other. According to this configuration, the step of forming the N-type well layer 63 of each of the transistors MF1 and MF2, the step of forming the N-type well layer 63 of the ninth transistor MF9, the step of forming the N-type well layer 63 of each of the transistors MF16 and MF17, and the step of forming the N-type well layer 63 of each of the transistors MB1 and MB3 can be collectively performed. Therefore, the step of manufacturing the operational amplifier 1U can be simplified.

(23-4) The impurity concentration in the channel region of the third transistor MF3, the impurity concentration in the channel region of the sixth transistor MF6 of the first constant current source 173, the impurity concentration in the channel of each of the transistors MF12 and MF13 of the cascode current mirror circuit 176, and the impurity concentration in the channel region of each of the transistors MB2, MB4, and MB5 of the current adjustment unit 120E are equal to each other. According to this configuration, the step of forming the P-type well layer 41 of the third transistor MF3, the step of forming the P-type well layer 41 of the sixth transistor MF6, the step of forming the P-type well layer 41 of each of the transistors MF12 and MF13, and the step of forming the P-type well layer 41 of each of the transistors MB2, MB4, and MB5 can be collectively performed. Therefore, the step of manufacturing the operational amplifier 1U can be simplified.

Modifications of Twenty-Third Embodiment

The operational amplifier 1U of the present embodiment can be modified in following manners. Following modified examples can be combined with each other as long as technical contradiction does not occur.

In the operational amplifier 1U, the resistance value of the first resistor R1, the resistance value of the second resistor R2, the resistance value of the third resistor R3, the resistance value of the fourth resistor R4, and the resistance value of the fifth resistor R5 may be changed in accordance with the ratio of the eleventh transistor MF11, the tenth transistor MF10, the second supply transistor MB2, the first branching transistor MB4, and the second branching transistor MB5.

The fourth resistor R4 and the fifth resistor R5 may be eliminated from the operational amplifier 1U. The source of the first branching transistor MB4 may be connected between the source of the eleventh transistor MF11 and the first resistor R1. The source of the second branching transistor MB5 may be connected between the source of the tenth transistor MF10 and the second resistor R2.

The first resistor R1, the second resistor R2, the third resistor R3, the fourth resistor R4, and the fifth resistor R5 may be eliminated from the operational amplifier 1U. The source of the first branching transistor MB4 of the first branching circuit 123 and the source of the second branching transistor MB5 of the second branching circuit 124 may be connected to the second power supply line 3. In this case, the adjustment current source 125 may be added to the operational amplifier 1U similarly to the operational amplifier 1H of the eleventh embodiment. The connection configuration between the transistor MB6 of the adjustment current source 125 and each of the transistors MB2, MB4, and MB5 is similar to the connection configuration of the eleventh embodiment.

Instead of lowering the impurity concentration in the channel region of each of the transistors MF4, MF5, MF7, MF8, MF10, MF11, MF14, MF15, and MF18 to MF21, embedded channel type MOSFETs such as the transistors M1 to M4 of the second embodiment may be adopted. In this case, effects similar to the effects of the second embodiment can be obtained. The transistors MF4 and MF5 configuring the first differential pair 171, the transistors MF7 and MF8 configuring the second differential pair 172, the transistors MF10 and MF11 configuring the current source of the cascode current mirror circuit 176, the transistors MF14 and MF15 configuring the current source of the bias circuit 177, the transistors MF18 and MF19 configuring the first switching section 175A, and the transistors MF20 and MF21 configuring the second switching section 175B may be changed to a mixture of the low concentration transistors of the first embodiment and the embedded channel type MOSFETs of the second embodiment.

In addition to lowering the impurity concentration in the channel region of each of the transistors MF4, MF5, MF7, MF8, MF10, MF11, MF14, MF15, and MF18 to MF21, embedded channel type MOSFETs may be adopted. That is, each of the transistors MF4, MF5, MF7, MF8, MF10, MF11, MF14, MF15, and MF18 to MF21 may have a structure similar to the structure of each of the transistors M1 to M4 of the third embodiment. In this case, effects similar to the effects of the third embodiment can be obtained. The transistors MF4 and MF5 configuring the first differential pair 171, the transistors MF7 and MF8 configuring the second differential pair 172, the transistors MF10 and MF11 configuring the current source of the cascode current mirror circuit 176, the transistors MF14 and MF15 configuring the current source of the bias circuit 177, the transistors MF18 and MF19 configuring the first switching section 175A, and the transistors MF20 and MF21 configuring the second switching section 175B may be changed to a mixture of structures similar to the structures of the low concentration transistors of the first embodiment and the transistors M1 to M4 of the third embodiment. Furthermore, the transistors MF4 and MF5 configuring the first differential pair 171, the transistors MF7 and MF8 configuring the second differential pair 172, the transistors MF10 and MF11 configuring the current source of the cascode current mirror circuit 176, the transistors MF14 and MF15 configuring the current source of the bias circuit 177, the transistors MF18 and MF19 configuring the first switching section 175A, and the transistors MF20 and MF21 configuring the second switching section 175B may be changed to a mixture of structures similar to the structures of the low concentration transistors of the first embodiment, the embedded channel type MOSFETS of the second embodiment, and the transistors M1 to M4 of the third embodiment. In short, the operational amplifier 1U may have a configuration which includes a mixture of structures similar to the structures of the low concentration transistors of the first embodiment, the embedded channel type MOSFETs of the second embodiment, and the transistors M1 to M4 of the third embodiment.

Twenty-Fourth Embodiment

Figure 41:
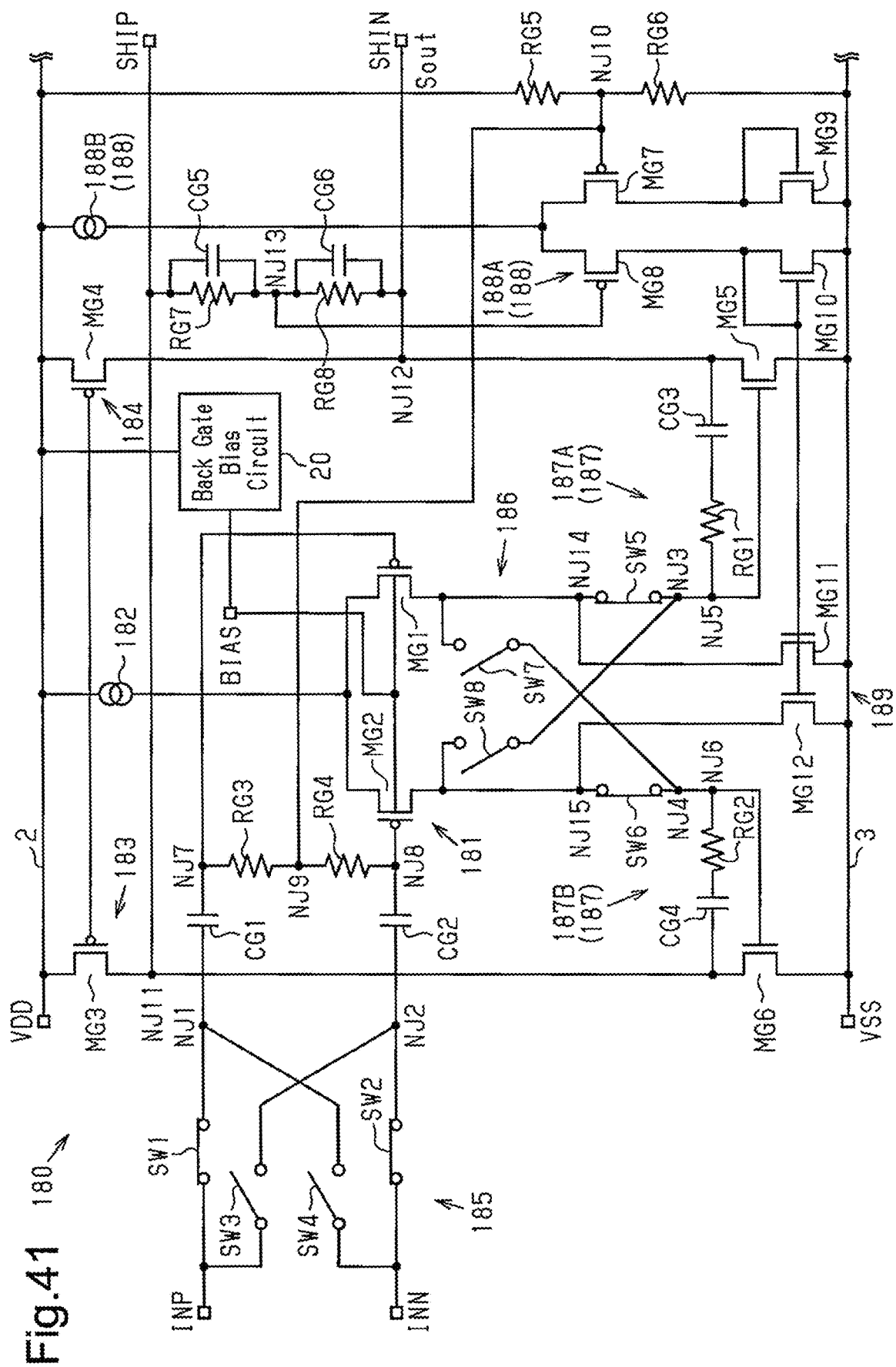
FIG. 41 is a circuit diagram of an integration circuit as an example of a differential circuit of a twenty-fourth embodiment.

An integration circuit 180 which is an example of a differential circuit of a twenty-fourth embodiment will be described with reference to FIG. 41. The integration circuit 180 of the present embodiment integrates differential input currents input to the noninverting input terminal INP and the inverting input terminal INN, samples and holds the differential input currents in a predetermined cycle, and generates a differential voltage signal.

The integration circuit 180 includes a differential pair 181, a constant current source 182, constant current sources 183 and 184, a first selector 185, a second selector 186, an integrator 187, a sample and hold circuit (not shown), a common feedback circuit 188, a current mirror circuit 189, and the back gate bias circuit 20.

The differential pair 181 includes a first transistor MG1 and a second transistor MG2. In the present embodiment, the first transistor MG1 and the second transistor MG2 are configured by P-channel MOSFETs. Each of the first transistor MG1 and the second transistor MG2 may have either a depletion-type structure or an enhancement type structure. In the present embodiment, each of the first transistor MG1 and the second transistor MG2 has an enhancement type structure. The source of the first transistor MG1 and the source of the second transistor MG2 are connected in common.

The constant current source 182 includes a transistor (not shown) connected to the differential pair 181. The transistor of the present embodiment is a P-channel MOSFET. The drain of the transistor is connected to the sources of the transistors MG1 and MG2, and the source of the transistor is connected to the first power supply line 2. A bias voltage from a first bias circuit (not shown) is input to the gate of the transistor. The constant current source 182 supplies the constant current It based on the bias voltage.

The constant current source 183 includes a third transistor MG3, while the constant current source 184 includes a fourth transistor MG4. The third transistor MG3 and the fourth transistor MG4 of the present embodiment are enhancement type P-channel MOSFETs. The source of the third transistor MG3 and the source of the fourth transistor MG4 are connected to the first power supply line 2, while the gate of the third transistor MG3 and the gate of the fourth transistor MG4 are connected in common. For example, a bias voltage from the first bias circuit may be input to the gates of the third transistor MG3 and the fourth transistor MG4.

The first selector 185 is provided at a stage prior to the differential pair 181. The first selector 185 switches between a first state where the gate of the first transistor MG1 of the differential pair 181 and the noninverting input terminal INP are connected, and that the gate of the second transistor MG2 and the inverting input terminal INN are connected, and a second state where the gate of the first transistor MG1 and the inverting input terminal INN are connected, and that the gate of the second transistor MG2 and the noninverting input terminal INP are connected. FIG. 41 shows the first state. The first selector 185 includes a first switch SW1 to a fourth switch SW4, a first capacitor CG1, and a second capacitor CG2. The first capacitor CG1 and the second capacitor CG2 are capacitors for a DC block. The first capacitor CG1 is provided between the first switch SW1 and the first transistor MG1, while the second capacitor CG2 is provided between the second switch SW2 and the second transistor MG2. Each of the switches SW1 to SW4 may be a complementary metal oxide semiconductor (CMOS) switch (CMOS transfer gate). The first terminal of the first switch SW1 and the first terminal of the third switch SW3 are connected to the noninverting input terminal INP, while the first terminal of the second switch SW2 and the first terminal of the fourth switch SW4 are connected to the inverting input terminal INN. The second terminal of the first switch SW1 is connected to a node NJ1 between the first switch SW1 and the first capacitor CG1. The second terminal of the second switch SW2 is connected to a node NJ2 between the second switch SW2 and the second capacitor CG2. The second terminal of the third switch SW3 is connected to the node NJ2, while the second terminal of the fourth switch SW4 is connected to the node NJ1. The first selector 185 enters the first state at the time when the first switch SW1 and the second switch SW2 are turned on and when the third switch SW3 and the fourth switch SW4 are turned off. The first selector 185 enters the second state at the time when the first switch SW1 and the second switch SW2 are turned off and when the third switch SW 3 and the fourth switch SW4 are turned on.

The second selector 186 is provided at a stage after the differential pair 181. The second selector 186 switches between a first state where the drain of the first transistor MG1 is connected to a first circuit 187A of the integrator 187, and the drain of the second transistor MG2 is connected to a second circuit 187B of the integrator 187, and a second state where the drain of the first transistor MG1 is connected to the second circuit 187B, and the drain of the second transistor MG2 is connected to the first circuit 187A. The second selector 186 includes a fifth switch SW5 to an eighth switch SW8. Each of the switches SW5 to SW8 may be a CMOS switch (CMOS transfer gate). The first terminal of the fifth switch SW5 and the first terminal of the seventh switch SW7 are connected to the drain of the first transistor MG1, while the first terminal of the sixth switch SW6 and the first terminal of the eighth switch SW are connected to the drain of the second transistor MG2. The second terminal of the fifth switch SW5 is connected to a node NJ3 between the first transistor MG1 and the first circuit 187A. The second terminal of the sixth switch SW6 is connected to a node NJ4 between the second transistor MG2 and the second circuit 187B. The second terminal of the seventh switch SW7 is connected to the node NJ4, while the second terminal of the eighth switch SW8 is connected to the node NJ3. The second selector 186 enters the first state at the time when the fifth switch SW5 and the sixth switch SW6 are turned on and when the seventh switch SW7 and the eighth switch SW8 are turned off. The second selector 186 enters the second state at the time when the fifth switch SW5 and the sixth switch SW6 are turned off and when the seventh switch SW7 and the eighth switch SW8 are turned on.

The integrator 187 includes the first circuit 187A and the second circuit 187B. The integrator 187 integrates first differential input currents flowing from the differential pair 181 to the first circuit 187A to generate a first differential voltage signal. The integrator 187 integrates second differential input currents flowing from the differential pair 181 to the second circuit 187B to generate a second differential voltage signal.

The first circuit 187A includes a fifth transistor MG5, a resistor RG1, and a capacitor CG3. The fifth transistor MG5 of the present embodiment is an enhancement type N-channel MOSFET. The drain of the fifth transistor MG5 is connected to the drain of the fourth transistor MG4, the source of the fifth transistor MG5 is connected to the second power supply line 3, and the gate of the fifth transistor MG5 is connected to the node NJ3. The resistor RG1 and the capacitor CG3 are connected in series to configure an RC circuit. The first terminal of the resistor RG1 is connected to a node NJ5 between the node NJ3 and the gate of the fifth transistor MG5. The second terminal of the resistor RG1 is connected to the first terminal of the capacitor CG3. The second terminal of the capacitor CG3 is connected to the drain of the fifth transistor MG5.

The second circuit 187B includes a sixth transistor MG6, a resistor RG2, and a capacitor CG4. The sixth transistor MG6 of the present embodiment is an enhancement type N-channel MOSFET. The drain of the sixth transistor MG6 is connected to the drain of the third transistor MG3, the source of the sixth transistor MG6 is connected to the second power supply line 3, and the gate of the sixth transistor MG6 is connected to the node NJ4. The resistor RG2 and the capacitor CG4 are connected in series to configure an RC circuit. The first terminal of the resistor RG2 is connected to a node NJ6 between the node NJ4 and the gate of the sixth transistor MG6. The second terminal of the resistor RG2 is connected to the first terminal of the capacitor CG4. The second terminal of the capacitor CG4 is connected to the drain of the sixth transistor MG6.

The common feedback circuit 188 adjusts a biased state of the differential pair 181 to such a state that a midpoint voltage between a first differential output voltage and a second differential output voltage of the integrator 187 becomes closer to a target voltage. The common feedback circuit 188 includes a differential pair 188A, a constant current source 188B, six resistors RG3 to RG8, and two capacitors CG5 and CG6.

The differential pair 188A includes a seventh transistor MG7 and an eighth transistor MG8. The seventh transistor MG7 and the eighth transistor MG8 of the present embodiment are P-channel MOSFETs. The source of the seventh transistor MG7 and the source of the eighth transistor MG8 are connected in common. The common feedback circuit 188 further includes a ninth transistor MG9 and a tenth transistor MG10. The ninth transistor MG9 and the tenth transistor MG10 are enhancement type N-channel MOSFETs. The drain of the ninth transistor MG9 is connected to the drain of the seventh transistor MG7, while the drain of the tenth transistor MG10 is connected to the drain of the eighth transistor MG8. The source of the ninth transistor MG9 and the source of the tenth transistor MG10 are connected to the second power supply line 3. The gate of the ninth transistor MG9 is connected to the drain of the ninth transistor MG9. The gate of the tenth transistor MG10 is connected to the drain of the tenth transistor MG10.

The constant current source 188B includes a transistor connected to the differential pair 188A. The transistor of the present embodiment is a P-channel MOSFET. The drain of the transistor is connected to the sources of the transistors MG7 and MG8, while the source of the transistor is connected to the first power supply line 2. A bias voltage from a first bias circuit (not shown) is input to the gate of the transistor. The constant current source 188B supplies a constant current based on the bias voltage.

The resistor RG3 and the resistor RG4 are connected in series. The first terminal of the resistor RG3 is connected to a node NJ7 between the capacitor CG1 and the gate of the first transistor MG1. The second terminal of the resistor RG3 is connected to the first terminal of the resistor RG4. The second terminal of the resistor RG4 is connected to a node NJ8 between the capacitor CG2 and the gate of the second transistor MG2. The resistor RG5 and the resistor RG6 are connected in series between the first power supply line 2 and the second power supply line 3. The first terminal of the resistor RG5 is connected to the first power supply line 2, while the second terminal of the resistor RG5 is connected to the first terminal of the resistor RG6. The second terminal of the resistor RG6 is connected to the second power supply line 3. The gate of the seventh transistor MG7 is connected to a node NJ9 between the second terminal of the resistor RG3 and the first terminal of the resistor RG4, and to a node NJ10 between the second terminal of the resistor RG5 and the first terminal of the resistor RG6.

The resistor RG7 and the resistor RG8 are connected in series. The first terminal of the resistor RG7 is connected to a noninverting input terminal SHIP of a sample and hold circuit, while the second terminal of the resistor RG7 is connected to the first terminal of the resistor RG8. The second terminal of the resistor RG8 is connected to an inverting input terminal SHIN of the sample and hold circuit. The capacitor CG5 is connected in parallel to the resistor RG7, while the capacitor CG6 is connected in parallel to the resistor RG8. The noninverting input terminal SHIP is connected to a node NJ11 between the drain of the third transistor MG3 and the drain of the sixth transistor MG6. The inverting input terminal SHIN is connected to a node NJ12 between the drain of the fourth transistor MG4 and the drain of the fifth transistor MG5. The gate of the eighth transistor MG8 is connected to a node NJ13 between the second terminal of the resistor RG7 and the first terminal of the resistor RG8.

The current mirror circuit 189 includes an eleventh transistor MG11 and a twelfth transistor MG12. The eleventh transistor MG11 and twelfth transistor MG12 of the present embodiment are enhancement type N-channel MOSFETs. The source of the eleventh transistor MG11 and the source of the twelfth transistor MG12 are connected to the second power supply line 3, while the gate of the eleventh transistor MG11 and the gate of the twelfth transistor MG12 are connected in common to the gate of the tenth transistor MG10. The drain of the eleventh transistor MG11 is connected to a node NJ14 between the drain of the first transistor MG1 and the fifth switch SW5. The drain of the twelfth transistor MG12 is connected to a node NJ15 between the drain of the second transistor MG2 and the sixth switch SW6.

The back gate bias circuit 20 is connected to the common back gate of the differential pair 181 and the first power supply line 2. The configuration of the back gate bias circuit 20 is the same as the configuration of the back gate bias circuit 20 of the first embodiment (see FIG. 2). The back gate bias circuit 20 applies a bias voltage VB, which is closer to the first power supply voltage VDD than the source potentials of the first transistor MG1 and the second transistor MG2, to the back gates of the first transistor MG1 and the second transistor MG2. In other words, the back gate bias circuit 20 applies a bias voltage VB, which is closer to the first power supply voltage VDD than an intermediate voltage between the source potentials of the first transistor MG1 and the second transistor MG2 and the first power supply voltage VDD, to the back gates of the first transistor MG1 and the second transistor MG2. That is, the back gate bias circuit 20 applies, to the first transistor MG1 and the second transistor MG2, the bias voltage VB which increases the back gate-to-source voltage VBS. As a result, the back gate-to-source voltage VBS becomes a voltage close to the back gate-to-source voltage VBSH. The bias voltage VB may be higher than the first power supply voltage VDD. In this case, it is preferable that the bias voltage VB be higher than the first power supply voltage VDD within a range where parasitic diodes of the first transistor MG1 and the second transistor MG2 are not turned on. That is, the bias voltage VB is preferably lower than a voltage at which parasitic diodes of the first transistor MG1 and the second transistor MG2 are turned on. An example of the voltage at which the parasitic diodes of the first transistor MG1 and the second transistor MG2 are turned on is a voltage 0.5 V to 0.6 V higher than the first power supply voltage VDD (VDD+ 0.5 to 0.6). It is preferable that the bias voltage VB be a voltage within a predetermined range including the first power supply voltage VDD and excluding a voltage equal to the first power supply voltage VDD. More specifically, it is more preferable that the bias voltage VB be a voltage within ±20% of the first power supply voltage VDD and excluding a voltage equal to the first power supply voltage VDD. As a result, the back gate-to-source voltage VBS becomes a voltage within the range of ±20% of the back gate-to-source voltage VBSH and excluding the back gate-to-source voltage VBSH.

Furthermore, according to the present embodiment, the impurity concentration in a channel region of some transistors of the transistors of the integration circuit 180 is made lower than then impurity concentration in a channel region of the other transistors to further reduce 1/f noise of the output signal Sout of the integration circuit 180. That is, the plurality of transistors of the integration circuit 180 include high concentration transistors whose impurity concentration in the channel region is a first concentration, and low concentration transistors whose impurity concentration in the channel region is a second concentration lower than the first concentration. More specifically, the impurity concentration in the channel region of each of the transistors easily affected by the 1/f noise of the output signal Sout among the transistors of the integration circuit 180 is made lower than the impurity concentration in the channel region of each of transistors not easily affected by the 1/f noise of the output signal Sout among the transistors of the integration circuit 180. That is, rather than high concentration transistors, low concentration transistors are used as transistors more easily affected by 1/f noise of the output signal Sout among the plurality of transistors. On the other hand, rather than low concentration transistors, high concentration transistors are used as transistors not easily affected by 1/f noise of the output signal Sout among the plurality of transistors. Specifically, the section easily affected by 1/f noise of the output signal Sout includes the differential pair 181, the constant current sources 183 and 184, the integrator 187, a part of the common feedback circuit 188, and the current mirror circuit 189, while the section not easily affected by 1/f noise characteristics of the output signal Sout includes the differential pair 188A of the common feedback circuit 188 and the back gate bias circuit 20.

In the present embodiment, the impurity concentration in the channel region of each of the transistors of the differential pair 181, the constant current sources 183 and 184, the integrator 187, a part of the common feedback circuit 188, and the transistor of the current mirror circuit 189 is made lower than the impurity concentration in the channel region of each of the transistors of the differential pair 188A of the common feedback circuit 188 and the back gate bias circuit 20. That is, the transistors configuring the differential pair 181, the constant current sources 183 and 184, the integrator 187, a part of the common feedback circuit 188, and the current mirror circuit 189 are low concentration transistors, while the transistors configuring the differential pair 188A of the common feedback circuit 188 and the back gate bias circuit 20 are high concentration transistors. Specifically, the impurity concentration in the channel region of each of the first transistor MG1 to the sixth transistor MG6 and the ninth transistor MG9 to the twelfth transistor MG12 is made lower than the impurity concentration in the channel region of each of the seventh transistor MG7, the eighth transistor MG8 and the transistor of the back gate bias circuit 20. That is, the first transistor MG1 to the sixth transistor MG6 and the ninth transistor MG9 to the twelfth transistor MG12 are low concentration transistors, while the seventh transistor MG7, the eighth transistor MG8, and the transistor of the back gate bias circuit 20 are high concentration transistors.

The impurity concentration in the channel region of each of the transistors MG1 to MG6 and MG9 to MG12 is preferably about ½ or lower of the impurity concentration in the channel region of each of the transistors MG7 and MG8 and the transistor of the back gate bias circuit 20. In the present embodiment, the impurity concentration in the channel region of each of the transistors MG1 to MG6 and MG9 to MG12 is about 1/10 of the impurity concentration in the channel region of each of the transistors MG7 and MG8 and the transistor of the back gate bias circuit 20. The transistors of the back gate bias circuit 20 are surface channel type MOSFETs.

The structure and manufacturing method of the N-channel MOSFETs and the P-channel MOSFETs of the transistor MG1 to MG12 are similar to the structure and manufacturing method of the N-channel MOSFETs and the P-channel MOSFETs of the first transistor M1 and the like of the first embodiment.

According to the present embodiment, following effects are achievable.

(24-1) The back gate bias circuit 20 applies a bias voltage VB, which is closer to the first power supply voltage VDD than the source potentials of the first transistor MG1 and the second transistor MG2, to the back gates of the first transistor MG1 and the second transistor MG2 (contact areas for applying bias voltage VB from back gate bias circuit 20 to N-type well layers 39 of the first transistor MG1 and the second transistor MG2). In this case, the back gate-to-source voltage VBS of each of the first transistor MG1 and the second transistor MG2 increases. According to this configuration, the transconductance gm12 of each of the first transistor MG1 and the second transistor MG2 increases. Accordingly, reduction of noise of the output signal Sout of the integration circuit 180 is achievable.

(24-2) The back gate bias circuit 20 can further reduce noise of the output signal Sout from the integration circuit 180 by making the bias voltage VB higher than the first power supply voltage VDD, and thereby further increasing the transconductance gm12 of each of the first transistor MG1 and the second transistor MG2.

(24-3) The first transistor MG1 and the second transistor MG2 can be operated in a stable manner by setting the bias voltage VB to a voltage lower than such a voltage at which parasitic diodes of the first transistor MG1 and the second transistor MG2 are turned on.

(24-4) Increase in the transconductance gm12 of each of the first transistor MG1 and the second transistor MG2, and stable operation of the first transistor MG1 and the second transistor MG2 can be achieved by setting the bias voltage VB to a voltage within a predetermined range including the first power supply voltage VDD and excluding the first power supply voltage VDD, and thereby increasing the back gate-to-source voltage VBS. In particular, the back gate-to-source voltage VBS is made closer to the back gate-to-source voltage VBSH by setting the bias voltage VB to a voltage within ±20% of the first power supply voltage VDD and excluding a voltage equal to the first power supply voltage VDD. Accordingly, the transconductance gm12 of each of the first transistor MG1 and the second transistor MG2 increases, and the first transistor MG1 and the second transistor MG2 can be operated in a more stable manner.

(24-5) The impurity concentration in the channel region of each of the first transistor MG1 and the second transistor MG2 configuring the differential pair 181 is lower than the impurity concentration in the channel region of each of the seventh transistor MG7 and the eighth transistor MG8 configuring the differential pair 188A of the common feedback circuit 188, and the transistor configuring the back gate bias circuit 20. According to this configuration, fluctuations of mobility and fluctuations of the drain current can be reduced by lowering the impurity concentration in the channel region of each of the transistors MG1 and MG2 configuring the differential pair 181 and easily affected by 1/f noise of the output signal Sout of the integration circuit 180. Therefore, 1/f noise of the output signal Sout of the integration circuit 180 can effectively decrease.

(24-6) The impurity concentration in the channel region of each of the third transistor MG3 and the fourth transistor MG4 configuring the constant current sources 183 and 184 is lower than the impurity concentration in the channel region of each of the seventh transistor MG7 and the eighth transistor MG8 configuring the differential pair 188A of the common feedback circuit 188, and the transistor configuring the back gate bias circuit 20. According to this configuration, fluctuations of mobility and fluctuations of the drain current can be reduced by lowering the impurity concentration in the channel region of each of the transistors MG3 and MG4 configuring the constant current sources 183 and 184 and easily affected by 1/f noise of the output signal Sout of the integration circuit 180. Therefore, 1/f noise of the output signal Sout of the integration circuit 180 can effectively decrease.

(24-7) The impurity concentration in the channel region of each of the eleventh transistor MG11 and the twelfth transistor MG12 configuring the current mirror circuit 189 is lower than the impurity concentration in the channel region of each of the seventh transistor MG7 and the eighth transistor MG8 configuring the differential pair 188A of the common feedback circuit 188, and the transistor configuring the back gate bias circuit 20. According to this configuration, fluctuations of mobility and fluctuations of the drain current can be reduced by lowering the impurity concentration in the channel region of each of the transistors MG11 and MG12 configuring the current mirror circuit 189 and easily affected by 1/f noise of the output signal Sout of the integration circuit 180. Therefore, 1/f noise of the output signal Sout of the integration circuit 180 can effectively decrease.

(24-8) The impurity concentration in the channel region of each of the fifth transistor MG5 and the sixth transistor MG6 configuring the integrator 187 is lower than the impurity concentration in the channel region of each of the seventh transistor MG7 and the eighth transistor MG8 configuring the differential pair 188A of the common feedback circuit 188, and the transistor configuring the back gate bias circuit 20. According to this configuration, fluctuations of mobility and fluctuations of the drain current can be reduced by lowering the impurity concentration in the channel region of each of the transistors MG5 and MG6 configuring the integrator 187 and easily affected by 1/f noise of the output signal Sout from the integration circuit 180. Therefore, 1/f noise of the output signal Sout of the integration circuit 180 can effectively decrease.

(24-9) The impurity concentration in the channel region of each of the transistors MG3 and MG4 configuring the constant current sources 183 and 184, and the impurity concentration in the channel region of each of the first transistor MG1 and the second transistor MG2 configuring the differential pair 181 are equal to each other. According to this configuration, the step of forming the N-type well layer 70 of each of the transistors MG3 and MG4, and the step of forming the N-type well layer 70 of each of the transistors MG1 and MG2 can be collectively performed. Accordingly, the step for manufacturing the integration circuit 180 can be simplified.

(24-10) The impurity concentration in the channel region of each of the transistors MG11 and MG12 configuring the current mirror circuit 189, the impurity concentration in the channel region of each of the transistor MG5 and MG6 configuring the integrator 187, and the impurity concentration in the channel region of each of the transistors MG9 and MG10 configuring the current source of the common feedback circuit 188 are equal to each other. According to this configuration, the step of forming the P-type well layer 62 of each of the transistors MG11 and MG12, the step of forming the P-type well layer 62 of each of the transistors MG5 and MG6, and the step of forming the P-type well layer 62 of each of the transistors MG9 and MG10 can be collectively performed. Accordingly, the step of manufacturing the integration circuit 180 can be simplified.

(24-11) The impurity concentration in the channel region of the transistor of the constant current source 182, the impurity concentration in the channel region of each of the transistors MG7 and MG8 of the differential pair 188A, the impurity concentration in the channel region of the transistor of the constant current source 188B, and the impurity concentration in the channel region of each of the transistors M5, M8, and M9 of the back gate bias circuit 20 are equal to each other. According to this configuration, the step of forming the N-type well layer 63 of the transistor of the constant current source 182, the step of forming the N-type well layer 63 of each of the transistors MG7 and MG8, the step of forming the N-type well layer 63 of the transistor of the constant current source 188B, and the step of forming the N-type well layer 63 of each of the transistors M5, M8, and M9 of the back gate bias circuit 20 can be collectively performed. Accordingly, the step of manufacturing the integration circuit 180A can be simplified.

Modifications of Twenty-Fourth Embodiment

The integration circuit 180 of the present embodiment can be modified in following manners. Following modified examples can be combined with each other as long as technical contradiction does not occur.

In the integration circuit 180, the step-down circuit 100 of the fifth embodiment may be added between the first power supply line 2 and the differential pair 181, more specifically between the first power supply line 2 and the constant current source 182. According to this configuration, effects similar to those of the fifth embodiment can be obtained. In addition, the back gate bias circuit 20 may also be connected to the third power supply line 4 as in the back gate bias circuit 20 of the sixth embodiment. According to this configuration, effects similar to the effects of the sixth embodiment can be obtained.

Instead of lowering the impurity concentration in the channel region of each of the transistors MG1 to MG6 and MG9 to MG12, embedded channel type MOSFETs such as the transistors M1, M2, M4, and M5 of the second embodiment may be adopted. In this case, effects similar to the effects of the second embodiment can be obtained. Furthermore, any one or two of the pair of transistors MG1 and MG2 configuring the differential pair 181, the pair of transistors MG11 and MG12 configuring the current mirror circuit 189, and the pair of the transistors MG3 and MG4 configuring the constant current sources 183 and 184 may be changed to the embedded channel type MOSFETs of the second embodiment.

In addition to lowering the impurity concentration in the channel region of each of the transistors MG1 to MG6 and MG9 to MG12, embedded channel type MOSFETs may be adopted. That is, each of the transistors MG1 to MG6 and MG9 to MG12 may have a structure similar to the structure of each of the transistors M1, M2, M4, and M5 of the third embodiment. In this case, effects similar to the effects of the third embodiment can be obtained. Furthermore, any one or two of the pair of transistors MG1 and MG2 configuring the differential pair 181, the pair of transistors MG11 and MG12 configuring the current mirror circuit 189, and the pair of the transistors MG3 and MG4 configuring the constant current sources 183 and 184 may be changed to the structures of the transistors M1, M2, M4, and M5 of the third embodiment. Moreover, any one or two of the pair of transistors MG1 and MG2 configuring the differential pair 181, the pair of transistors MG11 and MG12 configuring the current mirror circuit 189, and the pair of the transistors MG3 and MG4 configuring the constant current sources 183 and 184 may be changed to structures similar to the structures of the embedded type MOSFETs of the second embodiment or the transistors M1, M2, M4, and M5 of the third embodiment. In short, the integration circuit 180 may have a configuration which includes a mixture of structures similar to the structures of the low concentration transistor of the first embodiment, the embedded channel type MOSFETs of the second embodiment, and the transistors M1, M2, M4, and M5 of the third embodiment.

Twenty-Fifth Embodiment

Figure 42:
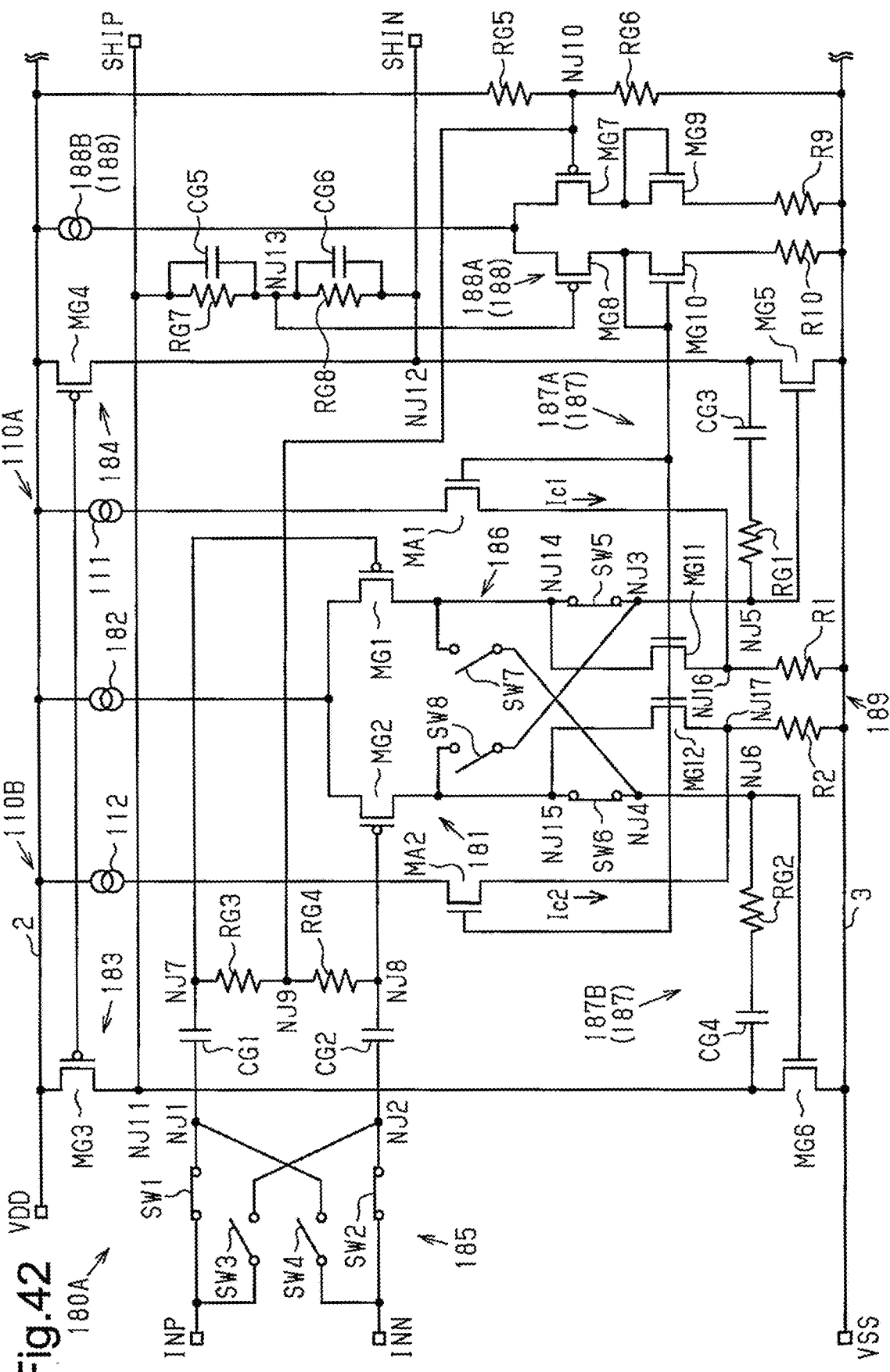
FIG. 42 is a circuit diagram of an integration circuit according to a twenty-fifth embodiment.

An integration circuit 180A which is an example of a differential circuit of a twenty-fifth embodiment will be described with reference to FIG. 42. The integration circuit 180A of the present embodiment is different from the integration circuit 180 of the twenty-fourth embodiment chiefly in that the back gate bias circuit 20 is eliminated, and that the first control unit 110A, the second control unit 110B, the first resistor R1, and the second resistor R2 are added.

The first resistor R1 is provided between the second power supply line 3 and the eleventh transistor MG11. The first terminal of the first resistor R1 is connected to the source of the eleventh transistor MG 11, while the second terminal of the first resistor R1 is connected to the second power supply line 3.

The second resistor R2 is provided between the second power supply line 3 and the twelfth transistor MG12. The first terminal of the second resistor R2 is connected to the source of the twelfth transistor MG12, while the second terminal of the second resistor R2 is connected to the second power supply line 3.

Along with addition of the first resistor R1 and the second resistor R2, a resistor R9 is provided between the source of the ninth transistor MG9 of the differential pair 188A of the common feedback circuit 188 and the second power supply line 3, while a resistor R10 is provided between the source of the tenth transistor MG10 and the second power supply line 3. The first terminal of the resistor R9 is connected to the source of the ninth transistor MG9, while the second terminal of the resistor R9 is connected to the second power supply line 3. The first terminal of the resistor R10 is connected to the source of the tenth transistor MG10, while the second terminal of the resistor R10 is connected to the second power supply line 3.

The first control unit 110 A controls a source potential of the eleventh transistor MG11 by controlling a current supplied to a node NJ16 between the source of the eleventh transistor MG11 and the first resistor R1. The first control transistor MA1 of the first control unit 110A of the present embodiment is an N-channel MOSFET. The first constant current source 111 includes a transistor (not shown). The transistor of the first constant current source 111 is a P-channel MOSFET. The drain of the transistor of the first constant current source 111 is connected to the drain of the first control transistor MA1, while the source of the transistor is connected to the first power supply line 2. The source of the first control transistor MA1 is connected to the node NJ16 between the source of the eleventh transistor MG11 and the first resistor R1, while the gate of the first control transistor MA1 is connected to the gate and the drain of the eleventh transistor MG11. In this configuration, the first control unit 110A supplies, to the node NJ16, the first current Ic1 proportional to the constant current It of the constant current source 182.

The second control unit 110B controls the source potential of the twelfth transistor MG12 by controlling a current supplied to a node NJ17 between the source of the twelfth transistor MG12 and the second resistor R2. The second control transistor MA2 of the second control unit 110B of the present embodiment is an N-channel MOSFET. The second constant current source 112 includes a transistor (not shown). The transistor of the second constant current source 112 is a P-channel MOSFET. The drain of the transistor of the second constant current source 112 is connected to the drain of the second control transistor MA2, while the source of the transistor is connected to the first power supply line 2. The source of the second control transistor MA2 is connected to the node NJ17 between the source of the twelfth transistor MG12 and the second resistor R2, while the gate of the second control transistor MA2 is connected to the gate of the eleventh transistor MG11. In this configuration, the second control unit 110B supplies, to the node NJ17, the second current Ic2 proportional to the constant current It of the constant current source 182.

In this manner, the first current Ic1 is supplied from the first control unit 110A to the source of the fourth transistor ME4, while the second current Ic2 is supplied from the second control unit 110B to the source of the fifth transistor ME5. As a result, the source potential of the fourth transistor ME4 and the source potential of the fifth transistor ME5 are raised. In addition, the source potentials of the fourth transistor ME4 and the fifth transistor ME5 are raised by the first resistor R1 and the second resistor R2. According to the present embodiment described above, the source potentials of the transistors ME4 and ME5 are further raised. Accordingly, the transconductance gm on the circuit decreases.

Moreover, the structure and manufacturing method of the N-channel MOSFETs and the P-channel MOSFETs of the transistors of the integration circuit 180A are similar to the structure and manufacturing method of the N-channel MOSFETs and the P-channel MOSFETs of the transistors MG1 to MG12 of the integration circuit 180 of the twenty-fourth embodiment. Therefore, effects similar to the effects (24-5) to (24-10) of the twenty-fourth embodiment can be obtained.

Moreover, the first control transistor MA1 and the second control transistor MA2 are not easily affected by 1/f noise of the output signal Sout. Accordingly, the impurity concentration in the channel region of each of the transistors MA1 and MA2 is made higher than the impurity concentration in the channel region of each of the transistors MG1 to MG6 and MG9 to MG12. In other words, the impurity concentration in the channel region of each of the transistors MG1 to MG6 and MG9 to MG12 is lower than the impurity concentration in the channel region of each of the transistors MA1 and MA2. That is, the transistors MG1 to MG6 and MG9 to MG12 are low concentration transistors, while the transistors MA1 and MA2 are high concentration transistors.

The impurity concentration in the channel region of each of the transistors MG1 to MG6 and MG9 to MG12 is preferably about ½ or lower of the impurity concentration in the channel region of each of the transistors MA1 and MA2. In the present embodiment, the impurity concentration in the channel region of each of the transistors MG1 to MG6 and MG9 to MG12 is about 1/10 of the impurity concentration in the channel region of each of the transistors MA1 and MA2. The transistors MA1 and MA2 are surface channel type MOSFETs.

According to the present embodiment, following effects are achievable.

(25-1) The control units 110A and 110B raise the source voltages of the transistors MG11 and MG12 of the active load to decrease currents flowing through the transistors MG11 and MG12. Accordingly, the transconductance gm of each of the transistors MG11 and MG12 on the circuit decreases, wherefore reduction of noise of the output signal Sout of the integration circuit 180A is achievable.

(25-2) The impurity concentration in the channel region of the transistor in the constant current source 182, the impurity concentration in the channel region of each of the transistors MG7 and MG8 of the differential pair 188A, the impurity concentration in the channel region of the transistor of the constant current source 188B, and the impurity concentration in the channel region of each of the transistor of the constant current source 111 of the first control unit 110A and the transistor of the constant current source 112 of the second control unit 110B are equal to each other. According to this configuration, the step of forming the N-type well layer 63 of the transistor of the constant current source 182, the step of forming the N-type well layer 63 of each of the transistors MG7 and MG8, the step of forming the N-type well layer 63 of the transistor of the constant current source 188B, and the step of forming the N-type well layer 63 of each of the transistors of the constant current sources 111 and 112 can be collectively performed. Accordingly, the step of manufacturing the integration circuit 180A can be simplified.

Modifications of Twenty-Fifth Embodiment

The integration circuit 180A of the present embodiment can be modified in following manners. Following modified examples can be combined with each other as long as technical contradiction does not occur.

The resistance value of the first resistor R1, the resistance value of the second resistor R2, the resistance value of the resistor R9, and the resistance value of the resistor R10 may be changed according to the ratio of the eleventh transistor MG11, the twelfth transistor MG12, the ninth transistor MG9, and the tenth transistor MG10.

The first control unit 110A and the second control unit 110B may be eliminated from the integration circuit 180A. In this case, the source potentials of the transistors MG11 and MG12 are raised by the first resistor R1 and the second resistor R2.

Instead of lowering the impurity concentration in the channel region of each of the transistors MG1 to MG6 and MG9 to MG12, embedded channel type MOSFETs such as the transistors M1, M2, M4, and M5 of the second embodiment may be adopted. In this case, effects similar to the effects of the second embodiment can be obtained. Furthermore, any one or two of the pair of transistors MG1 and MG2 configuring the differential pair 181, the pair of transistors MG11 and MG12 configuring the current mirror circuit 189, and the pair of the transistors MG3 and MG4 configuring the constant current sources 183 and 184 may be changed to the embedded channel type MOSFETs of the second embodiment.

In addition to lowering the impurity concentration in the channel region of each of the transistors MG1 to MG6 and MG9 to MG12, embedded channel type MOSFETs may be adopted. That is, each of the transistors MG1 to MG6 and MG9 to MG12 may have a structure similar to the structure of each of the transistors M1, M2, M4, and M5 of the third embodiment. In this case, effects similar to the effects of the third embodiment can be obtained. Furthermore, any one or two of the pair of transistors MG1 and MG2 configuring the differential pair 181, the pair of transistors MG11 and MG12 configuring the current mirror circuit 189, and the pair of the transistors MG3 and MG4 configuring the constant current sources 183 and 184 may be changed to the structures of the transistors M1, M2, M4, and M5 of the third embodiment. Moreover, any one or two of the pair of transistors MG1 and MG2 configuring the differential pair 181, the pair of transistors MG11 and MG12 configuring the current mirror circuit 189, and the pair of the transistors MG3 and MG4 configuring the constant current sources 183 and 184 may be changed to structures similar to the structures of the embedded type MOSFETs of the second embodiment or the transistors M1, M2, M4, and M5 of the third embodiment. In short, the integration circuit 180A may have a configuration which includes a mixture of structures similar to the structures of the low concentration transistors of the first embodiment, the embedded channel type MOSFETs of the second embodiment, and the transistors M1, M2, M4, and M5 of the third embodiment.

Twenty-Sixth Embodiment

Figure 43:
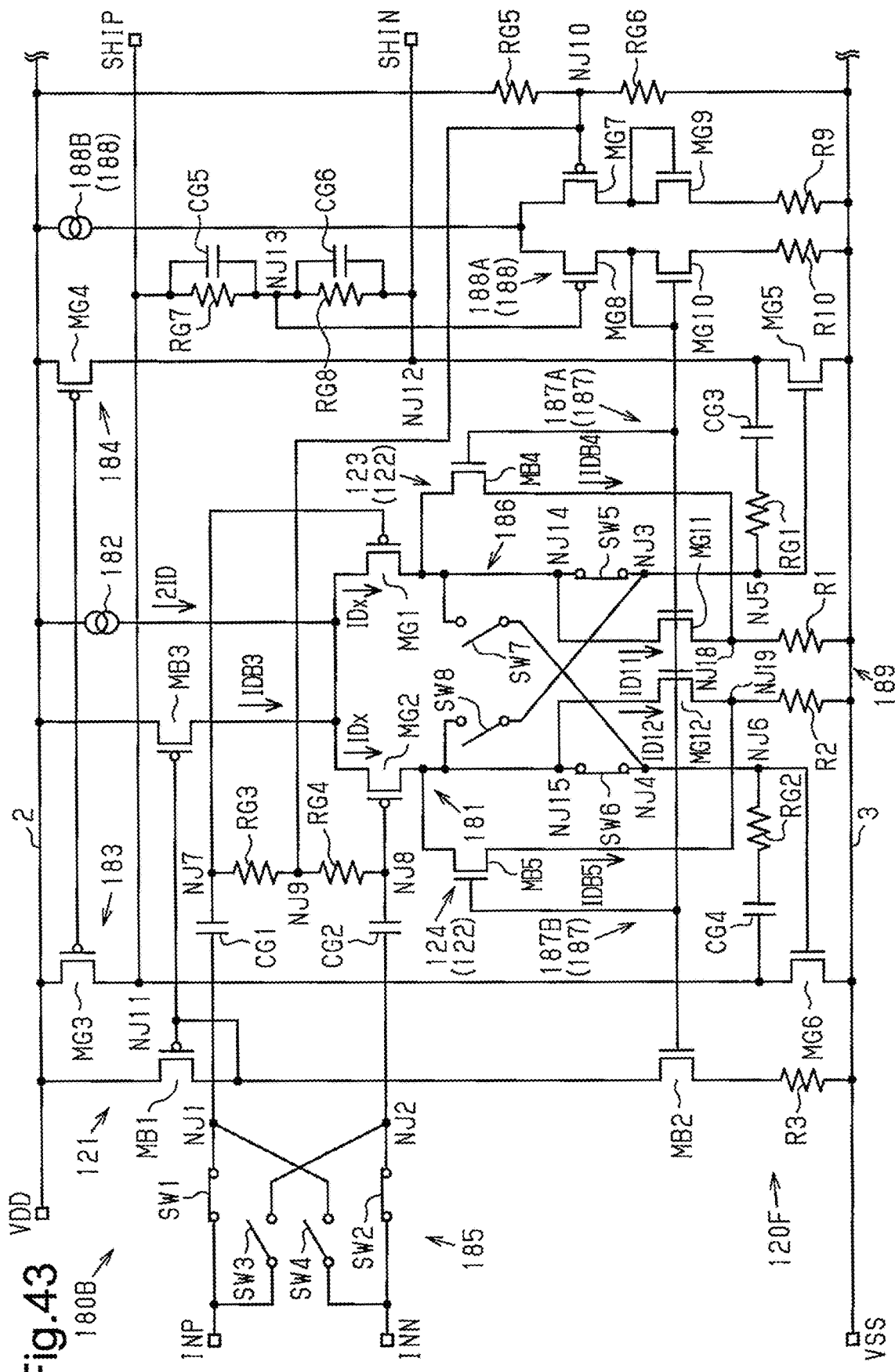
FIG. 43 is a circuit diagram of an integration circuit according to a twenty-sixth embodiment.

An integration circuit 180B which is an example of a differential circuit of a twenty-sixth embodiment will be described with reference to FIG. 43. The integration circuit 180B of the present embodiment is different from the integration circuit 180A of the twenty-fifth embodiment in that the control units 110A and 110B are eliminated, and that a current adjustment unit 120F is added.

The current adjustment unit 120F causes larger currents to flow through the first transistor MG1 and the second transistor MG2 of the differential pair 181 than currents flowing through the eleventh transistor MG11 and the twelfth transistor MG12 as the active load. More specifically, the current adjustment unit 120F increases currents flowing through the first transistor MG1 and the second transistor MG2 more than the constant current It of the constant current source 182 to prevent flow of currents toward the eleventh transistor MG11 and the twelfth transistor MG12 by an amount of increase in the currents flowing through the transistors MG1 and MG2. The current adjustment unit 120F has a configuration similar to the configuration of the current adjustment unit 120A of the twelfth embodiment, and includes the current supplying unit 121, the branching portion 122, and the third resistor R3.

The current supplying unit 121 is a current source provided separately from the constant current source 182, and supplies currents to the first transistor MG1 and the second transistor MG2. The current supplying unit 121 includes the first supply transistor MB1, the second supply transistor MB2, and the third supply transistor MB3. The first supply transistor MB1 and the third supply transistor MB3 of the present embodiment are P-channel MOSFETs, while the second supply transistor MB2 is an N-channel MOSFET.

The first supply transistor MB1 and the second supply transistor MB2 configure a series circuit between the first power supply line 2 and the second power supply line 3. The source of the first supply transistor MB1 is connected to the first power supply line 2, the gate of the first supply transistor MB1 is connected to the drain of the first supply transistor MB1, and the drain of the first supply transistor MB1 is connected to the drain of the second supply transistor MB2. The source of the second supply transistor MB2 is connected to the second power supply line 3.

The third supply transistor MB3 is provided between the first power supply line 2 and the differential pair 181. The source of the third supply transistor MB3 is connected to the first power supply line 2, the drain of the third supply transistor MB3 is connected to the sources of the first transistor MG1 and the second transistor MG2, and the gate of the third supply transistor MB3 is connected in common to the gate of the first supply transistor MB1. In this manner, the first supply transistor MB1 and the third supply transistor MB3 configure a current mirror circuit.

The branching portion 122 does not allow each of a current equivalent to an increase in the drain current flowing through the first transistor MG1, and a current equivalent to an increase in the drain current flowing through the second transistor MG2, to flow to the drains of the eleventh transistor MG11 and the twelfth transistor MG12. The branching portion 122 includes a first branching circuit 123 and a second branching circuit 124.

The first branching circuit 123 includes the first branching transistor MB4. The first branching transistor MB4 of the present embodiment is an N-channel MOSFET. The drain of the first branching transistor MB4 is connected to the drain of the first transistor MG1, the source of the first branching transistor MB4 is connected to a node NJ18 between the twelfth transistor MG12 and the first resistor R1, the gate of the first branching transistor MB4 is connected in common to the gate of the eleventh transistor MG11 and the gate of the tenth transistor MG10.

The second branching circuit 124 includes the second branching transistor MB5. The second branching transistor MB5 of the present embodiment is an N-channel MOSFET. The drain of the second branching transistor MB5 is connected to the drain of the second transistor MG2, the source of the second branching transistor MB5 is connected to a node NJ19 between the eleventh transistor MG11 and the second resistor R2, the gate of the second branching transistor MB5 is connected in common to the gate of the twelfth transistor MG12 and the gate of the tenth transistor MG10.

The gate of the second supply transistor MB2 is connected to the gate of the second branching transistor MB5. In this manner, the branching transistors MB4 and MB5, the second supply transistor MB2, and the tenth transistor MG10 configure a current mirror circuit. The gate voltages of the transistors MB2, MB4 and MB5 are controlled by the gate voltage of the tenth transistor MG10.

The first branching transistor MB4 of the first branching circuit 123 and the second branching transistor MB5 of the second branching circuit 124 have the same electrical characteristics. In addition, the transistors MB2, MB4, and MB5 have a common gate voltage. In this case, the current amount of the second supply transistor MB2 is twice larger than the current amount of the first branching transistor MB4 (second branching transistor MB5). Accordingly, a sum of currents flowing through the transistors MB4 and MB5 is generated in the second supply transistor MB2.

According to the present embodiment, settings of electric characteristics of the transistors MB4 and MB5, and settings of electric characteristics of the eleventh transistor MG11 and the twelfth transistor MG12 are equalized. In addition, the gates of the transistors MB4 and MB5 are connected to the gate of the eleventh transistor MG11, wherefore a current flowing through the first branching transistor MB4 and a current flowing through the second branching transistor MB5 are equalized with a current flowing through the eleventh transistor MG11 (current flowing through twelfth transistor MG12).

A current flowing through the integration circuit 180B, in particular, a current flowing through the current adjustment unit 120F, will be described. In this explanation, the constant current flowing through the constant current source 182 is referred to as 2ID.

In the integration circuit 180B, the constant current 2ID, and the supply current IDB3 supplied from the third supply transistor MB3 are supplied to the differential pair 181. The supply current IDB3 is a current proportional to the current IDB2 caused to flow through the second supply transistor MB2 by the current mirror circuit including the transistors MB1 and MB3. In the present embodiment, a current ratio of the first supply transistor MB1 to the third supply transistor MB3 is 1:1, wherefore the supply current IDB3 is equal to the current IDB2. More specifically, the current IDB2 is a current proportional to the current ID11 caused to flow through the eleventh transistor MG11 by the current mirror circuit including the transistors MG11, MB4, MB5, and MB2. In the present embodiment, the current ratio of the transistors MB4 and MB5 to the transistors M3 and M4 is 1:1, wherefore the currents IDB4 and IDB5 flowing through the transistors MB4, MB5 are equal to the current ID11. In addition, the second supply transistor MB2 and the transistors MB4 and MB5 configure a current mirror circuit, wherefore the current IDB2 flowing through the second supply transistor MB2 is a sum of the currents flowing through the transistors MB4 and MB5 (IDB4+IDB5). That is, the supply current IDB3 supplied to the differential pair 181 is the sum of the currents flowing through the transistors MB4 and MB5 (IDB4+IDB5). Further, the currents flowing through the transistors MG11, MG12, MB4, and MB5 are equal to each other, wherefore a sum of currents flowing through the transistors MG11 and MG12 (ID3+ID4), that is, the constant current 2ID, and the sum of currents flowing through the transistors MB4 and MB5 (IDB4+IDB5) are equal to each other. Accordingly, in the present embodiment, the supply current IDB3 and the constant current 2ID are equal to each other.

The current IDx flowing through each of the transistors MG1 and MG2 of the differential pair 181 is expressed as IDx=(2ID+IDB3)/2 when inputs of the constant current 2ID and the supply current IDB3 are in the same phase, that is, when gate voltages as input signals are in the same phase. In this manner, the current IDx flowing through each of the transistors MG1 and MG2 becomes larger than the current ID (constant current 2ID/2) by ½ of the IDB3. On the other hand, the current IDB4 and IDB5 are extracted from the drains of the transistors MG1 and MG2 by the transistors MB4 and MB5 of the branching portion 122 configuring the current mirror circuit in cooperation with the eleventh transistor MG11. As a result, the current ID11 flowing through the eleventh transistor MG11 becomes IDx−IDB4, while the current ID12 flowing through the twelfth transistor MG12 becomes IDx−IDB5. Accordingly, each of the currents IDB4 and IDB5 of the present embodiment becomes ½ of the current IDB3. That is, the amount of increase in the current flowing through each of the transistors MG1 and MG2, that is, the amount of current supplied from the current supplying unit 121 is caused to flow through the transistors MB4 and MB5. In this manner, the current adjustment unit 120F supplies a current equal to the constant current 2ID of the constant current source 11 to the differential pair 181, and the ½ of the constant current 2ID to the transistors MB4 and MB5. In this case, only the current ID flows in each of the transistors MG11 and MG12. Accordingly, the current adjustment unit 120F increases the currents flowing through the transistors MG1 and MG2, but does not increase the currents flowing through the transistors MG11 and MG12. As a result, the transconductance gm of each of the transistors MG1 and MG2 of the differential pair 181 increases, while the transconductance of each of the transistor MG11 and MG12 of the active load does not increase.

In addition, the source potentials of the eleventh transistor MG11 and the twelfth transistor MG12 are raised by the first resistor R1 and the second resistor R2. As described above, in the present embodiment, the source potentials of the transistors MG11 and MG12 are further raised. Accordingly, transconductance gm on the circuit of the active load decreases.

Moreover, the structure and manufacturing method of the N-channel MOSFETs and the P-channel MOSFETs of the transistors of the integration circuit 180B are similar to the structure and manufacturing method of the N-channel MOSFETs and the P-channel MOSFETs of the transistors MG1 to MG12 of the integration circuit 180 of the twenty-fourth embodiment. Therefore, effects similar to the effects (24-5) to (24-10) of the twenty-fourth embodiment can be obtained.

The transistors MB1 to MB5 of the current adjustment unit 120F are not easily affected by 1/f noise of the output signal Sout. Accordingly, the impurity concentration in the channel region of each of the transistors MB1 to MB5 is made higher than the impurity concentration in the channel region of each of the transistors MG1 to MG6 and MG9 to MG12. In other words, the impurity concentration in the channel region of each of the transistors MG1 to MG6 and MG9 to MG12 is lower than the impurity concentration in the channel region of each of the transistors MB1 to MB5. That is, the transistors MG1 to MG6 and MG9 to MG12 are low concentration transistors, while the transistors MB1 to MB5 are high concentration transistors. The impurity concentration in the channel region of each of the transistors MG1 to MG6 and MG9 to MG12 is preferably about ½ or lower of the impurity concentration in the channel region of each of the transistors MB1 to MB5. In the present embodiment, the impurity concentration in the channel region of each of the transistors MG1 to MG6 and MG9 to MG12 is about $\frac{1}{10}$ of the impurity concentration in the channel region of each of the transistors MB1 to MB5. The transistors MB1 to MB5 are surface channel type MOSFETs.

According to the present embodiment, following effects are achievable.

(26-1) The current adjustment unit 120F increases the current supplied to the differential pair 181, but does not increase the current supplied to the active load. Accordingly, transconductance of each of the transistors MG1 and MG2 of the differential pair 181 increases, suppressing increase in the transconductance of each of the transistors MG11 and MG12 of the active load. Accordingly, noise of the output signal Sout of the integration circuit 180B can be reduced.

(26-2) The source potentials of the transistors MG11 and MG12 of the active load can be raised by the first resistor R1 and the second resistor R2 connected to the active load. In this case, currents flowing through the transistors MG11 and MG12 decrease. Accordingly, the transconductance gm of each of the transistors MG11 and MG12 on the circuit decreases, wherefore reduction of noise of the output signal Sout of the integration circuit 180B is achievable.

(26-3) The impurity concentration in the channel region of the transistor of the constant current source 182, the impurity concentration in the channel region of each of the transistors MG7 and MG8 of the differential pair 188A, the impurity concentration in the channel region of the transistor of the constant current source 188B, and the impurity concentration in the channel region of each of the transistors MB1 and MB3 of the current adjustment unit 120F are equal to each other. According to this configuration, the step of forming the N-type well layer 63 of the transistor of the constant current source 182, the step of forming the N-type well layer 63 of each of the transistors MG7 and MG8, the step of forming the N-type well layer 63 of the transistor of the constant current source 188B, and the step of forming the N-type well layer 63 of each of the transistors MB1 and MB3 can be collectively performed. Accordingly, the step of manufacturing the integration circuit 180B can be simplified.

Modifications of Twenty-Sixth Embodiment

The integration circuit 180B of the present embodiment can be modified in following manners. Following modified examples can be combined with each other as long as technical contradiction does not occur.

The first resistor R1, the second resistor R2, the third resistor R3, the resistor R9, and the resistor R10 may be eliminated from the integration circuit 180B. The source of the first branching transistor MB4 of the first branching circuit 123 and the source of the second branching transistor MB5 of the second branching circuit 124 may be connected to the second power supply line 3. In this case, the adjustment current source 125 may be added to the integration circuit 180B similarly to the operational amplifier 1H of the eleventh embodiment. The connection configuration between the transistor MB6 of the adjustment current source 125 and each of the transistors MB2, MB4, and MB5 is similar to the connection configuration of the eleventh embodiment.

Instead of lowering the impurity concentration in the channel region of each of the transistors MG1 to MG6 and MG9 to MG12, embedded channel type MOSFETs such as the transistors M1 to M4 of the second embodiment may be adopted. In this case, effects similar to the effects of the second embodiment can be obtained. Furthermore, any one or two of the pair of transistors MG1 and MG2 configuring the differential pair 181, the pair of transistors MG11 and MG12 configuring the current mirror circuit 189, and the pair of the transistors MG3 and MG4 configuring the constant current sources 183 and 184 may be changed to the embedded channel type MOSFETs of the second embodiment.

In addition to lowering the impurity concentration in the channel region of each of the transistors MG1 to MG6 and MG9 to MG12, embedded channel type MOSFETs may be adopted. That is, each of the transistors MG1 to MG6 and MG9 to MG12 may have a structure similar to the structure of each of the transistors M1 to M4 of the third embodiment. In this case, effects similar to the effects of the third embodiment can be obtained. Furthermore, any one or two of the pair of transistors MG1 and MG2 configuring the differential pair 181, the pair of transistors MG11 and MG12 configuring the current mirror circuit 189, and the pair of the transistors MG3 and MG4 configuring the constant current sources 183 and 184 may be changed to structures similar to the structures of the transistors M1 to M4 of the third embodiment. Moreover, any one or two of the pair of transistors MG1 and MG2 configuring the differential pair 181, the pair of transistors MG11 and MG12 configuring the current mirror circuit 189, and the pair of the transistors MG3 and MG4 configuring the constant current sources 183 and 184 may be changed to structures similar to the structures of the embedded type MOSFETs of the second embodiment or the transistors M1 to M4 of the third embodiment. In short, the integration circuit 180B may have a configuration which includes a mixture of structures similar to the structures of the low concentration transistors of the first embodiment, the embedded channel type MOSFETs of the second embodiment, and the transistors M1 to M4 of the third embodiment.

Twenty-Seventh Embodiment

Figure 44:
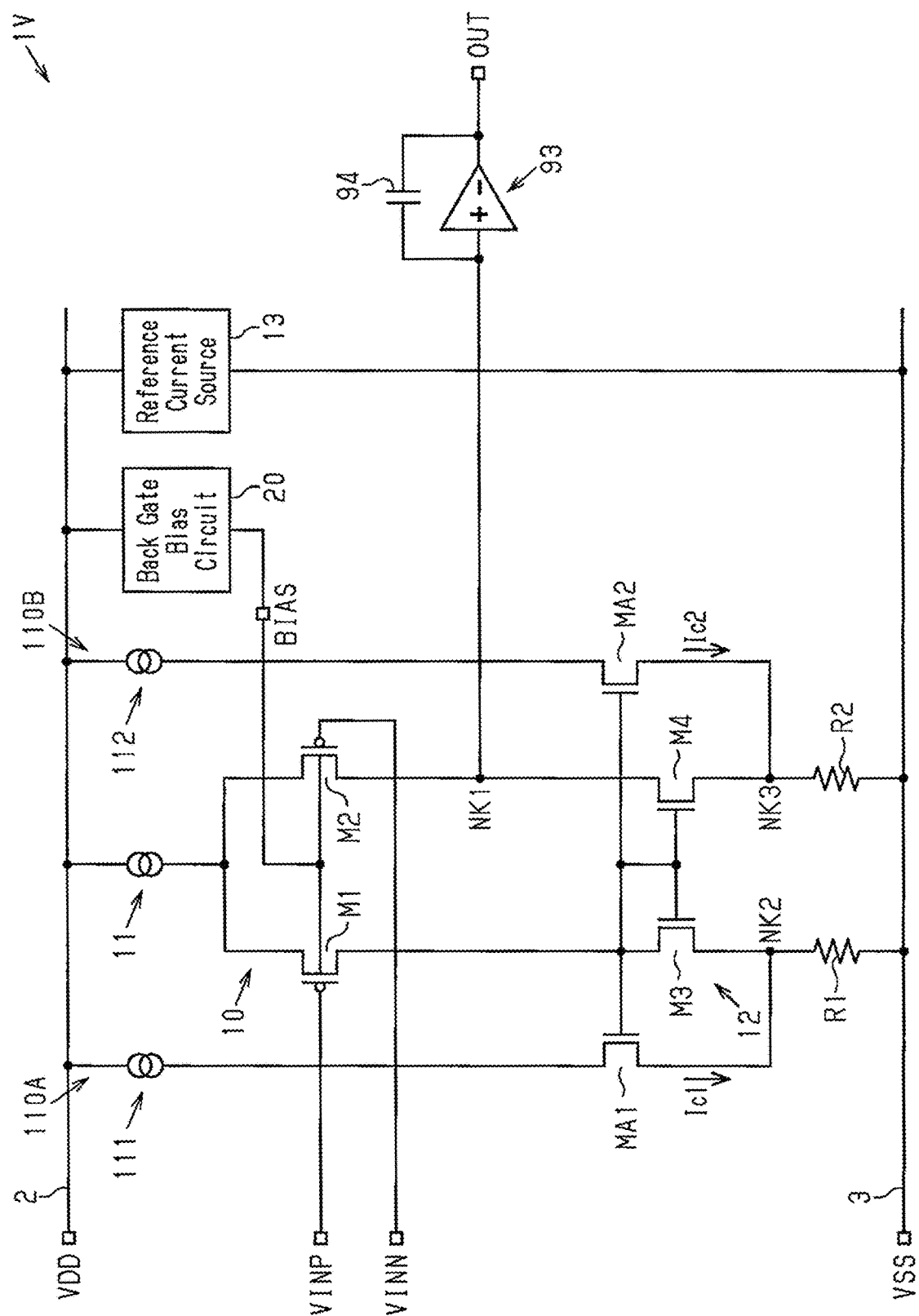
FIG. 44 is a circuit diagram of an operational amplifier according to a twenty-seventh embodiment.

An operational amplifier 1V according to a twenty-seventh embodiment will be described with reference to FIG. 44. The operational amplifier 1V of the present embodiment includes the configuration of the operational amplifier 1 of the first embodiment, and additionally includes the first control unit 110A, the second control unit 110B, the first resistor R1, and the second resistor R2 of the eighth embodiment, and the output stage 93 of the fourth embodiment.

The operational amplifier 1V includes the differential pair 10, the constant current source 11, the current mirror circuit 12 as an active load, the reference current source 13, the back gate bias circuit 20, the output stage 93, the first control unit 110A, the second control unit 110B, the first resistor R1, and the second resistor R2.

The differential pair 10, the constant current source 11, the current mirror circuit 12, the reference current source 13, and the back gate bias circuit 20 of the operational amplifier 1V have the same configurations as the configurations of the differential pair 10, the constant current source 11, the current mirror circuit 12, the reference current source 13, and the back gate bias circuit 20 of the operational amplifier 1 of the first embodiment. The connection configurations of the differential pair 10, the constant current source 11, the current mirror circuit 12, the reference current source 13, and the back gate bias circuit 20 of the operational amplifier 1V are the same as the connection configurations of the differential pair 10, the constant current source 11, the current mirror circuit 12, the reference current source 13, and the back gate bias circuit 20 of the operational amplifier 1 of the first embodiment.

The output stage 93 of the operational amplifier 1V is connected to a node NK1 between the drain of the second transistor M2 and the drain of the fourth transistor M4. The output stage 93 of the operational amplifier 1V has the same configuration as the configuration of the output stage 93 of the fourth embodiment.

The first control unit 110A and the second control unit 110B of the operational amplifier 1V have the same configurations as the configurations of the first control unit 110A and the second control unit 110B of the eighth embodiment. The resistance values of the first resistor R1 and the second resistor R2 of the operational amplifier 1V are equal to the resistance values of the first resistor R1 and the second resistor R2 of the eighth embodiment.

The connection configurations of the first control unit 110A, the second control unit 110B, the first resistor R1, and the second resistor R2 of the operational amplifier 1V are the same as the connection configurations of the first control unit 110A, the second control unit 110B, the first resistor R1, and the second resistor R2 of the eighth embodiment. That is, the source of the first control transistor MA1 of the first control unit 110A is connected to a node NK2 between the third transistor M3 and the first resistor R1, while the source of the second control transistor MA2 of the second control unit 110B is connected to a node NK3 between the fourth transistor M4 and the second resistor R2.

An operation of the present embodiment will be described.

The back gate bias circuit 20 applies the bias voltage VB, which is closer to the first power supply voltage VDD than the source potentials of the first transistor M1 and the second transistor M2, to the back gates of the first transistor M1 and the second transistor M2. In this case, the back gate-to-source voltage VBS approaches the back gate-to-source voltage VBSH, wherefore the transconductance gm12 becomes larger than that in the case where the back gates of the first transistor M1 and the second transistor M2 are connected to the sources of the transistors M1 and M2 as shown in FIG. 3.

The first current Ic1 is supplied from the first control unit 110A to the source of the third transistor M3, while the second current Ic2 is supplied from the second control unit 110B to the source of the fourth transistor M4. Accordingly, the source potential of the third transistor M3 and the source potential of the fourth transistor M4 rise. In addition, the source potentials of the third transistor M3 and the fourth transistor M4 are raised by the first resistor R1 and the second resistor R2. In this manner, the source potential of each transistor M3 and M4 is more raised in the present embodiment than in the seventh embodiment. Accordingly, the transconductance gm34 on the circuit further decreases.

As described above, the transconductance gm12 increases, while the transconductance gm34 decreases. Accordingly, noise of the operational amplifier 1V can be effectively reduced.

According to the present embodiment, effects similar to the effects (1-1) to (1-4) of the first embodiment, and effects similar to the effect (8-1) of the tenth embodiment can be obtained.

Moreover, the structure and manufacturing method of the transistors M1 to M4 of the operational amplifier 1V of the present embodiment are the same as the structure and manufacturing method of the transistors M1 to M4 of the first embodiment. Accordingly, effects similar to the effects (1-5) to (1-8) of the first embodiment can be obtained. Moreover, the structure and manufacturing method of the transistors MA1 and MA2 of the operational amplifier 1V of the present embodiment are the same as the structure and manufacturing method of the transistors MA1 and MA2 of the eighth embodiment. Accordingly, effects similar to effects (8-2) and (8-3) of the eighth embodiment can be obtained.

Modifications of Twenty-Seventh Embodiment

The operational amplifier 1V of the present embodiment can be modified in following manners. Following modified examples can be combined with each other as long as technical contradiction does not occur.

The operational amplifier 1V may include the cascode current mirror circuit 91 and the bias circuit 92 of the fourth embodiment instead of the current mirror circuit 12.

In the operational amplifier 1V, the resistance value of the first resistor R1 and the resistance value of the second resistor R2 may be changed in accordance with the ratio of the third transistor M3 and the fourth transistor M4.

In the operational amplifier 1V, the step-down circuit 100 of the fifth embodiment may be added between the first power supply line 2 and the differential pair 10, more specifically between the first power supply line 2 and the constant current source 11. According to this configuration, effects similar to the effects of the fifth embodiment can be obtained. Moreover, the back gate bias circuit 20 of the operational amplifier 1V may be connected to the third power supply line 4 similarly to the back gate bias circuit 20 of the sixth embodiment. According to this configuration, effects similar to the effects of the sixth embodiment can be obtained.

The first control unit 110A and the second control unit 110B may be eliminated from the operational amplifier 1V. In this case, the source potentials of the third transistor M3 and the fourth transistor M4 are raised by the first resistor R1 and the second resistor R2.

Instead of lowering the impurity concentration in the channel region of each of the transistors M1 to M4 in the operational amplifier 1V, embedded channel type MOSFETs such as the transistors M1 to M4 of the second embodiment may be adopted. In this case, effects similar to the effects of the second embodiment can be obtained. Furthermore, any one or two of the pairs of the transistors M1 and M2 configuring the differential pair 10, and the pair of the transistors M3 and M4 configuring the current mirror circuit 12 may be changed to the embedded channel type MOSFETs of the second embodiment.

In addition to lowering the impurity concentration in the channel region of each of the transistors M1 to M4 in the operational amplifier 1V, embedded channel type MOSFETs may be adopted. That is, the transistors M1 to M4 may have structures similar to the structures of the transistors M1 to M4 of the third embodiment. In this case, effects similar to the effects of the third embodiment can be obtained. Furthermore, any one or two of the pair of transistors M1 and M2 configuring the differential pair 10 in the operational amplifier 1V, and the pair of the transistors M3 and M4 configuring the current mirror circuit 12 may be changed to structures similar to the structures of the transistors M1 to M4 of the third embodiment. Moreover, any one or two of the pair of transistors M1 and M2 configuring the differential pair 10 in the operational amplifier 1V, and the pair of the transistors M3 and M4 configuring the current mirror circuit 12 may be changed to structures similar to the structures of the embedded channel type MOSFETs of the second embodiment, or the transistors M1 to M4 of the third embodiment. In short, the operational amplifier 1V may have a configuration which includes a mixture of structures similar to the structures of the low concentration transistors of the first embodiment, the embedded channel type MOSFETs of the second embodiment, and the transistors M1 to M4 of the third embodiment.

Twenty-Eighth Embodiment

Figure 45:
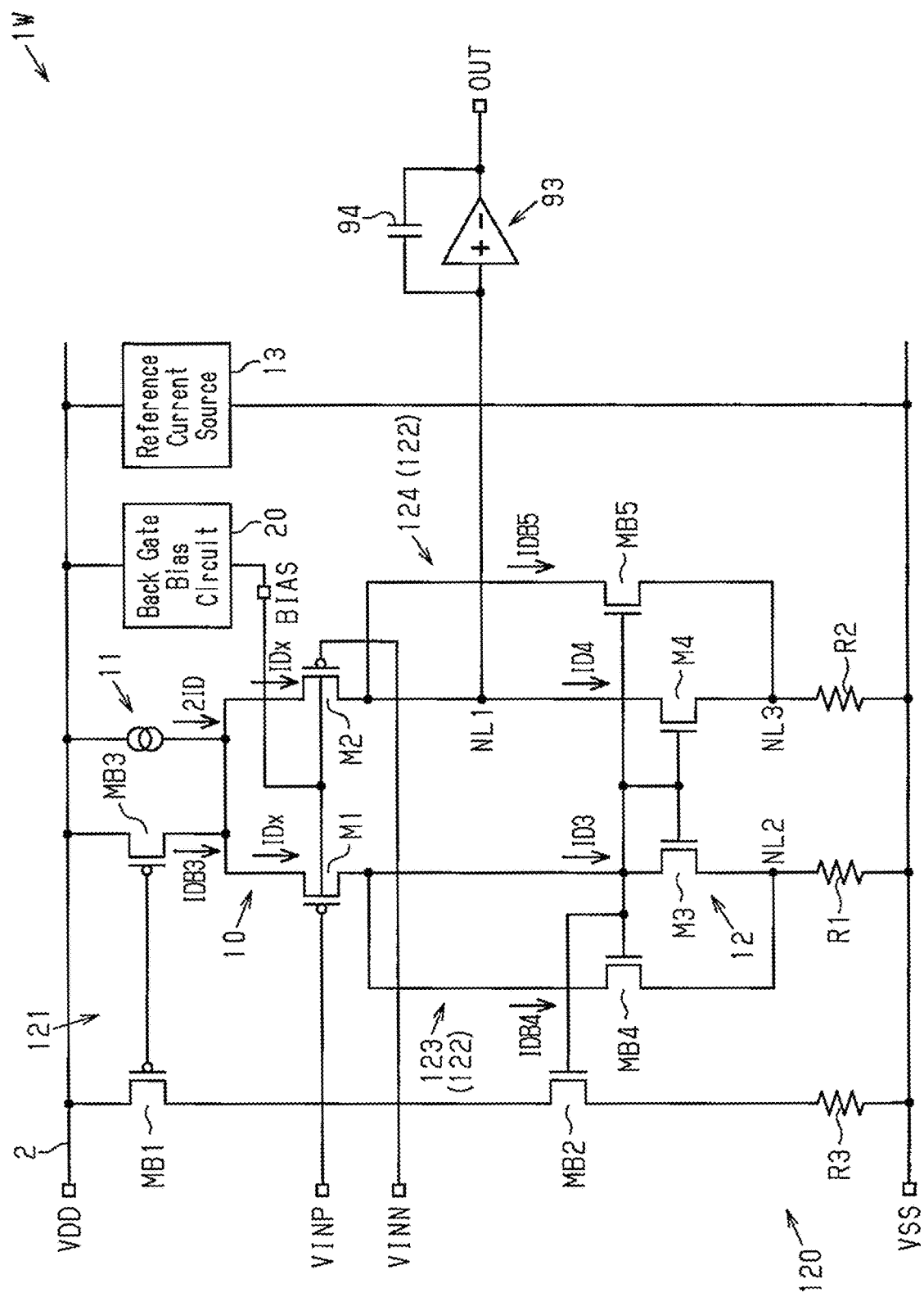
FIG. 45 is a circuit diagram of an operational amplifier according to a twenty-eighth embodiment.

An operational amplifier 1W according to a twenty-eighth embodiment will be described with reference to FIG. 45.

The operational amplifier 1W according to the present embodiment includes the operational amplifier 1 of the first embodiment, and additionally includes the current adjustment unit 120A, the first resistor R1, the second resistor R2, the third resistor R3, and the output stage 93 of the twelfth embodiment.

The current adjustment unit 120A and the output stage 93 of the operational amplifier 1W have the same configurations as the configurations of the current adjustment unit 120A and the output stage 93 of the twelfth embodiment. The output stage 93 is connected to a node NL1 between the drain of the second transistor M2 and the drain of the fourth transistor M4. Resistance values of the first resistor R1, the second resistor R2, and the third resistor R3 of the operational amplifier 1W are the same as the resistance values of the first resistor R1, the second resistor R2, and the third resistor R3 of the twelfth embodiment. The connection configurations of the current adjustment unit 120A, the first resistor R1, the second resistor R2, the third resistor R3, and the output stage 93 of the operational amplifier 1W are the same as the connection configurations of the current adjustment unit 120A, the first resistor R1, the second resistor R2, the third resistor R3, and the output stage 93 of the twelfth embodiment. That is, the source of the first branching transistor MB4 of the branching portion 122 is connected to a node NL2 between the third transistor M3 and the first resistor R1, while the source of the second branching transistor MB5 is connected to a node NL3 between the fourth transistor M4 and the second resistor R2.

The first branching transistor MB4 of the first branching circuit 123 and the second branching transistor MB5 of the second branching circuit 124 have the same electrical characteristics. In addition, the transistors MB2, MB4, and MB5 have a common gate voltage. In this case, the current amount of the second supply transistor MB2 is twice larger than the current amount of the first branching transistor MB4 (second branching transistor MB5). Accordingly, a sum of currents flowing through the transistors MB4 and MB5 is generated in the second supply transistor MB2.

According to the present embodiment, settings of electric characteristics of the transistors MB4 and MB5, and settings of electric characteristics of the third transistor M3 and the fourth transistor M4 are equalized. In addition, the gates of the transistors MB4 and MB5 are connected to the gate of the third transistor M3, wherefore a current flowing through the first branching transistor MB4 and a current flowing through the second branching transistor MB5 are equalized with a current flowing through the third transistor M3 (current flowing through fourth transistor M4).

An operation of the present embodiment will be described. In the following description, the constant current flowing through the constant current source 11 is referred to as 2ID.

The back gate bias circuit 20 applies the bias voltage VB, which is closer to the first power supply voltage VDD than the source potentials of the first transistor M1 and the second transistor M2, to the back gates of the first transistor M1 and the second transistor M2. In this case, the back gate-to-source voltage VBS approaches the back gate-to-source voltage VBSH, wherefore the transconductance gm12 becomes larger than that in the case where the back gates of the first transistor M1 and the second transistor M2 are connected to the sources of the transistors M1 and M2 as shown in FIG. 3.

The flow of the current in the current adjustment unit 120A is similar to the flow of the current in the current adjustment unit 120A of the twelfth embodiment. More specifically, the magnitudes of the supply current IDB3, the currents IDB2, IDB4 and IDB5, and the currents ID3 and ID4 are similar to the magnitudes of the supply current IDB3, the currents IDB2, IDB4 and IDB5, and the currents ID3 and ID4 of the ninth embodiment. As described in the ninth embodiment, the supply current IDB3, which has the same current amount as the current IDB2 which is a sum of the currents IDB4 and IDB5 flowing through the transistors MB4 and MB5, is supplied to the differential pair 10. In this case, the current supplied to the differential pair 10 is the sum of the supply current IDB3 and the constant current 2ID, wherefore the transconductance gm12 of each of the transistors M1 and M2 increases. Meanwhile, the currents IDB4 and IDB5 are extracted from the current IDx flowing through each of the transistors M1 and M2 by the transistors MB4 and MB5. Accordingly, an increase in the transconductance gm34 of each of the transistors M3 and M4 is suppressed.

The current IDB4 flowing through the first branching transistor MB4 flows to the node NL2 between the third transistor M3 and the first resistor R1, while the current IDB5 flowing through the second branching transistor MB5 flows to the node NL3 between the fourth transistor M4 and the second resistor R2. Therefore, the source potential of the third transistor M3 and the source potential of the fourth transistor M4 rise. In addition, as described in the seventh embodiment, the source potentials of the third transistor M3 and the fourth transistor M4 are raised by the first resistor R1 and the second resistor R2. In this manner, the source potential of each of the transistor M3 and M4 is more raised in the present embodiment than in the seventh embodiment. Accordingly, the transconductance gm34 on the circuit decreases.

As described above, the transconductance gm12 increases, while the transconductance gm34 decreases. Accordingly, noise of the operational amplifier 1W can be effectively reduced.

According to the present embodiment, effects similar to the effects (1-1) to (1-4) of the first embodiment, and effects similar to the effects of the twelfth embodiment can be obtained.

Moreover, the structure and manufacturing method of the transistors M1 to M4 of the operational amplifier 1W of the present embodiment are the same as the structure and manufacturing method of the transistors M1 to M4 of the first embodiment. Accordingly, effects similar to the effects (1-5) to (1-8) of the first embodiment can be obtained. Moreover, the structure and manufacturing method of the transistors MB1 to MB5 of the operational amplifier 1W of the present embodiment are the same as the structure and manufacturing method of the transistors MB1 to MB5 of the twelfth embodiment.

Modifications of Twenty-Eighth Embodiment

The operational amplifier 1W of the present embodiment can be modified in following manners. Following modified examples can be combined with each other as long as technical contradiction does not occur.

- The operational amplifier 1W may include the cascode current mirror circuit 91 and the bias circuit 92 of the fourth embodiment instead of the current mirror circuit 12.
- In the current adjustment unit 120A of the operational amplifier 1W, the magnitude of the supply current IDB3 from the current supplying unit 121 may be changed to any magnitude within a range not exceeding the constant current 2ID. For example, the current ratio of the first supply transistor MB1 to the third supply transistor MB3 may be set to 2:1. In this case, the supply current IDB3 of the third supply transistor MB3 becomes ½ of the supply current IDB2. In this manner, the supply current IDB3 can be made smaller than the constant current 2ID. Accordingly, the current IDB4 flowing through the first branching transistor MB4 and the current IDB5 flowing through the second branching transistor MB5 become smaller than the current ID, wherefore effects produced by element variations of the branching transistor MB4 and MB5 and imposed on the currents ID3 and ID4 flowing through the third transistor M3 and the fourth transistor M4 can further decrease.

In the operational amplifier 1W, the resistance value of the first resistor R1, the resistance value of the second resistor R2, and the resistance value of the third resistor R3 may be changed according to the ratio of the third transistor M3, the fourth transistor M4, and the second supply transistor MB2.

In the operational amplifier 1W, the step-down circuit 100 of the fifth embodiment may be added between the first power supply line 2 and the differential pair 10, more specifically between the first power supply line 2 and the constant current source 11. According to this configuration, effects similar to the effects of the fifth embodiment can be obtained. Moreover, the back gate bias circuit 20 of the operational amplifier 1W may be connected to the third power supply line 4 similarly to the back gate bias circuit 20 of the sixth embodiment. According to this configuration, effects similar to the effects of the sixth embodiment can be obtained.

In the operational amplifier 1W, the fourth resistor R4 and the fifth resistor R5 may be connected to the source of the first branching transistor MB4 and the source of the second branching transistor MB5. In this case, the fourth resistor R4 and the fifth resistor R5 are connected not to the nodes NL2 and NL3, but to the second power supply line 3. That is, the current adjustment unit 120A of the operational amplifier 1W may be changed similarly to the current adjustment unit 120B of the operational amplifier 1K of the fourteenth embodiment. In this case, the current control unit 130 may be added similarly to the operational amplifier 1K of the fourteenth embodiment.

The first resistor R1, the second resistor R2, and the third resistor R3 may be eliminated from the operational amplifier 1W, and the current adjustment unit 120A of the operational amplifier 1W may be changed to the current adjustment unit 120 of the ninth embodiment. In other words, the source of the second supply transistor MB2, the source of the first branching transistor MB4, and the source of the second branching transistor MB5 may be connected to the second power supply line 3.

Instead of lowering the impurity concentration in the channel region of each of the transistors M1 to M4 in the operational amplifier 1W, embedded channel type MOSFETs such as the transistors M1 to M4 of the second embodiment may be adopted. In this case, effects similar to the effects of the second embodiment can be obtained. Furthermore, any one or two of the pairs of the transistors M1 and M2 configuring the differential pair 10, and the pair of the transistors M3 and M4 configuring the current mirror circuit 12 may be changed to the embedded channel type MOSFETs of the second embodiment.

In addition to lowering the impurity concentration in the channel region of each of the transistors M1 to M4 in the operational amplifier 1W, embedded channel type MOSFETs may be adopted. That is, the transistors M1 to M4 may have structures similar to the structures of the transistors M1 to M4 of the third embodiment. In this case, effects similar to the effects of the third embodiment can be obtained. Furthermore, any one or two of the pair of transistors M1 and M2 configuring the differential pair 10 in the operational amplifier 1W, and the pair of the transistors M3 and M4 configuring the current mirror circuit 12 may be changed to structures similar to the structures of the transistors M1 to M4 of the third embodiment. Moreover, any one or two of the pair of transistors M1 and M2 configuring the differential pair 10 in the operational amplifier 1W, and the pair of the transistors M3 and M4 configuring the current mirror circuit 12 may be changed to structures similar to the structures of the embedded channel type MOSFETs of the second embodiment, or the transistors M1 to M4 of the third embodiment. In short, the operational amplifier 1W may have a configuration which includes a mixture of structures similar to the structures of the low concentration transistors of the first embodiment, the embedded channel type MOSFETs of the second embodiment, and the transistors M1 to M4 of the third embodiment.

Modifications

The description of each of the embodiments described above is only an example of a mode of the differential circuit of the present invention, wherefore the present invention is not intended to be limited to this specific mode. For example, the differential circuit of the present invention may have a mode of a combination of at least following modifications of the embodiments, and a mode obtained by combining at least two modifications which are mutually consistent.

In each of the above embodiments, the element isolation region 35 of the silicon substrate 30 has the STI structure. However, the element isolation region 35 may have a local oxidation of silicon (LOCOS) structure.

In each of the above embodiments, the source region 45 of the N-channel MOSFET in the plurality of transistors of the differential circuit is configured by the low concentration source region 47 and the high concentration source region 48, while the drain region 46 is configured by the low concentration drain region 49 and the high concentration drain region 50, i.e., the N-channel MOSFET is a what is called double diffused drain (DDD) type MOSFET. However, the structure of the N-channel MOSFET is not limited to this structure. For example, the source region 45 of the N-channel MOSFET may be configured by only the high concentration source region 48, while the drain region 46 may be configured by only the high concentration drain region 50. Similarly, the source region 64 of the P-channel MOSFET in the plurality of transistors of the differential circuit may be configured by only the high concentration source region 67, while the drain region 65 of the P-channel MOSFET may be configured by only the high concentration drain region 69.

The gate insulation film 42 is not limited to a silicon oxide film, but may be made of a high dielectric constant material (High-K material). Examples of the high dielectric constant material include $HfO_2$, HfSiON, SiON, $Si_3N_4$, $Al_2O_3$, $Ta_2O_5$, $TiO_2$, $La_2O_3$, $CeO_2$, $ZrO_2$, $HfO_2$, $SrTiO_3$, and $Pr_2O_3$.

When the high dielectric constant material is adopted as the material of the gate insulation film 42, scattering easily occurs at the interface between the channel region and the gate insulation film 42 depending on the adopted high dielectric constant material. In this case, deterioration of 1/f noise characteristics may be caused. This deterioration of 1/f noise characteristics caused by scattering at the interface can be reduced by adopting the embedded channel type MOS-FETs of the second embodiment, for example. Accordingly, the possibility of the deterioration caused by the use of the high dielectric constant material as the gate insulation film 42 can be reduced.

In the first embodiment, the impurity concentration of the P-type well layer 62 (N-type well layer 70) of some transistors of the plurality of transistors of the differential circuit is made lower than the impurity concentration of the P-type well layer 41 (N-type well layer 63) of the other transistors. However, the structure of the plurality of transistors is not limited to this structure. For example, as shown in FIG. 46, the P-type epitaxial layer 31 may be used as a conductive region configuring the channel region of the third transistor M3 (N-channel MOSFET) as an example of some transistors described above, and the high breakdown voltage N-type well layer 39 may be used as a conductive region configuring the channel region of the first transistor M1 (P-channel MOSFET) as an example of some transistors described above.

Figure 46:
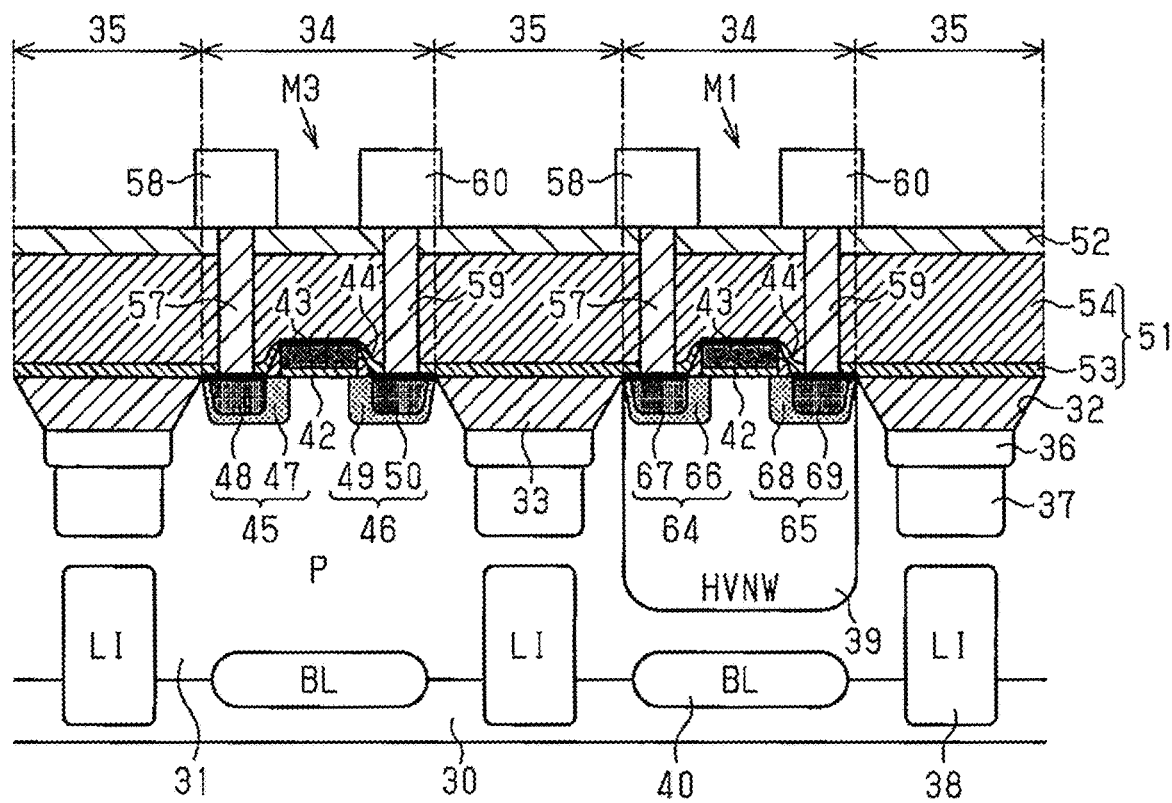
FIG. 46 is a cross-sectional view of a first transistor configuring a differential pair and a third transistor configuring an active load of an operational amplifier in a differential circuit of a modification.

In the third transistor M3 in FIG. 46, the source region 45 and the drain region 46 are formed in the surface layer portion of the P-type epitaxial layer 31. That is, a channel region is formed in the P-type epitaxial layer 31. The channel region of the third transistor M3 in FIG. 46 is disposed in the P-type epitaxial layer 31 between the source region 45 and the drain region 46 below the gate insulation film 42. The channel region of the third transistor M3 in FIG. 46 includes the interface between the P-type epitaxial layer 31 and the gate insulation film 42. The impurity concentration in the channel region of the third transistor M3 is equal to the impurity concentration of the P-type epitaxial layer 31.

The impurity concentration of the P-type epitaxial layer 31 of the third transistor M3 in FIG. 46 is lower than the impurity concentration of the P-type well layer 41 of the sixth transistor M6 (see FIG. 5A), for example. In one example, the impurity concentration of the P-type epitaxial layer 31 is about ½ or lower of the impurity concentration of the P-type well layer 41 of the sixth transistor M6. The impurity concentration of the P-type epitaxial layer 31 is preferably about 1/10 of the impurity concentration of the P-type well layer 41 of the sixth transistor M6.

In the first transistor M1 in FIG. 46, the source region 64 and the drain region 65 are formed in the surface layer portion of the N-type well layer 39. That is, a channel region is formed in the N-type well layer 39. The channel region of the first transistor M1 in FIG. 46 is disposed in the N-type well layer 39 between the source region 64 and the drain region 65 below the gate insulation film 42. The channel region of the first transistor M1 in FIG. 46 includes the interface between the N-type well layer 39 and the gate insulation film 42. The impurity concentration of the channel region of the first transistor M1 is the same as the impurity concentration of the N-type well layer 39.

For example, the impurity concentration of the N-type well layer 39 in the first transistor M1 in FIG. 46 is lower than the impurity concentration of the N-type well layer 63 of the eighth transistor M8 (see FIG. 5C). In one example, the impurity concentration of the N-type well layer 39 is about ½ or lower of the impurity concentration of the N-type well layer 63 of the eighth transistor M8. The impurity concentration of the N-type well layer 39 is preferably about 1/10 of the impurity concentration of the N-type well layer 63 of the eighth transistor M8.

[Method for Manufacturing Transistor]

A method for manufacturing the first transistor M1 and the third transistor M3 in FIG. 46 will be described with reference to FIGS. 47A to 47H. In the manufacturing method of the transistors, the epitaxial layer forming step, the isolation forming step, and the wiring step are similar to the corresponding steps in the first embodiment. Accordingly, description of these steps is omitted, and parts of the well forming step, the gate forming step, and the source/drain forming step different from the corresponding parts of the steps in the first embodiment are chiefly described.

Figure 47A:
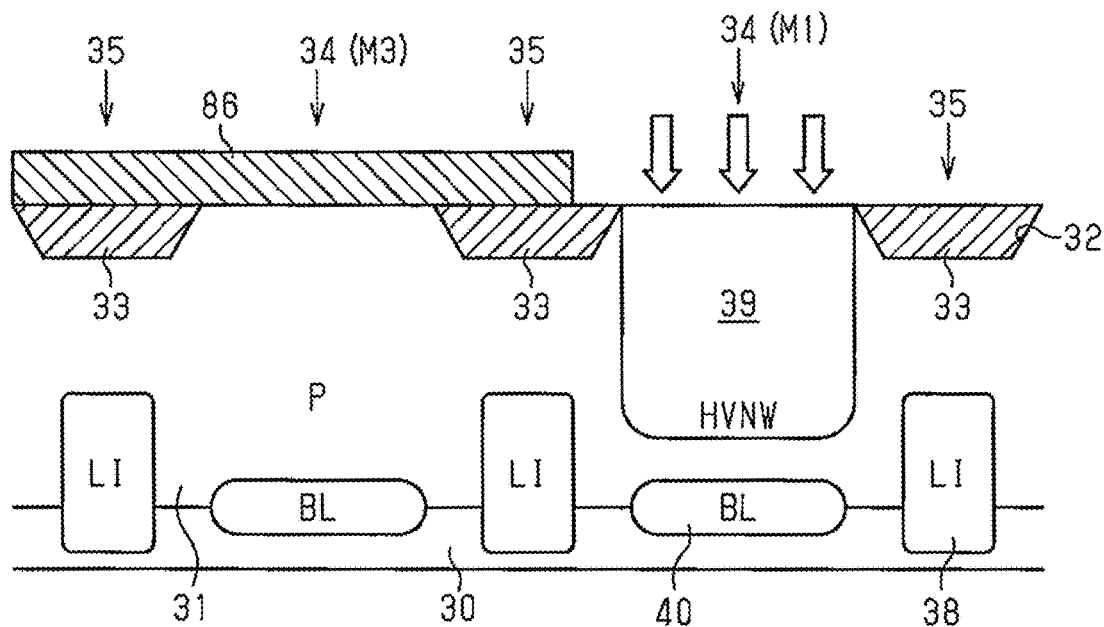
FIG. 47A is a cross-sectional view illustrating a manufacturing step of the first transistor and the third transistor.

In the well forming step, the N-type well layer 39 is formed in the element formation region 34 corresponding to the first transistor M1, but is not formed in the element formation region 34 corresponding to the third transistor M3 as shown in FIG. 47A. Specifically, formed is an ion implantation mask 86 that covers the element formation region 34 and the element isolation region 35 corresponding to the third transistor M3, and opens the element formation region 34 corresponding to the first transistor M1. N-type impurity ions are implanted into the element formation region 34 corresponding to the first transistor M1. For example, phosphorus ions are used as the N-type impurity ions. Thereafter, the ion implantation mask 86 is removed.

Figure 47B:
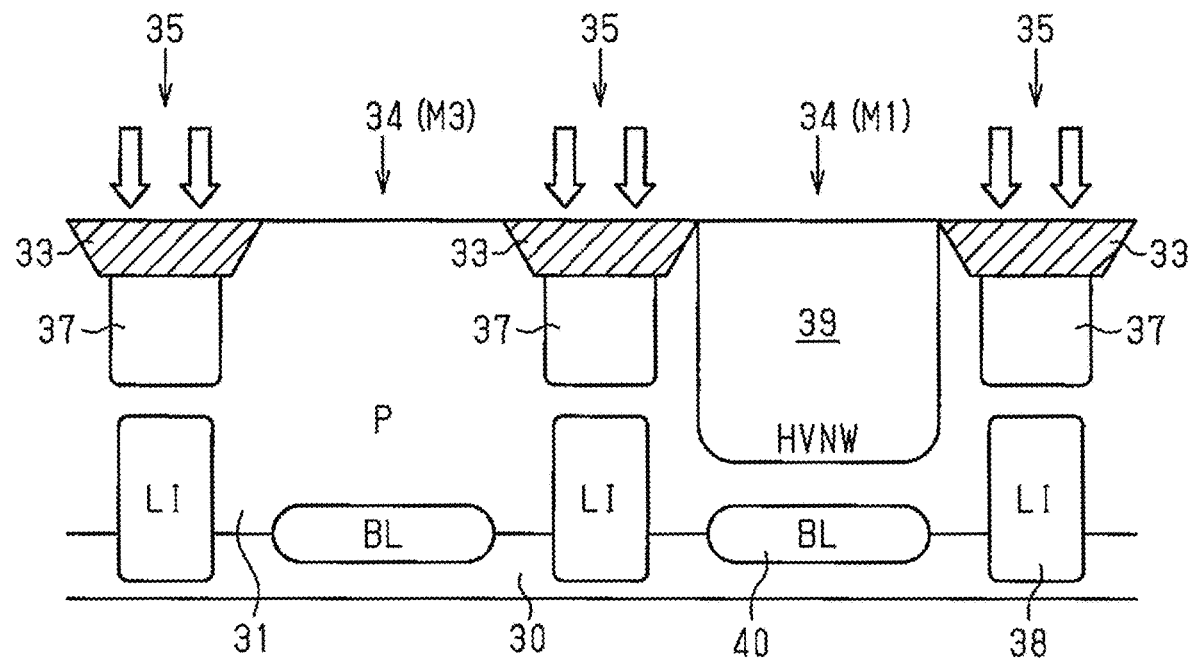
FIG. 47B is a cross-sectional view illustrating a step subsequent to the manufacturing step of the transistors shown in FIG. 47A.
Figure 47C:
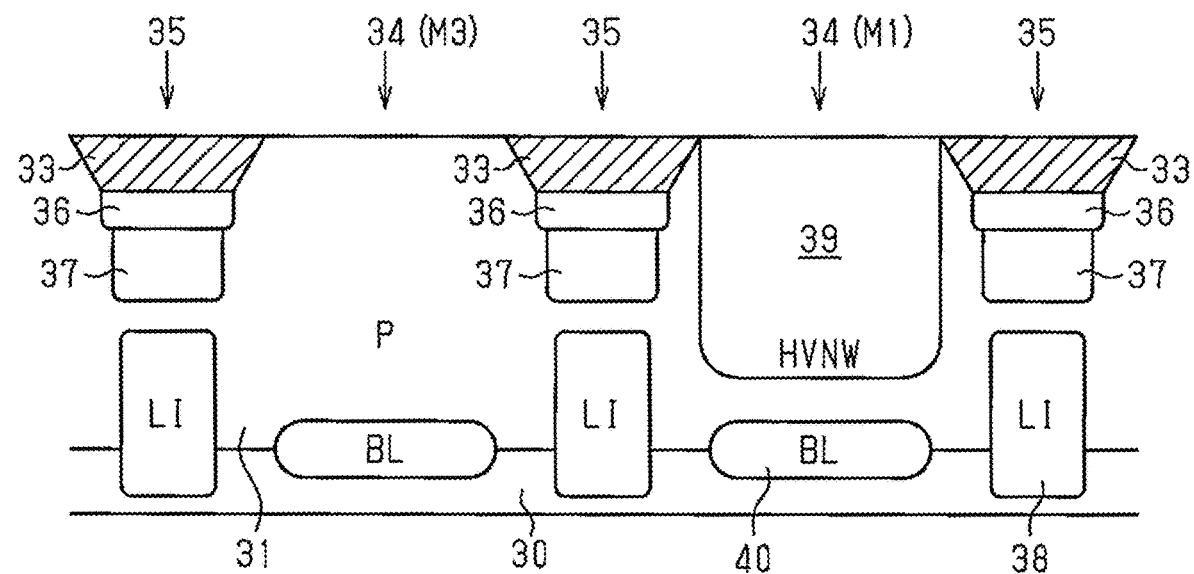
FIG. 47C is a cross-sectional view illustrating a step subsequent to the manufacturing step of the transistors shown in FIG. 47B.
Figure 47D:
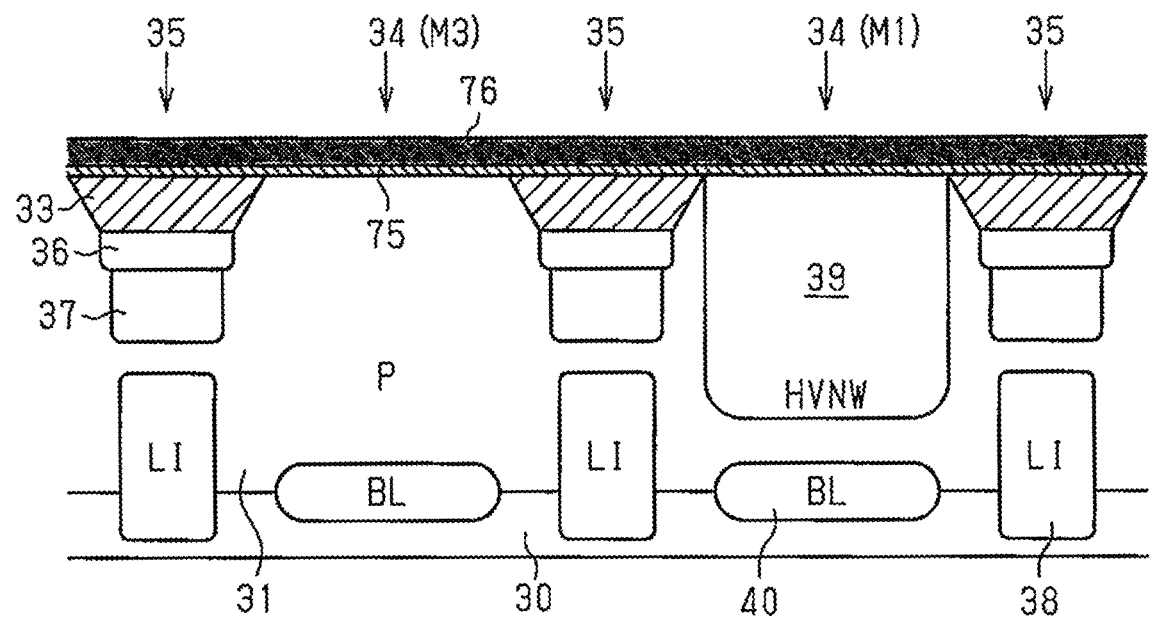
FIG. 47D is a cross-sectional view illustrating a step subsequent to the manufacturing step of the transistors shown in FIG. 47C.
Figure 47E:
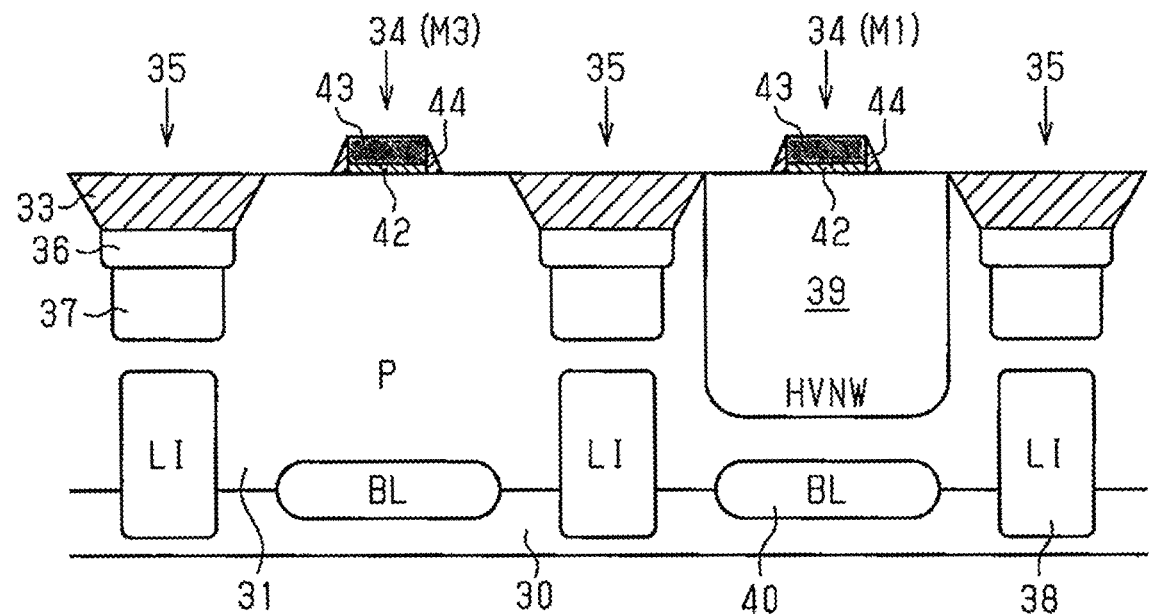
FIG. 47E is a cross-sectional view illustrating a step subsequent to the manufacturing step of the transistors shown in FIG. 47D.

Next, as shown in FIGS. 47B and 47C, the P-type well layer 36 is formed in each of the element isolation regions 35 after the P-type drift layer 37 is formed similarly to the first embodiment (see FIG. 6F). Then, as shown in FIG. 47D, a thermal oxide film 75 is formed by a thermal oxidation method, for example, on the surface of each of the element formation regions 34 of the P-type epitaxial layer 31. Next, a polysilicon film 76 is formed in such a manner as to cover the thermal oxide film 75 and the silicon oxide film 33. As shown in FIG. 47E, the gate insulation film 42 and the gate electrode 43 patterned into a predetermined shape after removal of unnecessary portions from the thermal oxide film 75 and the polysilicon film 76 are formed in the element formation region 34 corresponding to each of the first transistor M1 and the third transistor M3 by photolithography and etching, for example. Then, a nitride film (not shown) is formed on the P-type epitaxial layer 31 by a chemical vapor deposition (CVD) method, for example, after the nitride film is selectively etched to form the sidewall 44 on each of the side surfaces of the gate electrodes 43.

Figure 47F:
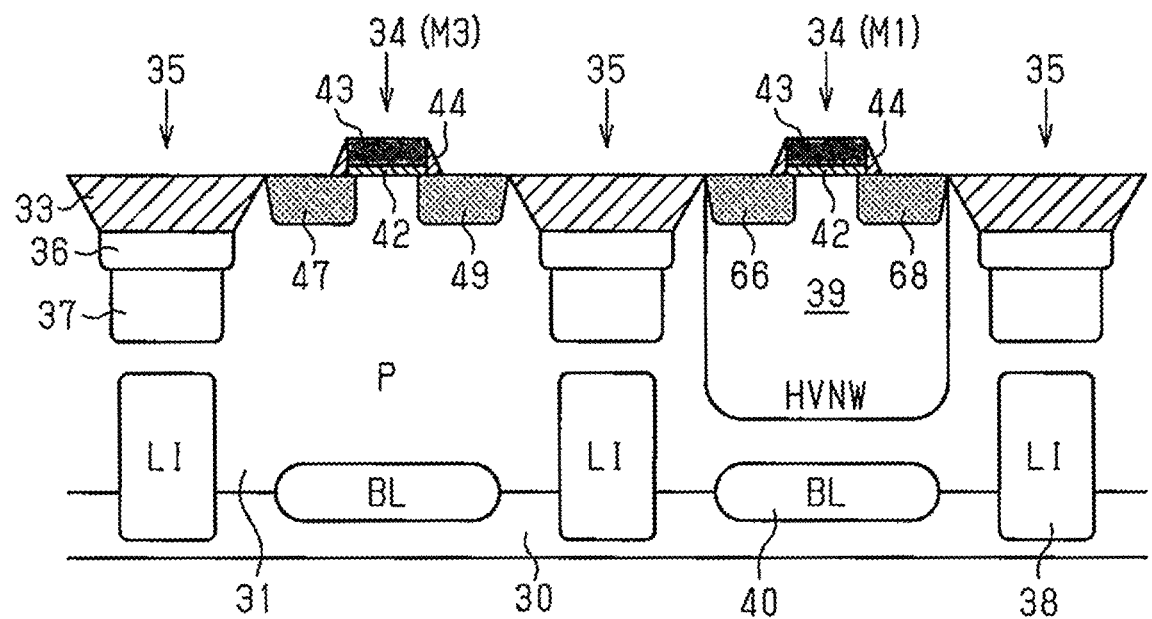
FIG. 47F is a cross-sectional view illustrating a process subsequent to the manufacturing steps of the transistors shown in FIG. 47E.

As shown in FIG. 47F, the low concentration source region 47 and the low concentration drain region 49 are formed in the element formation region 34 (P-type epitaxial layer 31) of the third transistor M3, while the low concentration source region 66 and the low concentration drain region 68 are formed in the element formation region 34 (N-type well layer 39) of the first transistor M1. More specifically, an ion implantation mask (not shown) having an opening through which the element formation region 34 of the third transistor M3 is exposed is formed in such a manner as to cover the element formation region 34 and the element isolation region 35 of the first transistor M1. N-type impurity ions are implanted through the opening of the ion implantation mask. Subsequently, the ion implantation mask described above is removed after an ion implantation mask (not shown) having an opening through which the element formation region 34 (N-type well layer 39) of the first transistor M1 is exposed is formed in such a manner as to cover the element formation region 34 and the element isolation region 35 of the third transistor M3. P-type impurity ions are implanted through the opening of the ion implantation mask. In this modification, the low concentration source region 66 and the low concentration drain region 68 are formed after the low concentration source region 47 and the low concentration drain region 49 are formed. However, the low concentration source region 47 and the low concentration drain region 49 may be formed after the low concentration source region 66 and the low concentration drain region 68 are formed.

Figure 47G:
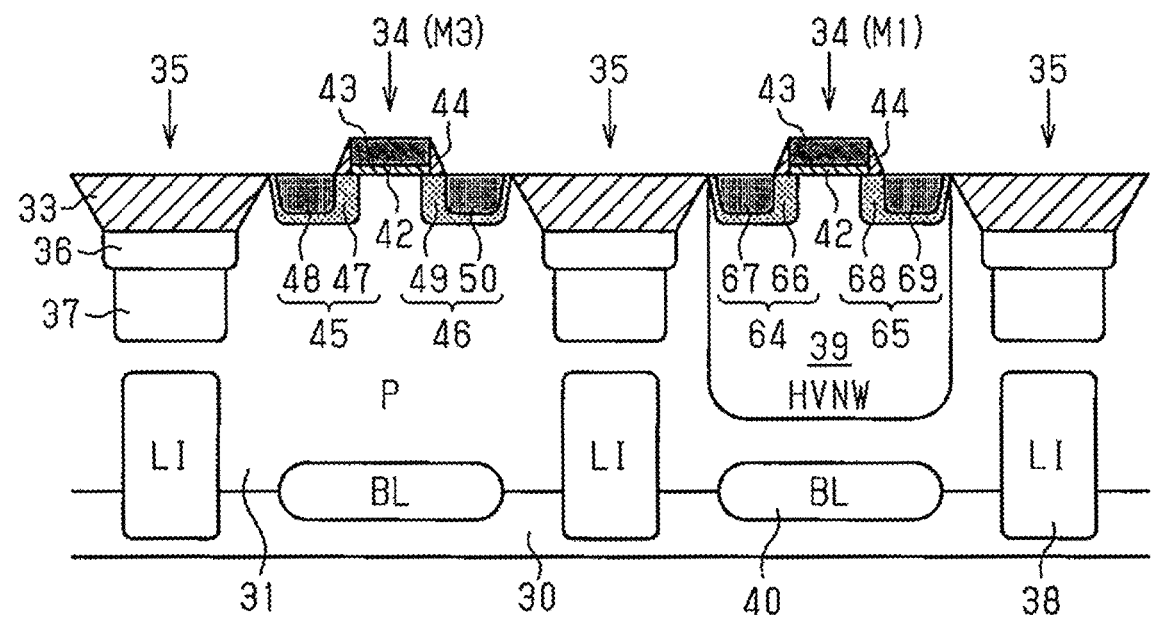
FIG. 47G is a cross-sectional view illustrating a step subsequent to the manufacturing step of the transistors shown in FIG. 47F.

As shown in FIG. 47G, the high concentration source region 48 and the high concentration drain region 50 are formed in the element formation region 34 (P-type epitaxial layer 31) of the third transistor M3, while the high concentration source region 67 and the high concentration drain region 69 are formed in the element formation region 34 (N-type well layer 39) of the first transistor M1. Specifically, an ion implantation mask (not shown) having an opening through which the P-type epitaxial layer 31 in the element formation region 34 of the third transistor M3 is exposed is so formed as to cover the N-type well layer 39 of the element formation region 34 and the element isolation region 35 of the first transistor M1. N-type impurity ions are implanted through the opening of the ion implantation mask. For example, arsenic ions are adopted as the N-type impurity ions. Subsequently, the ion implantation mask described above is removed after an ion implantation mask (not shown) having an opening through which the element formation regions 34 of the first transistor M1 is exposed is formed in such a manner as to cover the element formation region 34 and the element isolation region 35 of the third transistor M3. P-type impurity ions are implanted through the opening of the ion implantation mask. For example, boron ions are used as the P-type impurity ions. In this modification, the high concentration source region 67 and the high concentration drain region 69 are formed after the high concentration source region 48 and the high concentration drain region 50 are formed. However, the high concentration source region 48 and the high concentration drain region 50 may be formed after the high concentration source region 67 and the high concentration drain region 69 are formed.

Figure 47H:
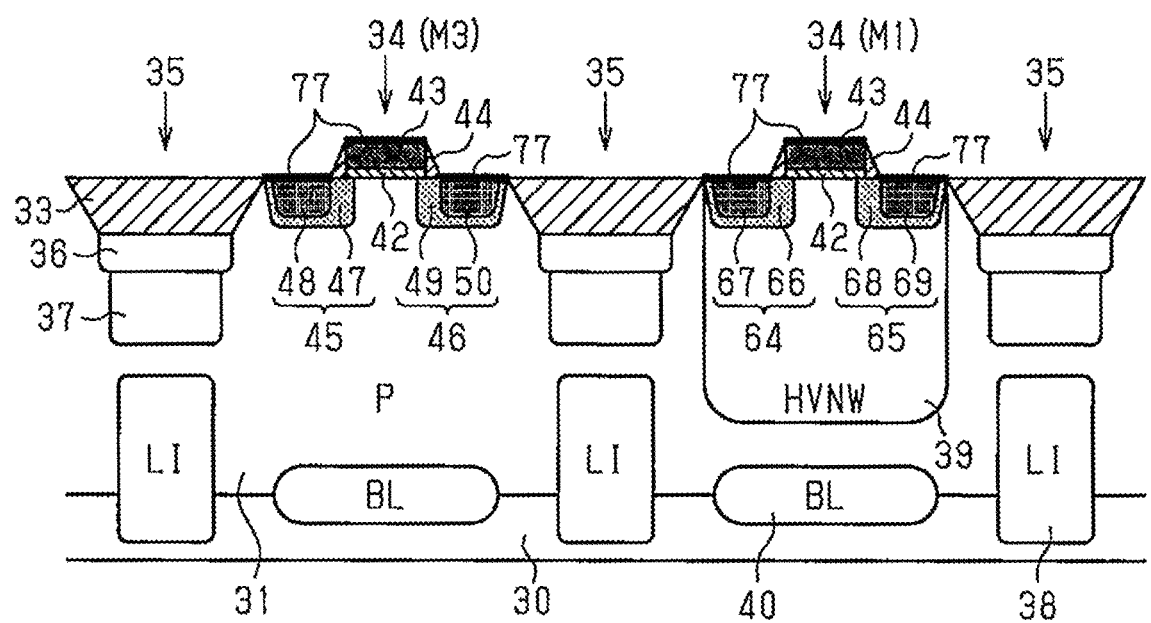
FIG. 47H is a cross-sectional view illustrating a step subsequent to the manufacturing step of the transistors shown in FIG. 47G.

As shown in FIG. 47H, a silicide layer 77 is formed on the surfaces of the high concentration source region 48, the high concentration drain region 50, and the gate electrode 43 formed in the element formation region 34 (P-type epitaxial layer 31) of the third transistor M3. The silicide layer 77 is also formed on the surfaces of the high concentration source region 67, the high concentration drain region 69, and the gate electrode 43 formed in the element formation region 34 (N-type well layer 39) of the first transistor M1. Specifically, after a cobalt film (not shown) is formed toward the P-type epitaxial layer 31 by a PVD method, for example, heat treatment is performed. As a result, the cobalt film on the high concentration source regions 48 and 67, the high concentration drain regions 50 and 69, and the gate electrode 43 in each of the element formation regions 34 changes into the silicide layer 77, while the cobalt film on the silicon oxide film 33 in each of the element isolation regions 35 remains cobalt. Then, cobalt on each of the silicon oxide films 33 is selectively removed by chemical treatment, for example.

The structure of the modification in FIG. 46 may be changed to a structure similar to the structure of each of the transistors M1 to M4 of the third embodiment. That is, an embedded channel layer (not shown) may be formed in the P-type epitaxial layer 31 in the third transistor M3 in FIG. 46. The embedded channel layer is a region (layer) of the same conductivity type as the conductivity type of the source region 45 and the drain region 46. That is, the embedded channel layer is an N-type region (layer) similarly to the source region 45 and the drain region 46 doped with N-type impurities. The channel region (embedded channel layer) of the third transistor M3 does not include the interface between the P-type epitaxial layer 31 and the gate insulation film 42. The impurity concentration in the channel region (embedded channel layer) of the third transistor M3 is higher than the impurity concentration of the P-type epitaxial layer 31. The fourth transistor M4 has a configuration similar to the configuration of the third transistor M3.

An embedded channel layer (not shown) may be formed in the N-type well layer 39 of the first transistor M1 in FIG. 46. The embedded channel layer is a region (layer) of the same conductivity type as the conductivity type of the source region 64 and the drain region 65. That is, the embedded channel layer is a region (layer) of the P-type similarly to the source region 64 and the drain region 65 doped with P-type impurities. The channel region (embedded channel layer) of the first transistor M1 does not include the interface between the N-type well layer 39 and the gate insulation film 42. The impurity concentration of the channel region (embedded channel layer) of the first transistor M1 is higher than the impurity concentration of the N-type well layer 39. The second transistor M2 has a configuration similar to the configuration of the first transistor M1.

In each of the above embodiments, each of the transistors configuring the operational amplifiers may be a high concentration transistor. That is, the transistor easily affected by 1/f noise in an operational amplifier may be a high concentration transistor.

In each of the above embodiments, each of the transistors configuring the operational amplifiers may be a low concentration transistor. That is, the transistor not easily affected by 1/f noise in an operational amplifier may be a low concentration transistor.

In each of the above embodiments, each of the transistors configuring the operational amplifiers may be a surface channel type MOSFET. That is, the transistor easily affected by 1/f noise in the operational amplifier may be a surface channel type MOSFET.

In each of the above embodiments, each of the transistors configuring the operational amplifiers may be an embedded channel type MOSFET. That is, the transistor not easily affected by 1/f noise in the operational amplifier may be an embedded channel type MOSFET.

Each of the transistors MA1 and MA2 configuring the first control unit 110A and the second control unit 110B may be a bipolar transistor instead of a MOSFET. In this case, the base of each of the bipolar transistors corresponds to "the control terminal of the first control transistor" and "the control terminal of the second control transistor".

The transistors MB1 to MB5 configuring the current adjustment units 120 to 120F may be bipolar transistors instead of MOSFETs. In this case, the base of each of the bipolar transistors as the first branching transistor corresponds to "the control terminal of the first adjustment transistor". The base of each of the bipolar transistors as the second branching transistor corresponds to "the control terminal of the second adjustment transistor". The base of each of the bipolar transistors as the second supply transistors corresponds to "the control terminal of the second supply transistor".

The transistors of the operational amplifiers of the seventh to fourteenth, sixteenth, seventeenth, nineteenth, twentieth, twenty-second, and twenty-third embodiments, or the integration circuits of the twenty-fifth and twenty-sixth, i.e., the transistors configuring the operational amplifier or the integration circuit not including the back gate bias circuit 20, may be bipolar transistors instead of MOSFETs.

The back gate bias circuit 20 may be added to the operational amplifiers of the sixteenth, seventeenth, nineteenth, twentieth, twenty-second, and twenty-third embodiments, or the integration circuits of the twenty-fifth and twenty-sixth embodiments. In this case, the step-down circuit 100 may be added between the first power supply line 2 and the differential pair. According to this configuration, effects similar to those of the fifth embodiment can be obtained. In addition, the back gate bias circuit 20 may also be connected to the third power supply line 4 as in the back gate bias circuit 20 of the sixth embodiment. According to this configuration, effects similar to the effects of the sixth embodiment can be obtained.

The back gate bias circuit 20 (20A, 20B) may be manufactured from a semiconductor substrate different from the operational amplifier.

In each of the above embodiments, the channel length of each of the transistors configuring the differential pairs 10, 151, 161, 171, 172, and 181 may be smaller than the channel length of each of the transistors configuring the active load (current mirror circuits 12 and 189 and cascode current mirror circuits 91, 163, and 176). With this relationship of the channel length, the element area increases, but fluctuations of mobility decrease. Accordingly, noise of the output signal Sout can be further reduced.

Embodiment

Technical ideas achievable from the above embodiments and modifications will be described.

Embodiment A1

The differential circuit according to claim 1, wherein the differential pair includes a first differential pair and a second differential pair. The differential circuit further includes a current switching unit that switches between supply of current to the first differential pair and supply of current to the second differential pair. The transistor that configures the current switching unit among the plurality of transistors is the low concentration transistor.

Embodiment A2

The differential circuit according to embodiment A1, wherein the low concentration transistor configuring the current switching unit is an enhancement type MOS transistor.

Embodiment A3

The differential circuit according to embodiment A1 or A2, wherein the transistor configuring the current switching unit, and either the transistor configuring the first differential pair or the transistor configuring the second differential pair are the low concentration transistors of the same conductivity type.

Embodiment B1

The differential circuit according to claim 1, wherein the back gate bias circuit includes a plurality of MOS transistors. The plurality of MOS transistors are surface channel type MOS transistors. The first MOS transistor and the second MOS transistor are embedded channel type MOS transistors.

Embodiment B2

The differential circuit according to embodiment B1, wherein the first MOS transistor and the second MOS transistor are enhancement type MOS transistors.

Embodiment B3

The differential circuit according to embodiment B1, including an active load including a third MOS transistor connected to the first MOS transistor, and a fourth MOS transistor connected to the second MOS transistor. The transistor configuring the active load among the plurality of transistors is an embedded channel type MOS transistor.

Embodiment B4

The differential circuit according to embodiment B3, wherein the transistor configuring the active load is an enhancement type MOS transistor.

Embodiment B5

The differential circuit according to embodiment B1, wherein the differential pair includes a first differential pair and a second differential pair. The differential circuit further includes a current switching unit that switches between supply of current to the first differential pair and supply of current to the second differential pair. The transistor that configures the current switching unit among the plurality of transistors is an embedded channel type MOS transistor.

Embodiment B6

The differential circuit according to embodiment B5, wherein the transistor configuring the current switching unit is an enhancement type MOS transistor.

Embodiment C1

The differential circuit according to claim 1, wherein the back gate bias circuit includes a plurality of MOS transistors. The plurality of MOS transistors are surface channel type MOS transistors. The first MOS transistor and the second MOS transistor are embedded channel type MOS transistors. The impurity concentration in the channel region of the embedded channel type MOS transistor is lower than the impurity concentration in the channel region of the surface channel type MOS transistor.

Embodiment C2

The differential circuit according to embodiment C1, wherein the first MOS transistor and the second MOS transistor are enhancement type MOS transistors.

Embodiment C3

The differential circuit according to embodiment C1, including an active load including a third MOS transistor connected to the first MOS transistor, and a fourth MOS transistor connected to the second MOS transistor. The transistor configuring the active load among the plurality of transistors is the embedded channel type MOSFET.

Embodiment C4

The differential circuit according to embodiment C3, wherein the transistor configuring the active load is an enhancement type MOSFET.

Embodiment C5

The differential circuit according to embodiment C1, wherein the differential pair includes a first differential pair and a second differential pair. The operational amplifier further includes a current switching unit that switches between supply of current to the first differential pair and supply of current to the second differential pair. The transistor that configures the current switching unit among the plurality of transistors is the embedded channel type MOS transistor.

Embodiment C6

The differential circuit according to embodiment C5, wherein the transistor configuring the current switching unit is an enhancement type MOS transistor.

Embodiment C7

The differential circuit according to embodiment C5, wherein the transistor configuring the current switching unit, and either the transistor configuring the first differential pair or the transistor configuring the second differential pair are the embedded channel type MOS transistors of the same conductivity type.

Embodiment C8

The differential circuit according to embodiment C1, wherein the impurity concentration in the channel region of the embedded channel type MOS transistor is about ½ of the impurity concentration in the channel region of the surface channel type MOS transistor.

Embodiment D1

The differential circuit according to claim 1, wherein the differential pair includes a first differential pair and a second differential pair. The differential circuit further includes a current switching unit that switches between supply of current to the first differential pair and supply of current to the second differential pair. The transistor that configures the first differential pair and the transistor that configures the second differential pair in the plurality of transistors are the low concentration transistors.

Embodiment D2

The differential circuit according to embodiment D1, wherein the transistor configuring the first differential pair and the transistor configuring the second differential pair are enhancement type MOS transistors.

Embodiment D3

The differential circuit according to embodiment D1, wherein the transistor configuring the current switching unit is the low concentration transistor.

Embodiment D4

The differential circuit according to embodiment D3, wherein the low concentration transistor configuring the current switching unit is an enhancement type MOS transistor.

Embodiment D5

The differential circuit according to embodiment D1, wherein the transistor configuring the current switching unit, and either the transistor configuring the first differential pair or the transistor configuring the second differential pair are the low concentration transistors of the same conductivity type.

Embodiment E1

The differential circuit according to claim 1, including a plurality of transistors including the first transistor, the second transistor, the third transistor, and the fourth transistor, wherein the plurality of transistors include an embedded channel type MOS transistor, and a surface channel type MOS transistor. The transistor easily affected by 1/f noise of the differential circuit is configured by the embedded channel type MOS transistor rather than the surface channel type MOS transistor.

Embodiment E2

The differential circuit according to embodiment E1, wherein the transistor configuring the differential pair among the plurality of transistors is an embedded channel type MOS transistor.

Embodiment E3

The differential circuit according to embodiment E2, wherein the transistor configuring the differential pair is an enhancement type MOS transistor.

Embodiment E4

The differential circuit according to embodiment E1, wherein the transistor configuring the active load among the plurality of transistors is an embedded channel type MOS transistor.

Embodiment E5

The differential circuit according to embodiment E4, wherein the transistor configuring the active load is an enhancement type MOS transistor.

Embodiment E6

The differential circuit according to embodiment E2, wherein the differential pair includes a first differential pair and a second differential pair. The differential circuit further includes a current switching unit that switches between supply of current to the first differential pair and supply of current to the second differential pair. The transistor that configures the current switching unit among the plurality of transistors is an embedded channel type MOS transistor.

Embodiment E7

The differential circuit according to embodiment E6, wherein the transistor configuring the current switching unit is an enhancement type MOS transistor.

Embodiment F1

The differential circuit according to claim 1, including a plurality of transistors including the first transistor, the second transistor, the third transistor, and the fourth transistor, wherein the plurality of transistors include an embedded channel type MOS transistor, and a surface channel type MOS transistor. The impurity concentration in the channel region of the embedded channel type MOS transistor is lower than the impurity concentration in the channel region of the surface channel type MOS transistor circuit.

Embodiment F2

The differential circuit according to embodiment F1, wherein the transistor easily affected by the 1/f noise of the differential circuit among the plurality of transistors is the embedded channel type MOS transistor. The transistor not easily affected by 1/f noise of the differential circuit among the plurality of transistors is the surface channel type MOS transistor.

Embodiment F3

The differential circuit according to embodiment F1, wherein the transistor configuring the differential pair among the plurality of transistors is the embedded channel type MOSFET.

Embodiment F4

The differential circuit according to embodiment F3, wherein the transistor configuring the differential pair is an enhancement type MOS transistor.

Embodiment F5

The differential circuit according to embodiment F3, wherein the transistor configuring the active load among the plurality of transistors is the embedded channel type MOSFET.

Embodiment F6

The differential circuit according to embodiment F5, wherein the transistor configuring the active load is an enhancement type MOS transistor.

Embodiment F7

The differential circuit according to embodiment F3, wherein the differential pair includes a first differential pair and a second differential pair. The operational amplifier circuit further includes a current switching unit that switches between supply of current to the first differential pair and supply of current to the second differential pair. The transistor that configures the current switching unit among the plurality of transistors is the embedded channel type MOS transistor.

Embodiment F8

The differential circuit according to embodiment F7, wherein the transistor configuring the current switching unit is an enhancement type MOS transistor.

Embodiment F9

The differential circuit according to embodiment F7, wherein the transistor configuring the current switching unit, and either the transistor configuring the first differential pair or the transistor configuring the second differential pair are the embedded channel type MOS transistors of the same conductivity type.

Embodiment F10

The differential circuit according to embodiment F1, wherein the impurity concentration in the channel region of the embedded channel type MOS transistor is about ½ of the impurity concentration in the channel region of the surface channel type MOS transistor.

Embodiment G1

A differential circuit including: a differential pair that includes a first MOS transistor and a second MOS transistor provided between a first power supply line to which a first power supply voltage is applied and a second power supply line to which a second power supply voltage different from the first power supply voltage is applied; and a back gate bias circuit that applies a bias voltage closer to the first power supply voltage than source potentials of the first MOS transistor and the second MOS transistor to back gates of the first MOS transistor and the second MOS transistor.

Embodiment G2

The differential circuit according to embodiment G1, wherein a voltage conversion circuit is provided between the first power supply line and the differential pair to convert the first power supply voltage into a voltage closer to the source potentials of the first MOS transistor and the second MOS transistor than the first power supply voltage.

Embodiment G3

The differential circuit according to embodiment G1, wherein the back gate bias circuit generates the bias voltage with a third power supply voltage that differs from the first power supply voltage. The first power supply voltage is a voltage closer to the source potentials of the first MOS transistor and the second MOS transistor than the third power supply voltage.

Embodiment G4

The differential circuit according to embodiment G1, wherein the bias voltage is a voltage within a predetermined range including the first power supply voltage and excluding a voltage equal to the first power supply voltage.

Embodiment G5

The differential circuit according to note G4, wherein the first power supply voltage is higher than the second power supply voltage. The first MOS transistor and the second MOS transistor are P-channel MOS transistors. The bias voltage is higher than the first power supply voltage.

Embodiment G6

The differential circuit according to embodiment G5, wherein the bias voltage is lower than a voltage at which parasitic diodes of the first MOS transistor and the second MOS transistor are turned on.

Embodiment G7

The differential circuit according to embodiment G4, wherein the bias voltage is a voltage within ±20% of the first power supply voltage.

Embodiment G8

The differential circuit according to embodiment G1, wherein the second power supply voltage is higher than the first power supply voltage. The first MOS transistor and the second MOS transistor are N-channel type MOS transistors. The bias voltage is lower than the first power supply voltage.

DESCRIPTION OF REFERENCE CHARACTERS 1, 1A to 1W) operational amplifier (differential circuit); 2) first power supply line; 3) second power supply line; 4) third power supply line; 10, 151, 161, 181) differential pair; 12) current mirror circuit (active load); 20, 20A, 20B) back gate bias circuit; 91, 163, 176) cascode current mirror circuit; 92, 164, 177) bias circuit; 100) step-down circuit (voltage conversion circuit); 103) step-up circuit (voltage conversion circuit); 110A) first control unit; 110B) second control unit; 111) first constant current source; 112) second constant current source; 120, 120A to 120F) current adjustment unit; 121) current supplying unit; 125) adjustment current source (current source); 131) first control unit; 132) second control unit; 171) first differential pair (differential pair); 172) second differential pair (differential pair); 180) integration circuit (differential circuit); M1, MD1, ME1) first transistor (first MOS transistor); M2, MD2, MD3) second transistor (second MOS transistor); M3) third transistor (third MOS transistor); M4) fourth transistor (fourth MOS transistor); M5 to M9) plural MOS transistors of back gate bias circuit; M10, MF10) tenth transistor (fifth transistor); M11, MF11) eleventh transistor (sixth transistor); M12, MF12) twelfth transistor (seventh transistor); M13, MF13) thirteenth transistor (eighth transistor); MD4) fourth transistor (third MOS transistor); MD5) fifth transistor (fourth MOS transistor); ME4) fourth transistor (fifth MOS transistor); ME5) fifth transistor (sixth MOS transistor); ME6) sixth transistor (seventh MOS transistor); ME7) seventh transistor (eighth MOS transistor); MF4) fourth transistor (first MOS transistor); MF5) fifth transistor (second MOS transistor); MF7) seventh transistor (first MOS transistor); MF8) eighth transistor (second MOS transistor); MA1) first control transistor; MA2) second control transistor; MB1) first supply transistor; MB2) second supply transistor; MB3) third supply transistor; MB4) first branching transistor (first adjustment transistor); MB5) second branching transistor (second adjustment transistor); R1) first resistor (first resistance portion); R2) second resistor (second resistance portion); R3) third resistor (third resistance portion); VB) bias voltage; VDD, VDD1) first power supply voltage; VSS, VSS1) second power supply voltage; VDD2) third power supply voltage

The invention claimed is:
1. A differential circuit comprising:
a differential pair including a first metal oxide semiconductor (MOS) transistor and a second MOS transistor provided between a first power supply line, to which a first power supply voltage is applied, and a second power supply line, to which a second power supply voltage that differs from the first power supply voltage is applied;
a back gate bias circuit that applies a bias voltage, which is closer to the first power supply voltage than source potentials of the first MOS transistor and the second MOS transistor, to back gates of the first MOS transistor and the second MOS transistor; and
a voltage conversion circuit provided between the first power supply line and the differential pair to convert the first power supply voltage into a voltage closer to the source potentials of the first MOS transistor and the second MOS transistor than the first power supply voltage.

2. The differential circuit according to claim 1, wherein the back gate bias circuit generates the bias voltage with a third power supply voltage that differs from the first power supply voltage, and
the first power supply voltage is a voltage closer to the source potentials of the first MOS transistor and the second MOS transistor than the third power supply voltage.

3. The differential circuit according to claim 1, wherein the bias voltage is a voltage within a predetermined range including the first power supply voltage and excluding a voltage equal to the first power supply voltage.

4. The differential circuit according to claim 3, wherein the first power supply voltage is higher than the second power supply voltage,
the first MOS transistor and the second MOS transistor are P-channel MOS transistors, and
the bias voltage is higher than the first power supply voltage.

5. The differential circuit according to claim 4, wherein the bias voltage is lower than a voltage at which parasitic diodes of the first MOS transistor and the second MOS transistor are turned on.

6. The differential circuit according to claim 3, wherein the bias voltage is a voltage within ±20% of the first power supply voltage.

7. A differential circuit comprising:
   a differential pair including a first metal oxide semiconductor (MOS) transistor and a second MOS transistor provided between a first power supply line, to which a first power supply voltage is applied, and a second power supply line, to which a second power supply voltage that differs from the first power supply voltage is applied; and
   a back gate bias circuit that applies a bias voltage, which is closer to the first power supply voltage than source potentials of the first MOS transistor and the second MOS transistor, to back gates of the first MOS transistor and the second MOS transistor,
   the second power supply voltage is higher than the first power supply voltage,
   the first MOS transistor and the second MOS transistor are N-channel MOS transistors, and
   the bias voltage is lower than the first power supply voltage.

8. The differential circuit according to claim 1, comprising:
   an active load including a third MOS transistor, which is connected to the first MOS transistor, and a fourth MOS transistor, which is connected to the second MOS transistor;
   a first resistance portion provided between the third MOS transistor and the second power supply line; and
   a second resistance portion provided between the fourth MOS transistor and the second power supply line.

9. The differential circuit according to claim 8, comprising:
   a first control unit that controls a source potential of the third MOS transistor by supplying a current between a source of the third MOS transistor and the first resistance portion; and
   a second control unit that controls a source potential of the fourth MOS transistor by supplying a current between a source of the fourth MOS transistor and the second resistance portion, wherein
   the first control unit includes a first control transistor connected between the source of the third MOS transistor and the first resistance portion,
   the second control unit includes a second control transistor connected between the source of the fourth MOS transistor and the second resistance portion,
   voltages of control terminals of the first control transistor and the second control transistor are controlled by gate voltages of the third MOS transistor and the fourth MOS transistor,
   the first control unit further includes a first current source connected to the first power supply line and the first control transistor, and
   the second control unit further includes a second current source connected to the first power supply line and the second control transistor.

10. The differential circuit according to claim 8, further comprising a current adjustment unit that causes larger currents to flow through the first MOS transistor and the second MOS transistor than currents flowing through the third MOS transistor and the fourth MOS transistor.

11. The differential circuit according to claim 10, wherein the current adjustment unit includes
    a first adjustment transistor connected in parallel with the third MOS transistor, and
    a second adjustment transistor connected in parallel with the fourth MOS transistor and having a control terminal connected to a control terminal of the first adjustment transistor;
   the current adjustment unit includes a current supplying unit that supplies the differential pair with an adjustment current for adjusting a sum of an amount of current flowing through the first adjustment transistor and an amount of current flowing through the second adjustment transistor;
   the current supplying unit includes a first supply transistor and a second supply transistor, which are connected in series between the first power supply line and the second power supply line, a third supply transistor, which is provided between the first power supply line and the differential pair, and a third resistance portion, which is provided between the second supply transistor and the second power supply line;
   the first supply transistor is provided between the second supply transistor and the first power supply line,
   a control terminal of the second supply transistor is connected to a control terminal of the first adjustment transistor and a control terminal of the second adjustment transistor;
   the third supply transistor configures a current mirror circuit in cooperation with the first supply transistor and supplies the adjustment current to the differential pair; and
   the first adjustment transistor and the second adjustment transistor cause a flow of a current smaller than or equal to the current flowing through the third MOS transistor.

12. The differential circuit according to claim 1, further comprising:
    an active load that includes a third MOS transistor, which is connected to the first MOS transistor, and a fourth MOS transistor, which is connected to the second MOS transistor and has a gate connected to a gate of the third MOS transistor; and
    a current adjustment unit that causes larger currents to flow through the first MOS transistor and the second MOS transistor than currents flowing through the third MOS transistor and the fourth MOS transistor.

13. The differential circuit according to claim 12, wherein the current adjustment unit includes
    a first adjustment transistor connected in parallel with the third MOS transistor, and
    a second adjustment transistor connected in parallel with the fourth MOS transistor and having a control terminal connected to a control terminal of the first adjustment transistor.

14. The differential circuit according to claim 13, wherein the current adjustment unit includes a current supplying unit that supplies the differential pair with an adjustment current for adjusting a sum of an amount of current flowing through the first adjustment transistor and an amount of current flowing through the second adjustment transistor.

15. The differential circuit according to claim 14, wherein the current supplying unit includes a first supply transistor and a second supply transistor, which are connected in series between the first power supply line and the second power supply line, and a third supply transistor, which is provided between the first power supply line and the differential pair;
   the first supply transistor is provided between the second supply transistor and the first power supply line;

a control terminal of the second supply transistor is connected to a control terminal of the first adjustment transistor and a control terminal of the second adjustment transistor; and the third supply transistor configures a current mirror circuit in cooperation with the first supply transistor and supplies the adjustment current to the differential pair.

16. The differential circuit according to claim 14, wherein the first adjustment transistor and the second adjustment transistor cause a flow of a current smaller than or equal to the current flowing through the third MOS transistor.

17. The differential circuit according to claim 14, wherein the current supplying unit biases the first adjustment transistor and the second adjustment transistor so that a current smaller than or equal to the current flowing through the third MOS transistor is caused to flow by a current source.

18. The differential circuit according to claim 1, wherein the differential circuit is used as an operational amplifier.

19. A differential circuit comprising:
a differential pair provided between a first power supply line and a second power supply line and including a first transistor and a second transistor;
an active load that includes a third transistor, which is connected to the first transistor, and a fourth transistor, which is connected to the second transistor;
a first resistance portion provided between the third transistor and the second power supply line;
a second resistance portion provided between the fourth transistor and the second power supply line;
a first control unit that controls a source potential of the third transistor by supplying a current between a source of the third transistor and the first resistance portion; and
a second control unit that controls a source potential of the fourth transistor by supplying a current between a source of the fourth transistor and the second resistance portion, wherein
the first control unit includes a first control transistor connected between the source of the third transistor and the first resistance portion,
the second control unit includes a second control transistor connected between the source of the fourth transistor and the second resistance portion, and
voltages of control terminals of the first control transistor and the second control transistor are controlled by gate voltages of the third transistor and the fourth transistor.

20. A differential circuit comprising:
a differential pair provided between a first power supply line and a second power supply line and including a first transistor and a second transistor;
an active load that includes a third transistor, which is connected to the first transistor, and a fourth transistor, which is connected to the second transistor;
a first resistance portion provided between the third transistor and the second power supply line;
a second resistance portion provided between the fourth transistor and the second power supply line; and
a current adjustment unit that causes larger currents to flow through the first transistor and the second transistor than currents flowing through the third transistor and the fourth transistor,
wherein the current adjustment unit includes
a first adjustment transistor connected in parallel with the third transistor, and
a second adjustment transistor connected in parallel with the fourth transistor and having a control terminal connected to a control terminal of the first adjustment transistor.

21. The differential circuit according to claim 20, wherein the current adjustment unit includes a current supplying unit that supplies, to the differential pair, an adjustment current for adjusting a sum of an amount of current flowing through the first adjustment transistor and an amount of current flowing through the second adjustment transistor.

22. The differential circuit according to claim 21, wherein:
the current supplying unit includes a first supply transistor and a second supply transistor, which are connected in series between the first power supply line and the second power supply line, a third supply transistor, which is provided between the first power supply line and the differential pair, and a third resistance portion provided between the second supply transistor and the second power supply line;
the first supply transistor is provided between the second supply transistor and the first power supply line;
a control terminal of the second supply transistor is connected to a control terminal of the first adjustment transistor and a control terminal of the second adjustment transistor; and
the third supply transistor configures a current mirror circuit in cooperation with the first supply transistor and supplies the adjustment current to the differential pair.

23. The differential circuit according to claim 20, wherein the first adjustment transistor and the second adjustment transistor cause a flow of a current smaller than or equal to the current flowing through the third transistor.

24. A differential circuit comprising:
a differential pair provided between a first power supply line and a second power supply line and including a first transistor and a second transistor;
an active load that includes a third transistor, which is connected to the first transistor, and a fourth transistor, which is connected to the second transistor; and
a current adjustment unit that causes larger currents to flow through the first transistor and the second transistor than currents flowing through the third transistor and the fourth transistor,
wherein the current adjustment unit includes
a first adjustment transistor connected in parallel with the third transistor, and
a second adjustment transistor connected in parallel with the fourth transistor and having a control terminal connected to a control terminal of the first adjustment transistor.

25. The differential circuit according to claim 24, wherein the current adjustment unit includes a current supplying unit that supplies the differential pair with an adjustment current for adjusting a sum of an amount of current flowing through the first adjustment transistor and an amount of current flowing through the second adjustment transistor.

26. The differential circuit according to claim 25, wherein:
the current supplying unit includes a first supply transistor and a second supply transistor, which are connected in series between the first power supply line and the second power supply line, and a third supply transistor, which is provided between the first power supply line and the differential pair;

the first supply transistor is provided between the second supply transistor and the first power supply line;

a control terminal of the second supply transistor is connected to a control terminal of the first adjustment transistor and a control terminal of the second adjustment transistor; and the third supply transistor configures a current mirror circuit in cooperation with the first supply transistor and supplies the adjustment current to the differential pair.

27. The differential circuit according to claim 24, wherein the first adjustment transistor and the second adjustment transistor cause a flow of a current smaller than or equal to the current flowing through the third transistor.

28. The differential circuit according to claim 25, wherein the current supplying unit biases the first adjustment transistor and the second adjustment transistor so that a current smaller than or equal to the current flowing through the third transistor is caused to flow by a current source.

\* \* \* \* \*